(12) United States Patent
Or-Bach et al.

(10) Patent No.: US 8,823,122 B2
(45) Date of Patent: Sep. 2, 2014

(54) SEMICONDUCTOR AND OPTOELECTRONIC DEVICES

(75) Inventors: Zvi Or-Bach, San Jose, CA (US); Deepak C. Sekar, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 431 days.

(21) Appl. No.: 13/422,057

(22) Filed: Mar. 16, 2012

(65) Prior Publication Data

US 2013/0069191 A1   Mar. 21, 2013

Related U.S. Application Data

(63) Continuation of application No. 12/904,103, filed on Oct. 13, 2010, now Pat. No. 8,163,581.

(51) Int. Cl.
| | |
|---|---|
| *H01L 31/0352* | (2006.01) |
| *H01L 31/18* | (2006.01) |
| *H01L 25/075* | (2006.01) |
| *H01L 31/0725* | (2012.01) |
| *H01L 33/00* | (2010.01) |
| *H01L 27/15* | (2006.01) |
| *H01L 33/34* | (2010.01) |

(52) U.S. Cl.
CPC ........ *H01L 31/1892* (2013.01); *H01L 25/0756* (2013.01); *H01L 31/0725* (2013.01); *H01L 27/153* (2013.01); *H01L 33/34* (2013.01); *Y02E 10/50* (2013.01); *H01L 33/0079* (2013.01)
USPC ............................ 257/432; 257/435; 257/440

(58) Field of Classification Search
CPC .................. H01L 27/14612; H01L 27/14634; H01L 21/8221
USPC ......................................... 257/432, 435, 440
See application file for complete search history.

(56) References Cited

U.S. PATENT DOCUMENTS

| | | |
|---|---|---|
| 3,007,090 A | 10/1961 | Rutz |
| 3,819,959 A | 6/1974 | Chang et al. |
| 4,197,555 A | 4/1980 | Uehara et al. |
| 4,400,715 A | 8/1983 | Barbee et al. |
| 4,487,635 A | 12/1984 | Kugimiya et al. |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |

(Continued)

FOREIGN PATENT DOCUMENTS

| | | |
|---|---|---|
| EP | 1267594 A2 | 12/2002 |
| EP | 1909311 A2 | 4/2008 |
| WO | PCT/US2008/063483 | 5/2008 |

OTHER PUBLICATIONS

Colinge, J. P., et al., "Nanowire transistors without Junctions", Nature Nanotechnology, Feb. 21, 2010, pp. 1-5.

(Continued)

*Primary Examiner* — George Fourson, III

(57) ABSTRACT

An integrated device, the device including a first crystalline layer covered by an oxide layer, a second crystalline layer overlying the oxide layer, wherein the first and second crystalline layers are image sensor layers, and the device includes a third crystalline layer, wherein the third crystalline layer includes single crystal transistors.

22 Claims, 147 Drawing Sheets

(56) References Cited

U.S. PATENT DOCUMENTS

| | | |
|---|---|---|
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,881 A | 6/1998 | Pelella et al. |
| 5,781,031 A | 7/1998 | Bertin et al. |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,222,203 B1 | 4/2001 | Ishibashi et al. |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,259,623 B1 | 7/2001 | Takahashi |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,353,492 B2 | 3/2002 | McClelland et al. |
| 6,355,501 B1 | 3/2002 | Fung et al. |
| 6,358,631 B1 | 3/2002 | Forrest et al. |
| 6,365,270 B2 | 4/2002 | Forrest et al. |
| 6,376,337 B1 | 4/2002 | Wang et al. |
| 6,380,046 B1 | 4/2002 | Yamazaki |
| 6,392,253 B1 | 5/2002 | Saxena |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,289 B2 | 6/2003 | Cox |
| 6,600,173 B2 | 7/2003 | Tiwari |
| 6,620,659 B2 | 9/2003 | Emma et al. |
| 6,624,046 B1 | 9/2003 | Zavracky et al. |
| 6,627,518 B1 | 9/2003 | Inoue et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |

(56) References Cited

U.S. PATENT DOCUMENTS

| | | | |
|---|---|---|---|
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,335,573 B2 | 2/2008 | Takayama et al. |
| 7,337,425 B2 | 2/2008 | Kirk |
| 7,338,884 B2 | 3/2008 | Shimoto et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,393,722 B1 | 7/2008 | Issaq et al. |
| 7,419,844 B2 * | 9/2008 | Lee et al. ........................ 438/48 |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,557,367 B2 | 7/2009 | Rogers et al. |
| 7,563,659 B2 | 7/2009 | Kwon et al. |
| 7,566,855 B2 | 7/2009 | Olsen et al. |
| 7,586,778 B2 | 9/2009 | Ho et al. |
| 7,589,375 B2 | 9/2009 | Jang et al. |
| 7,608,848 B2 | 10/2009 | Ho et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,745,250 B2 * | 6/2010 | Han ................................ 438/57 |
| 7,749,884 B2 | 7/2010 | Mathew et al. |
| 7,759,043 B2 | 7/2010 | Tanabe et al. |
| 7,768,115 B2 | 8/2010 | Lee et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 * | 9/2010 | Lee et al. ........................ 257/292 |
| 7,800,199 B2 | 9/2010 | Oh et al. |
| 7,843,718 B2 | 11/2010 | Koh et al. |
| 7,846,814 B2 | 12/2010 | Lee |
| 7,863,095 B2 | 1/2011 | Sasaki et al. |
| 7,867,822 B2 | 1/2011 | Lee |
| 7,888,764 B2 | 2/2011 | Lee |
| 7,915,164 B2 | 3/2011 | Konevecki et al. |

(56) References Cited

U.S. PATENT DOCUMENTS

| | | |
|---|---|---|
| 7,982,250 B2 | 7/2011 | Yamasaki et al. |
| 8,013,399 B2 | 9/2011 | Thomas et al. |
| 8,014,195 B2 | 9/2011 | Okhonin et al. |
| 8,022,493 B2 * | 9/2011 | Bang .............................. 257/440 |
| 8,030,780 B2 | 10/2011 | Kirby et al. |
| 8,031,544 B2 | 10/2011 | Kim et al. |
| 8,044,464 B2 | 10/2011 | Yamazaki et al. |
| 8,107,276 B2 | 1/2012 | Breitwisch et al. |
| 8,129,256 B2 | 3/2012 | Farooq et al. |
| 8,136,071 B2 | 3/2012 | Solomon |
| 8,138,502 B2 * | 3/2012 | Nakamura et al. .............. 257/72 |
| 8,158,515 B2 | 4/2012 | Farooq et al. |
| 8,183,630 B2 | 5/2012 | Batude et al. |
| 8,184,463 B2 | 5/2012 | Saen et al. |
| 8,203,187 B2 | 6/2012 | Lung et al. |
| 8,208,279 B2 | 6/2012 | Lue |
| 8,264,065 B2 | 9/2012 | Su et al. |
| 8,343,851 B2 | 1/2013 | Kim et al. |
| 8,354,308 B2 | 1/2013 | Kang et al. |
| 8,497,512 B2 * | 7/2013 | Nakamura et al. .............. 257/72 |
| 8,525,342 B2 | 9/2013 | Chandrasekaran |
| 8,546,956 B2 | 10/2013 | Nguyen |
| 2001/0000005 A1 | 3/2001 | Forrest et al. |
| 2001/0014391 A1 | 8/2001 | Forrest et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0141233 A1 | 10/2002 | Hosotani et al. |
| 2002/0153243 A1 | 10/2002 | Forrest et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0157748 A1 | 8/2003 | Kim et al. |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0150068 A1 | 8/2004 | Leedy |
| 2004/0152272 A1 | 8/2004 | Fladre et al. |
| 2004/0155301 A1 | 8/2004 | Zhang |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0175902 A1 | 9/2004 | Rayssac et al. |
| 2004/0178819 A1 | 9/2004 | New |
| 2004/0195572 A1 | 10/2004 | Kato et al. |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0067620 A1 | 3/2005 | Chan et al. |
| 2005/0067625 A1 | 3/2005 | Hata |
| 2005/0073060 A1 | 4/2005 | Datta et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0249859 A1 | 11/2006 | Eiles et al. |
| 2006/0275962 A1 | 12/2006 | Lee |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0108523 A1 | 5/2007 | Ogawa et al. |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0158659 A1 | 7/2007 | Bensce |
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0210336 A1 | 9/2007 | Madurawe |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2008/0032463 A1 | 2/2008 | Lee |
| 2008/0038902 A1 | 2/2008 | Lee |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0099780 A1 | 5/2008 | Tran |
| 2008/0108171 A1 | 5/2008 | Rogers et al. |

(56) References Cited

U.S. PATENT DOCUMENTS

| | | |
|---|---|---|
| 2008/0124845 A1 | 5/2008 | Yu et al. |
| 2008/0128745 A1 | 6/2008 | Mastro et al. |
| 2008/0136455 A1 | 6/2008 | Diamant et al. |
| 2008/0142959 A1 | 6/2008 | DeMulder et al. |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0179678 A1 | 7/2008 | Dyer et al. |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0261378 A1 | 10/2008 | Yao et al. |
| 2008/0272492 A1 | 11/2008 | Tsang |
| 2008/0277778 A1 | 11/2008 | Furman et al. |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0079000 A1 | 3/2009 | Yamasaki et al. |
| 2009/0081848 A1 | 3/2009 | Erokhin et al. |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bilger et al. |
| 2009/0179268 A1 | 7/2009 | Abou-Khalil et al. |
| 2009/0194152 A1 | 8/2009 | Liu et al. |
| 2009/0194768 A1 | 8/2009 | Leedy |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224364 A1 | 9/2009 | Oh et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0250686 A1 | 10/2009 | Sato et al. |
| 2009/0262583 A1 | 10/2009 | Lue |
| 2009/0263942 A1 | 10/2009 | Ohnuma et al. |
| 2009/0267233 A1 | 10/2009 | Lee |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294861 A1 | 12/2009 | Thomas et al. |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0025766 A1 | 2/2010 | Nuttinck et al. |
| 2010/0031217 A1 | 2/2010 | Sinha et al. |
| 2010/0038743 A1 | 2/2010 | Lee |
| 2010/0052134 A1 | 3/2010 | Werner et al. |
| 2010/0058580 A1 | 3/2010 | Yazdani |
| 2010/0081232 A1 | 4/2010 | Furman et al. |
| 2010/0112753 A1 | 5/2010 | Lee |
| 2010/0112810 A1 | 5/2010 | Lee et al. |
| 2010/0123202 A1 | 5/2010 | Hofmann |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0190334 A1 | 7/2010 | Lee |
| 2010/0193884 A1 | 8/2010 | Park et al. |
| 2010/0193964 A1 | 8/2010 | Farooq et al. |
| 2010/0224915 A1 | 9/2010 | Kawashima et al. |
| 2010/0276662 A1 | 11/2010 | Colinge |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0221022 A1 | 9/2011 | Toda |
| 2011/0227158 A1 | 9/2011 | Zhu |
| 2011/0241082 A1 | 10/2011 | Bernstein et al. |
| 2011/0284992 A1 | 11/2011 | Zhu |
| 2011/0286283 A1 | 11/2011 | Lung et al. |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0063090 A1 | 3/2012 | Hsiao et al. |
| 2012/0074466 A1 | 3/2012 | Setiadi et al. |
| 2012/0178211 A1 | 7/2012 | Hebert |
| 2012/0181654 A1 | 7/2012 | Lue |
| 2012/0182801 A1 | 7/2012 | Lue |
| 2012/0241919 A1 | 9/2012 | Mitani |
| 2012/0319728 A1 | 12/2012 | Madurawe |
| 2013/0193550 A1 | 8/2013 | Sklenard et al. |
| 2013/0196500 A1 | 8/2013 | Batude et al. |
| 2013/0203248 A1 | 8/2013 | Ernst et al. |

OTHER PUBLICATIONS

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

(56) References Cited

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
Demeester, P., et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T., et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Burr, G. W., et al., "Overview of candidate device technologies for storage-class memory," IBM Journal of Research and Development, vol. 52, No. 4.5, pp. 449-464, Jul. 2008.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Bez, R., et al., "Introduction to Flash memory," Proceedings IEEE, 91(4), 489-502 (2003).
Kim, W., et al., "Multi-layered Vertical Gate NAND Flash overcoming stacking limit for terabit density storage", Symposium on VLSI Technology Digest of Technical Papers, 2009, pp. 188-189.
Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Dicioccio, L., et. al., "Direct bonding for wafer level 3D integration", ICICDT 2010, pp. 110-113.

Shino, T., et al., "Floating Body RAM Technology and its Scalability to 32nm Node and Beyond," Electron Devices Meeting, 2006, IEDM '06, International , pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates ($\phi$Flash), Suitable for Full 3D Integration", International Electron Devices Meeting, 2009, pp. 637-640.
Celler, G.K., et al., "Frontiers of silicon-on-insulator," J. App. Phys., May 1, 2003, pp. 4955-4978, vol. 93, No. 9.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Vengurlekar, A., et al., "Mechanism of Dopant Activation Enhancement in Shallow Junctions by Hydrogen", Proceedings of the Materials Research Society, vol. 864, Spring 2005, E9.28.1-6.
Hui, K. N., et al., "Design of vertically-stacked polychromatic light-emitting diodes," Optics Express, Jun. 8, 2009, pp. 9873-9878, vol. 17, No. 12.

(56) References Cited

OTHER PUBLICATIONS

Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X., et al., "Cascade single-chip phosphor-free white light emitting diodes," Applied Physics Letters, 2008, pp. 013507-1-013507-3, vol. 92.
Chuai, D. X., et al., "A Trichromatic Phosphor-Free White Light-Emitting Diode by Using Adhesive Bonding Scheme," Proc. SPIE, 2009, vol. 7635.
Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Takafuji, Y., et al., "Integration of Single Crystal Si TFTs and Circuits on a Large Glass Substrate," IEEE International Electron Devices Meeting (IEDM), Dec. 7-9, 2009, pp. 1-4.
Flamand, G., et al., "Towards Highly Efficient 4-Terminal Mechanical Photovoltaic Stacks," III-VS Review, Sep.-Oct. 2006, pp. 24-27, vol. 19, Issue 7.
Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Wierer, J.J., et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al.,"Autonomous Refresh of Floating Body Cell (FBC)", International Electron Device Meeting, 2008, pp. 801-804.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-H150.
Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D., et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C., et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410, 2009.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M., et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.
Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.

(56) References Cited

OTHER PUBLICATIONS

Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.

Abramovici, M., "In-system silicon validation and debug", (2008) IEEE Design and Test of Computers, 25 (3), pp. 216-223.

Saxena, P., et al., "Repeater Scaling and Its Impact on CAD", IEEE Transactions on Computer-Aided Design of Integrated Circuits and Systems, vol. 23, No. 4, Apr. 2004.

Abrmovici, M., et al., A reconfigurable design-for-debug infrastructure for SoCs, (2006) Proceedings—Design Automation Conference, pp. 7-12.

Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings DATE, pp. 1338-1343.

McLaughlin, R., et al., "Automated debug of speed path failures using functional tests", (2009) Proceedings of the IEEE VLSI Test Symposium, pp. 91-96.

Morris, K., "On-Chip Debugging—Built-in Logic Analyzers on your FPGA", (2004) Journal of FPGA and Structured ASIC, 2 (3).

Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Sellathamby, C.V., et al., "Non-contact wafer probe using wireless probe cards", (2005) Proceeding—International Test Conference, 2005, pp. 447-452.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S., et al., "*CELONCEL: Effective Design Technique for 3-D Monolithic Integration targeting High Performance Integrated Circuits*", Asia pacific DAC 2011, paper 4A-4.

Choudhury, D., "3D Integration Technologies for Emerging Microsystems", IEEE Proceedings of the IMS 2010, pp. 1-4.

Lee, Y.-J., et. al, "3D 65nm CMOS with 320° C. Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.

(56) References Cited

OTHER PUBLICATIONS

Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Jung, S.-M., et al., "Highly Area Efficient and Cost Effective Double Stacked S3(Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore'S Law: The Interconnect Era", IEEE Computing in Science & Engineering, Jan./Feb. 2003, pp. 20-24.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multi-level Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-Cmos Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/ Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Rajendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.

(56) References Cited

OTHER PUBLICATIONS

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.

Ko, C.H., et al., "NiSi Schottky Barrier Process-Strained Si (SB-PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Azevedo, I. L., et al., "The Transition to Solid-State Lighting", Proc. IEEE, vol. 97, No. 3, Mar. 2009, pp. 481-510.

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Sadaka, M., et al., "Building Blocks for wafer level 3D integration", www.electroiq.conn , Aug. 18, 2010, last accessed Aug. 18, 2010.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Huet, K., et al., "Ultra Low Thermal Budget Anneals for 3D Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et al., "Germanium on Insulator and new 3D architectures opportunities for integration", International Journal of Nanotechnology, vol. 7, No. 4, pp. 304-319, 2010.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

Kuroda, T., "ThruChip Interface for Heterogeneous Chip Stacking," ElectroChemicalSociety Transactions, 50 (14) 63-68 (2012).

Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).

Kuroda, T., "Wireless Proximity Communications for 3D System Integration," Future Directions in IC and Package Design Workshop, Oct. 29, 2007.

Faynot, O. et al., "Planar Fully depleted SOI technology: A Powerful architecture for the 20nnn node and beyond," Electron Devices Meeting (IEDM), 2010 IEEE International, vol., No., pp. 3.2.1, 3.2.4, Dec. 6-8, 2010.

Khakifirooz, A., "ETSOI Technology for 20nnn and Beyond", SOI Consortium Workshop: Fully Depleted SOI, Apr. 28, 2011, Hsinchu Taiwan.

Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.

(56) References Cited

OTHER PUBLICATIONS

Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Agarwal, A., et al., "Efficient production of silicon-on-insulator films by co-implantation of He+ with H+'" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Gaillardon, P-E., et al., "Can We Go Towards True 3-D Architectures?," DAC 2011, paper 58, pp. 282-283.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.
Yun, C. H., et al., "Transfer of patterned ion-cut silicon layers", Applied Physics Letters, vol. 73, No. 19, Nov. 1998, pp. 2772-2774.
En, W. G., et al., "The Genesis Process: A New SOI wafer fabrication method", Proceedings 1998 IEEE International SOI Conference, Oct. 1998, pp. 163-164.
Kim, J., et al., "A Stacked Memory Device on Logic 3D Technology for Ultra-high-density Data Storage," Nanotechnology, vol. 22, 254006 (2011).
Yang, M., et al., "High Performance CMOS Fabricated on Hybrid Substrate with Different Crystal Orientation," Proceedings IEDM 2003.
Lee, K. W., et al., "Three-dimensional shared memory fabricated using wafer stacking technology," IEDM Tech. Dig., 2000, pp. 165-168.
Yin, H., et al., "Scalable 3-D finlike poly-Si TFT and its nonvolatile memory application," IEEE Trans. Electron Devices, vol. 55, No. 2, pp. 578-584, Feb. 2008.
Chen, H. Y., et al., "HfOx Based Vertical Resistive Random Access Memory for Cost Effective 3D Cross-Point Architecture without Cell Selector," Proceedings IEDM 2012, pp. 497-499.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.

\* cited by examiner

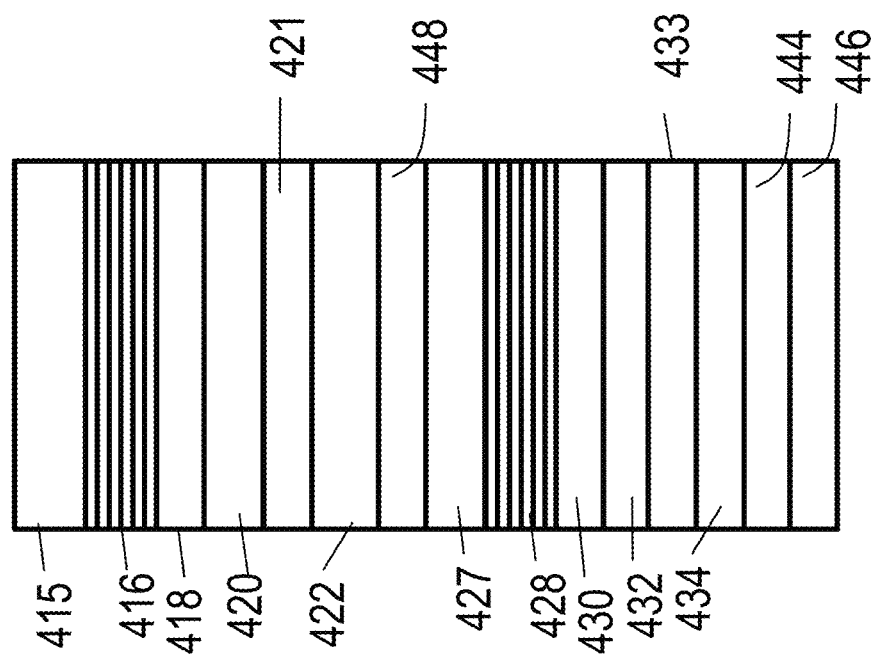

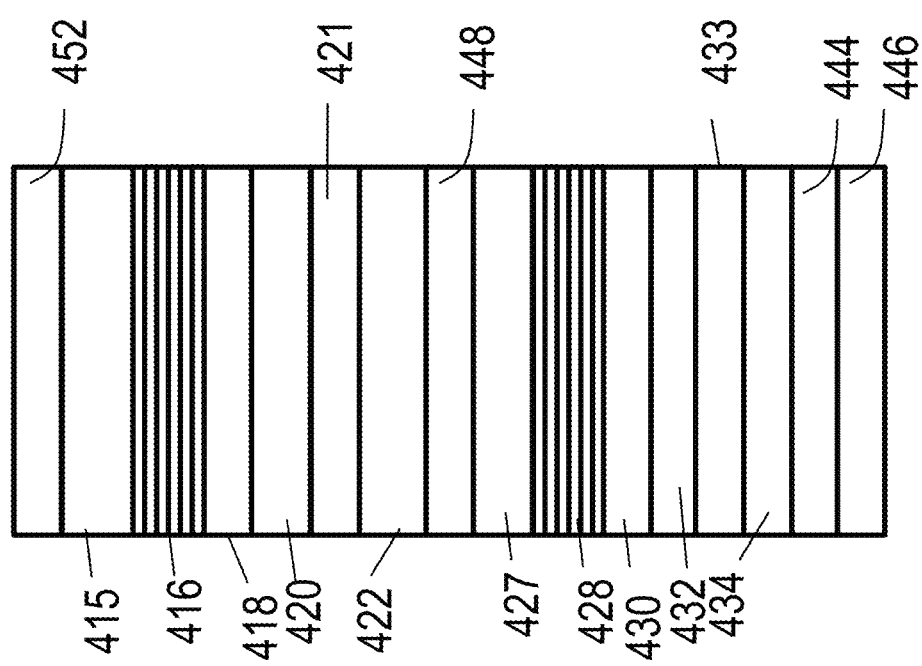

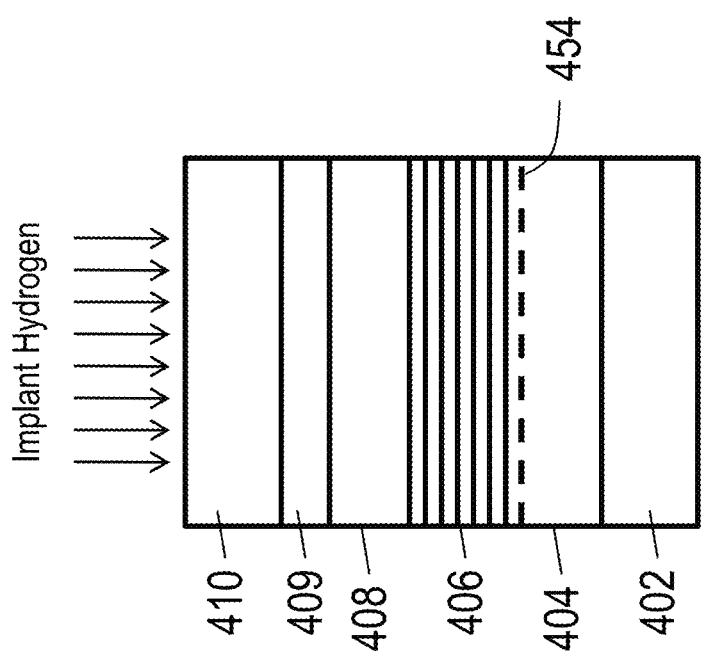

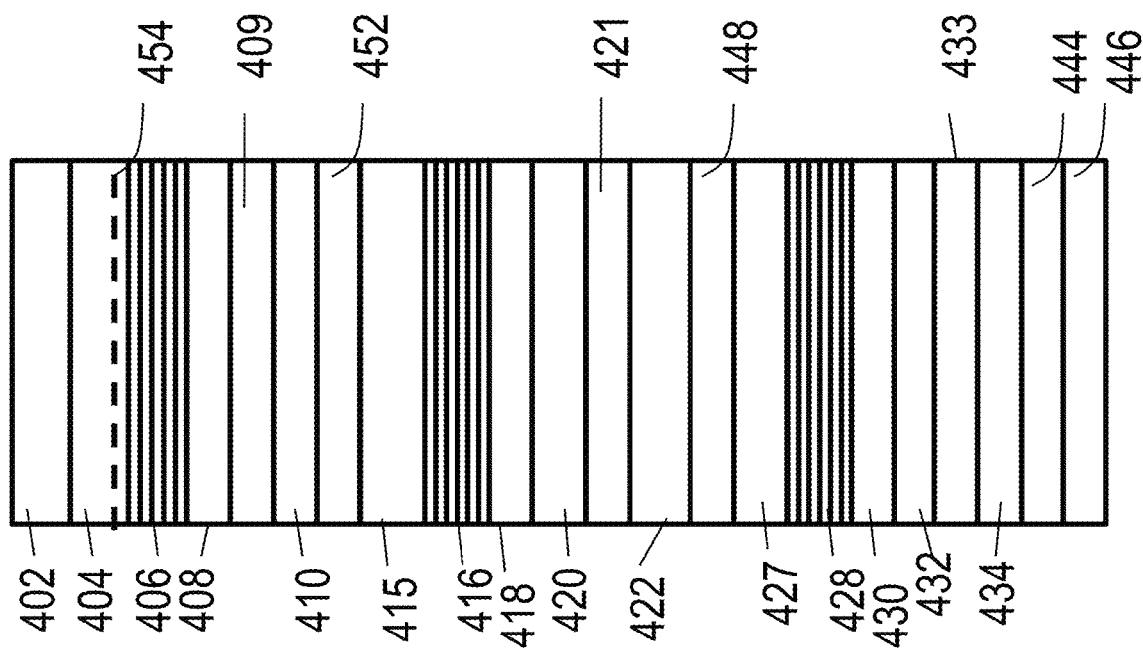

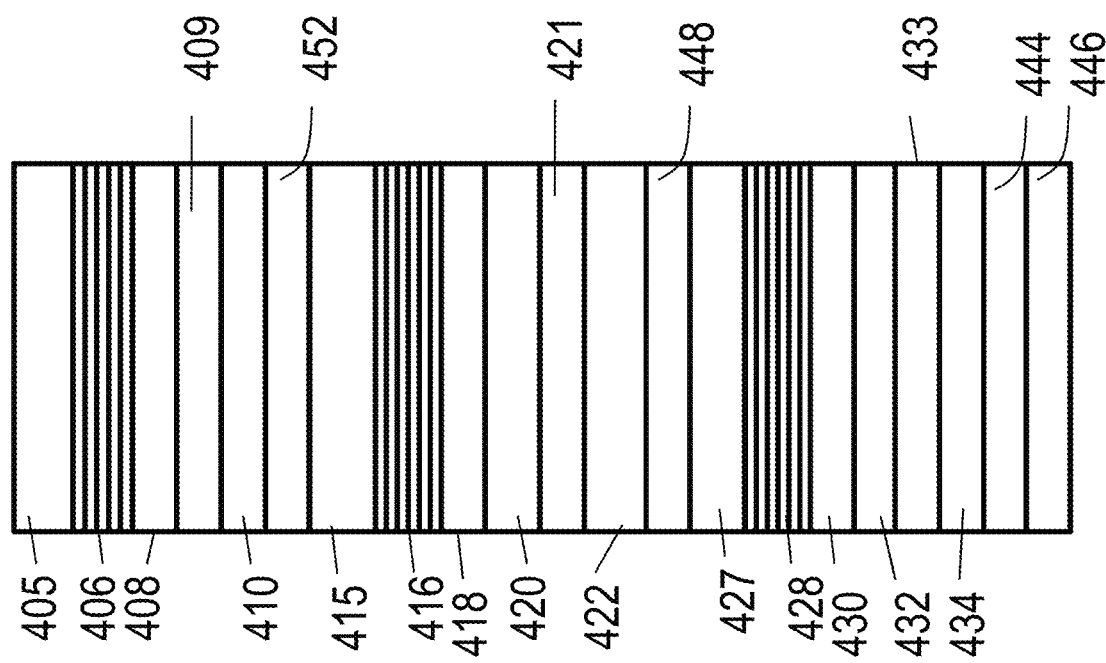

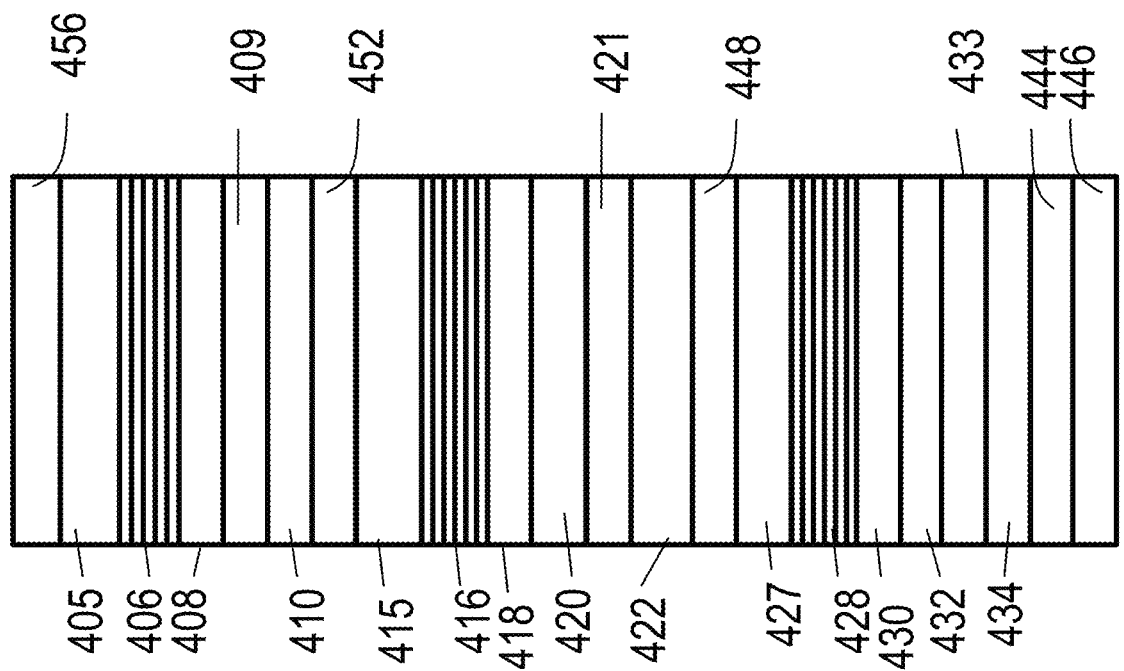

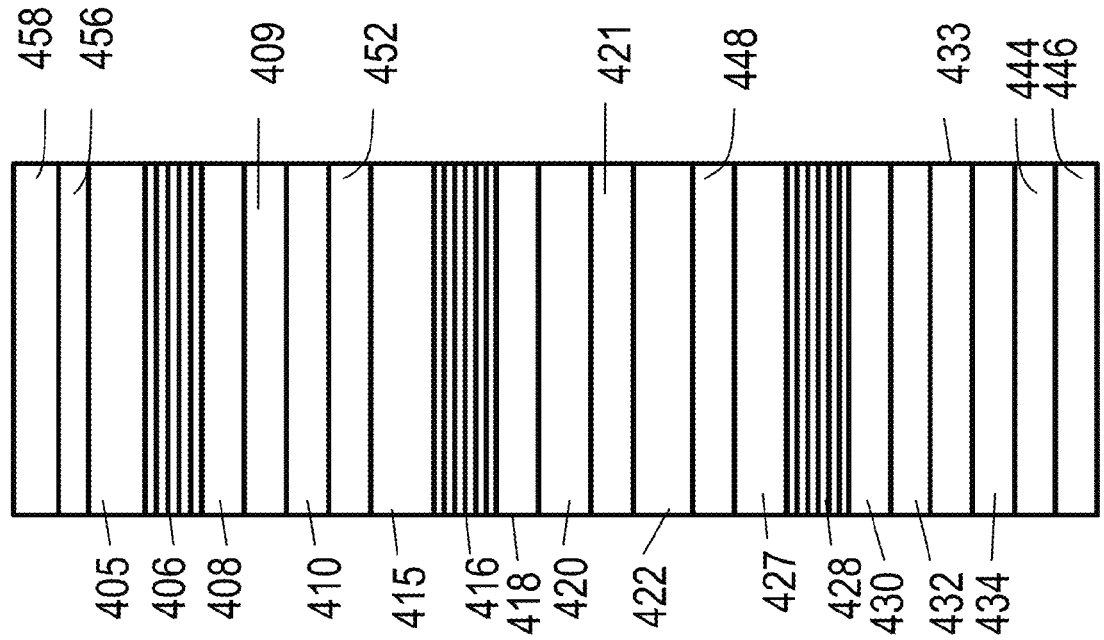

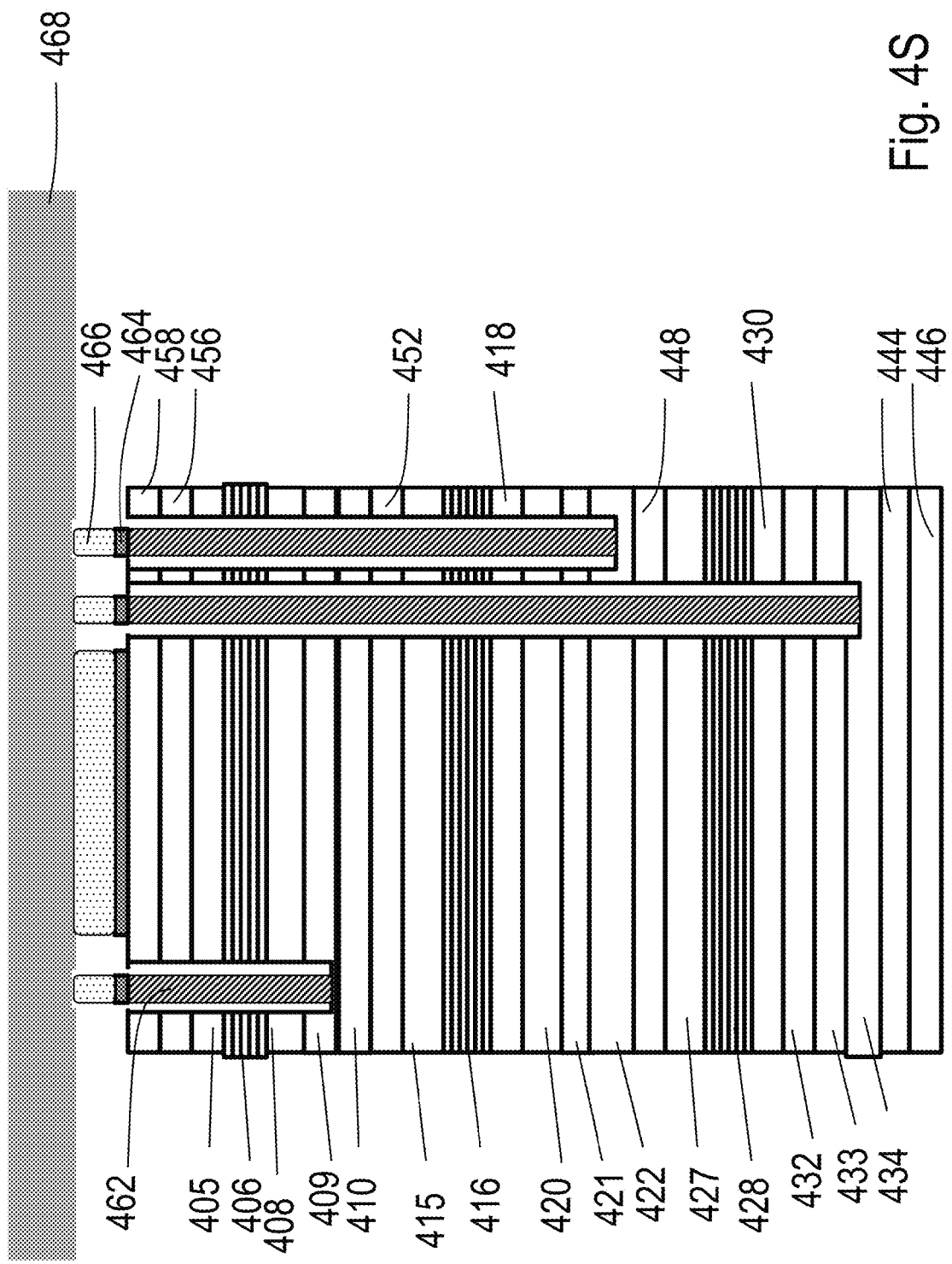

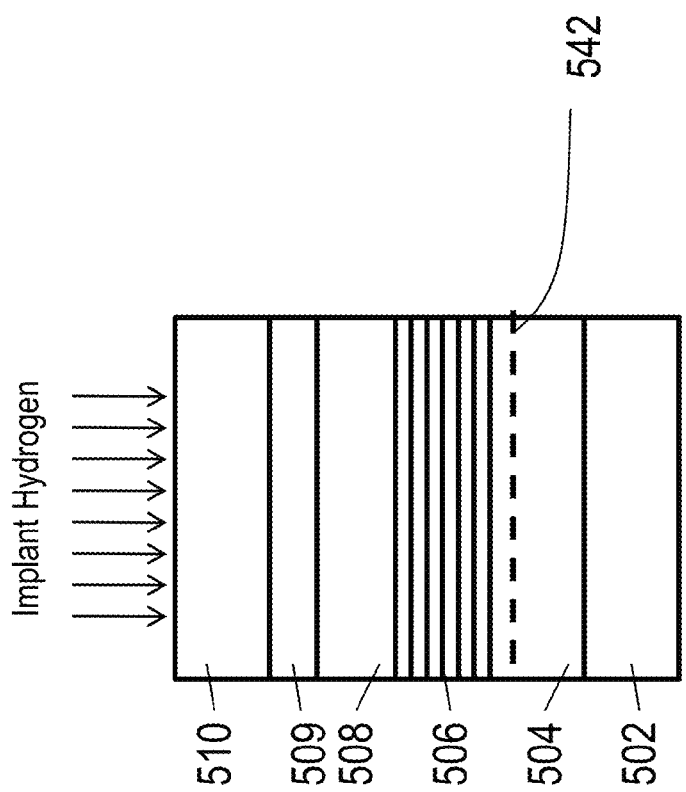

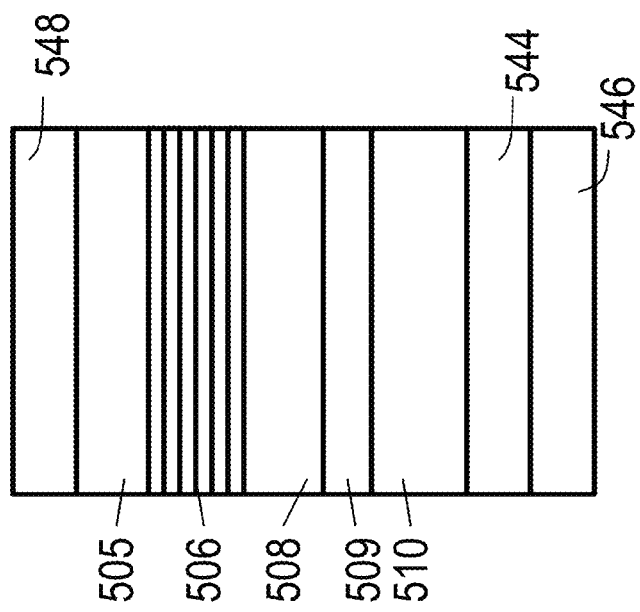

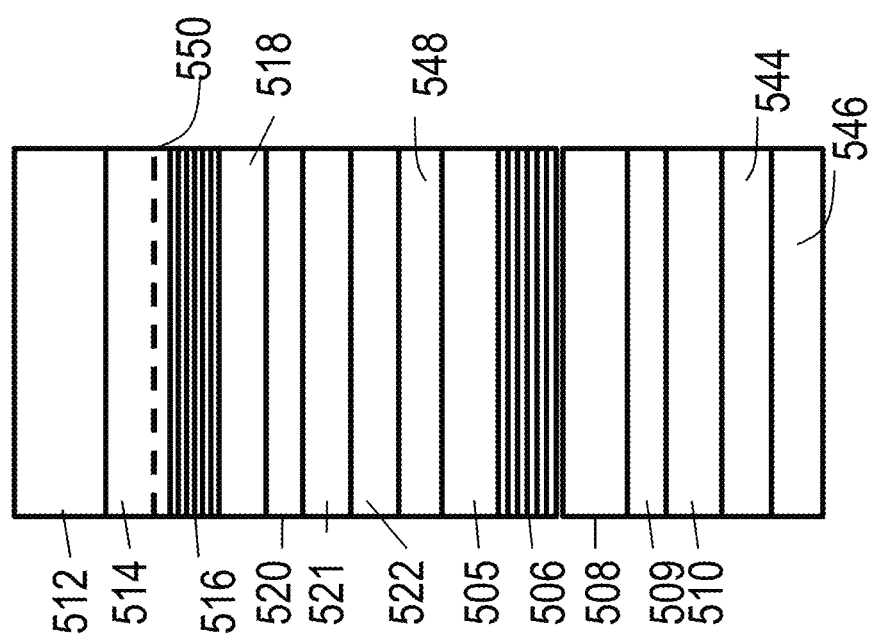

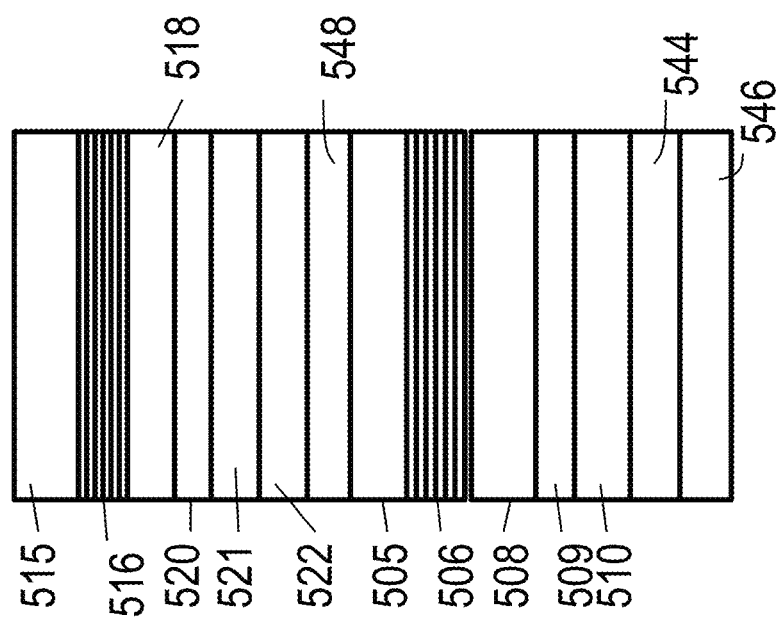

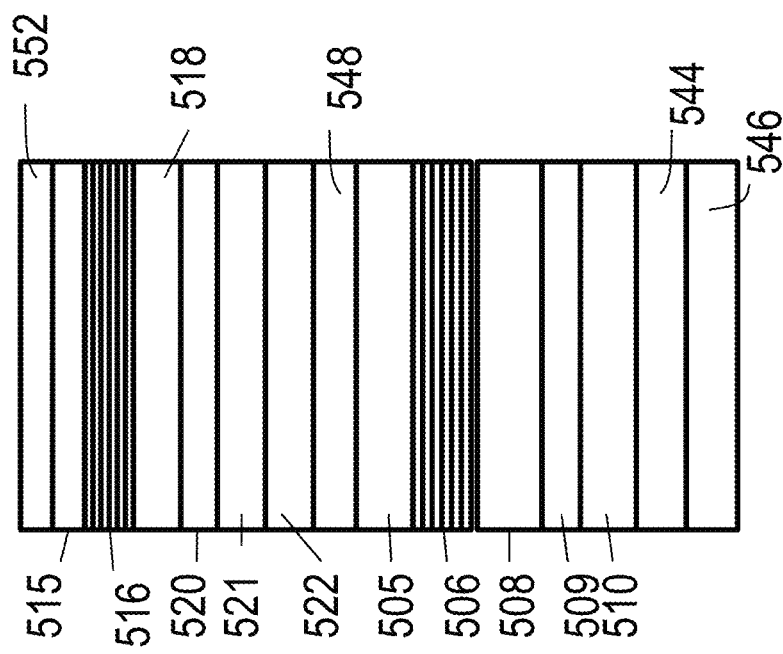

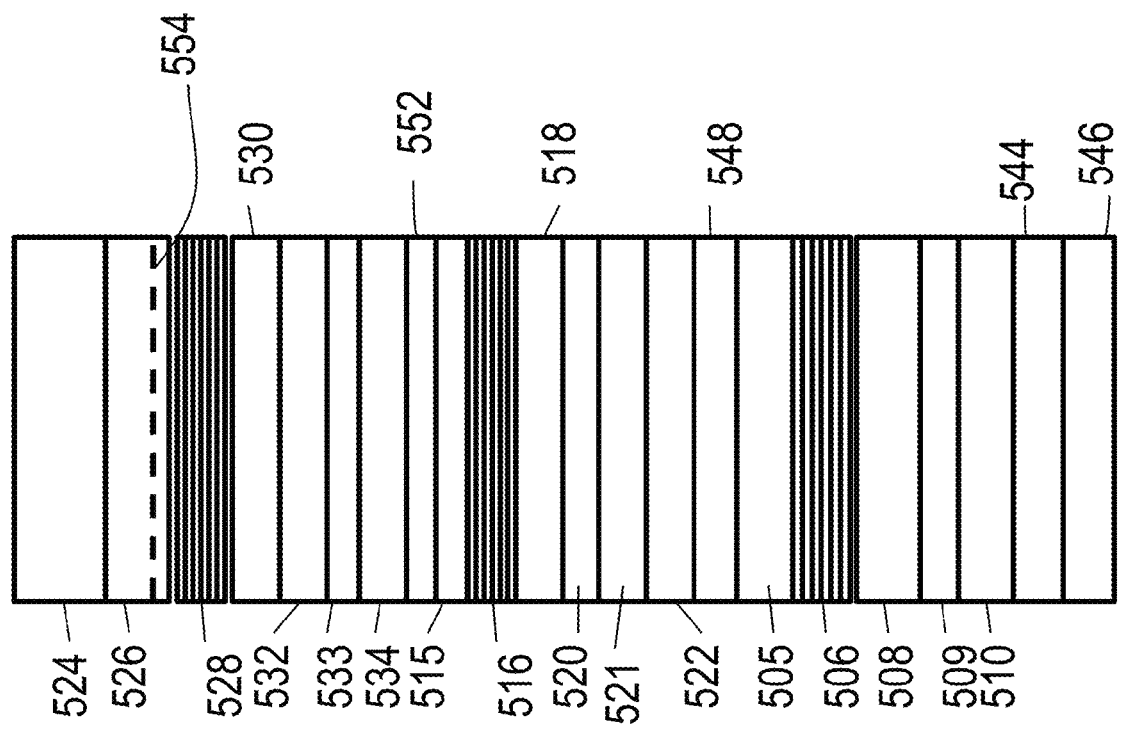

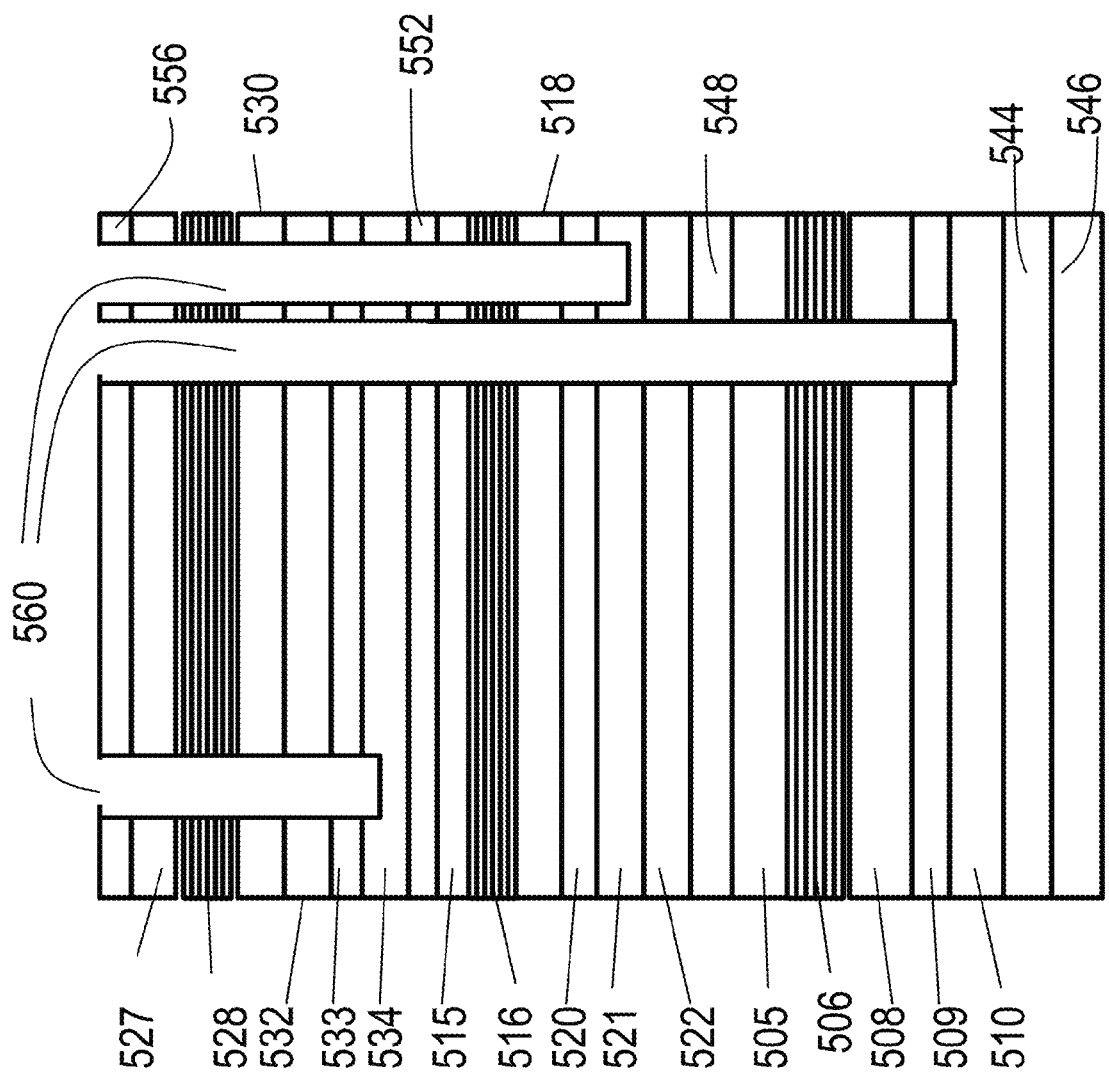

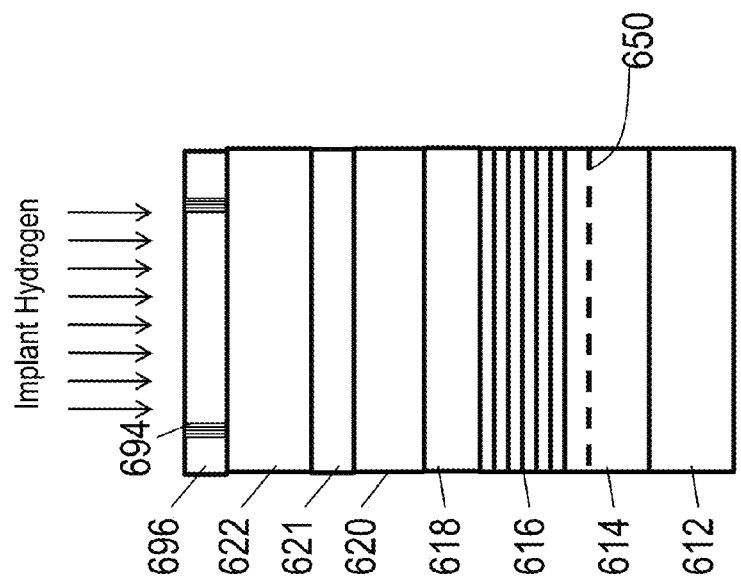

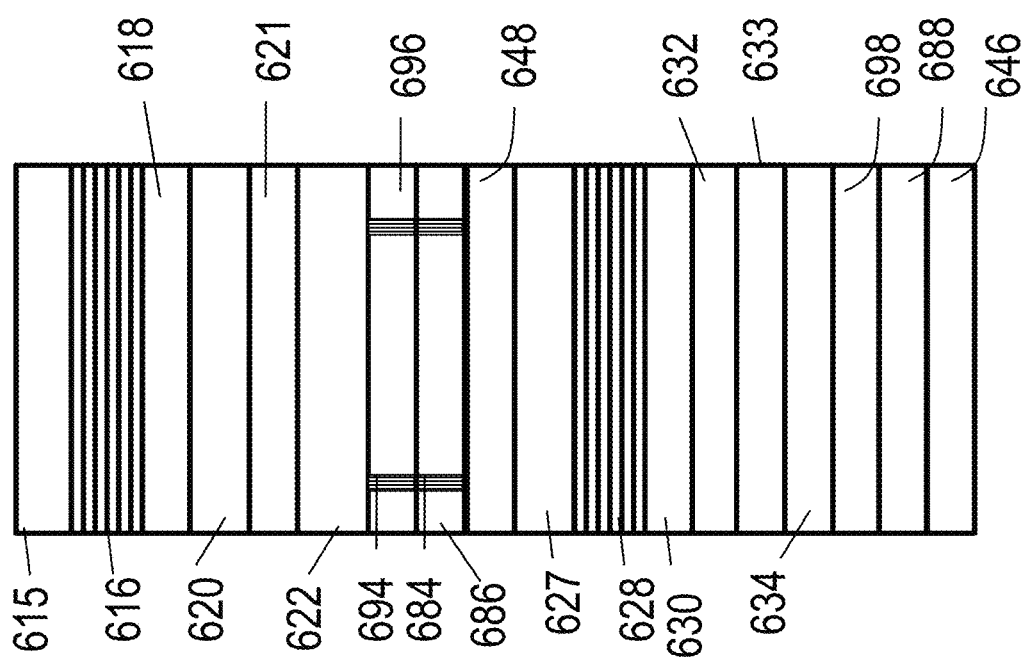

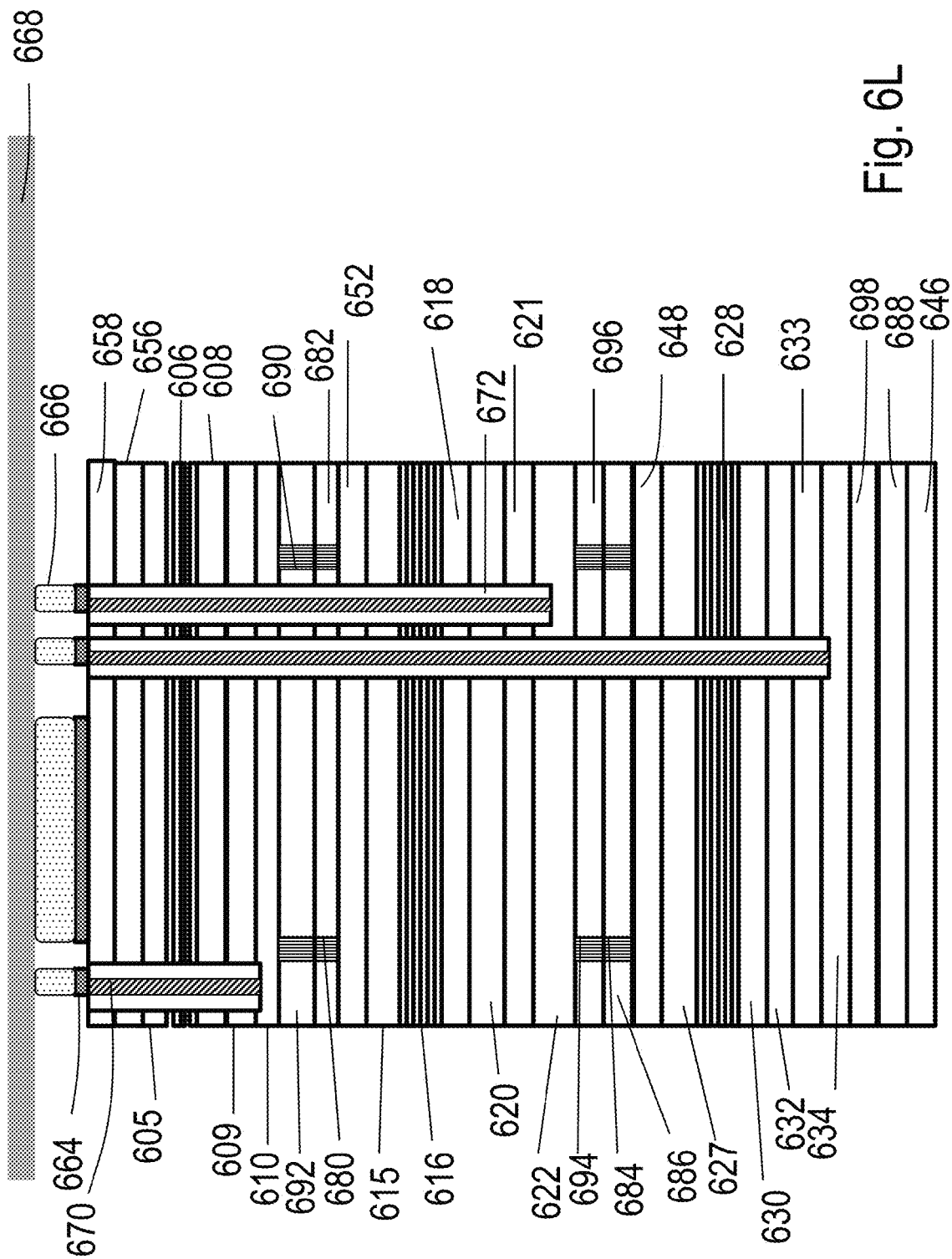

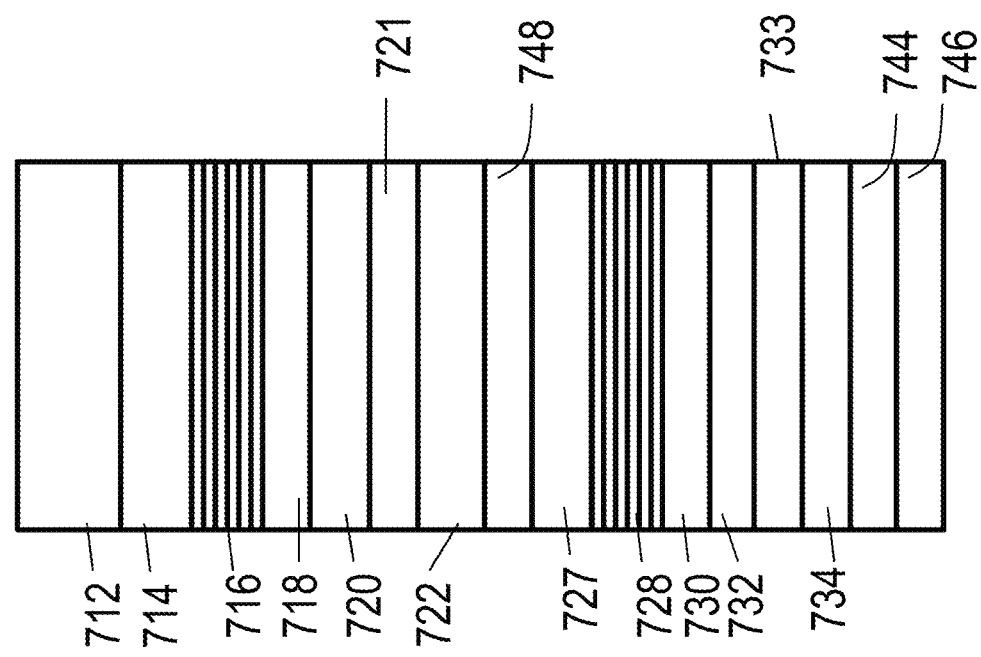

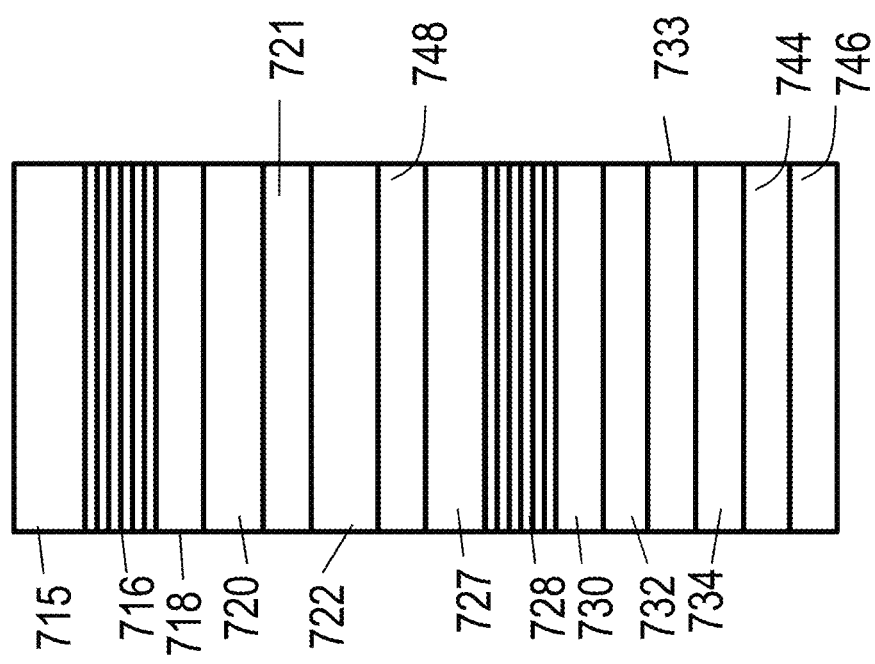

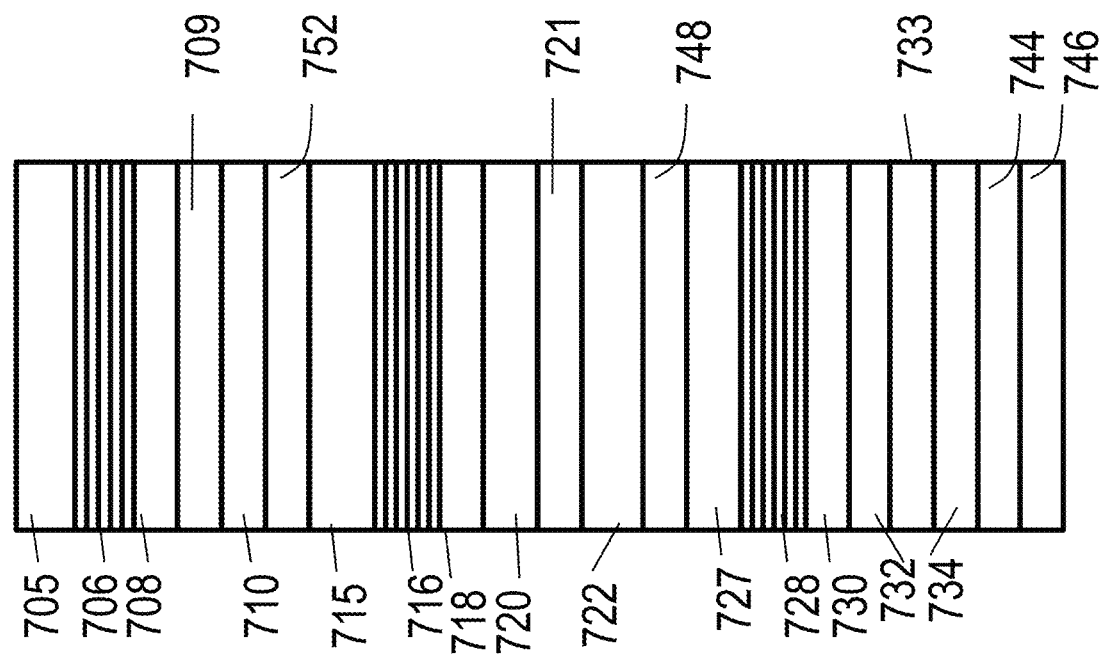

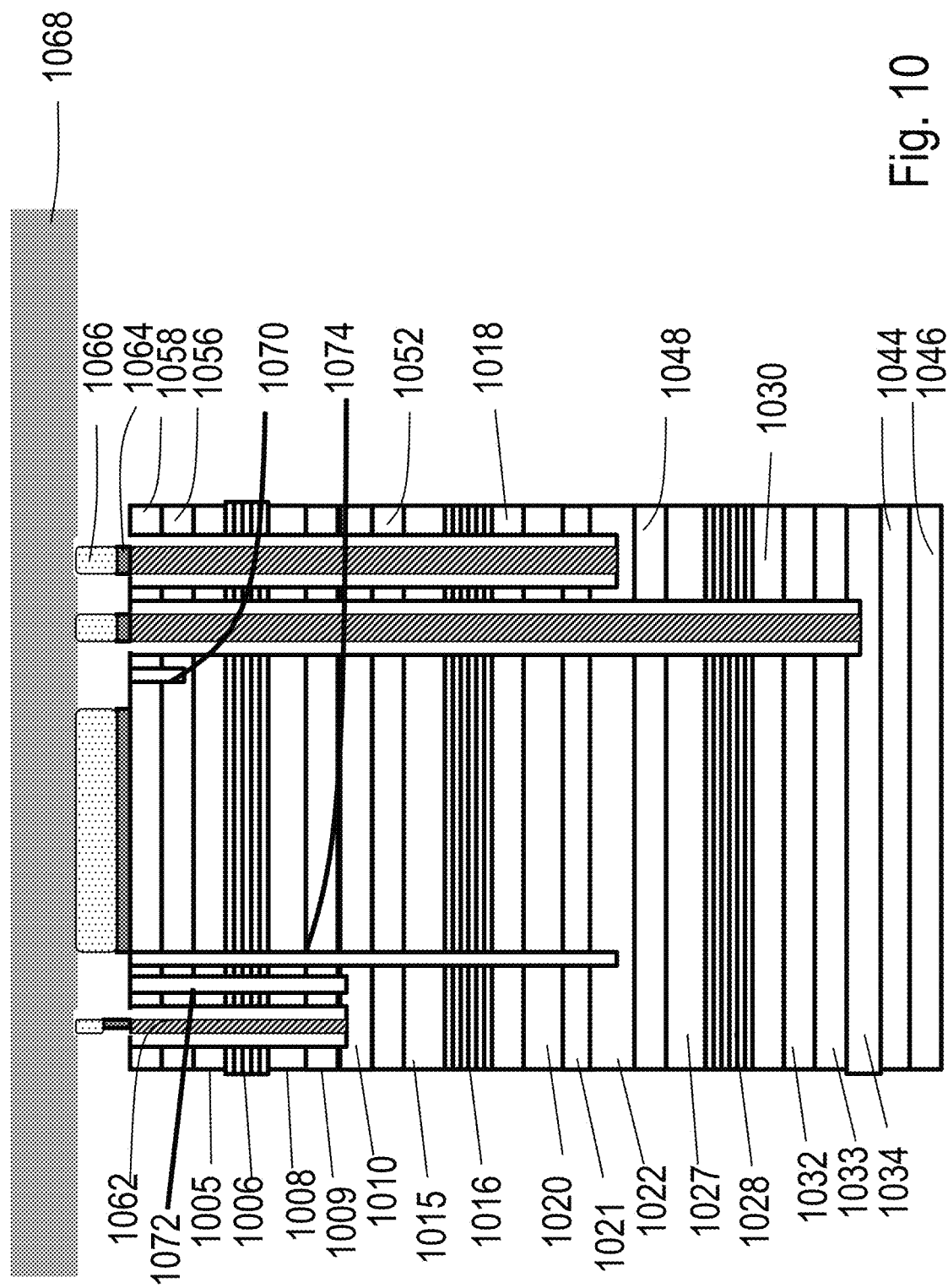

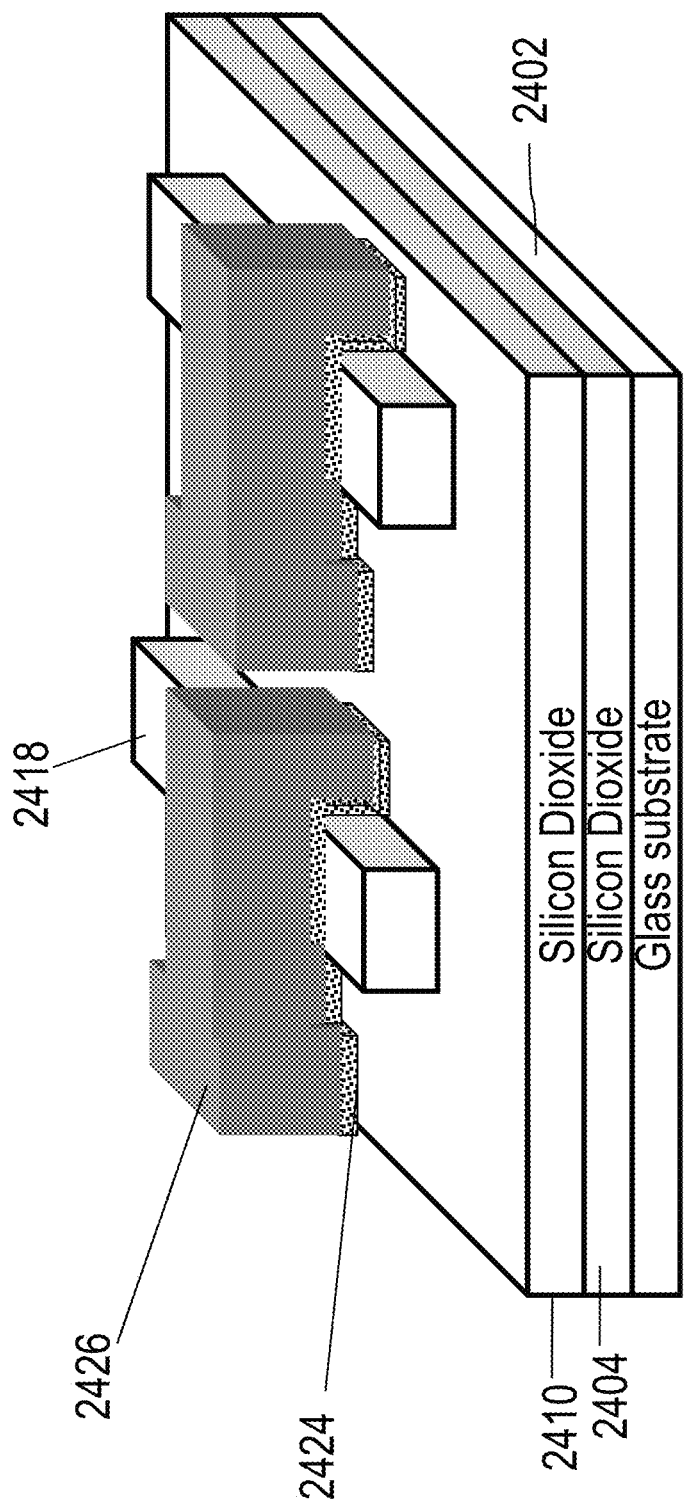

| | | | | | | | | |
|---|---|---|---|---|---|---|---|---|
| p++ Contact A — 2915 | p+ BSF A — 2912 | p Base A — 2910 | n Emitter A — 2908 | n+ Window A — 2906 | n++ Contact A — 2904 | Oxide A — 2902 | Oxide C — 2944 | Substrate C — 2942 |

Fig. 29D

| 2950 | 2915 | 2912 | 2910 | 2908 | 2906 | 2904 | 2902 | 2944 | 2942 |
|---|---|---|---|---|---|---|---|---|---|
| Oxide | p++ Contact A | p+ BSF A | p Base A | n Emitter A | n+ Window A | n++ Contact A | Oxide A | Oxide C | Substrate C |

Fig. 29E

| Layer | Ref |
|---|---|
| Oxide | 2954 |
| p++ Contact B | 2935 |
| p+ BSF B | 2932 |
| p Base B | 2930 |
| n Emitter B | 2928 |
| n+ Window B | 2926 |
| n++ Contact B | 2924 |
| Oxide B | 2922 |
| Oxide | 2950 |
| p++ Contact A | 2915 |
| p+ BSF A | 2912 |
| p Base A | 2910 |
| n Emitter A | 2908 |
| n+ Window A | 2906 |
| n++ Contact A | 2904 |
| Oxide A | 2902 |
| Oxide C | 2944 |
| Substrate C | 2942 |

Fig. 29H

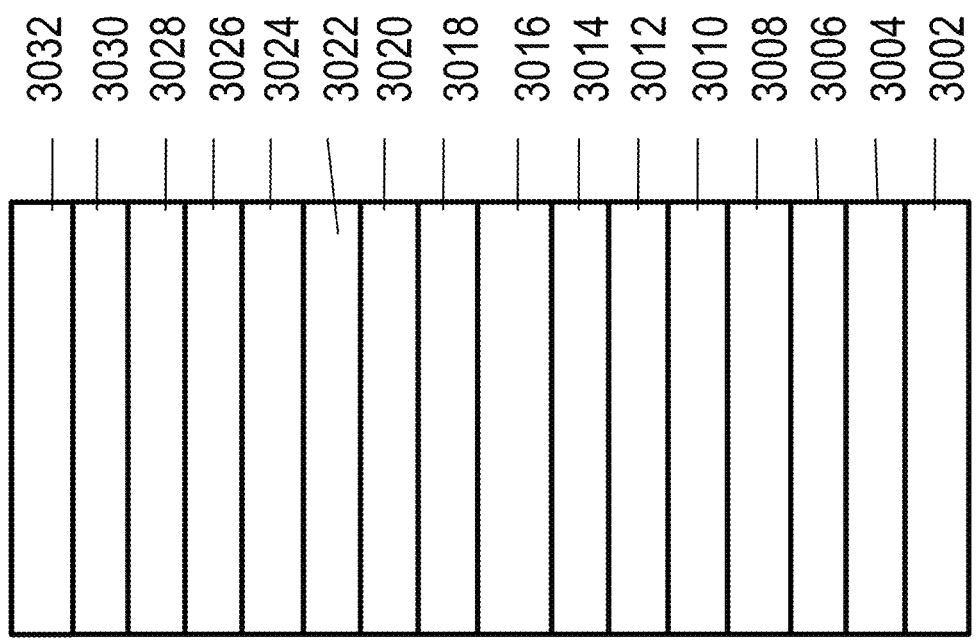

SEMICONDUCTOR AND OPTOELECTRONIC DEVICES

CROSS-REFERENCE OF RELATED APPLICATION

This application is a continuation application of co-pending U.S. patent application Ser. No. 12/904,103, filed on Oct. 13, 2010 U.S. Pat. No. 8,163,581, the contents of which are incorporated by reference.

BACKGROUND OF THE INVENTION (A) Field of the Invention

This invention describes applications of monolithic 3D integration to various disciplines, including but not limited to, for example, light-emitting diodes, displays, image-sensors and solar cells.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology", JSAP International, Number 4, July 2001 by T. Yonehara and K. Sakaguchi ("Yonehara").

Lift-off with a temporary substrate, also referred to as epitaxial lift-off This is described in "Epitaxial lift-off and its applications", 1993 Semicond. Sci. Technol. 8 1124 by P. Demeester, et al ("Demeester").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced", 19 May 2010, Nature News.

With novel applications of these methods and recognition of their individual strengths and weaknesses, one can significantly enhance today's light-emitting diode (LED), display, image-sensor and solar cell technologies.

Background on LEDs

Light emitting diodes (LEDs) are used in many applications, including automotive lighting, incandescent bulb replacements, and as backlights for displays. Red LEDs are typically made on Gallium Arsenide (GaAs) substrates, and include quantum wells constructed of various materials such as AlInGaP and GaInP. Blue and green LEDs are typically made on Sapphire or Silicon Carbide (SiC) or bulk Gallium Nitride (GaN) substrates, and include quantum wells constructed of various materials such as GaN and InGaN.

A white LED for lighting and display applications can be constructed by either using a blue LED coated with phosphor (called phosphor-coated LED or pcLED) or by combining light from red, blue, and green LEDs (called RGB LED). RGB LEDs are typically constructed by placing red, blue, and green LEDs side-by-side. While RGB LEDs are more energy-efficient than pcLEDs, they are less efficient in mixing red, blue and green colors to form white light. They also are much more costly than pcLEDs. To tackle issues with RGB LEDs, several proposals have been made.

One RGB LED proposal from Hong Kong University is described in "Design of vertically stacked polychromatic light emitting diodes", Optics Express, June 2009 by K. Hui, X. Wang, et al ("Hui"). It involves stacking red, blue, and green LEDs on top of each other after individually packaging each of these LEDs. While this solves light mixing problems, this RGB-LED is still much more costly than a pcLED solution since three LEDs for red, blue, and green color need to be packaged. A pcLED, on the other hand, requires just one LED to be packaged and coated with phosphor.

Another RGB LED proposal from Nichia Corporation is described in "Phosphor Free High-Luminous-Efficiency White Light-Emitting Diodes Composed of InGaN Multi-Quantum Well", Japanese Journal of Applied Physics, 2002 by M. Yamada, Y. Narukawa, et al. ("Yamada"). It involves constructing and stacking red, blue and green LEDs of GaN-based materials on a sapphire or SiC substrate. However, red LEDs are not efficient when constructed with GaN-based material systems, and that hampers usefulness of this implementation. It is not possible to deposit defect-free AlInGaP/InGaP for red LEDs on the same substrate as GaN based blue and green LEDs, due to a mismatch in thermal expansion co-efficient between the various material systems.

Yet another RGB-LED proposal is described in "Cascade Single chip phosphor-free while light emitting diodes", Applied Physics Letters, 2008 by X. Guo, G. Shen, et al. ("Guo"). It involves bonding GaAs based red LEDs with GaN based blue-green LEDs to produce white light. Unfortunately, this bonding process requires 600° C. temperatures, causing issues with mismatch of thermal expansion co-efficients and cracking Another publication on this topic is "A trichromatic phosphor-free white light-emitting diode by using adhesive bonding scheme", Proc. SPIE, Vol. 7635, 2009 by D. Chuai, X. Guo, et al. ("Chuai"). It involves bonding red LEDs with green-blue LED stacks. Bonding is done at the die level after dicing, which is more costly than a wafer-based approach.

U.S. patent application Ser. No. 12/130,824 describes various stacked RGB LED devices. It also briefly mentions a method for construction of a stacked LED where all layers of the stacked LED are transferred using lift-off with a temporary carrier and Indium Tin Oxide (ITO) to semiconductor bonding. This method has several issues for constructing a RGB LED stack. First, it is difficult to manufacture a lift-off with a temporary carrier of red LEDs for producing a RGB LED stack, especially for substrates larger than 2 inch. This is because red LEDs are typically constructed on non-transparent GaAs substrates, and lift-off with a temporary carrier is done by using an epitaxial lift-off process. Here, the thin film to be transferred typically sits atop a "release-layer" (eg. AlAs), this release layer is removed by etch procedures after the thin film is attached to a temporary substrate. Scaling this process to 4 inch wafers and bigger is difficult. Second, it is very difficult to perform the bonding of ITO to semiconductor materials of a LED layer at reasonable temperatures, as described in the patent application Ser. No. 12/130,824.

It is therefore clear that a better method for constructing RGB LEDs will be helpful. Since RGB LEDs are significantly more efficient than pcLEDs, they can be used as replacements of today's phosphor-based LEDs for many applications, provided a cheap and effective method of constructing RGB LEDs can be invented.

Background on Image-Sensors:

Image sensors are used in applications such as cameras. Red, blue, and green components of the incident light are sensed and stored in digital format. CMOS image sensors typically contain a photodetector and sensing circuitry. Almost all image sensors today have both the photodetector and sensing circuitry on the same chip. Since the area consumed by the sensing circuits is high, the photodetector cannot see the entire incident light, and image capture is not as efficient.

To tackle this problem, several researchers have proposed building the photodetectors and the sensing circuitry on separate chips and stacking them on top of each other. A publication that describes this method is "Megapixel CMOS image sensor fabricated in three-dimensional integrated circuit technology", Intl. Solid State Circuits Conference 2005 by Suntharalingam, V., Berger, R., et al. ("Suntharalingam"). These proposals use through-silicon via (TSV) technology where alignment is done in conjunction with bonding. However, pixel size is reaching the 1 µm range, and successfully processing TSVs in the 1 µm range or below is very difficult. This is due to alignment issues while bonding. For example, the International Technology Roadmap for Semiconductors (ITRS) suggests that the 2-4 um TSV pitch will be the industry standard until 2012. A 2-4 µm pitch TSV will be too big for a sub-1 µm pixel. Therefore, novel techniques of stacking photodetectors and sensing circuitry are required.

A possible solution to this problem is given in "Setting up 3D Sequential Integration for Back-Illuminated CMOS Image Sensors with Highly Miniaturized Pixels with Low Temperature Fully-depleted SOI Transistors," IEDM, p. 1-4 (2008) by P. Coudrain et al. ("Coudrain"). In the publication, transistors are monolithically integrated on top of photodetectors. Unfortunately, transistor process temperatures reach 600° C. or more. This is not ideal for transistors (that require a higher thermal budget) and photodetectors (that may prefer a lower thermal budget).

Background on Displays:

Liquid Crystal Displays (LCDs) can be classified into two types based on manufacturing technology utilized: (1) Large-size displays that are made of amorphous/polycrystalline silicon thin-film-transistors (TFTs), and (2) Microdisplays that utilize single-crystal silicon transistors. Microdisplays are typically used where very high resolution is needed, such as camera/camcorder view-finders, projectors and wearable computers.

Microdisplays are made in semiconductor fabs with 200 mm or 300 mm wafers. They are typically constructed with LCOS (Liquid-Crystal-on-Silicon) Technology and are reflective in nature. An exception to this trend of reflective microdisplays is technology from Kopin Corporation (U.S. Pat. No. 5,317,236, filed December 1991). This company utilizes transmittive displays with a lift-off layer transfer scheme. Transmittive displays may be generally preferred for various applications.

While lift-off layer transfer schemes are viable for transmittive displays, they are frequently not used for semiconductor manufacturing due to yield issues. Therefore, other layer transfer schemes will be helpful. However, it is not easy to utilize other layer transfer schemes for making transistors in microdisplays. For example, application of "smart-cut" layer transfer to attach monocrystalline silicon transistors to glass is described in "Integration of Single Crystal Si TFTs and Circuits on a Large Glass Substrate", IEDM 2009 by Y. Takafuji, Y. Fukushima, K. Tomiyasu, et al. ("Takafuji"). Unfortunately, hydrogen is implanted through the gate oxide of transferred transistors in the process, and this degrades performance. Process temperatures are as high as 600° C. in this paper, and this requires costly glass substrates. Several challenges therefore need to be overcome for efficient layer transfer, and require innovation.

Background on Solar Cells:

Solar cells can be constructed of several materials such as, for example, silicon and compound semiconductors. The highest efficiency solar cells are typically multi junction solar cells that are constructed of compound semiconductor materials. These multi junction solar cells are typically constructed on a germanium substrate, and semiconductors with various band-gaps are epitaxially grown atop this substrate to capture different portions of the solar spectrum.

There are a few issues with standard multi junction solar cells. Since multiple junctions are grown epitaxially above a single substrate (such as Germanium) at high temperature, materials used for different junctions are restricted to those that have lattice constants and thermal expansion co-efficients close to those of the substrate. Therefore, the choice of materials used to build junctions for multi-junction solar cells is limited. As a result, most multi junction solar cells commercially available today cannot capture the full solar spectrum. Efficiency of the solar cell can be improved if a large band of the solar spectrum is captured. Furthermore, multi junction solar cells today suffer from high cost of the substrate above which multiple junctions are epitaxially grown. Methods to build multi-junction solar cells that tackle both these issues will be helpful.

A method of making multi junction solar cells by mechanically bonding two solar cells, one with a Germanium junction and another with a compound semiconductor junction is described in "Towards highly efficient 4-terminal mechanical photovoltaic stacks", III-Vs Review, Volume 19, Issue 7, September-October 2006 by Giovanni Flamand, Jef Poortmans ("Flamand"). In this work, the authors make the compound semiconductor junctions on a Germanium substrate epitaxially. They then etch away the entire Germanium substrate after bonding to the other substrate with the Germanium junction. The process uses two Germanium substrates, and is therefore expensive.

Techniques to create multi junction solar cells with layer transfer have been described in "Wafer bonding and layer transfer processes for 4-junction high efficiency solar cells," *Photovoltaic Specialists Conference*, 2002. *Conference Record of the Twenty-Ninth IEEE*, vol., no., pp. 1039-1042, 19-24 May 2002 by Zahler, J. M.; Fontcuberta i Morral, A.; Chang-Geun Ahn; Atwater, H. A.; Wanlass, M. W.; Chu, C. and Iles, P. A. An anneal is used for ion-cut purposes, and this anneal is typically done at temperatures higher than 350-400° C. (if high bond strength is desired). When that happens, cracking and defects can be produced due to mismatch of co-efficients of thermal expansion between various layers in the stack. Furthermore, semiconductor layers are bonded together, and the quality of this bond not as good as oxide-to-oxide bonding, especially for lower process temperatures.

SUMMARY

Techniques to utilize layer transfer schemes such as ion-cut to form novel light emitting diodes (LEDs), CMOS image sensors, displays, microdisplays and solar cells are discussed.

In one aspect, an integrated device, the integrated device including a first crystalline layer covered by an oxide layer, a second crystalline layer overlying the oxide layer, wherein the first and second crystalline layers are image sensor layers, and the device includes a third crystalline layer, wherein the third crystalline layer includes single crystal transistors.

In another aspect, an integrated image sensor, the integrated image sensor including a first mono-crystal layer including a plurality of image sensor pixels and alignment marks, and an oxide layer overlaying and on top of the first mono-crystal layer, and a second mono-crystal layer including a plurality of second image sensor pixels aligned to the alignment marks, and the second mono-crystal layer overlaying the oxide layer, and a third mono-crystal layer, wherein the third mono-crystal layer includes a plurality of single crystal transistors aligned to the alignment marks.

In another aspect, an integrated device, the integrated device including a first mono-crystal layer including a plurality of single crystal transistors and alignment marks, and an overlaying oxide on top of the first mono-crystal layer, and a second mono-crystal layer overlaying the oxide, and wherein the second mono-crystal layer includes a plurality of image sensor pixels aligned to the alignment marks.

BRIEF DESCRIPTION OF THE DRAWINGS

Various embodiments of the present invention will be understood and appreciated more fully from the following detailed description, taken in conjunction with the drawings in which:

FIGS. 6A-L illustrate an embodiment of this invention, where stacked RGB LEDs are formed with ion-cut technology, flip-chip packaging and aligned bonding;

FIGS. 7A-L illustrate an embodiment of this invention, where stacked RGB LEDs are formed with laser lift-off, substrate etch, flip-chip packaging and conductive oxide bonding;

FIG. 10 illustrates an embodiment of this invention, where stacked RGB LEDs are formed with control and driver circuits as well as image sensors for the LED built on the silicon sub-mount;

FIGS. 24A-F illustrate an embodiment of this invention, where a display is constructed using sub-400° C. processed single crystal junctionless transistors on a glass substrate;

FIGS. 29A-H illustrate an embodiment of this invention, where multijunction solar cells are constructed using sub-250° C. bond and cleave processes; and FIGS. 30A-D illustrate an embodiment of this invention, where a full-spectrum multi-junction solar cells is constructed using sub-250° C. bond and cleave processes.

DETAILED DESCRIPTION

Figure 1A:
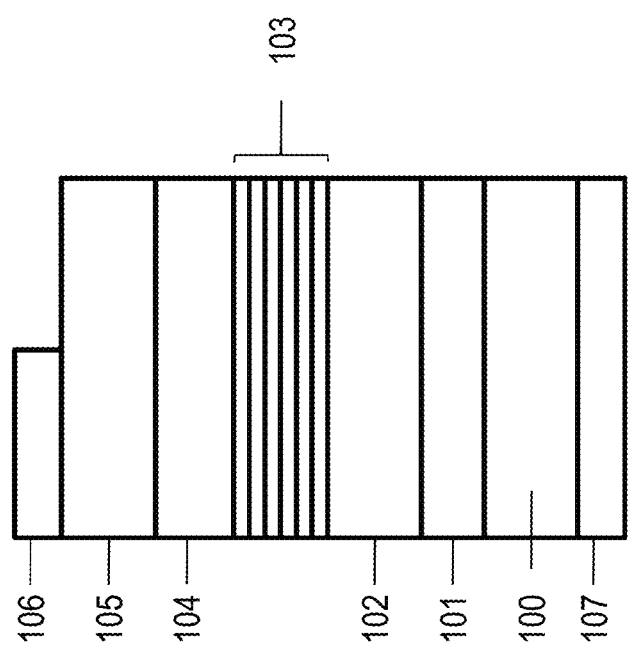
FIGS. 1A-B illustrate red, green and blue type LEDs (prior art)

Embodiments of the present invention are now described with reference to FIGS. 1-30, it being appreciated that the figures illustrate the subject matter not to scale or to measure.
NuLED Technology:

FIG. 1A illustrates a cross-section of prior art red LEDs. Red LEDs are typically constructed on a Gallium Arsenide substrate 100. Alternatively, Gallium Phosphide or some other material can be used for the substrate. Since Gallium Arsenide 100 is opaque, a Bragg Reflector 101 is added to ensure light moves in the upward direction. Red light is produced by a p-n junction with multiple quantum wells (MQW). A p-type confinement layer 104, a n-type confinement layer 102 and a multiple quantum well 103 form this part of the device. A current spreading region 105 ensures current flows throughout the whole device and not just close to the contacts. Indium Tin Oxide (ITO) could be used for the current spreading region 105. A top contact 106 and a bottom contact 107 are used for making connections to the LED. It will be obvious to one skilled in the art based on the present disclosure that many configurations and material combinations for making red LEDs are possible. This invention is not limited to one particular configuration or set of materials.

Figure 1B:
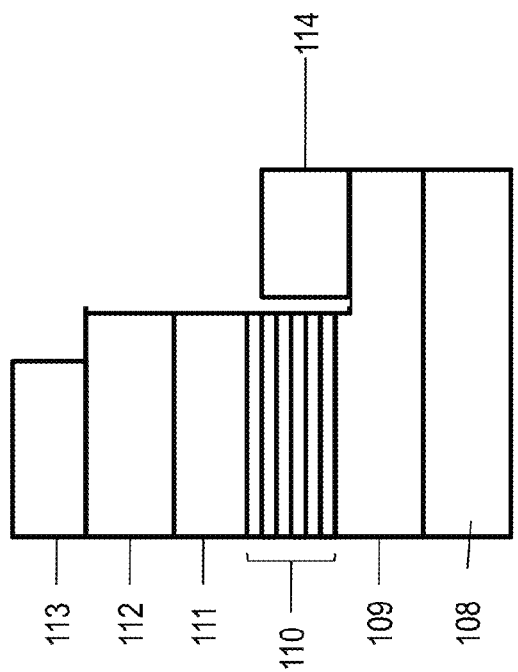
Figure 2:
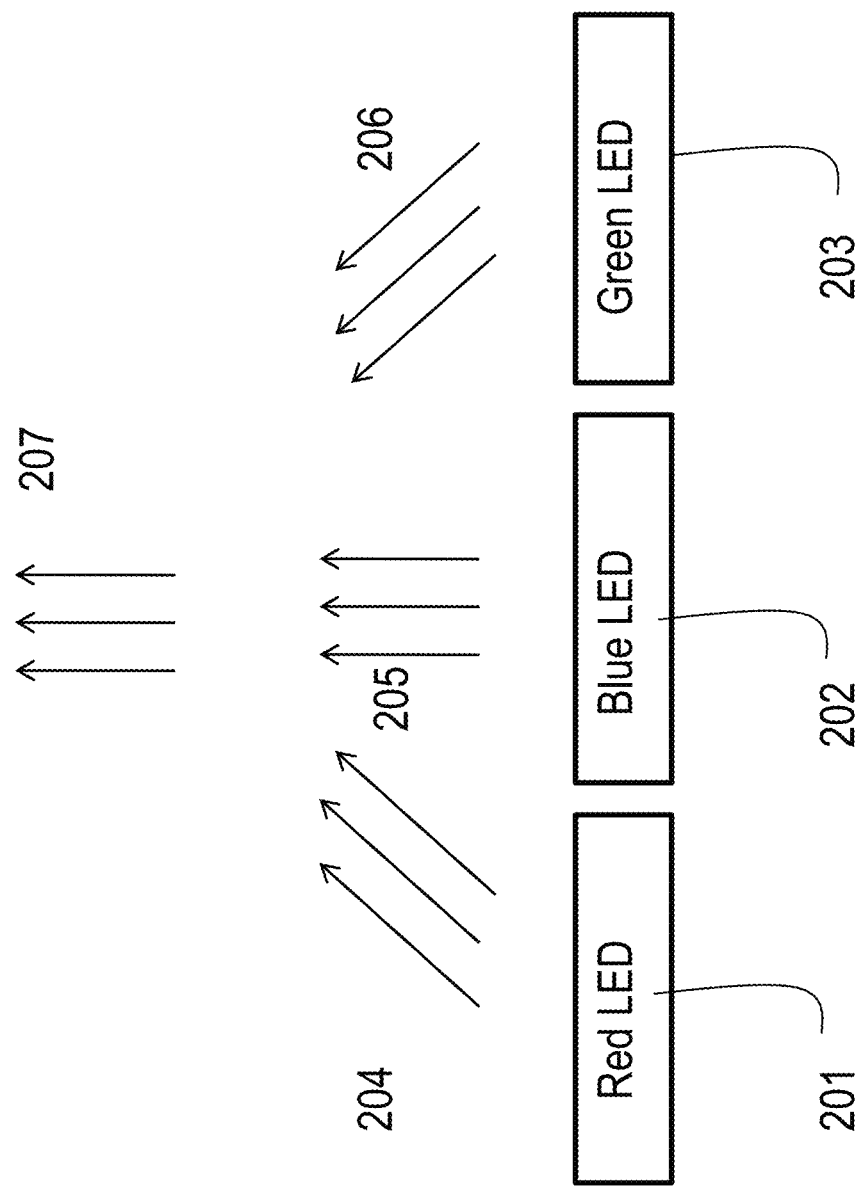
FIG. 2 illustrates a conventional RGB LED where red, green, and blue LEDs are placed side-by-side (prior art)
Figure 3:
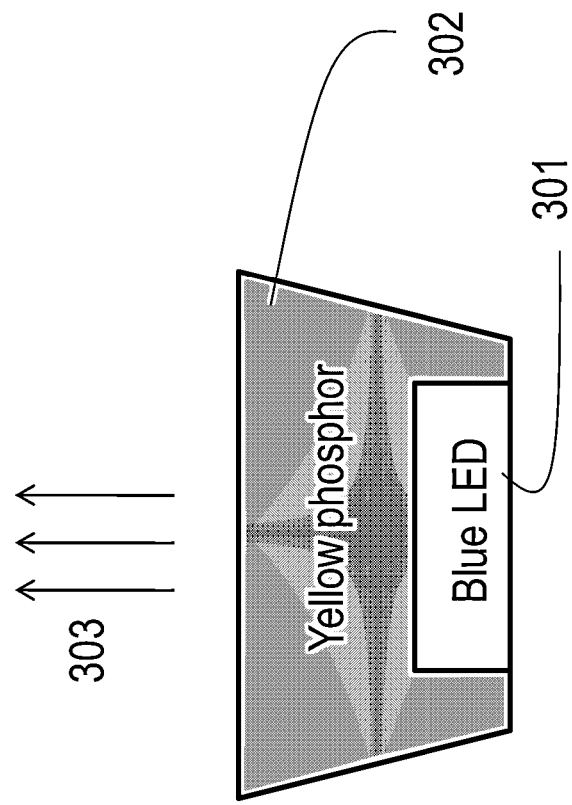
FIG. 3 illustrates a prior-art phosphor-based LED (pcLED)

FIG. 1B also illustrates green and blue LED cross-sections. These are typically constructed on a sapphire, SiC or bulk-GaN substrate, indicated by 108. Light is produced by a p-n junction with multiple quantum wells made of $In_xGa_{1-x}N$/GaN. A p-type confinement layer 111, a n-type confinement layer 109 and a multiple quantum well 110 form this part of the device. The value of subscript x in $In_xGa_{1-x}N$ determines whether blue light or green light is produced. For example, blue light typically corresponds to x ranging from 10% to 20% while green light typically corresponds to x ranging from 20% to 30%. A current spreader 112 is typically used as well. ITO could be a material used for the current spreader 112. An alternative material for current spreading could be ZnO. A top contact 113 and a bottom contact 114 are used for making connections to the LED. It will be obvious to one skilled in the art based on the present disclosure that many configurations and material combinations for making blue and green LEDs are possible. This invention is not limited to one particular configuration or set of materials.

White LEDs for various applications can be constructed in two ways. Method 1 is described in FIG. 2 which shows Red LED 201, blue LED 202, and green LED 203 that are constructed separately and placed side-by-side. Red light 204, blue light 205 and green light 206 are mixed to form white light 207. While these "RGB LEDs" are efficient, they suffer from cost issues and have problems related to light mixing. Method 2 is described in FIG. 3 which shows a blue LED 301 constructed and coated with a phosphor layer 302. The yellow phosphor layer converts blue light into white light 303. These "Phosphor-based LEDs" or "pcLEDs" are cheaper than RGB LEDs but are typically not as efficient.

Figure 4A:
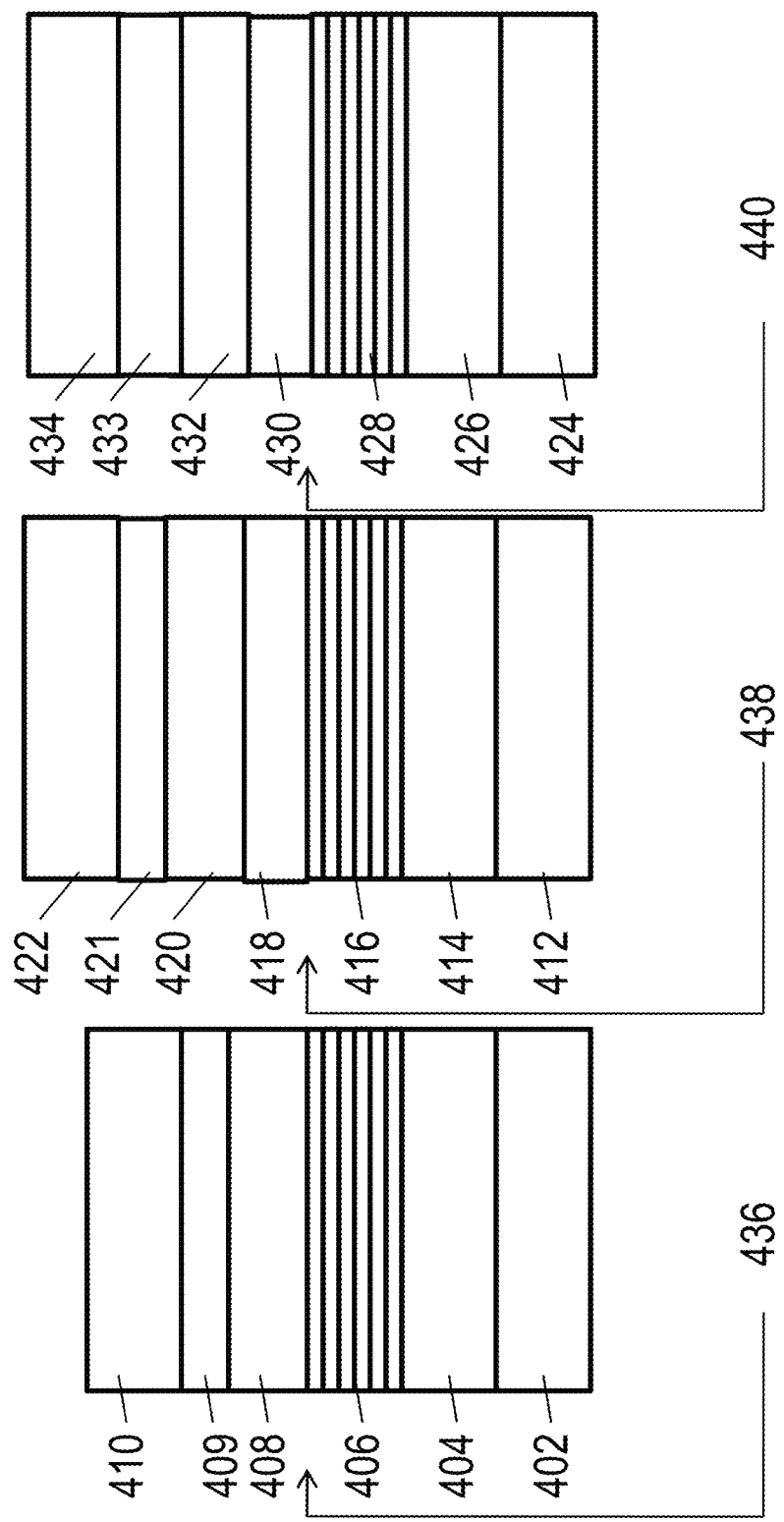
FIGS. 4A-S illustrate an embodiment of this invention, where RGB LEDs are stacked with ion-cut technology, flip-chip packaging and conductive oxide bonding.

FIG. 4A-S illustrate an embodiment of this invention where Red, Blue, and Green LEDs are stacked on top of each other with smart layer transfer techniques. A smart layer transfer may be defined as one or more of the following processes:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology," JSAP International, Number 4, July 2001 by T. Yonehara and K. Sakaguchi ("Yonehara").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced," 19 May 2010, Nature News.

This process of constructing RGB LEDs could include several steps that occur in a sequence from Step (A) to Step (S). Many of them share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 4A. A red LED wafer 436 is constructed on a GaAs substrate 402 and includes a N-type confinement layer 404, a multiple quantum well (MQW) 406, a P-type confinement layer 408, an optional reflector 409 and an ITO current spreader 410. Examples of materials used to construct these layers, include, but are not limited to, doped AlInGaP for the N-type confinement layer 404 and P-type confinement layer 408, the multiple quantum well layer 406 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 438 is constructed on a sapphire or SiC or bulk-GaN substrate 412 and includes a N-type confinement layer 414, a multiple quantum well (MQW) 416, a buffer layer 418, a P-type confinement layer 420, an optional reflector 421 and an ITO current spreader 422. Yet another wafer is constructed with a blue LED. The blue LED wafer 440 is constructed on a sapphire or SiC or bulk-GaN substrate 424 and includes a N-type confinement layer 426, a multiple quantum well (MQW) 428, a buffer layer 430, a P-type confinement layer 432, an optional reflector 433 and an ITO current spreader 434. Examples of materials used to construct these blue and green LED layers, include, but are not limited to, doped GaN for the N-type and P-type confinement layers 414, 420, 426 and 432, AlGaN for the buffer layers 430 and 418 and InGaN/GaN for the multiple quantum wells 416 and 428. The optional reflectors 421 and 433 could be distributed Bragg Reflectors or some other type of reflectors. Various other material types and configurations could be used for constructing blue and green LEDs for this process.

Figure 4B:
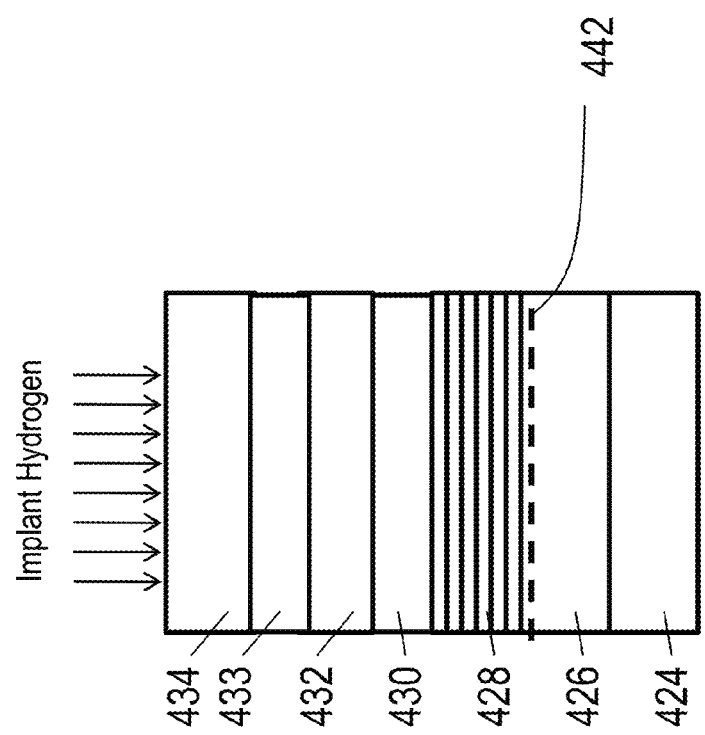

Step (B) is illustrated in FIG. 4B. The blue LED wafer 440 from FIG. 4A is used for this step. Various elements in FIG. 4B such as, for example, 424, 426, 428, 430, 432, 433, and 434 have been previously described. Hydrogen is implanted into the wafer at a certain depth indicated by dotted lines 442. Alternatively, helium could be used for this step.

Figure 4C:
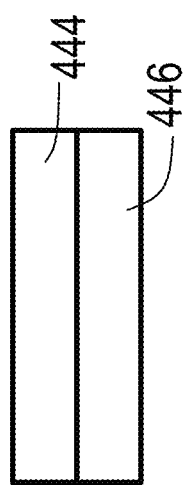

Step (C) is illustrated in FIG. 4C. A glass substrate 446 is taken and an ITO layer 444 is deposited atop it.

Figure 4D:
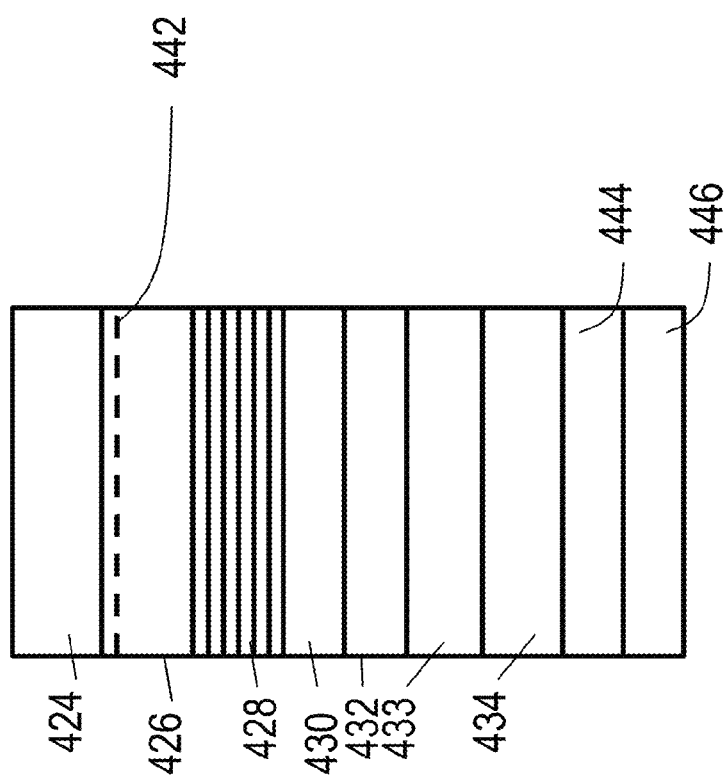

Step (D) is illustrated in FIG. 4D. The wafer shown in FIG. 4B is flipped and bonded atop the wafer shown in FIG. 4C using ITO-ITO bonding. Various elements in FIG. 4D such as 424, 426, 428, 430, 432, 433, 434, 442, 446, and 444 have been previously described. The ITO layer 444 is essentially bonded to the ITO layer 434 using an oxide-to-oxide bonding process.

Figure 4E:
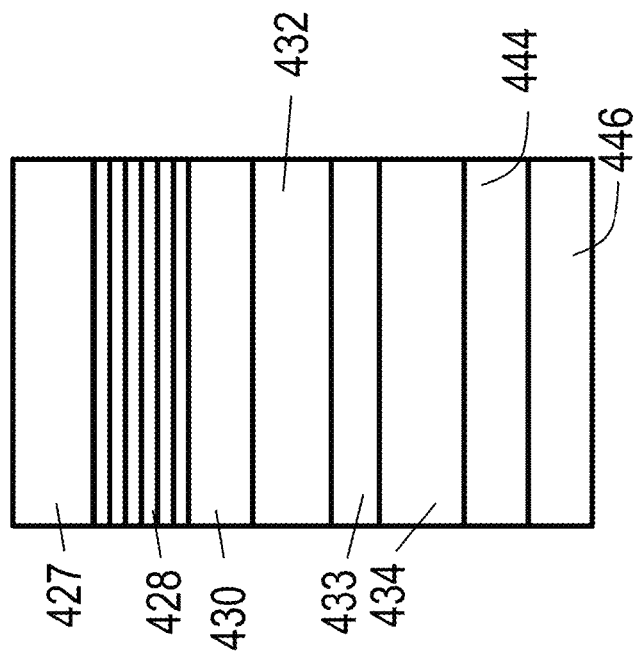

Step (E) is illustrated in FIG. 4E. Various elements in FIG. 4E such as 424, 426, 428, 430, 432, 433, 434, 442, 446, and 444 have been previously described. An ion-cut process is conducted to cleave the structure shown in FIG. 4D at the hydrogen implant plane 442. This ion-cut process may use a mechanical cleave. An anneal process could be utilized for the cleave as well. After the cleave, a chemical mechanical polish (CMP) process is conducted to planarize the surface. The N-type confinement layer present after this cleave and CMP process is indicated as 427.

Figure 4F:
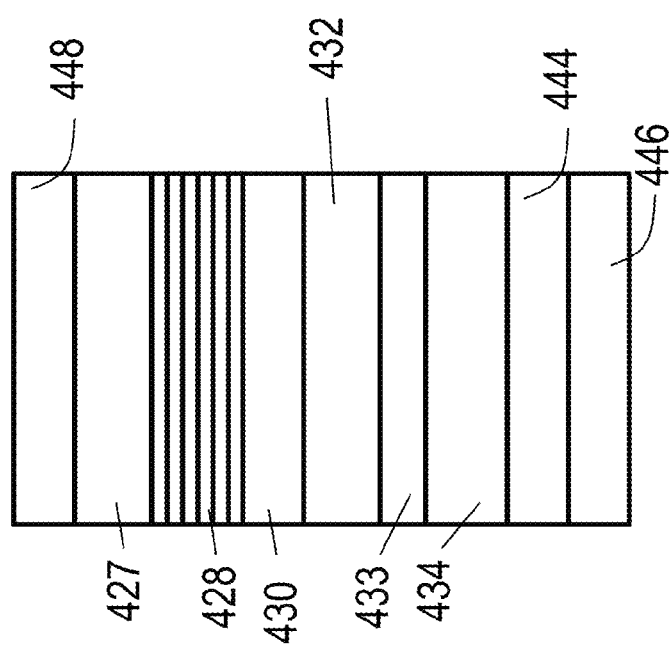

Step (F) is illustrated in FIG. 4F. Various elements in FIG. 4F such as 446, 444, 434, 433, 432, 430, 428, and 427 have been previously described. An ITO layer 448 is deposited atop the N-type confinement layer 427.

Figure 4G:
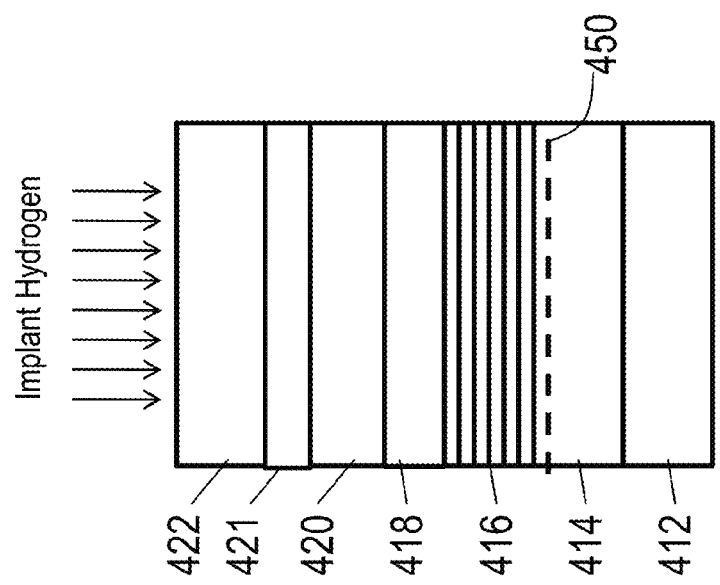

Step (G) is illustrated in FIG. 4G. The green LED wafer 438 shown in Step (A) is used for this step. Various elements in FIG. 4G such as 412, 414, 416, 418, 420, 421, and 422 have been described previously. Hydrogen is implanted into the wafer at a certain depth indicated by dotted lines 450. Alternatively, helium could be used for this step.

Figure 4H:
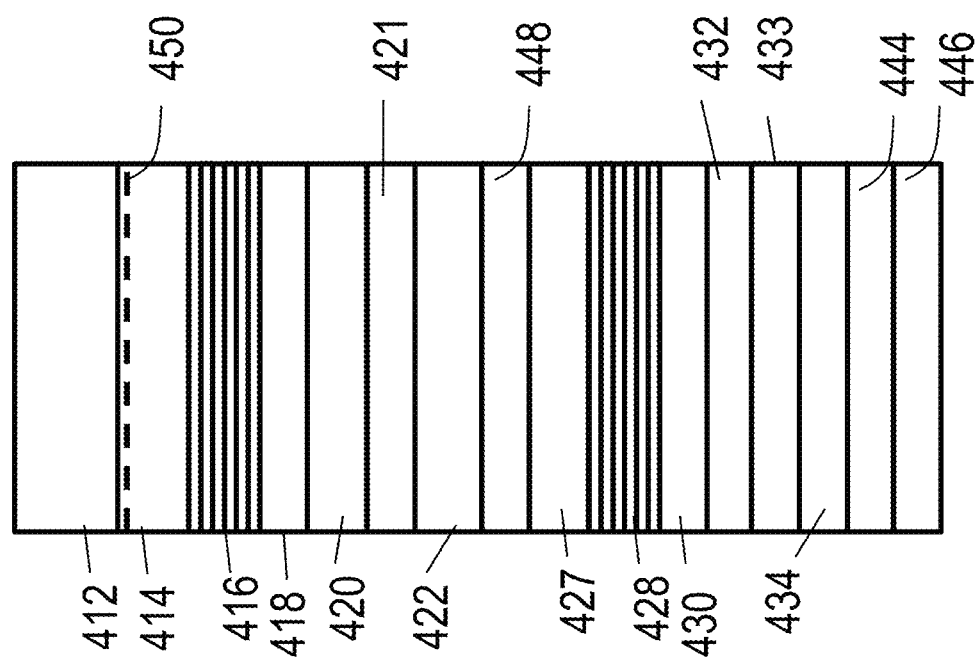

Step (H) is illustrated in FIG. 4H. The structure shown in FIG. 4G is flipped and bonded atop the structure shown in FIG. 4F using ITO-ITO bonding. Various elements in FIG. 4H such as 446, 444, 434, 433, 432, 430, 428, 427, 448, 412, 414, 416, 418, 420, 421, 422, and 450 have been described previously.

Step (I) is illustrated in FIG. 4I. The structure shown in FIG. 4H is cleaved at the hydrogen plane indicated by 450. This cleave process may be preferably done with a mechanical force. Alternatively, an anneal could be used. A CMP process is conducted to planarize the surface. Various elements in FIG. 4I such as 446, 444, 434, 433, 432, 430, 428, 427, 448, 416, 418, 420, 421, and 422 have been described previously. The N-type confinement layer present after this cleave and CMP process is indicated as 415.

Step (J) is illustrated in FIG. 4J. An ITO layer 452 is deposited atop the structure shown in FIG. 4I. Various elements in FIG. 4J such as 446, 444, 434, 433, 432, 430, 428, 427, 448, 416, 418, 420, 421, 415, and 422 have been described previously.

Step (K) is illustrated in FIG. 4K. The red LED wafer 436 shown in Step (A) is used for this step. Various elements in FIG. 4K such as 402, 404, 406, 408, 409, and 410 have been described previously. Hydrogen is implanted into the wafer at a certain depth indicated by dotted lines 454. Alternatively, helium could be used for this step.

Step (L) is illustrated in FIG. 4L. The structure shown in FIG. 4K is flipped and bonded atop the structure shown in FIG. 4J using ITO-ITO bonding. Various elements in FIG. 4L such as 446, 444, 434, 433, 432, 430, 428, 427, 448, 416, 418, 420, 421, 415, 422, 452, 402, 404, 406, 408, 409, 410, and 454 have been described previously.

Step (M) is illustrated in FIG. 4M. The structure shown in FIG. 4L is cleaved at the hydrogen plane 454. A mechanical force could be used for this cleave. Alternatively, an anneal could be used. A CMP process is then conducted to planarize the surface. The N-type confinement layer present after this process is indicated as 405. Various elements in FIG. 4M such as 446, 444, 434, 433, 432, 430, 428, 427, 448, 416, 418, 420, 421, 415, 422, 452, 406, 408, 409, and 410 have been described previously.

Step (N) is illustrated in FIG. 4N. An ITO layer 456 is deposited atop the structure shown in FIG. 4M. Various elements in FIG. 4M such as 446, 444, 434, 433, 432, 430, 428, 427, 448, 416, 418, 420, 421, 415, 422, 452, 406, 408, 409, 410, and 405 have been described previously.

Step (O) is illustrated in FIG. 4O. A reflecting material layer 458, constructed for example with Aluminum or Silver, is deposited atop the structure shown in FIG. 4N. Various elements in FIG. 4O such as 446, 444, 434, 433, 432, 430, 428, 427, 448, 416, 418, 420, 421, 415, 422, 452, 406, 408, 409, 410, 456, and 405 have been described previously.

Figure 4P:
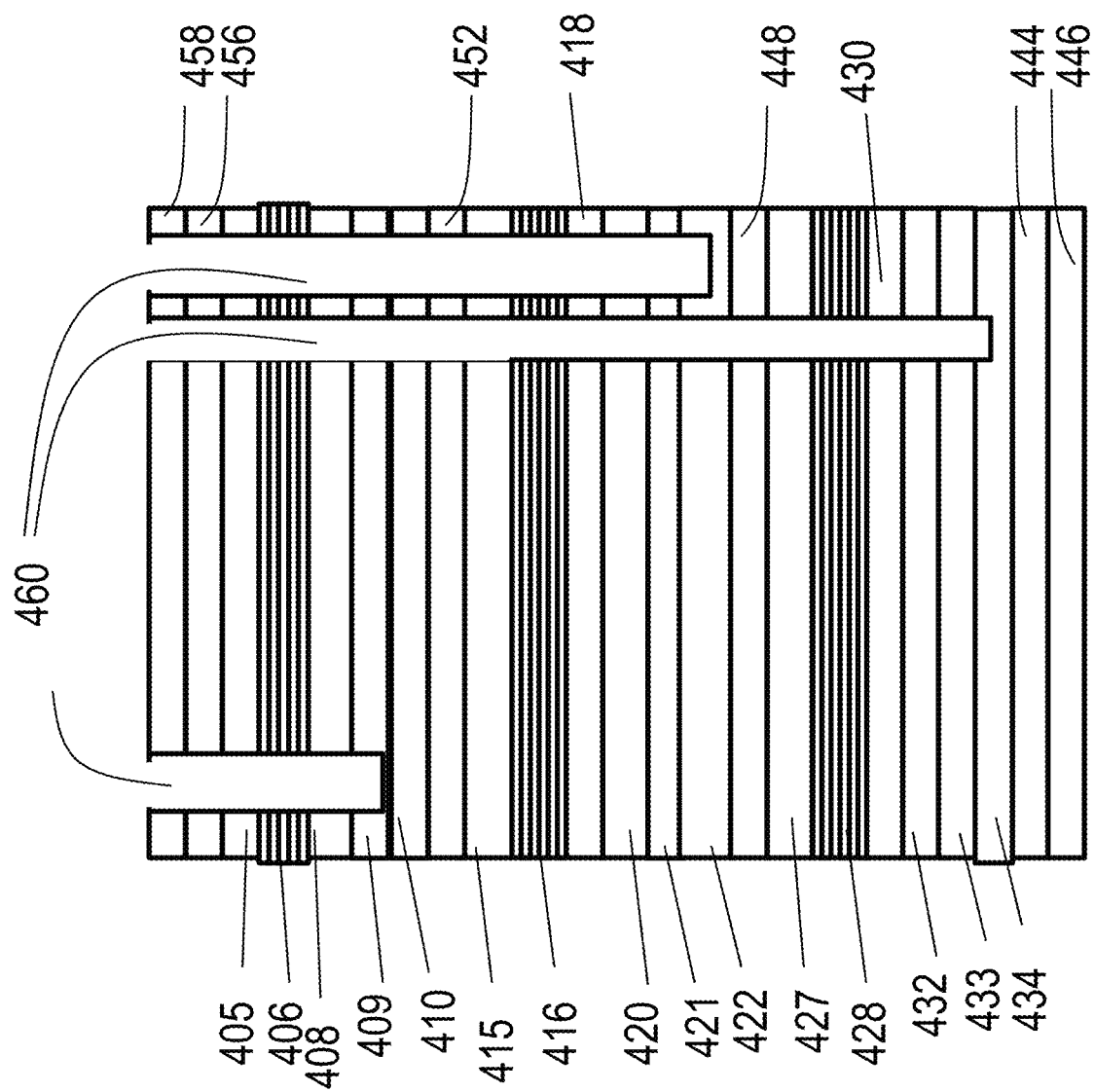

Step (P) is illustrated in FIG. 4P. The process of making contacts to various layers and packaging begins with this step. A contact and bonding process similar to the one used in "High-power AlGaInN flip-chip light-emitting diodes," Applied Physics Letters, vol. 78, no. 22, pp. 3379-3381, May 2001, by Wierer, J. J.; Steigerwald, D. A.; Krames, M. R.; OShea, J. J.; Ludowise, M. J.; Christenson, G.; Shen, Y.-C.; Lowery, C.; Martin, P. S.; Subramanya, S.; Gotz, W.; Gardner, N. F.; Kern, R. S.; Stockman, S. A. is used. Vias 460 are etched to different layers of the LED stack. Various elements in FIG. 4P such as 446, 444, 434, 433, 432, 430, 428, 427, 448, 416, 418, 420, 421, 415, 422, 452, 406, 408, 409, 410, 456, 405, and 458 have been described previously. After the via holes 460 are etched, they may optionally be filled with an oxide layer and polished with CMP. This fill with oxide may be optional, and the preferred process may be to leave the via holes as such without fill. Note that the term contact holes could be used instead of the term via holes. Similarly, the term contacts could be used instead of the term vias.

Figure 4Q:
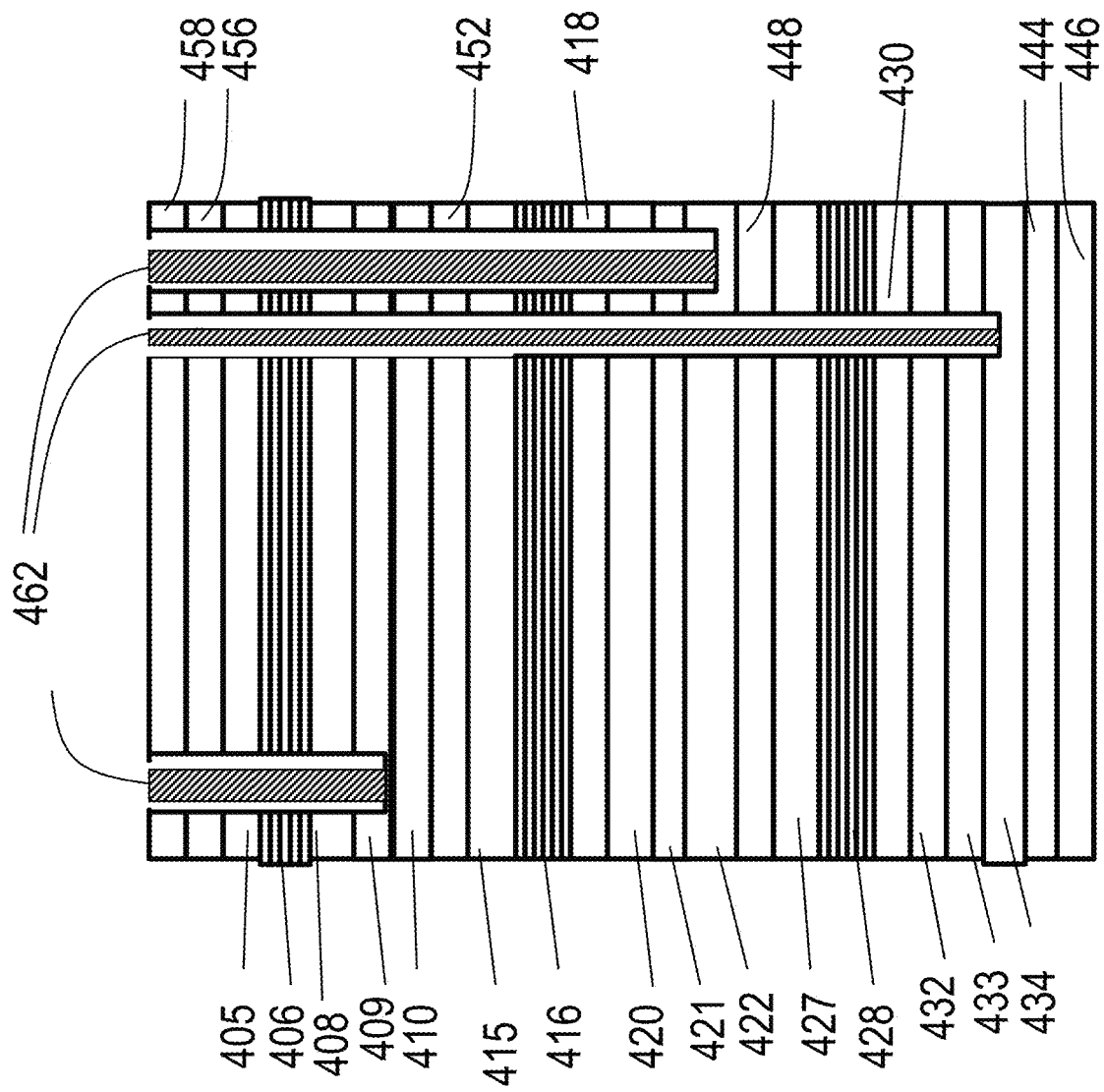

Step (Q) is illustrated in FIG. 4Q. Aluminum is deposited to fill via holes 460 from FIG. 4P. Following this deposition, a lithography and etch process is utilized to define the aluminum metal to form vias 462. The vias 462 are smaller in diameter than the via holes 460 shown in FIG. 4P. Various elements in FIG. 4Q such as 446, 444, 434, 433, 432, 430, 428, 427, 448, 416, 418, 420, 421, 415, 422, 452, 406, 408, 409, 410, 456, 405, 460, and 458 have been described previously.

Figure 4R:
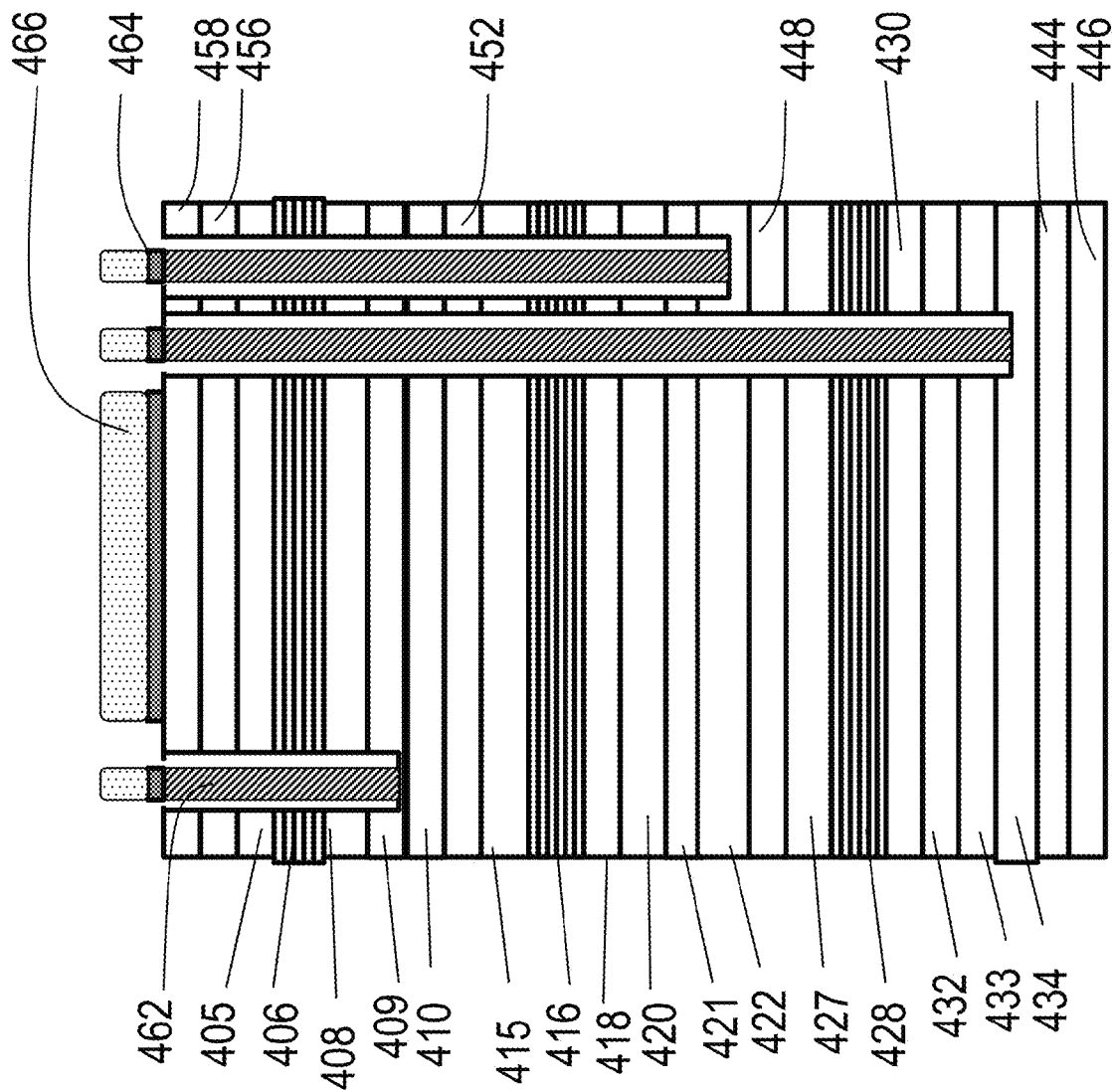

Step (R) is illustrated in FIG. 4R. A nickel layer 464 and a solder layer 466 are formed using standard procedures. Various elements in FIG. 4R such as 446, 444, 434, 433, 432, 430, 428, 427, 448, 416, 418, 420, 421, 415, 422, 452, 406, 408, 409, 410, 456, 405, 460, 462, and 458 have been described previously.

Step (S) is illustrated in FIG. 4S. The solder layer 466 is then bonded to pads on a silicon sub-mount 468. Various elements in FIG. 4S such as 446, 444, 434, 433, 432, 430, 428, 427,

448, 416, 418, 420, 421, 415, 422, 452, 406, 408, 409, 410, 456, 405, 460, 462, 458, 464, and 466 have been described previously. The configuration of optional reflectors 433, 421, and 409 determines light output coming from the LED. A preferred embodiment of this invention may not have a reflector 433, and may have the reflector 421 (reflecting only the blue light produced by multiple quantum well 428) and the reflector 409 (reflecting only the green light produced by multiple quantum well 416). In the process described in FIG. 4A-FIG. 4S, the original substrates in FIG. 4A, namely 402, 412 and 424, can be reused after ion-cut. This reuse may make the process more cost-effective.

Figure 5A:
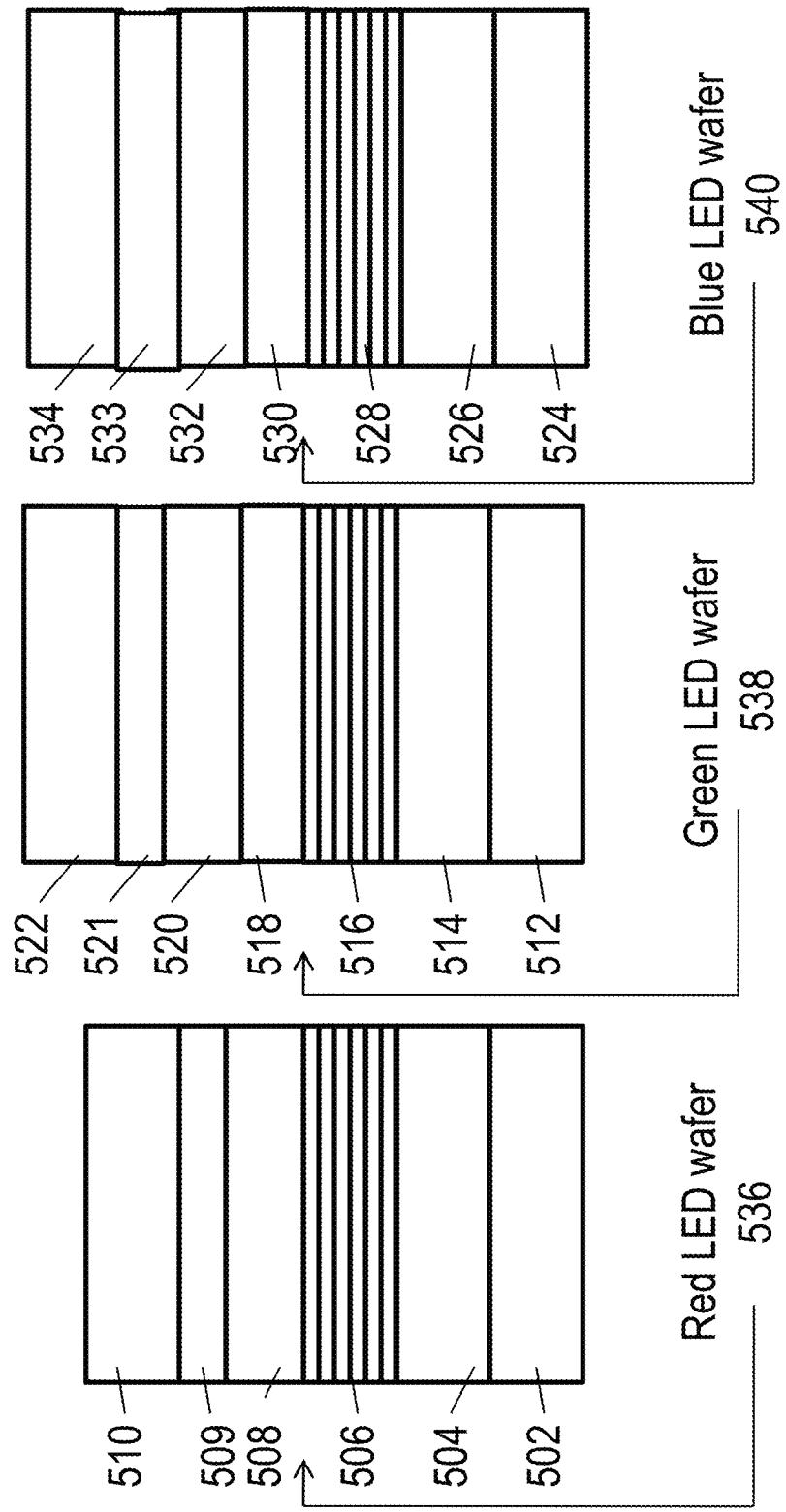
FIGS. 5A-Q illustrate an embodiment of this invention, where RGB LEDs are stacked with ion-cut technology, wire bond packaging and conductive oxide bonding.
Figure 5C:
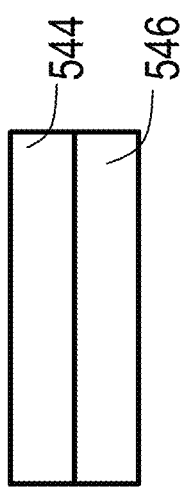
Figure 5D:
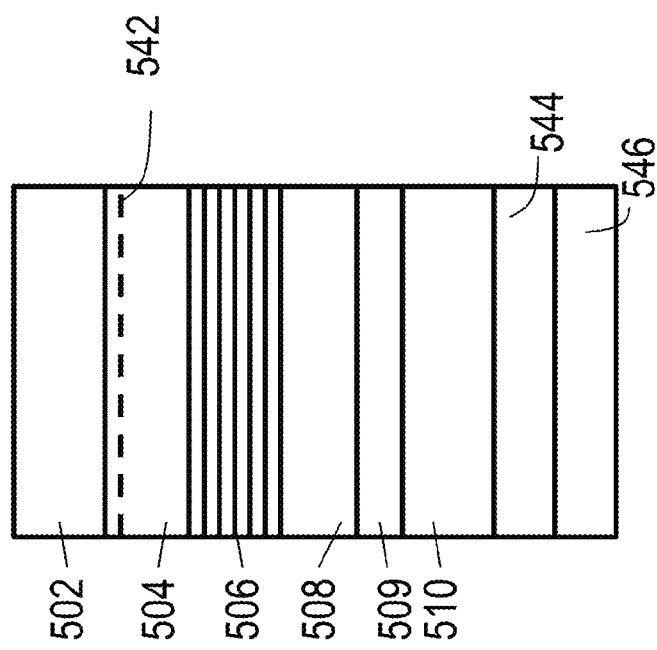
Figure 5E:
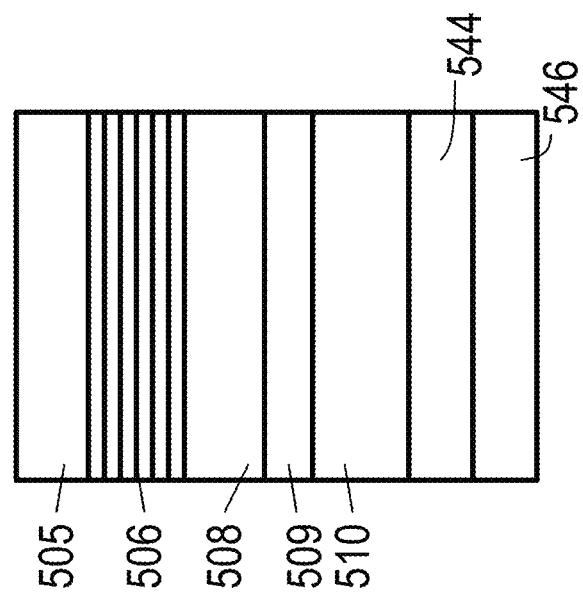
Figure 5G:
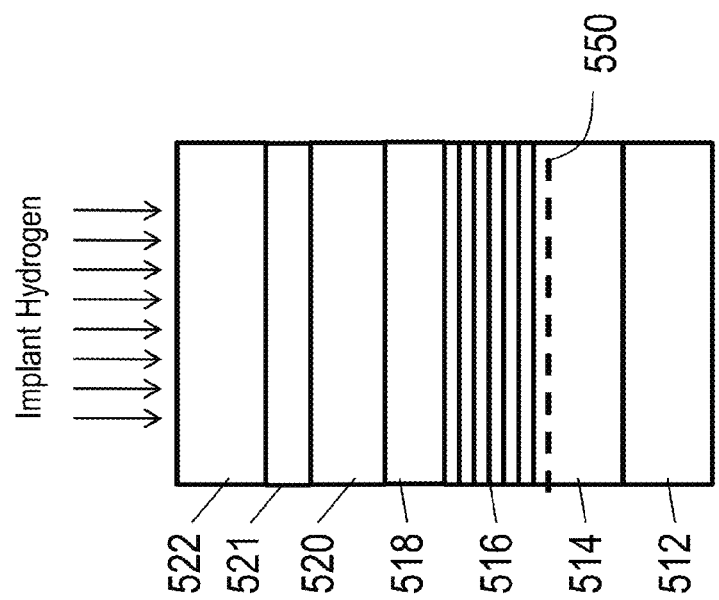
Figure 5K:
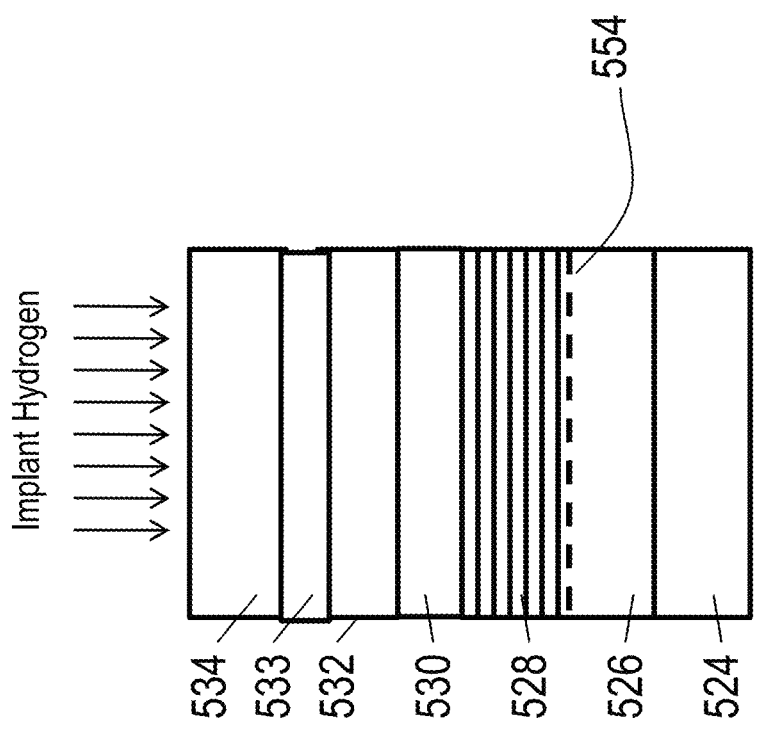
Figure 5M:
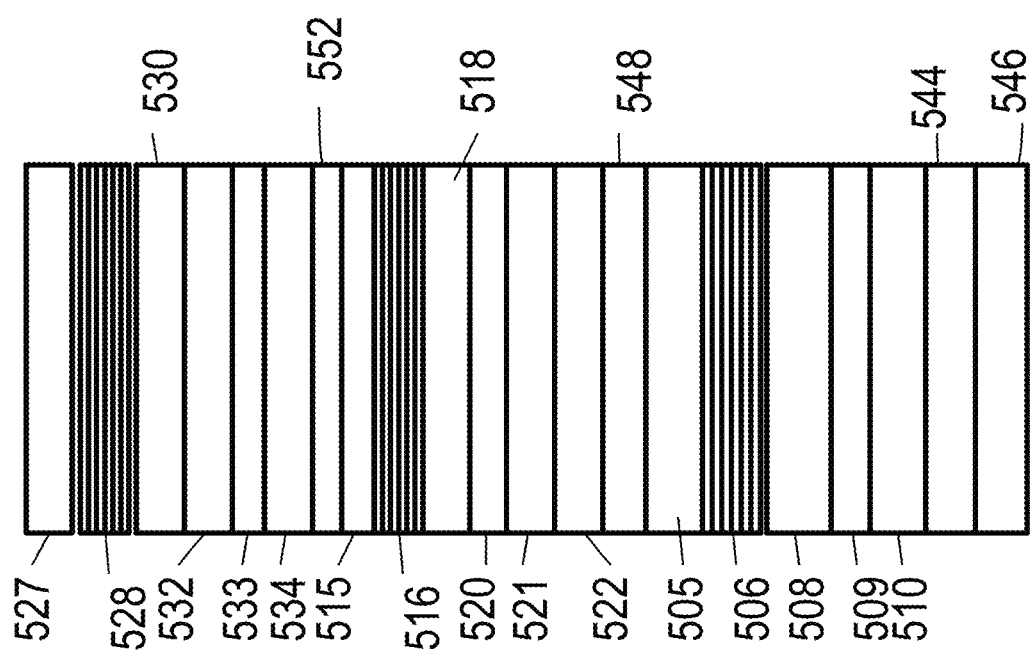
Figure 5N:
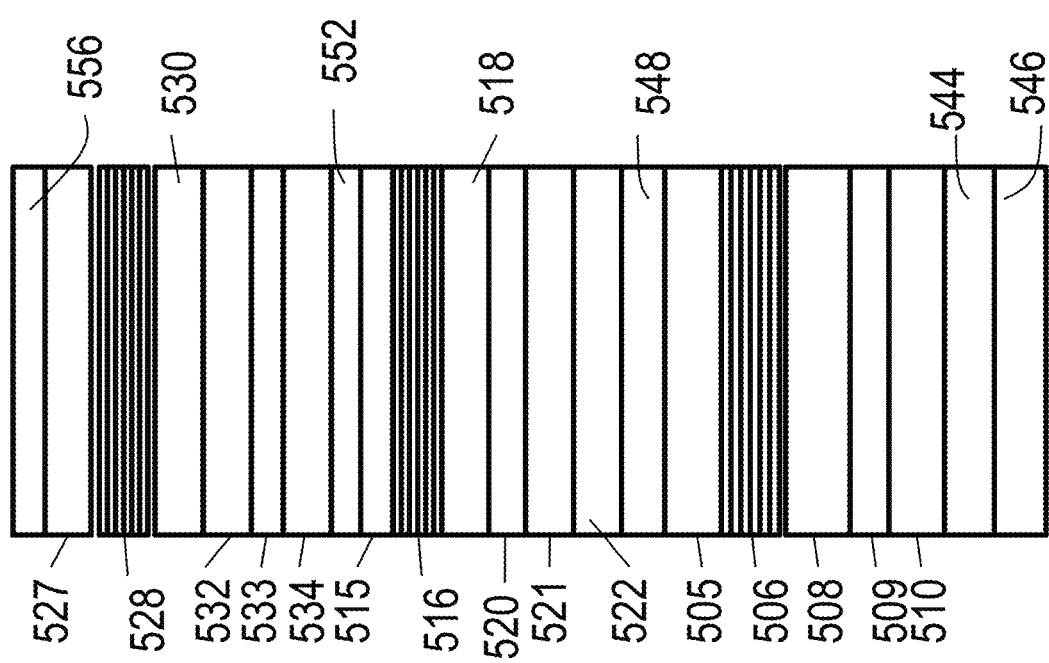
Figure 5P:
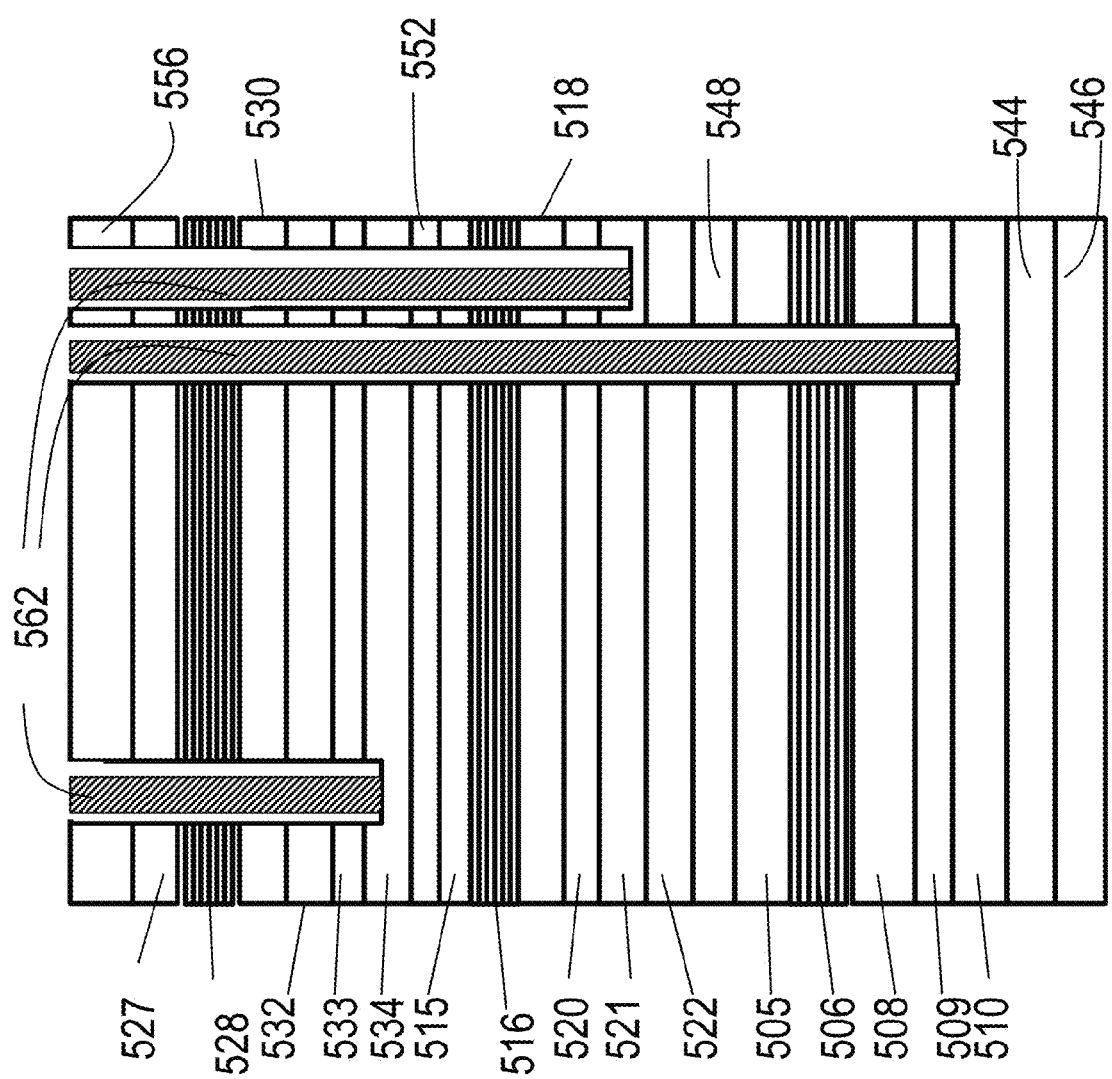
Figure 5Q:
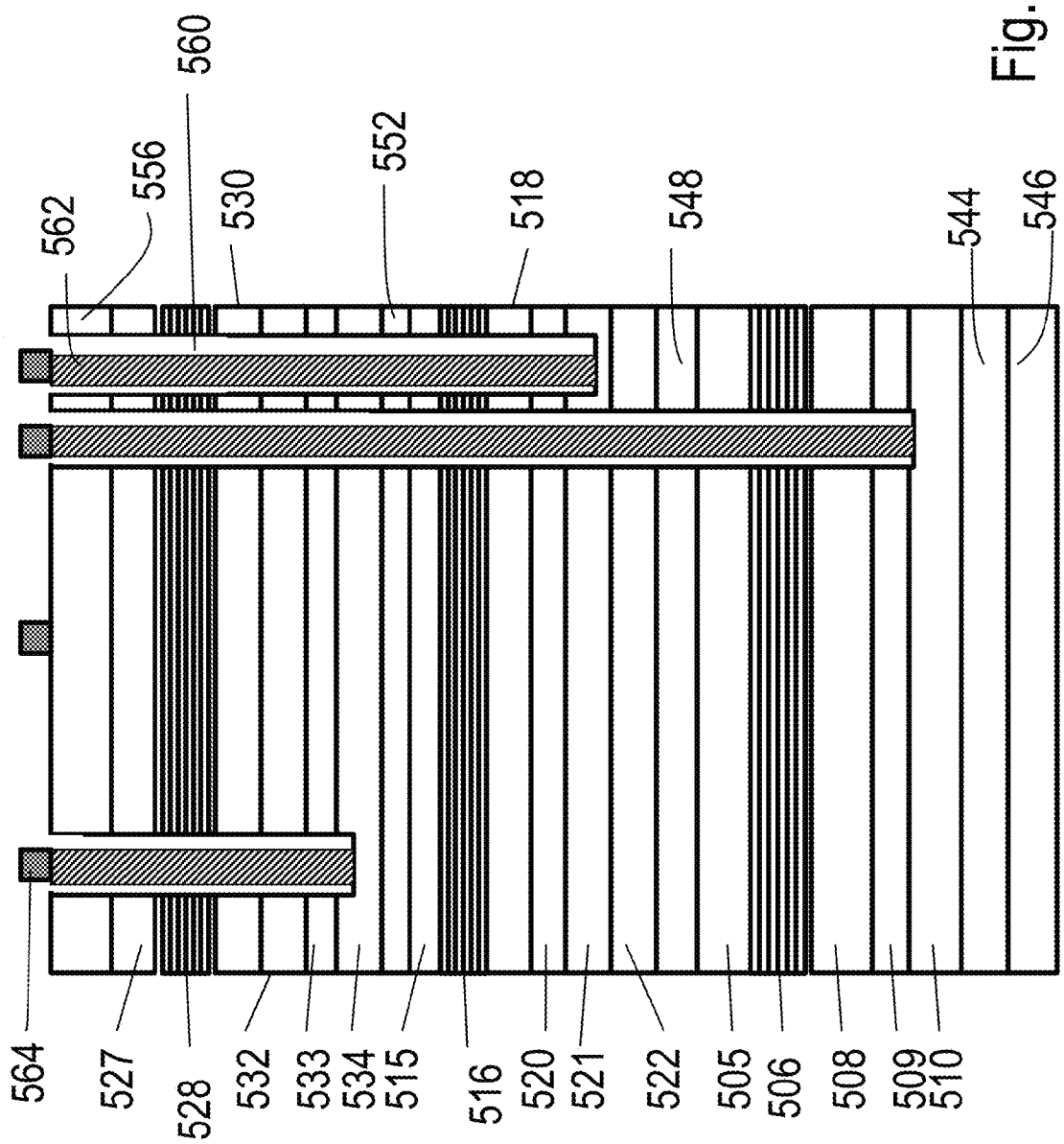

FIGS. 5A-Q describe an embodiment of this invention, where RGB LEDs are stacked with ion-cut technology, wire bond packaging and conductive oxide bonding. Essentially, smart-layer transfer is utilized to construct this embodiment of the invention. This process of constructing RGB LEDs could include several steps that occur in a sequence from Step (A) to Step (Q). Many of the steps share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): This is illustrated using FIG. 5A. A red LED wafer 536 is constructed on a GaAs substrate 502 and includes a N-type confinement layer 504, a multiple quantum well (MQW) 506, a P-type confinement layer 508, an optional reflector 509 and an ITO current spreader 510. Examples of materials used to construct these layers, include, but are not limited to, doped AlInGaP for the N-type confinement layer 504 and P-type confinement layer 508, the multiple quantum well layer 506 could be of AlInGaP and GaInP and the optional reflector 509 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 538 is constructed on a sapphire or SiC or bulk-GaN substrate 512 and includes a N-type confinement layer 514, a multiple quantum well (MQW) 516, a buffer layer 518, a P-type confinement layer 520, an optional reflector 521 and an ITO current spreader 522. Yet another wafer is constructed with a blue LED. The blue LED wafer 540 is constructed on a sapphire or SiC or bulk-GaN substrate 524 and includes a N-type confinement layer 526, a multiple quantum well (MQW) 528, a buffer layer 530, a P-type confinement layer 532, an optional reflector 533 and an ITO current spreader 534. Examples of materials used to construct these blue and green LED layers, include, but are not limited to, doped GaN (for the N-type and P-type confinement layers 514, 520, 526, and 532), AlGaN (for the buffer layers 530 and 518), and InGaN/GaN (for the multiple quantum wells 516 and 528). The optional reflectors 521 and 533 could be distributed Bragg Reflectors or some other type of reflectors. Various other material types and configurations could be used for constructing blue and green LEDs for this process.

Step (B) is illustrated in FIG. 5B. The red LED wafer 536 from FIG. 5A is used for this step. Various elements in FIG. 5B such as 502, 504, 506, 508, 509, and 510 have been previously described. Hydrogen is implanted into the wafer at a certain depth indicated by dotted lines 542. Alternatively, helium could be used for this step.

Step (C) is illustrated in FIG. 5C. A silicon substrate 546 is taken and an ITO layer 544 is deposited atop it.

Step (D) is illustrated in FIG. 5D. The wafer shown in FIG. 5B is flipped and bonded atop the wafer shown in FIG. 5C using ITO-ITO bonding. Various elements in FIG. 5D such as 502, 504, 506, 508, 509, 510, 542, 544, and 546 have been previously described. The ITO layer 544 is essentially bonded to the ITO layer 510 using an oxide-to-oxide bonding process.

Step (E) is illustrated in FIG. 5E. Various elements in FIG. 5E such as 506, 508, 509, 510, 544 and 546 have been previously described. An ion-cut process is conducted to cleave the structure shown in FIG. 5D at the hydrogen implant plane 542. This ion-cut process could preferably use a mechanical cleave. An anneal process could be utilized for the cleave as well. After the cleave, a chemical mechanical polish (CMP) process is conducted to planarize the surface. The N-type confinement layer present after this cleave and CMP process is indicated as 505.

Step (F) is illustrated in FIG. 5F. Various elements in FIG. 5F such as 505, 506, 508, 509, 510, 544, and 546 have been previously described. An ITO layer 548 is deposited atop the N-type confinement layer 505.

Step (G) is illustrated in FIG. 5G. The green LED wafer 538 shown in Step (A) is used for this step. Various elements in FIG. 5G such as 512, 514, 516, 518, 520, 521, and 522 have been described previously. Hydrogen is implanted into the wafer at a certain depth indicated by dotted lines 550. Alternatively, helium could be used for this step.

Step (H) is illustrated in FIG. 5H. The structure shown in FIG. 5G is flipped and bonded atop the structure shown in FIG. 5F using ITO-ITO bonding. Various elements in FIG. 5H such as 505, 506, 508, 509, 510, 544, 546, 548, 512, 514, 516, 518, 520, 521, 550, and 522 have been described previously.

Step (I) is illustrated in FIG. 5I. The structure shown in FIG. 5H is cleaved at the hydrogen plane indicated by 550. This cleave process may be preferably done with a mechanical force. Alternatively, an anneal could be used. A CMP process is conducted to planarize the surface. Various elements in FIG. 5I such as 505, 506, 508, 509, 510, 544, 546, 548, 516, 518, 520, 521, and 522 have been described previously. The N-type confinement layer present after this cleave and CMP process is indicated as 515.

Step (J) is illustrated using FIG. 5J. An ITO layer 552 is deposited atop the structure shown in FIG. 5I. Various elements in FIG. 5J such as 505, 506, 508, 509, 510, 544, 546, 548, 516, 518, 520, 521, 515, and 522 have been described previously.

Step (K) is illustrated using FIG. 5K. The blue LED wafer 540 from FIG. 5A is used for this step. Various elements in FIG. 5K such as 524, 526, 528, 530, 532, 533, and 534 have been previously described. Hydrogen is implanted into the wafer at a certain depth indicated by dotted lines 554. Alternatively, helium could be used for this step.

Step (L) is illustrated in FIG. 5L. The structure shown in FIG. 5K is flipped and bonded atop the structure shown in FIG. 5J using ITO-ITO bonding. Various elements in FIG. 4L such as 505, 506, 508, 509, 510, 544, 546, 548, 516, 518, 520, 521, 515, 522, 552, 524, 526, 528, 530, 532, 533, 554, and 534 have been described previously.

Step (M) is illustrated in FIG. 5M. The structure shown in FIG. 5L is cleaved at the hydrogen plane 554. A mechanical force could be used for this cleave. Alternatively, an anneal could be used. A CMP process is then conducted to planarize the surface. The N-type confinement layer present after this process is indicated as 527. Various elements in FIG. 5M such as 505, 506, 508, 509, 510, 544, 546, 548, 516, 518, 520, 521, 515, 522, 552, 528, 530, 532, 533, and 534 have been described previously.

Step (N) is illustrated in FIG. 5N. An ITO layer 556 is deposited atop the structure shown in FIG. 5M. Various elements in FIG. 5N such as 505, 506, 508, 509, 510, 544, 546, 548, 516, 518, 520, 521, 515, 522, 552, 528, 530, 532, 533, and 534 have been described previously.

Step (O) is illustrated in FIG. 5O. The process of making contacts to various layers and packaging begins with this step. Various elements in FIG. 5O such as 505, 506, 508, 509, 510, 544, 546, 548, 516, 518, 520, 521, 515, 522, 552, 528, 530, 532, 533, 556, and 534 have been described previously. Via holes 560 are etched to different layers of the LED stack. After the via holes 560 are etched, they may optionally be filled with an oxide layer and polished with CMP. This fill with oxide may be optional, and the preferred process may be to leave the via holes as such without fill.

Step (P) is illustrated in FIG. 5P. Aluminum is deposited to fill via holes 560 from FIG. 5O. Following this deposition, a lithography and etch process is utilized to define the aluminum metal to form via holes 562. Various elements in FIG. 5P such as 505, 506, 508, 509, 510, 544, 546, 548, 516, 518, 520, 521, 515, 522, 552, 528, 530, 532, 533, 556, 560, and 534 have been described previously.

Step (Q) is illustrated in FIG. 5Q. Bond pads 564 are constructed and wire bonds are attached to these bond pads following this step. Various elements in FIG. 5Q such as 505, 506, 508, 509, 510, 544, 546, 548, 516, 518, 520, 521, 515, 522, 552, 528, 530, 532, 533, 556, 560, 562, and 534 have been described previously. The configuration of optional reflectors 533, 521 and 509 determines light output coming from the LED. The preferred embodiment of this invention is to have reflector 533 reflect only blue light produced by multiple quantum well 528, to have the reflector 521 reflecting only green light produced by multiple quantum well 516 and to have the reflector 509 reflect light produced by multiple quantum well 506. In the process described in FIG. 5A-FIG. 5Q, the original substrates in FIG. 5A, namely 502, 512 and 524, can be re-used after ion-cut. This may make the process more cost-effective.

FIGS. 6A-L show an alternative embodiment of this invention, where stacked RGB LEDs are formed with ion-cut technology, flip-chip packaging and aligned bonding. A smart layer transfer process, ion-cut, is therefore utilized. This process of constructing RGB LEDs could include several steps that occur in a sequence from Step (A) to Step (K). Many of the steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 6A:
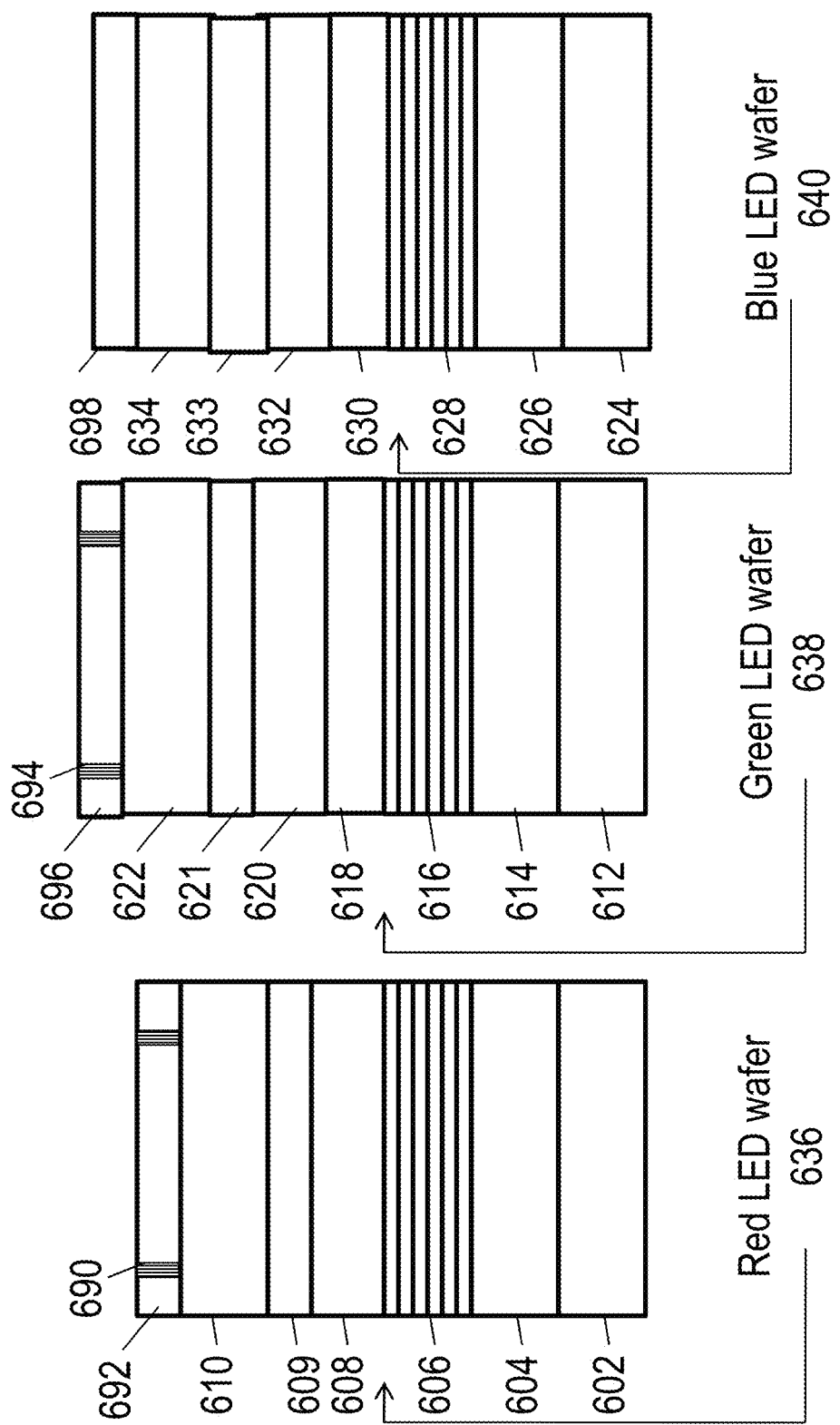

Step (A) is illustrated in FIG. 6A. A red LED wafer 636 is constructed on a GaAs substrate 602 and includes a N-type confinement layer 604, a multiple quantum well (MQW) 606, a P-type confinement layer 608, an optional reflector 609 and an ITO current spreader 610. Above the ITO current spreader 610, a layer of silicon oxide 692 is deposited, patterned, etched and filled with a metal 690 (e.g., tungsten) which is then CMPed. Examples of materials used to construct these layers, include, but are not limited to, doped AlInGaP for the N-type confinement layer 604 and P-type confinement layer 608, the multiple quantum well layer 606 could be of AlInGaP and GaInP and the optional reflector 609 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 638 is constructed on a sapphire or SiC or bulk-GaN substrate 612 and includes a N-type confinement layer 614, a multiple quantum well (MQW) 616, a buffer layer 618, a P-type confinement layer 620, an optional reflector 621 and an ITO current spreader 622. Above the ITO current spreader 622, a layer of silicon oxide 696 is deposited, patterned, etched and filled with a metal 694 (e.g., tungsten) which is then CMPed. Yet another wafer is constructed with a blue LED. The blue LED wafer 640 is constructed on a sapphire or SiC or bulk-GaN substrate 624 and includes a N-type confinement layer 626, a multiple quantum well (MQW) 628, a buffer layer 630, a P-type confinement layer 632, an optional reflector 633 and an ITO current spreader 634. Above the ITO current spreader 634, a layer of silicon dioxide 698 is deposited. Examples of materials used to construct these blue and green LED layers, include, but are not limited to, doped GaN for the N-type and P-type confinement layers 614, 620, 626 and 632, AlGaN for the buffer layers 630 and 618 and InGaN/GaN for the multiple quantum wells 616 and 628. The optional reflectors 621 and 633 could be distributed Bragg Reflectors or some other type of reflectors. Various other material types and configurations could be used for constructing blue and green LEDs for this process.

Figure 6B:
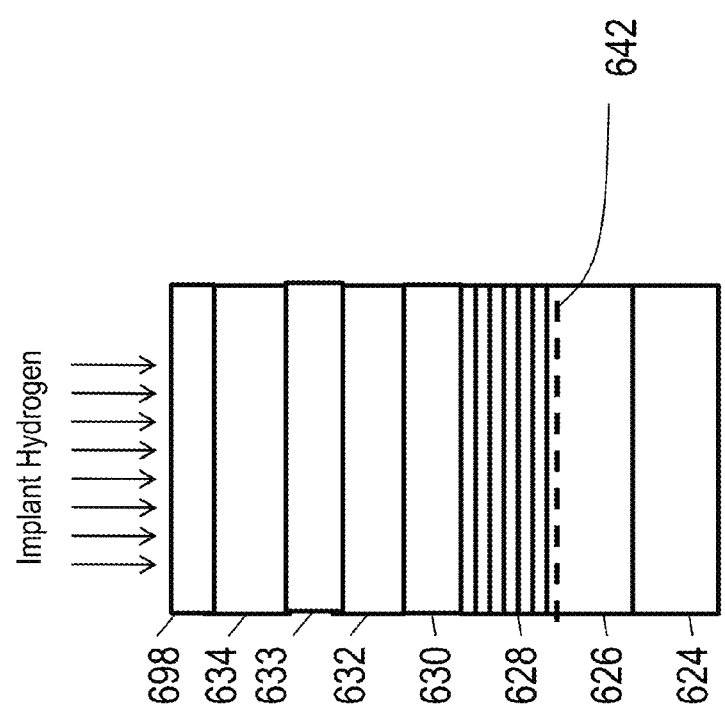

Step (B) is illustrated in FIG. 6B. The blue LED wafer 640 from FIG. 6A is used for this step. Various elements in FIG. 6B such as 624, 626, 628, 630, 632, 633, 698, and 634 have been previously described. Hydrogen is implanted into the wafer at a certain depth indicated by dotted lines 642. Alternately, helium could be used for this step.

Figure 6C:
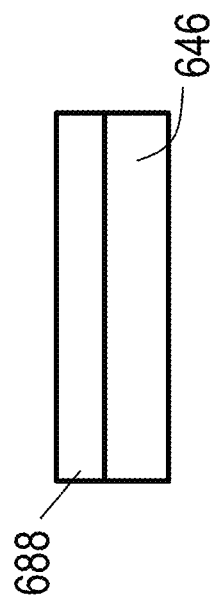

Step (C) is illustrated in FIG. 6C. A glass substrate 646 is taken and a silicon dioxide layer 688 is deposited atop it.

Figure 6D:
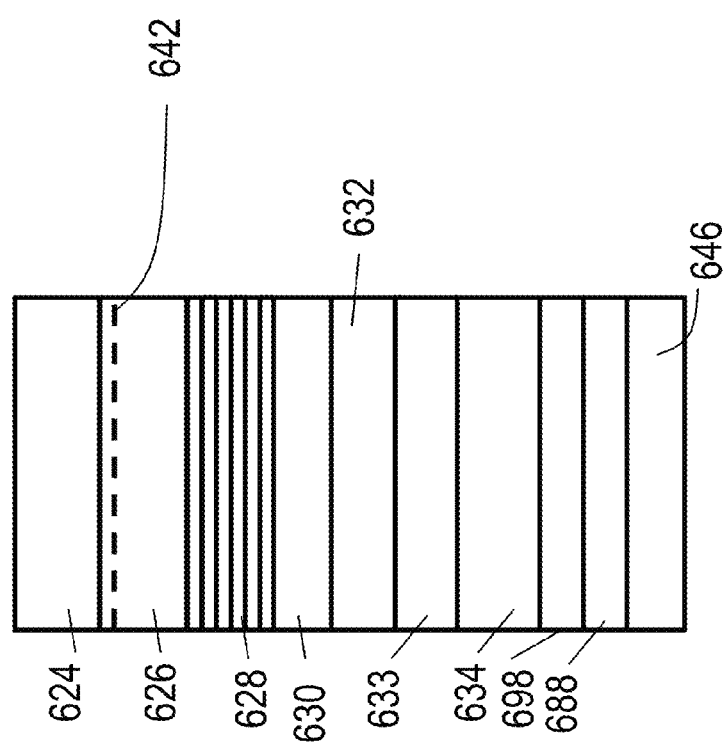

Step (D) is illustrated in FIG. 6D. The wafer shown in FIG. 6B is flipped and bonded atop the wafer shown in FIG. 6C using oxide-oxide bonding. Various elements in FIG. 6D such as 624, 626, 628, 630, 632, 633, 698, 642, 646, 688, and 634 have been previously described. The oxide layer 688 is essentially bonded to the oxide layer 698 using an oxide-to-oxide bonding process.

Figure 6E:
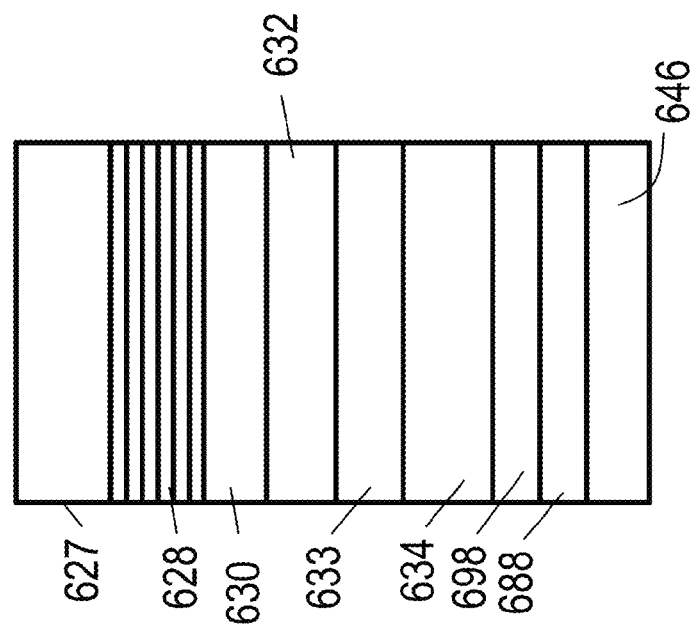

Step (E) is illustrated in FIG. 6E. Various elements in FIG. 6E such as 628, 630, 632, 633, 698, 646, 688, and 634 have been previously described. An ion-cut process is conducted to cleave the structure shown in FIG. 6D at the hydrogen implant plane 642. This ion-cut process may be preferably using a mechanical cleave. An anneal process could be utilized for the cleave as well. After the cleave, a chemical mechanical polish (CMP) process is conducted to planarize the surface. The N-type confinement layer present after this cleave and CMP process is indicated as 627.

Figure 6F:
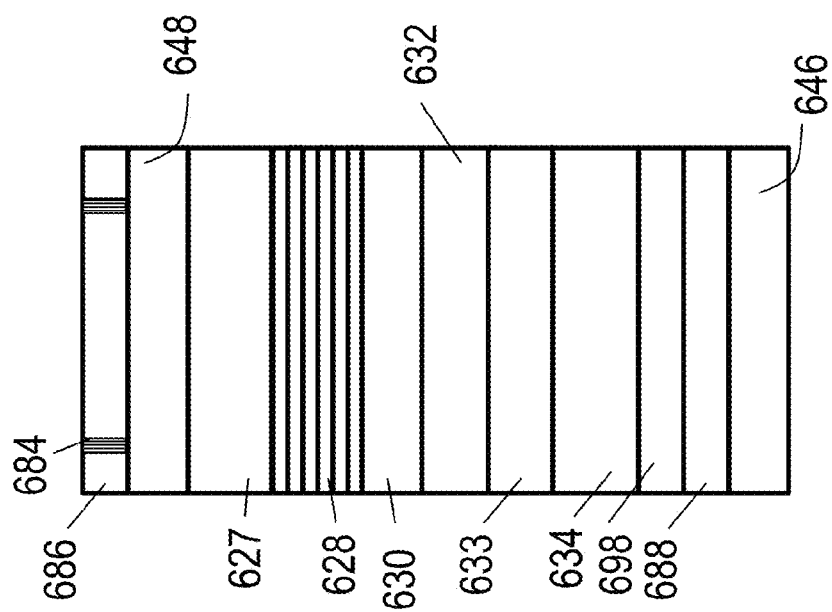

Step (F) is illustrated in FIG. 6F. Various elements in FIG. 6F such as 628, 630, 632, 633, 698, 646, 688, 627, and 634 have been previously described. An ITO layer 648 is deposited atop the N-type confinement layer 627. Above the ITO layer 648, a layer of silicon oxide 686 is deposited, patterned, etched and filled with a metal 684 (e.g., tungsten) which is then CMPed.

Step (G) is illustrated in FIG. 6G. The green LED wafer 638 shown in Step (A) is used for this step. Various elements in FIG. 6G such as 612, 614, 616, 618, 620, 621, 696, 694, and 622 have been described previously. Hydrogen is implanted into the wafer at a certain depth indicated by dotted lines 650. Alternatively, helium could be used for this step.

Figure 6H:
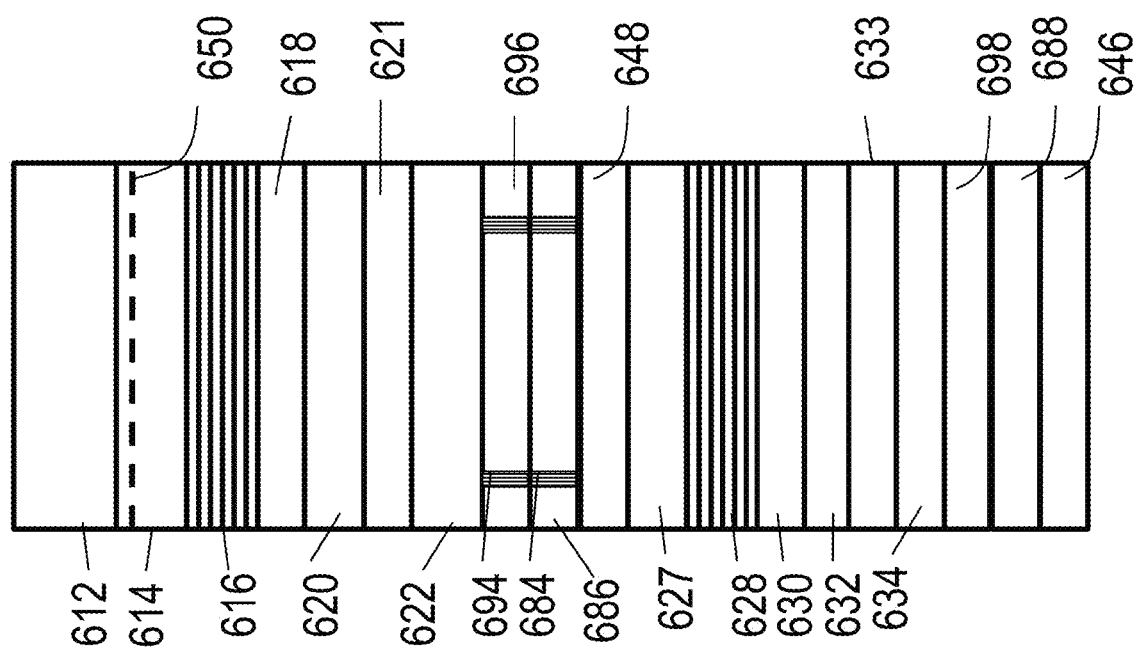

Step (H) is illustrated in FIG. 6H. The structure shown in FIG. 6G is flipped and bonded atop the structure shown in FIG. 6F using oxide-oxide bonding. The metal regions 694 and 684 on the bonded wafers are aligned to each other. Various elements in FIG. 6H such as 628, 630, 632, 633, 698, 646, 688, 627, 634, 648, 686, 684, 612, 614, 616, 618, 620, 621, 696, 694, 650, and 622 have been described previously.

Step (I) is illustrated in FIG. 6I. The structure shown in FIG. 6H is cleaved at the hydrogen plane indicated by 650. This cleave process may be preferably done with a mechanical force. Alternatively, an anneal could be used. A CMP process is conducted to planarize the surface. Various elements in FIG. 6I such as 628, 630, 632, 633, 698, 646, 688, 627, 634, 648, 686, 684, 616, 618, 620, 621, 696, 694, and 622 have been described previously. The N-type confinement layer present after this cleave and CMP process is indicated as 615.

Figure 6J:
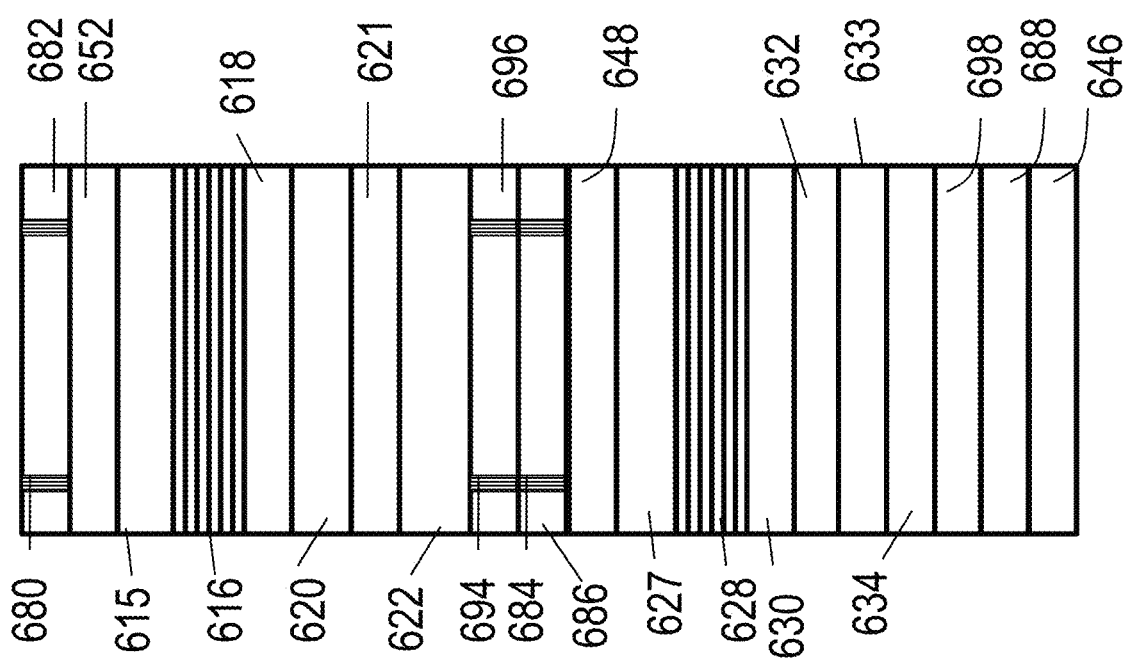

Step (J) is illustrated in FIG. 6J. An ITO layer 652 is deposited atop the structure shown in FIG. 6I. Above the ITO layer 652, a layer of silicon oxide 682 is deposited, patterned, etched and filled with a metal 680 (e.g., tungsten) which is then CMPed. Various elements in FIG. 6J such as 628, 630, 632, 633, 698, 646, 688, 627, 634, 648, 686, 684, 616, 618, 620, 621, 696, 694, 615, and 622 have been described previously.

Figure 6K:
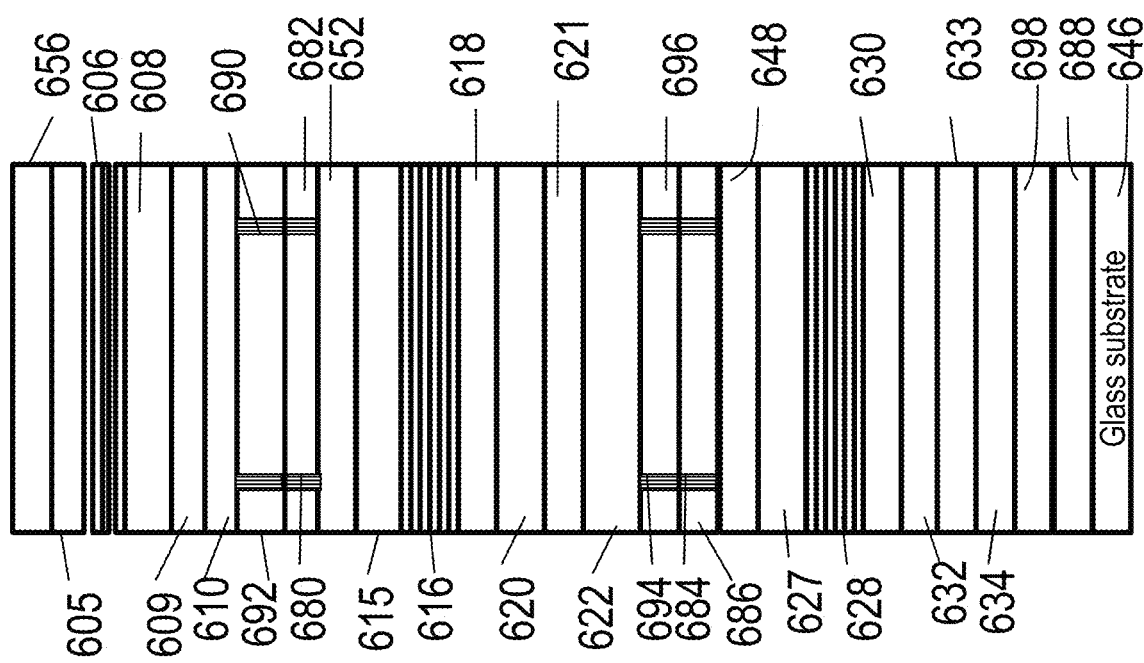

Step (K) is illustrated in FIG. 6K. Using procedures similar to Step (G)-Step (J), the red LED layer is transferred atop the structure shown in FIG. 6J. The N-type confinement layer after ion-cut is indicated by 605. An ITO layer 656 is deposited atop the N-type confinement layer 605. Various elements in FIG. 6K such as 628, 630, 632, 633, 698, 646, 688, 627, 634, 648, 686, 684, 616, 618, 620, 621, 696, 694, 615, 690, 692, 610, 609, 608, 606, and 622 have been described previously.

Step (L) is illustrated in FIG. 6L. Using flip-chip packaging procedures similar to those described in FIG. 4A-FIG. 4S, the RGB LED stack shown in FIG. 6K is attached to a silicon sub-mount 668. 658 indicates a reflecting material, 664 is a nickel layer, 666 represents solder bumps, 670 is an aluminum via, and 672 is either an oxide layer or an air gap. Various elements in FIG. 6K such as 628, 630, 632, 633, 698, 646, 688, 627, 634, 648, 686, 684, 616, 618, 620, 621, 696, 694, 615, 690, 692, 610, 609, 608, 606, 605, 656, and 622 have been described previously. The configuration of optional reflectors 633, 621 and 609 determines light output coming from the LED. A preferred embodiment of this invention may not have a reflector 633, but may have the reflector 621 (reflecting only the blue light produced by multiple quantum well 628) and the reflector 609 (reflecting only the green light produced by multiple quantum well 616). In the process described in FIG. 6A-FIG. 6L, the original substrates in FIG. 6A, namely 602, 612, and 624, can be re-used after ion-cut. This may make the process more cost-effective.

FIGS. 7A-L illustrate an embodiment of this invention, where stacked RGB

LEDs are formed with laser lift-off, substrate etch, flip-chip packaging and conductive oxide bonding. Essentially, smart layer transfer techniques are used. This process could include several steps that occur in a sequence from Step (A) to Step (M). Many of the steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): This is illustrated using FIG. 7A. A red LED wafer 736 is constructed on a GaAs substrate 702 and includes a N-type confinement layer 704, a multiple quantum well (MQW) 706, a P-type confinement layer 708, an optional reflector 709 and an ITO current spreader 710. Examples of materials used to construct these layers, include, but are not limited to, doped AlInGaP for the N-type confinement layer 704 and P-type confinement layer 708, the multiple quantum well layer 706 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 738 is constructed on a sapphire substrate 712 (or some other transparent substrate) and includes a N-type confinement layer 714, a multiple quantum well (MQW) 716, a buffer layer 718, a P-type confinement layer 720, an optional reflector 721 and an ITO current spreader 722. Yet another wafer is constructed with a blue LED. The blue LED wafer 740 is constructed on a sapphire substrate 724 (or some other transparent substrate) and includes a N-type confinement layer 726, a multiple quantum well (MQW) 728, a buffer layer 730, a P-type confinement layer 732, an optional reflector 733 and an ITO current spreader 734. Examples of materials used to construct these blue and green LED layers, include, but are not limited to, doped GaN for the N-type and P-type confinement layers 714, 720, 726 and 732, AlGaN for the buffer layers 730 and 718 and InGaN/GaN for the multiple quantum wells 716 and 728. The optional reflectors 721 and 733 could be distributed Bragg Reflectors or some other type of reflectors. Various other material types and configurations could be used for constructing blue and green LEDs for this process.

Figure 7A:
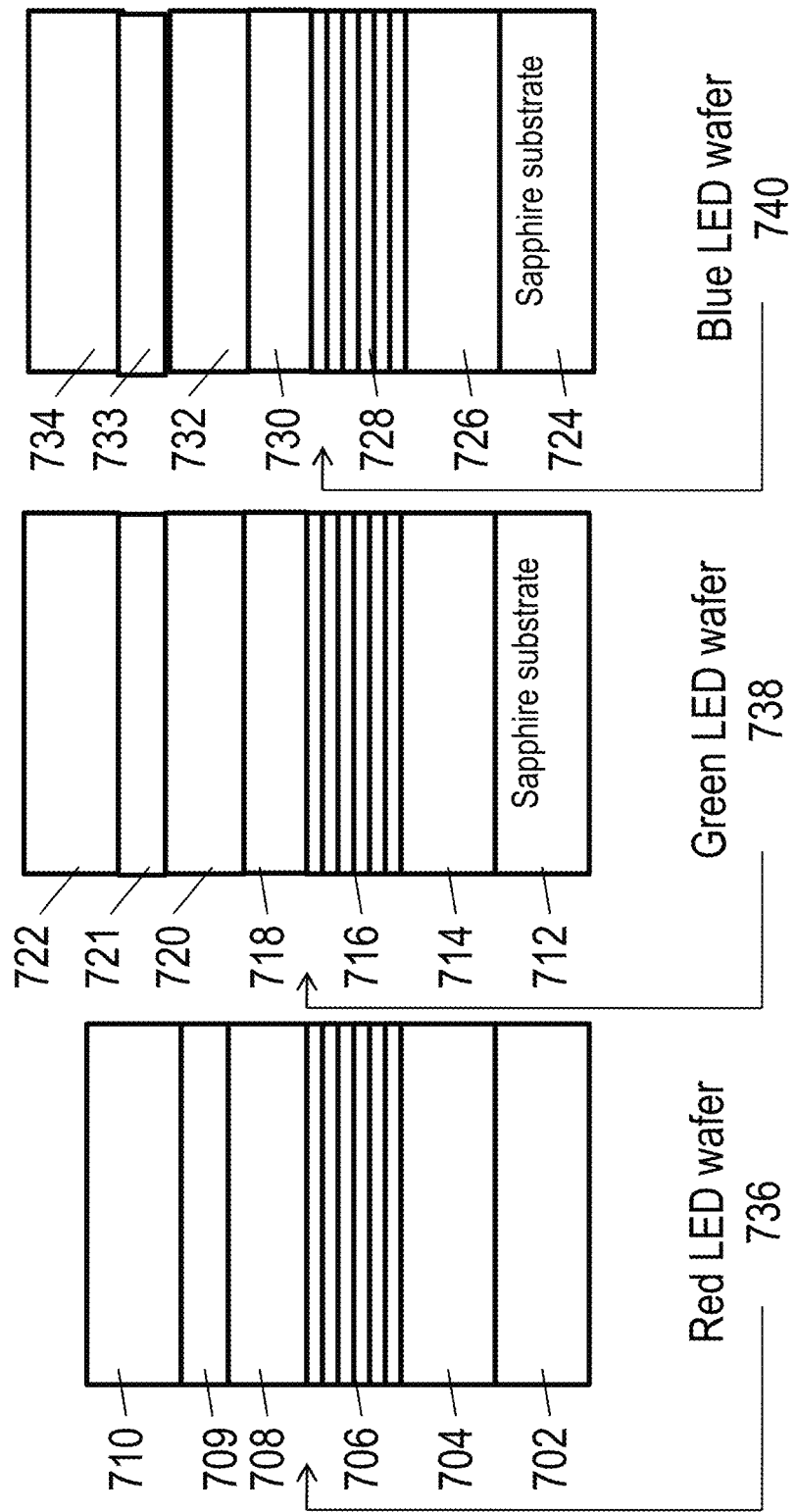
Figure 7B:
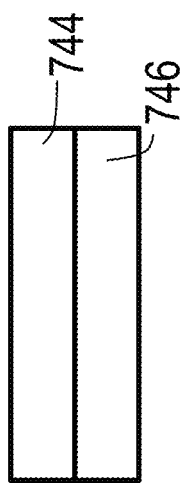

Step (B) is illustrated in FIG. 7B. A glass substrate 746 is taken and an ITO layer 744 is deposited atop it.

Figure 7C:
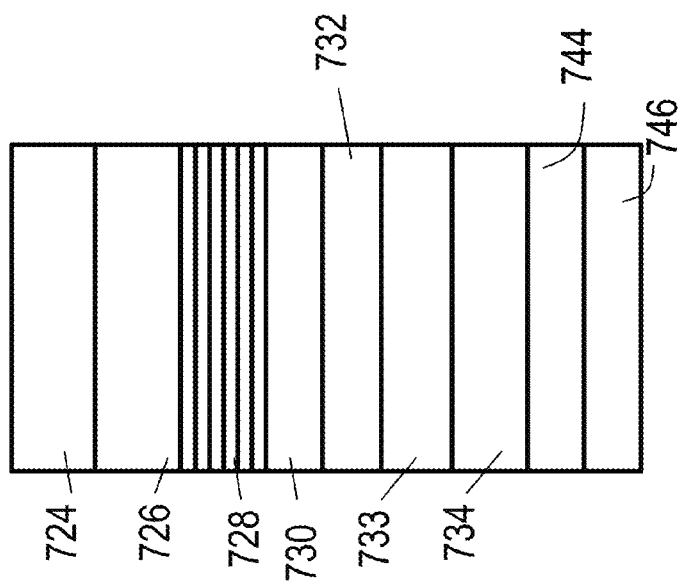

Step (C) is illustrated in FIG. 7C. The blue LED wafer 740 shown in FIG. 7A is flipped and bonded atop the wafer shown in FIG. 7B using ITO-ITO bonding. Various elements in FIG. 7C such as 724, 726, 728, 730, 732, 733, 734, 746, and 744 have been previously described. The ITO layer 744 is essentially bonded to the ITO layer 734 using an oxide-to-oxide bonding process.

Figure 7D:
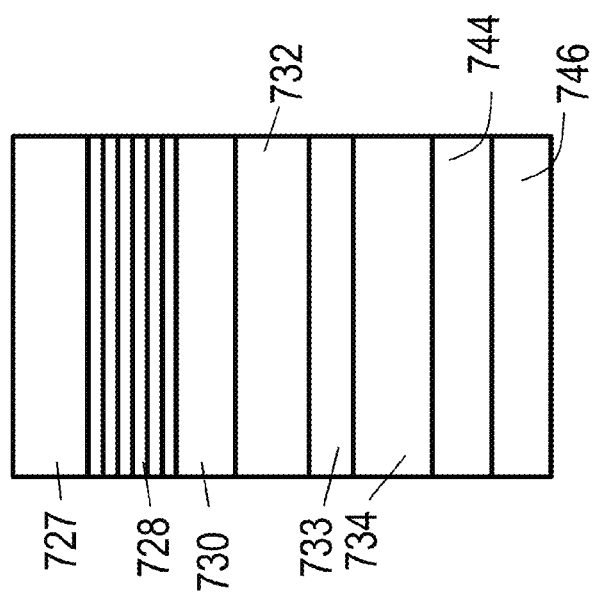

Step (D) is illustrated in FIG. 7D. A laser is used to shine radiation through the sapphire substrate 724 of FIG. 7C and a laser lift-off process is conducted. The sapphire substrate 724 of FIG. 7C is removed with the laser lift-off process. Further details of the laser lift-off process are described in U.S. Pat. No. 6,071,795 by Nathan W. Cheung, Timothy D. Sands and William S. Wong ("Cheung"). A CMP process is conducted to planarize the surface of the N confinement layer 727 after laser lift-off of the sapphire substrate. Various elements in FIG. 7D such as 728, 730, 732, 733, 734, 746, and 744 have been previously described.

Figure 7E:
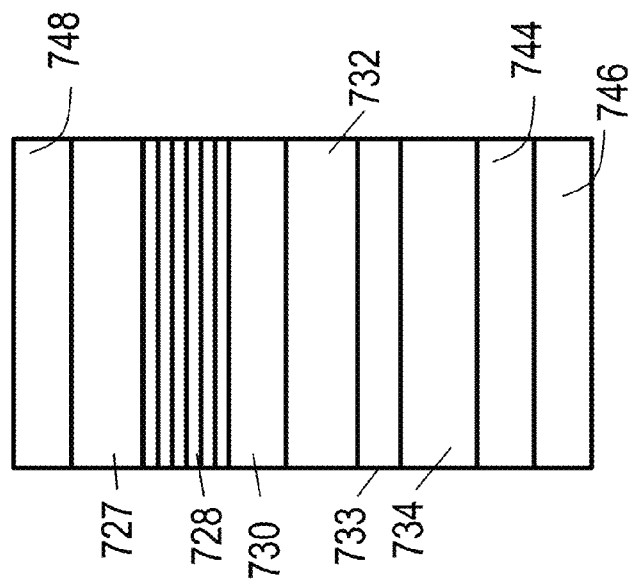

Step (E) is illustrated in FIG. 7E. Various elements in FIG. 7E such as 728, 730, 732, 733, 734, 746, 727, and 744 have been previously described. An ITO layer 748 is deposited atop the N confinement layer 727.

Step (F) is illustrated in FIG. 7F. The green LED wafer 738 is flipped and bonded atop the structure shown in FIG. 7E using ITO-ITO bonding of layers 722 and 748. Various elements in FIG. 7F such as 728, 730, 732, 733, 734, 746, 727, 748, 722, 721, 720, 718, 716, 714, 712 and 744 have been previously described.

Step (G) is illustrated in FIG. 7G. A laser is used to shine radiation through the sapphire substrate 712 of FIG. 7F and a laser lift-off process is conducted. The sapphire substrate 712 of FIG. 7F is removed with the laser lift-off process. A CMP process is conducted to planarize the surface of the N-type confinement layer 715 after laser lift-off of the sapphire substrate. Various elements in FIG. 7G such as 728, 730, 732, 733, 734, 746, 727, 748, 722, 721, 720, 718, 716, and 744 have been previously described.

Figure 7H:
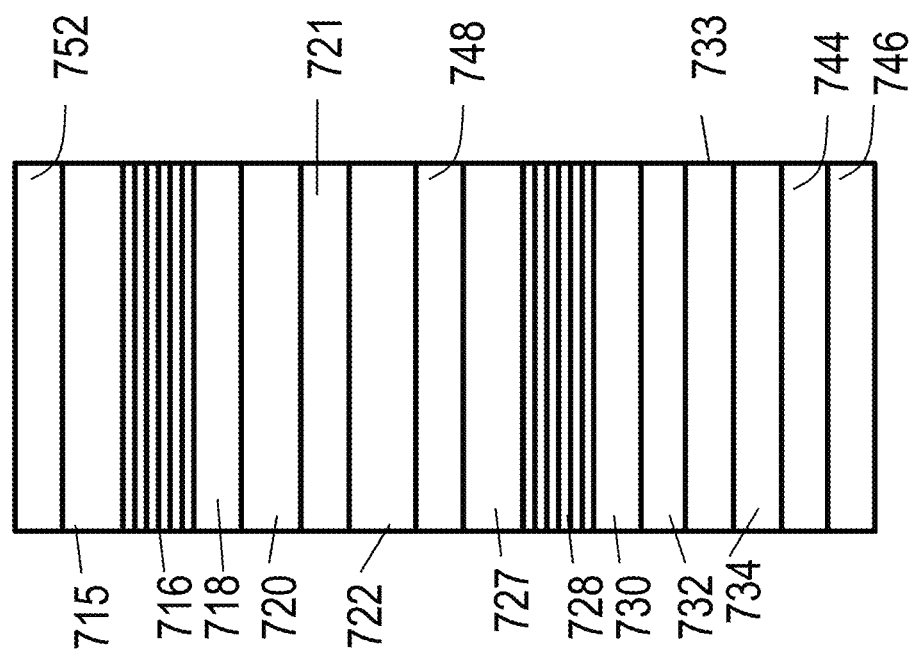
Figure 71:
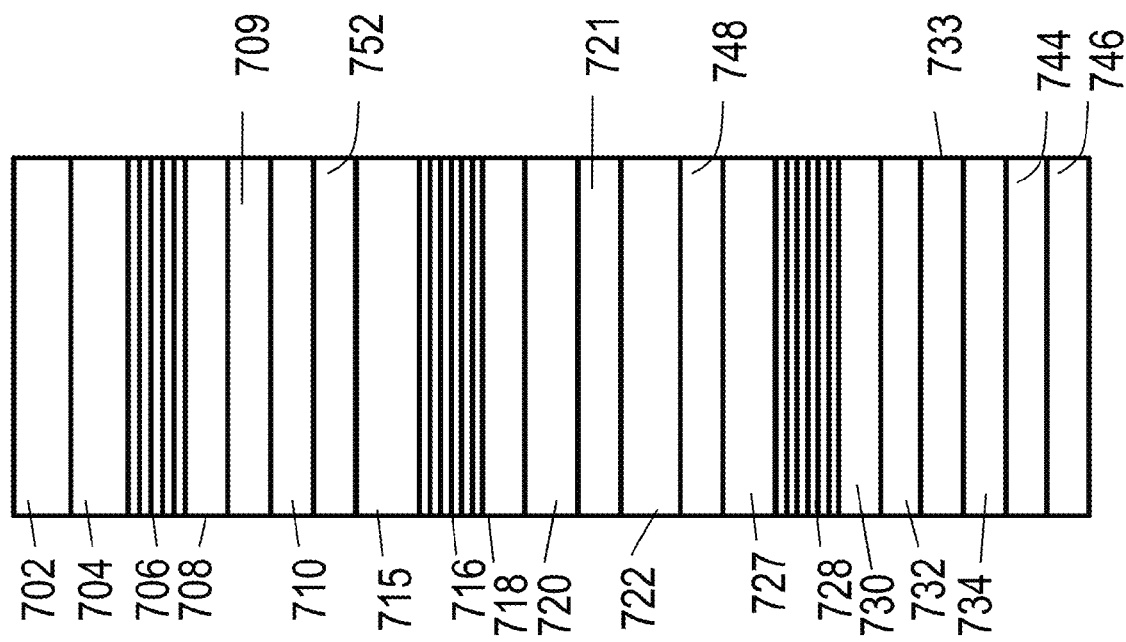

Step (H) is illustrated in FIG. 7H. An ITO layer 752 is deposited atop the N-type confinement layer 715. Various elements in FIG. 7H such as 728, 730, 732, 733, 734, 746, 727, 748, 722, 721, 720, 718, 716, 715, and 744 have been previously described.

Step (I) is illustrated in FIG. 7I. The red LED wafer 736 from FIG. 7A is flipped and bonded atop the structure shown in FIG. 7H using ITO-ITO bonding of layers 710 and 752. Various elements in FIG. 7I such as 728, 730, 732, 733, 734, 746, 727, 748, 722, 721, 720, 718, 716, 715, 752, 710, 709, 708, 706, 704, 702, and 744 have been previously described.

Step (J) is illustrated in FIG. 7J. The GaAs substrate 702 from FIG. 7I is removed using etch and/or CMP. Following this etch and/or CMP process, the N-type confinement layer 704 of FIG. 7I is planarized using CMP to form the N-type confinement layer 705. Various elements in FIG. 7J such as 728, 730, 732, 733, 734, 746, 727, 748, 722, 721, 720, 718, 716, 715, 752, 710, 709, 708, 706, and 744 have been previously described.

Figure 7K:
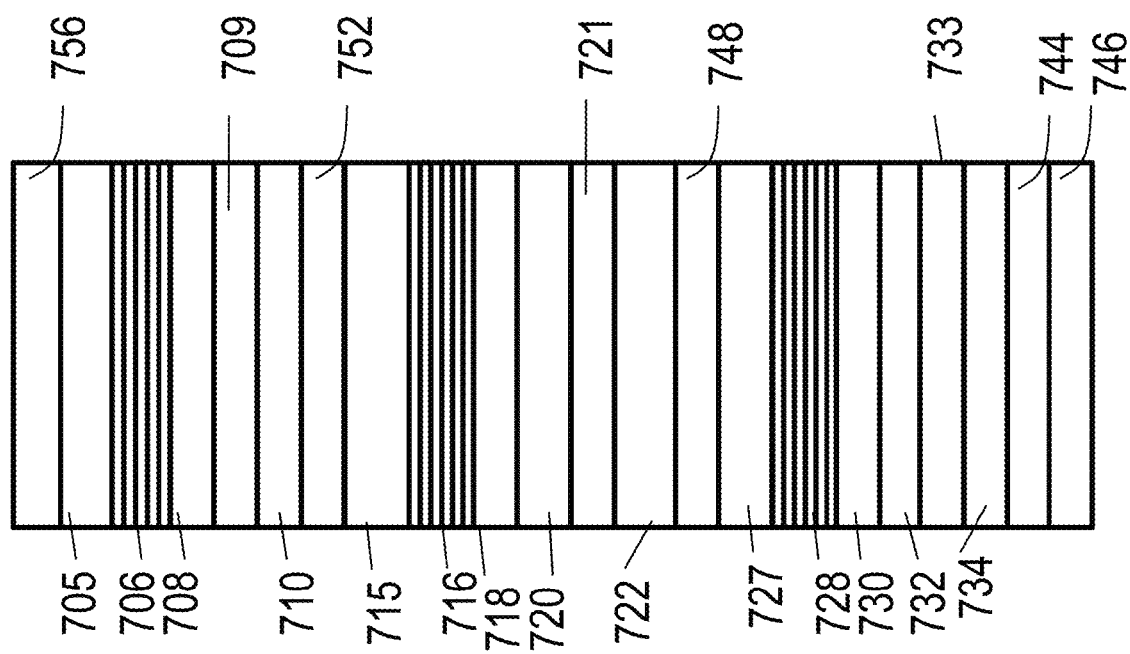

Step (K) is illustrated in FIG. 7K. An ITO layer 756 is deposited atop the N confinement layer 705 of FIG. 7J. Various elements in FIG. 7K such as 728, 730, 732, 733, 734, 746, 727, 748, 722, 721, 720, 718, 716, 715, 752, 710, 709, 708, 706, 705, and 744 have been previously described.

Figure 7L:
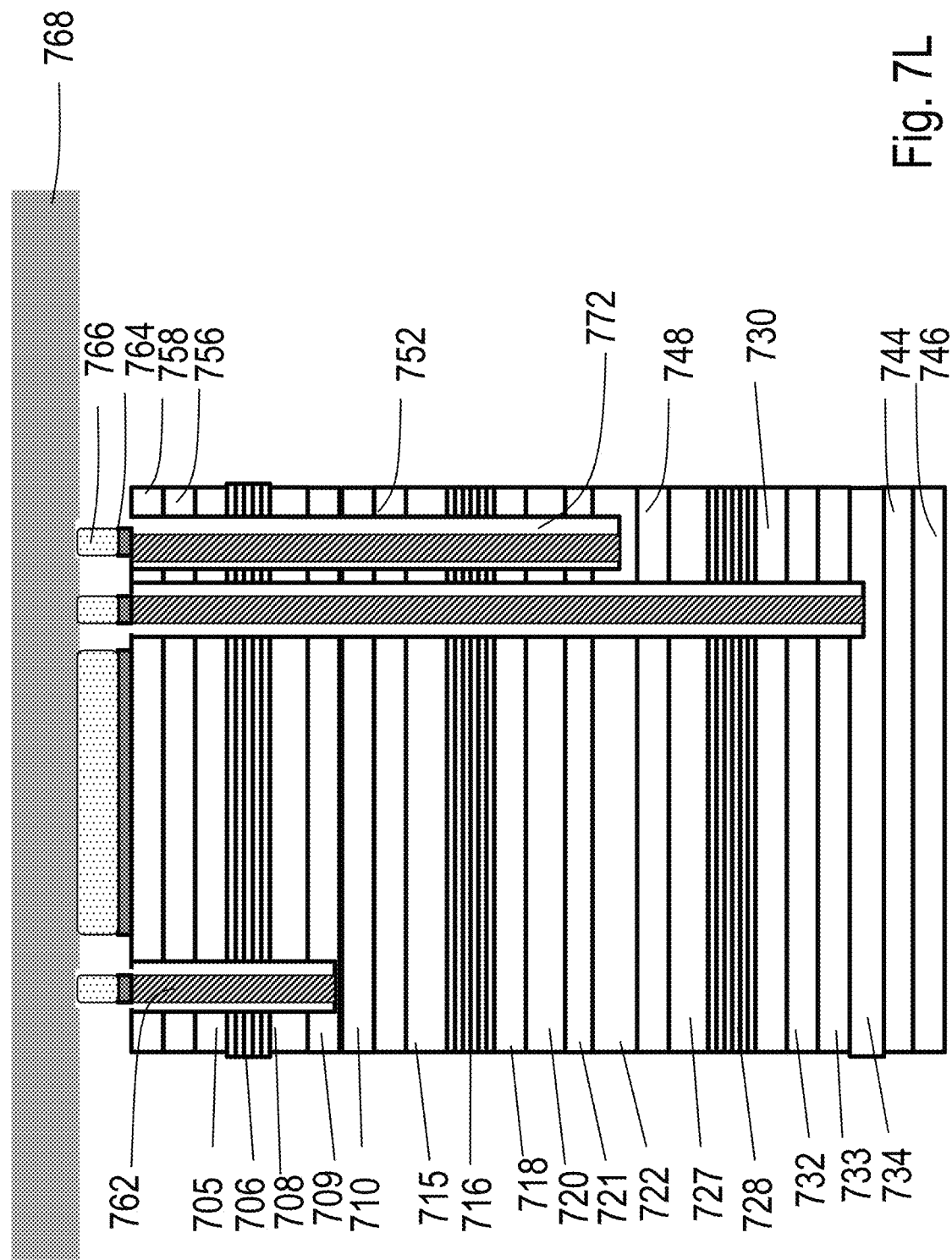

Step (L) is illustrated in FIG. 7L. Using flip-chip packaging procedures similar to those described in FIG. 4A-FIG. 4S, the RGB LED stack shown in FIG. 7K is attached to a silicon sub-mount 768. 758 indicates a reflecting material, 764 is a nickel layer, 766 represents solder bumps, 762 is an aluminum via, and 772 is either an oxide layer or an air gap. Various elements in FIG. 7L such as 728, 730, 732, 733, 734, 746, 727, 748, 722, 721, 720, 718, 716, 715, 752, 710, 709, 708, 706, 705, and 756 have been described previously. The configuration of optional reflectors 733, 721 and 709 determines light output coming from the LED. The preferred embodiment of this invention may not have a reflector 733, but may have the reflector 721 (reflecting only the blue light produced by multiple quantum well 728) and the reflector 709 (reflecting only the green light produced by multiple quantum well 716).

Figure 8A:
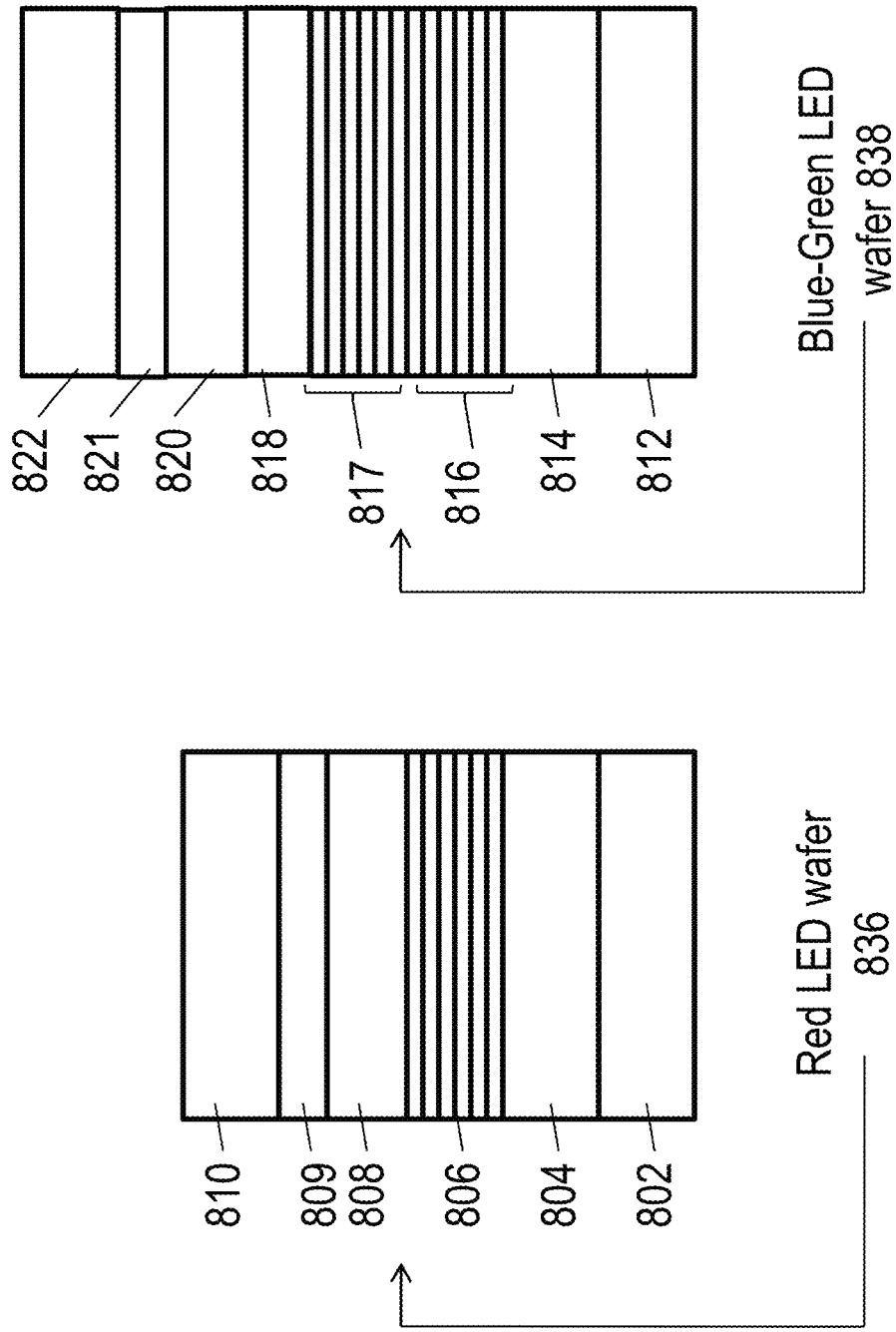
FIGS. 8A-B illustrate an embodiment of this invention, where stacked RGB LEDs are formed from a wafer having red LED layers and another wafer having both green and blue LED layers.
Figure 8B:
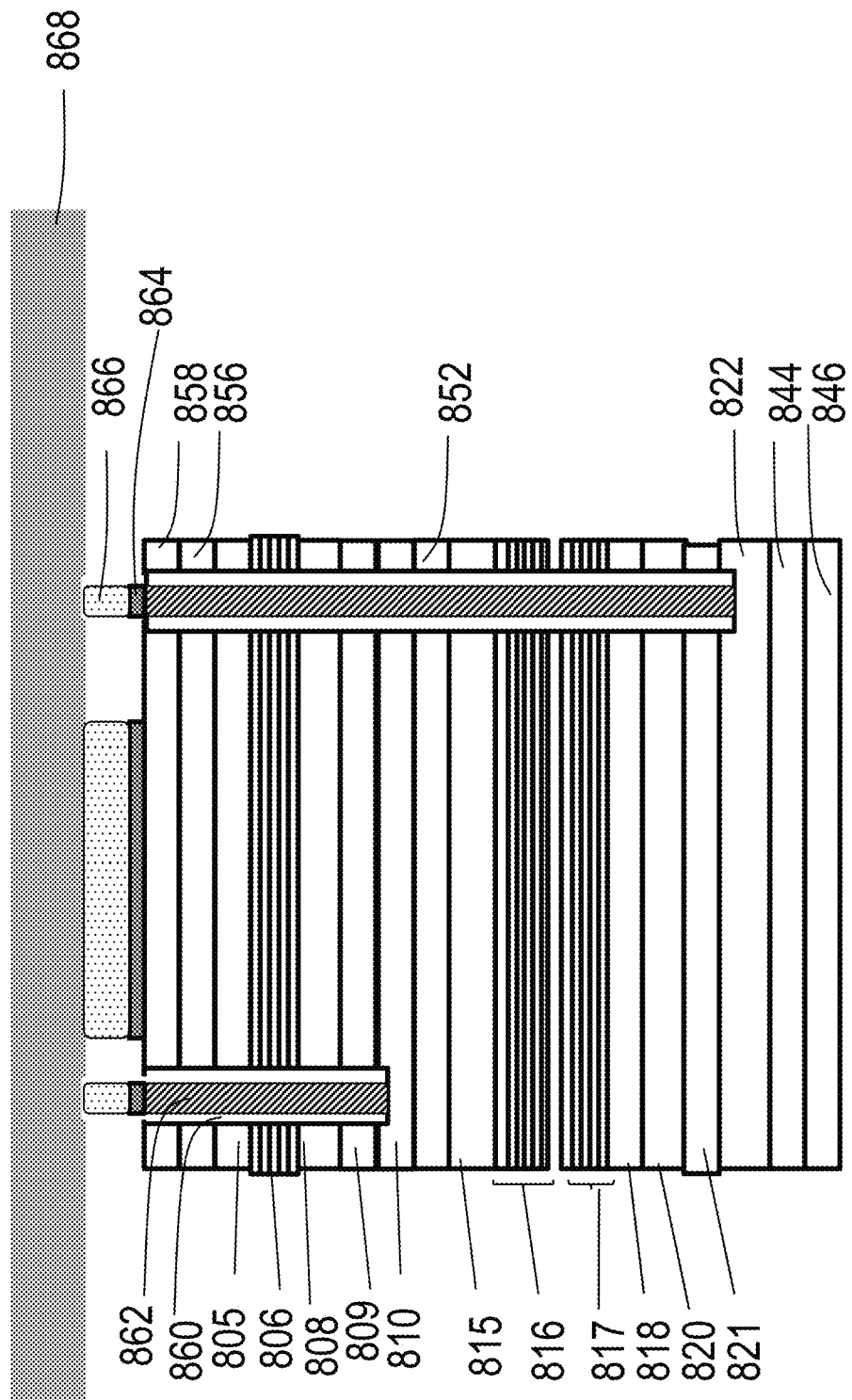

FIGS. 8A-B show an embodiment of this invention, where stacked RGB LEDs are formed from a wafer having red LED layers and another wafer having both green and blue LED layers. Therefore, a smart layer transfer process is used to form the stacked RGB LED. FIG. 8A shows that a red LED wafer 836 and another wafer called a blue-green LED wafer 836 are used. The red LED wafer 836 is constructed on a GaAs substrate 802 and includes a N-type confinement layer 804, a multiple quantum well (MQW) 806, a P-type confinement layer 808, an optional reflector 809 and an ITO current spreader 810. Examples of materials used to construct these layers, include, but are not limited to, doped AlInGaP for the N-type confinement layer 804 and P-type confinement layer 808, the multiple quantum well layer 806 could be of AlInGaP and GaInP and the optional reflector 809 could be a distributed Bragg Reflector. A double heterostructure configuration or single quantum well configuration could be used instead of a multiple quantum well configuration. Various other material types and configurations could be used for constructing the red LEDs for this process. The blue-green LED wafer 838 is constructed on a sapphire or bulk GaN or SiC substrate 812 (or some other transparent substrate) and includes a N-type confinement layer 814, a green multiple quantum well (MQW) 816, a blue multiple quantum well 817, a buffer layer 818, a P-type confinement layer 820, an optional reflector 821, and an ITO current spreader 822. Examples of materials used to construct the blue-green LED wafers, include, but are not limited to, doped GaN for the N-type and P-type confinement layers 814, 820, AlGaN for the buffer layer 818 and InGaN/GaN for the multiple quantum wells 816 and 817. The optional reflector 821 could be a distributed Bragg Reflector or some other type of reflector. The optional reflector 821 could alternatively be built between the N-type confinement layer 814 or below it, and this is valid for all LEDs discussed in the patent application. Various other material types and configurations could be used for constructing blue-green LED wafers for this process. Using smart layer transfer procedures similar to those shown in FIG. 4-FIG. 7, the stacked RGB LED structure shown in FIG. 8B is constructed. Various elements in FIG. 8B such as 806, 808, 809, 810, 816, 817, 818, 820, 821, and 822 have been described previously. 846 is a glass substrate, 844 is an ITO layer, 815 is a N-type confinement layer for a blue-green LED, 852 is an ITO layer, 805 is a N-type confinement layer for a red LED, 856 is an ITO layer, 858 is a reflecting material such as, for example, silver or aluminum, 864 is a nickel layer, 866 is a solder layer, 862 is a contact layer constructed of aluminum or some other metal, 860 may be preferably an air gap but could be an oxide layer and 868 is a silicon sub-mount. The configuration of optional reflectors 821 and 809 determines light produced by the LED. For the configuration shown in FIG. 8B, the preferred embodiment may not have the optional reflector 821 and may have the optional reflector 809 reflecting light produced by the blue and green quantum wells 816 and 817.

Figure 9:
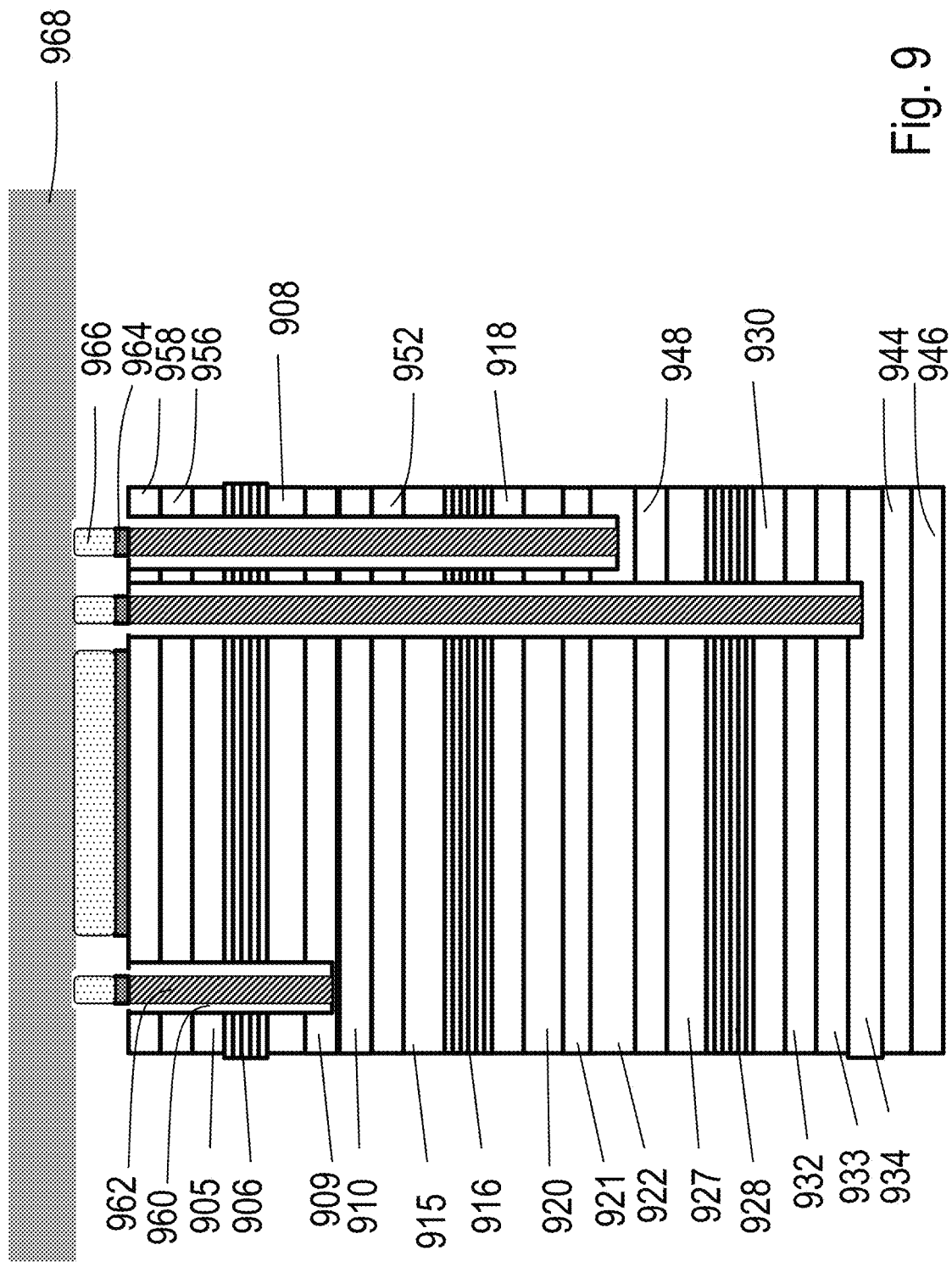
FIG. 9 illustrates an embodiment of this invention, where stacked RGB LEDs are formed with control and driver circuits for the LED built on the silicon sub-mount.

FIG. 9 illustrates an embodiment of this invention, where stacked RGB LEDs are formed with control and driver circuits for the LED built on the silicon sub-mount. Procedures similar to those described in FIG. 4-FIG. 7 are utilized for constructing and packaging the LED. Control and driver circuits are integrated on the silicon sub-mount 968 and can be used for controlling and driving the stacked RGB LED. 946 is a glass substrate, 944 and 934 are ITO layers, 933 is an optional reflector, 932 is a P-type confinement layer for a blue LED, 930 is a buffer layer for a blue LED, 928 is a blue multiple quantum well, 927 is a N-type confinement layer for a blue LED, 948 and 922 are ITO layers, 921 is an optional reflector, 920 is a P-type confinement layer for a green LED, 918 is a buffer layer for a green LED, 916 is a multiple quantum well for a green LED, 915 is a N-type confinement layer for a green LED, 952 and 910 are ITO layers, 909 is a reflector, 908 is a P-type confinement layer for a red LED, 906 is a red multiple quantum well, 905 is a N-type confinement layer for a red LED, 956 is an ITO layer, 958 is a reflecting layer such as aluminum or silver, 962 is a metal via constructed, for example, out of aluminum, 960 is an air-gap or an oxide layer, 964 is a nickel layer, and 966 is a solder bump.

FIG. 10 illustrates an embodiment of this invention, where stacked RGB LEDs are formed with control and driver circuits as well as image sensors for the LED built on the silicon sub-mount 1068. Image sensors essentially monitor the light coming out of the LED and tune the voltage and current given by control and driver circuits such that light output of the LED is the right color and intensity. 1046 is a glass substrate, 1044 and 1034 are ITO layers, 1033 is an optional reflector, 1032 is a P-type confinement layer for a blue LED, 1030 is a buffer layer for a blue LED, 1028 is a blue multiple quantum well, 1027 is a N-type confinement layer for a blue LED, 1048 and 1022 are ITO layers, 1021 is an optional reflector, 1020 is a P-type confinement layer for a green LED, 1018 is a buffer layer for a green LED, 1016 is a multiple quantum well for a green LED, 1015 is a N-type confinement layer for a green LED, 1052 and 1010 are ITO layers, 1009 is a reflector, 1008 is a P-type confinement layer for a red LED, 1006 is a red multiple quantum well, 1005 is a N-type confinement layer for a red LED, 1056 is an ITO layer, 1058 is a reflecting layer such as aluminum or silver, 1062 is a metal via constructed for example out of aluminum, an air-gap or an oxide layer between silicon sub-mount 1068 and reflecting layer 1058, 1064 is a nickel layer and 1066 is a solder bump. The via hole 1074 helps transfer light produced by the blue multiple quantum well 1028 reach an image sensor on the silicon sub-mount 1068. The via hole 1072 helps transfer light produced by the green multiple quantum well 1016 to an image sensor on the silicon sub-mount 1068. The via hole 1070 helps transfer light produced by the red multiple quantum well 1006 reach an image sensor on the silicon sub-mount 1068. By sampling the light produced by each of the quantum wells on the LED, voltage and current drive levels to different terminals of the LED can be determined. Color tunability, temperature compensation, better color stability, and many other features can be obtained with this scheme. Furthermore, circuits to communicate wirelessly with the LED can be constructed on the silicon sub-mount. Light output of the LED can be modulated by a signal from the user delivered wirelessly to the light.

While three LED layers, namely, red, green, and blue, are shown as stacked in various embodiments of this invention, it will be clear to one skilled in the art based on the present disclosure that more than three LED layers can also be stacked. For example, red, green, blue and yellow LED layers can be stacked.

The embodiments of this invention described in FIG. 4-FIG. 10 share a few common features. They have multiple stacked (or overlying) layers, they are constructed using smart layer transfer techniques and at least one of the stacked layers has a thickness less than 50 microns. When cleave is done using ion-cut, substrate layers that are removed using cleave can be reused after a process flow that often includes a CMP.

Figure 11A:
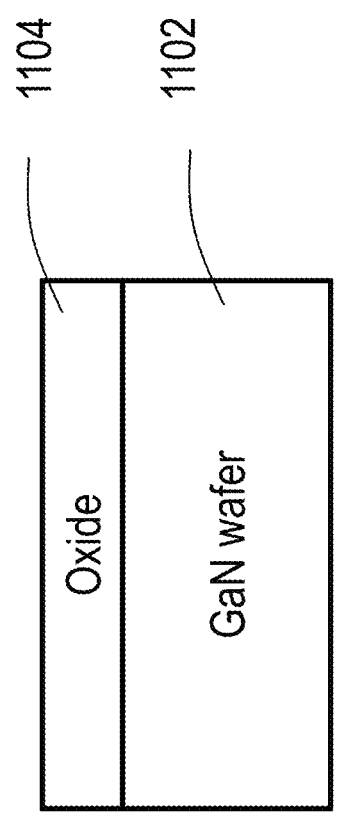
FIGS. 11A-F is a prior art illustration of pcLEDs constructed with ion-cut processes.
Figure 11B:
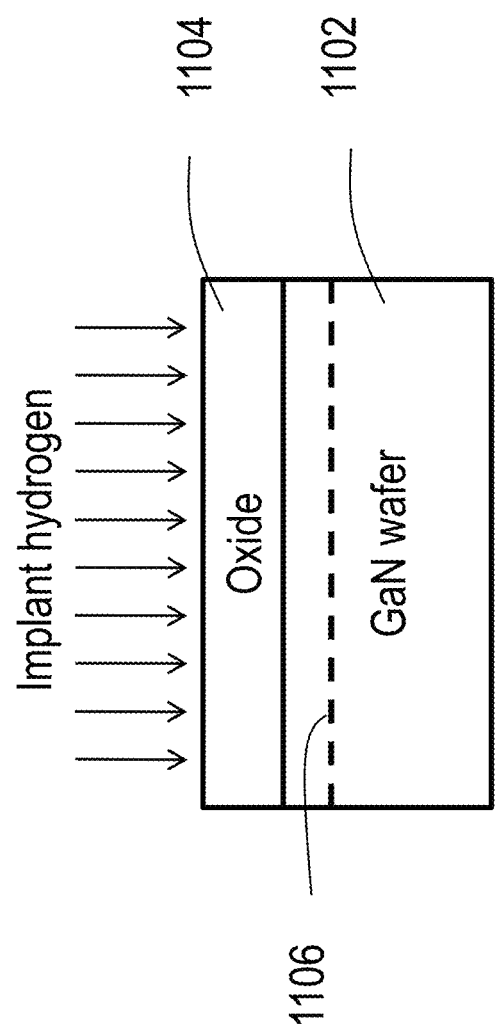
Figure 11C:
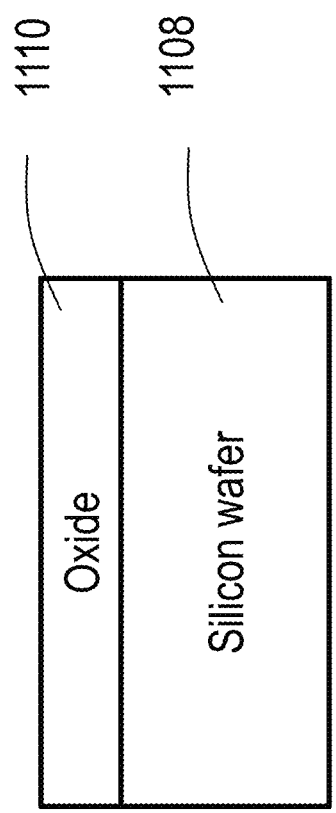
Figure 11D:
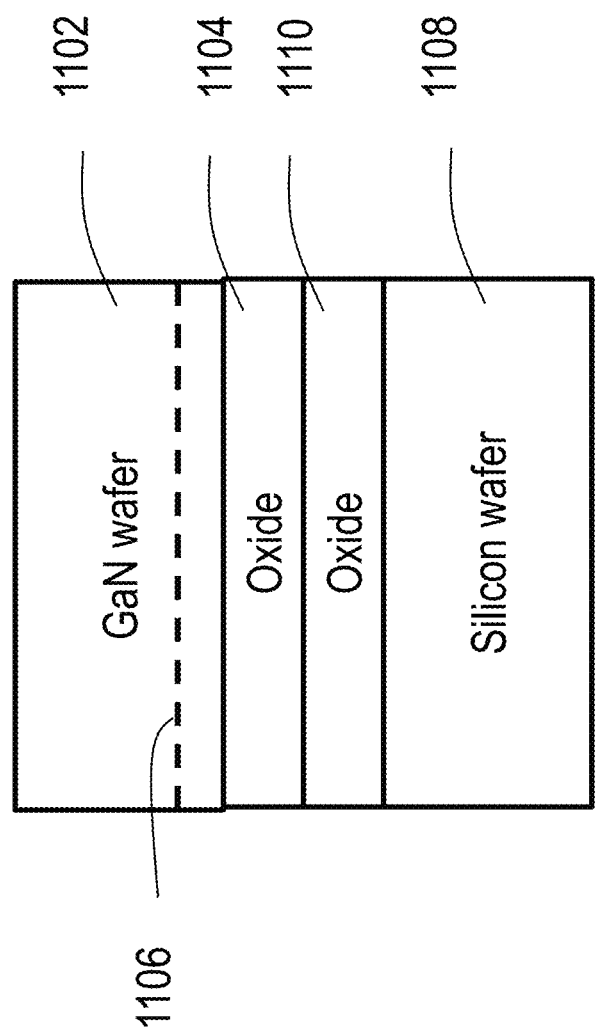
Figure 11E:
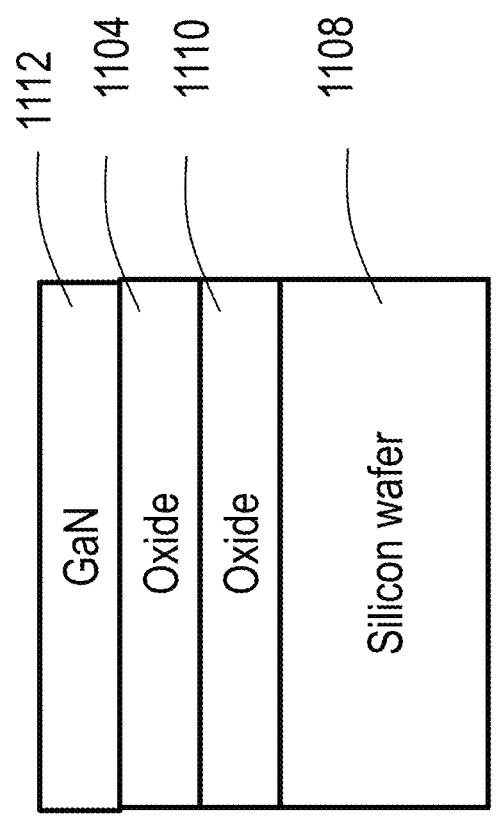
Figure 11F:
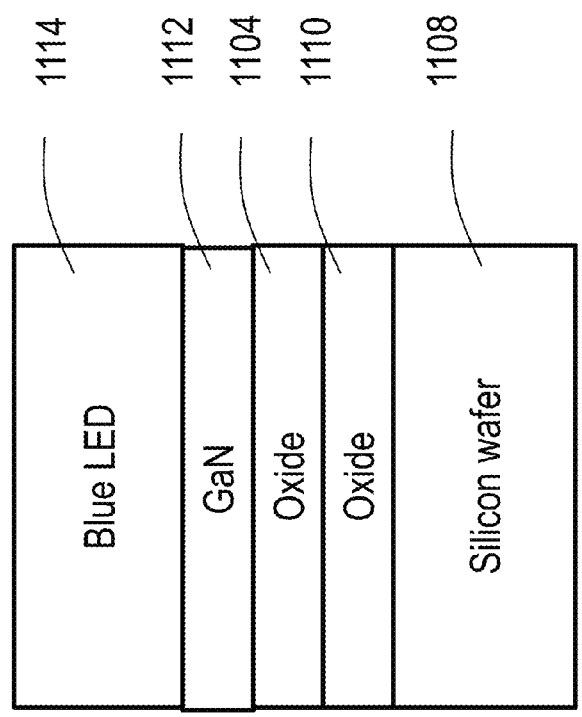

FIGS. 11A-F show a prior art illustration of phosphor-coated LEDs (pcLEDs) constructed with ion-cut processes. The process begins in FIG. 11A with a bulk-GaN substrate 1102, and an oxide layer 1104 is deposited atop it. The oxide layer 1104 is an oxide compatible with GaN. FIG. 11B depicts hydrogen being implanted into the structure shown in FIG. 11A at a certain depth (for ion-cut purposes). 1102 and 1104 have been described previously with respect to FIG. 11A. Dotted lines 1106 indicate the plane of hydrogen ions. Alternatively, helium can be implanted instead of hydrogen or hydrogen and helium can be co-implanted. FIG. 11C shows a silicon wafer 1108 with an oxide layer 1110 atop it. The structure shown in FIG. 11B is flipped and bonded atop the structure shown in FIG. 11C using oxide-to-oxide bonding of layers 1104 and 1110. This is depicted in FIG. 11D. 1108, 1110 and 1106 have been described previously. FIG. 11E shows the next step in the process. Using an anneal, a cleave is conducted at the plane of hydrogen atoms 1106 shown in FIG. 11D, and a CMP is done to form GaN layer 1112. 1104, 1110 and 1108 have been described previously. FIG. 11F shows the following step in the process. A blue LED 1114 is grown epitaxially above the GaN layer 1112. 1104, 1108 and 1110 have been described previously. A phosphor layer can be coated atop the blue LED 1114 to form a white phosphor coated LED.

There may be some severe challenges with the prior art process shown in FIGS. 11A-F. The thermal expansion coefficients for GaN layers 1112 in FIG. 11F are very different from that for silicon layers 1108. This difference can cause cracks and defects while growing the blue LED layer 1114 at high temperatures (>600° C.), which usually occurs. These cracks and defects, in turn, cause bad efficiency and can in turn cause the phosphor coated LED process in FIG. 11A-F to be difficult to manufacture. Furthermore, an anneal (typically >400° C.) is typically used in FIG. 11E to cleave the bulk GaN layers. This can again cause issues with mismatch of thermal expansion co-efficients and cause cracking and defects.

Figure 12A:
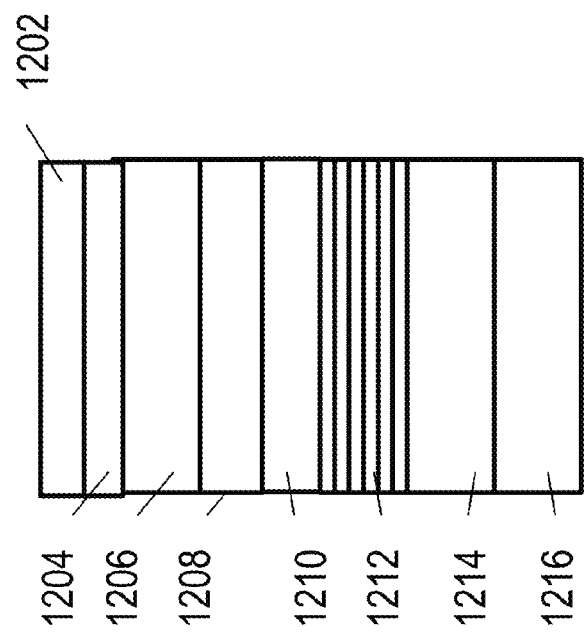
FIGS. 12A-F illustrate an embodiment of this invention, where pcLEDs are constructed with ion-cut processes.

FIGS. 12A-F describe an embodiment of this invention, where phosphor coated LEDs are formed with an ion-cut process (i.e. a smart layer transfer process). It minimizes the problem with mismatch of thermal expansion co-efficients that is inherent to the process described in FIGS. 11A-F. This process could include several steps as described in the following sequence:

Step (A): FIG. 12A illustrates this step. A blue LED wafer is constructed on a bulk-GaN substrate 1216. For discussions within this document, the bulk-GaN substrate could be semi-polar or non-polar or polar. The blue LED wafer includes a N-type confinement layer 1214, a multiple quantum well (MQW) 1212, a buffer layer 1210, a P-type confinement layer 1208, an optional reflector 1204 and an ITO current spreader 1206. Examples of materials used to construct these blue LED layers, include, but are not limited to, doped GaN for the N-type and P-type confinement layers 1214 and 1208, AlGaN for the buffer layer 1210 and InGaN/GaN for the multiple quantum wells 1212. The optional reflector 1204 could be distributed Bragg Reflector, an Aluminum or silver layer or some other type of reflectors. A silicon dioxide layer 1202 is deposited atop the optional reflector 1204.

Figure 12B:
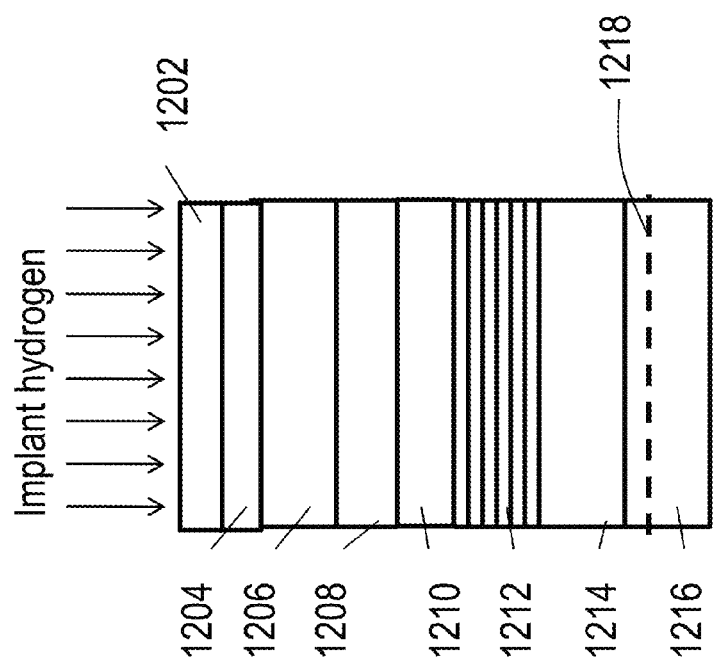

Step (B): FIG. 12B illustrates this step. The blue LED wafer described in FIG. 12A has hydrogen implanted into it at a certain depth. The dotted lines 1218 depict the hydrogen implant. Alternatively, helium can be implanted. Various elements in FIG. 12B such as 1216, 1214, 1212, 1210, 1208, 1206, 1204, and 1202 have been described previously.

Figure 12C:
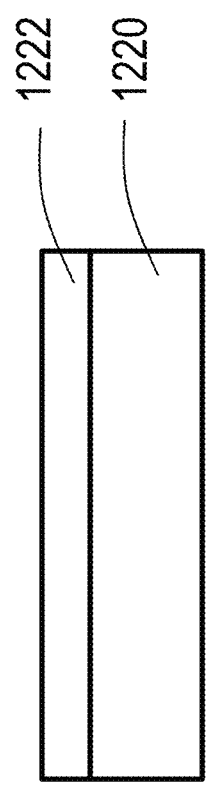

Step (C): FIG. 12C illustrates this step. A wafer 1220, preferably of silicon, having the same wafer size as the structure in FIG. 12B is taken and an oxide layer 1222 is grown or deposited atop it.

Figure 12D:
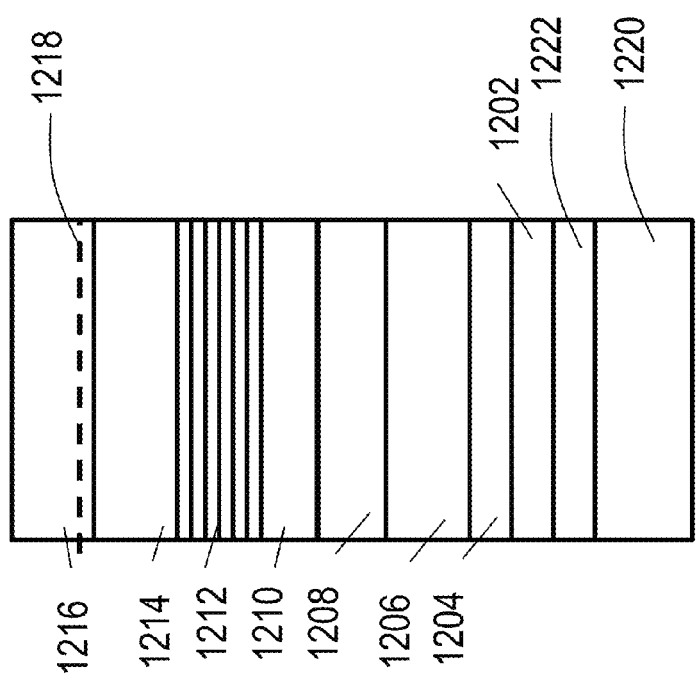

Step (D): FIG. 12D illustrates this step. The structure shown in FIG. 12B is flipped and bonded atop the structure shown in FIG. 12C using oxide-to-oxide bonding of layers 1202 and 1222. Various elements in FIG. 12D such as 1216, 1214, 1212, 1210, 1208, 1206, 1204, 1220, 1222, 1218 and 1202 have been described previously.

Figure 12E:
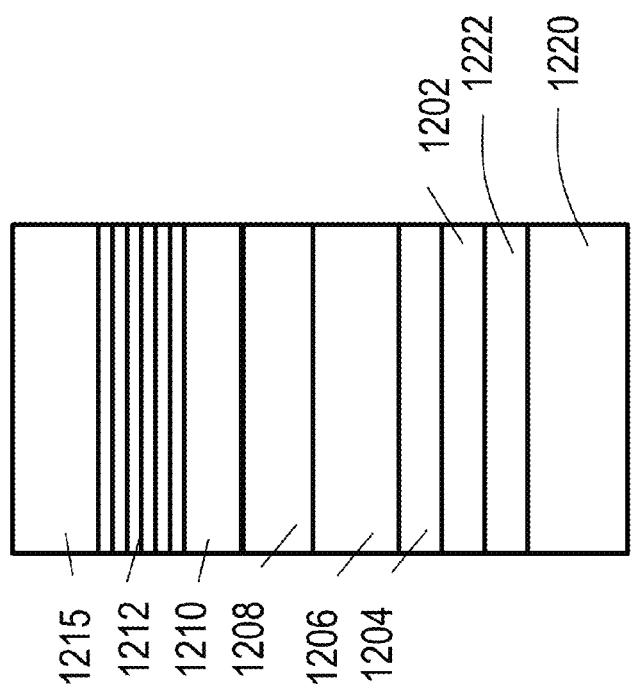

Step (E): FIG. 12E illustrates this step. The structure shown in FIG. 12D is cleaved at its hydrogen plane 1218. A mechanical cleave may be preferably used for this process. However, an anneal could be used as well. The mechanical cleave process typically happens at room temperatures, and therefore can avoid issues with thermal expansion co-efficients mismatch. After cleave, the wafer is planarized and the N-type confinement layer 1215 is formed. Various elements in FIG. 12E such as 1212, 1210, 1208, 1206, 1204, 1220, 1222, and 1202 have been described previously. The bulk GaN substrate 1216 from FIG. 12D that has been cleaved away can be reused. This may be attractive from a cost perspective, since bulk GaN substrates are quite costly.

Figure 12F:
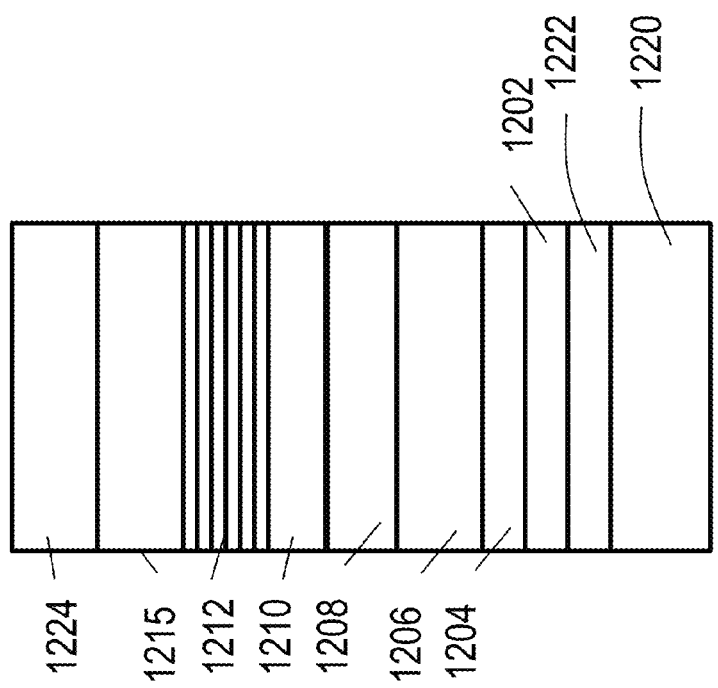

Step (F): This is illustrated in FIG. 12F. An ITO layer 1224 is deposited atop the structure shown in FIG. 12E. Various elements in FIG. 12F such as 1212, 1210, 1208, 1206, 1204, 1220, 1222, 1215, 1224, and 1202 have been described previously.

A phosphor coating can be applied over the structure shown in FIG. 12F to produce a phosphor-coated LED. The advantage of the process shown in FIG. 12A-F over the process shown in FIG. 11A-F may include low process temperatures, even less than 250° C. Therefore, issues with thermal expansion co-efficients mismatch are substantially mitigated. While the description in FIG. 12A-F is for a LED, many other devices, such as, for example, laser diodes, high power transistors, high frequencies transistors, special transmitter circuits and many other devices can be constructed, according to a similar description, with bulk-GaN.

In the description of FIG. 12A-F, silicon is described as a preferred material for the substrate 1220. Silicon has a co-efficient of thermal expansion of about 2.6 ppm/° C., while bulk-GaN, which is the substrate 1216 on which the LED is epitaxially grown, has a co-efficient of thermal expansion of 5.6 ppm/° C. In an alternate embodiment of this invention, the substrate 1220 used in FIG. 12A-F could be constructed of a material that has a co-efficient of thermal expansion (CTE) fairly close to bulk-GaN. Preferably, the CTE of the substrate 1220 could be any value in between (the CTE of bulk GaN −2 ppm/° C.) and (the CTE of bulk GaN+2 ppm/° C.). Examples of materials that could be used for the substrate 1220 could include, but are not limited to, Germanium, that has a CTE of 5.8 ppm/° C., and various ceramic materials. Having CTE for the substrate 1220 close to bulk-GaN prevents defects and cracks being formed due to issues with mismatch of CTE, even if higher temperature processing (>250° C.) is used.

In an alternative embodiment of this invention, the flow in FIG. 11A-F can be used with the substrate 1108 having a CTE fairly close to the CTE of bulk GaN. Preferably, the CTE of the substrate 1108 could be any value in between (the CTE of bulk GaN −2 ppm/° C.) and (the CTE of bulk GaN+2 ppm/° C.). Examples of materials that could be used for the substrate 1108 could include, but are not limited to, Germanium, that has a CTE of 5.8 ppm/° C., and various ceramic materials.

NuImager Technology:

Layer transfer technology can also be advantageously utilized for constructing image sensors. Image sensors typically include photodetectors on each pixel to convert light energy to electrical signals. These electrical signals are sensed, amplified and stored as digital signals using transistor circuits.

Figure 13:
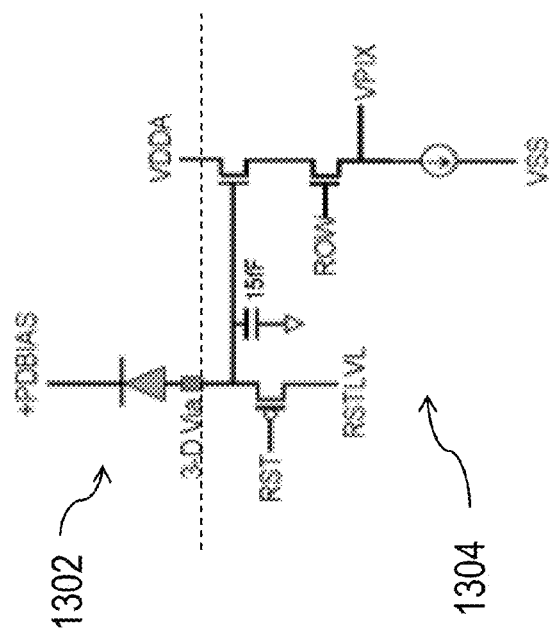
FIG. 13 illustrates a prior art image sensor stacking technology where connections between chips are aligned during bonding.

FIG. 13 shows prior art where through-silicon via (TSV) technology is utilized to connect photodetectors 1302 on one layer (tier) of silicon to transistor read-out circuits 1304 on another layer (tier) of silicon. Unfortunately, pixel sizes in today's image sensors are 1.1 μm or so. It is difficult to get through-silicon vias with size <1 μm due to alignment problems, leading to a diminished ability to utilize through-silicon via technology for future image sensors. In FIG. 13, essentially, transistors can be made for read-out circuits in one wafer, photodetectors can be made on another wafer, and then these wafers can be bonded together with connections made with through-silicon vias.

Figure 14:
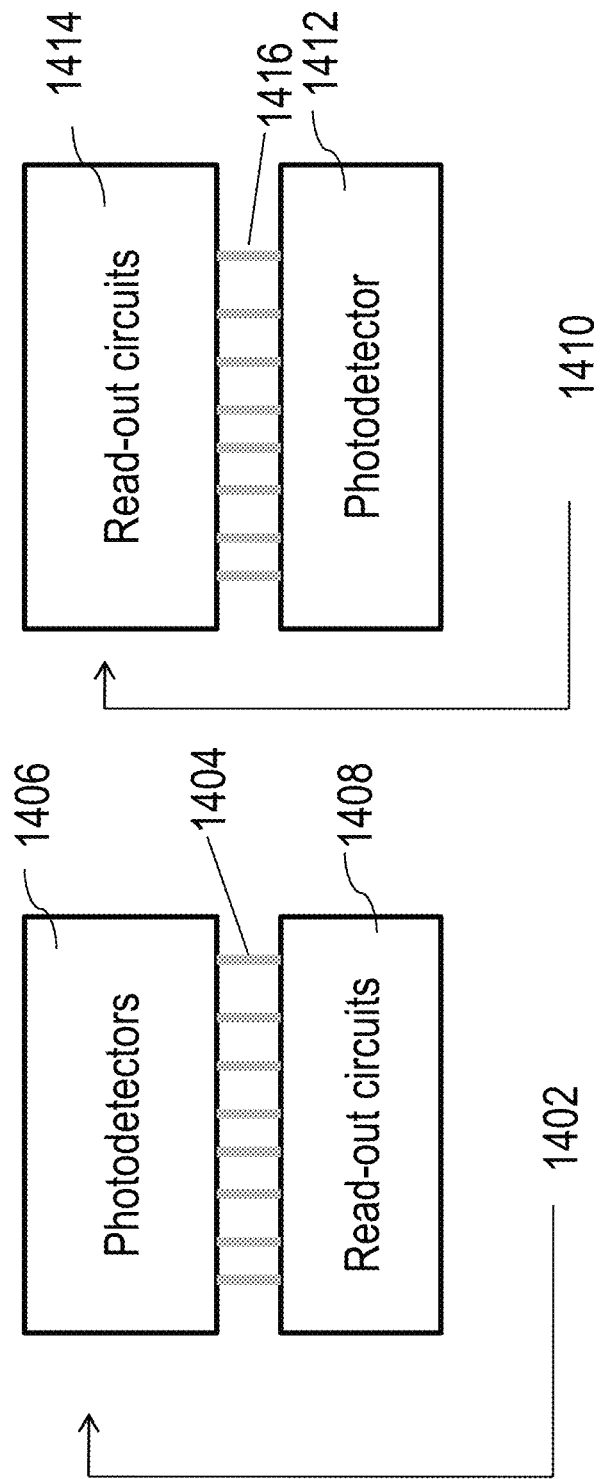
FIG. 14 describes two configurations for stacking photo-detectors and read-out circuits.

FIGS. 14-21 describe some embodiments of this invention, where photodetector and read-out circuits are stacked monolithically with layer transfer. FIG. 14 shows two configurations for stacking photodetectors and read-out circuits. In one configuration, denoted as 1402, a photodetector layer 1406 may be formed above read-out circuit layer 1408 with connections 1404 between these two layers. In another configuration, denoted as 1410, photodetectors 1412 may have read-out circuits 1414 formed above them, with connections 1416 between these two layers.

FIGS. 15A-H describe an embodiment of this invention, where an image sensor includes a photodetector layer formed atop a read-out circuit layer using layer transfer. In this document, the photodetector layer is denoted as a p-n junction layer. However, any type of photodetector layer, such as a pin layer or some other type of photodetector can be used. The thickness of the photodetector layer is typically less than 5 μm. The process of forming the image sensor could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 15A:
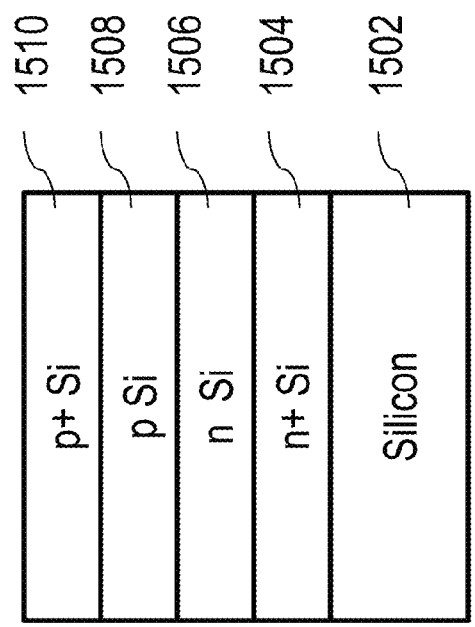
FIGS. 15A-H illustrate an embodiment of this invention, where a CMOS image sensor is formed by stacking a photo-detector monolithically on top of read-out circuits using ion-cut technology.

Step (A) is illustrated in FIG. 15A. A silicon wafer 1502 may be taken and a n+ Silicon layer 1504 may be formed by ion implantion. Following this, n layer 1506, p layer 1508 and p+ layer 1510 may be formed epitaxially. It will be appreciated by one skilled in the art based on the present disclosure that there are various other procedures to form the structure shown in FIG. 15A. An anneal may then be performed to activate dopants in the various layers.

Figure 15B:
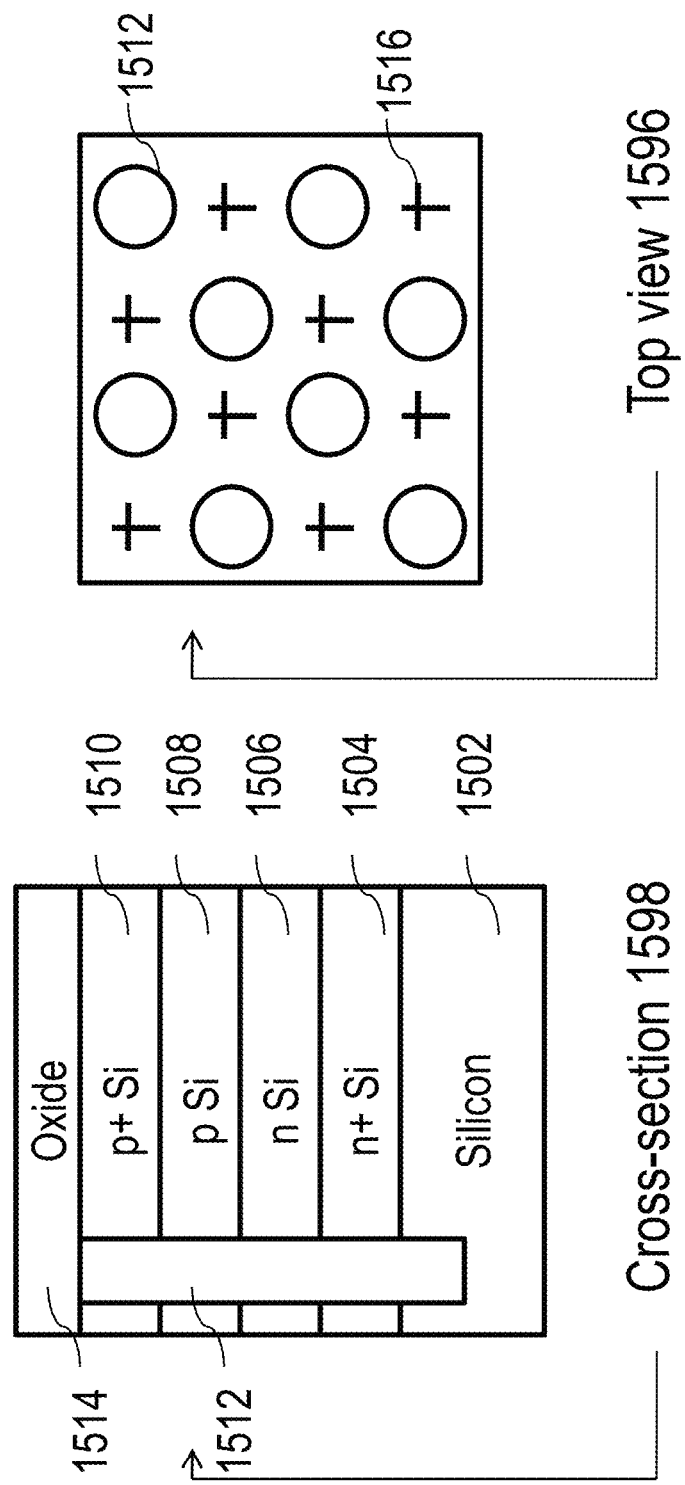

Step (B) is illustrated in FIG. 15B. Various elements in FIG. 15B such as 1502, 1504, 1506, 1508 and 1510 have been described previously. Using lithography and etch, a via may be etched into the structure shown in FIG. 15A, then may be filled with oxide and then polished with CMP. The regions formed are the oxide filled via 1512 and the oxide layer 1514. The oxide filled via 1512 may also be referred to as an oxide via or an oxide window region or oxide aperture. A cross-section of the structure is indicated by 1598 and a top view is indicated by 1596. 1516 indicates alignment marks and the oxide filled via 1512 may be formed in place of some of the alignment marks printed on the wafer.

Figure 15C:
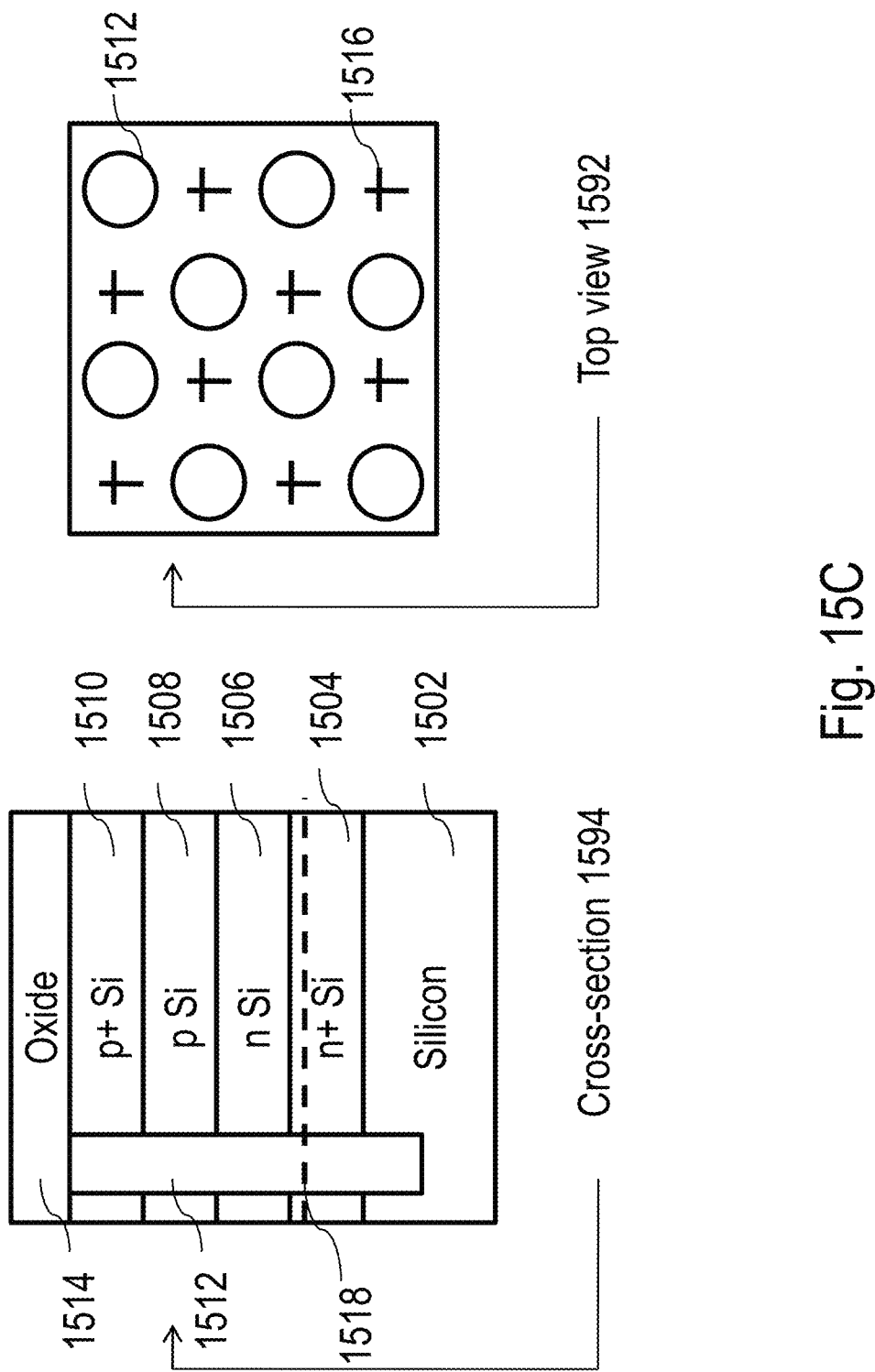

Step (C) is illustrated in FIG. 15C. Various elements in FIG. 15C such as 1502, 1504, 1506, 1508, 1510, 1512, 1514, and 1516 have been described previously. Hydrogen may be implanted into the structure indicated in FIG. 15B at a certain depth indicated by dotted lines 1518 of FIG. 15C. Alternatively, Helium can be used as the implanted species. A cross-sectional view 1594 and a top view 1592 are shown.

Figure 15D:
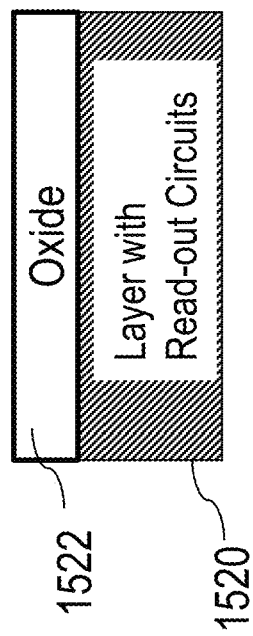

Step (D) is illustrated in FIG. 15D. A silicon wafer 1520 with read-out circuits (which includes wiring) processed on it is taken, and an oxide layer 1522 may be deposited above it.

Figure 15E:
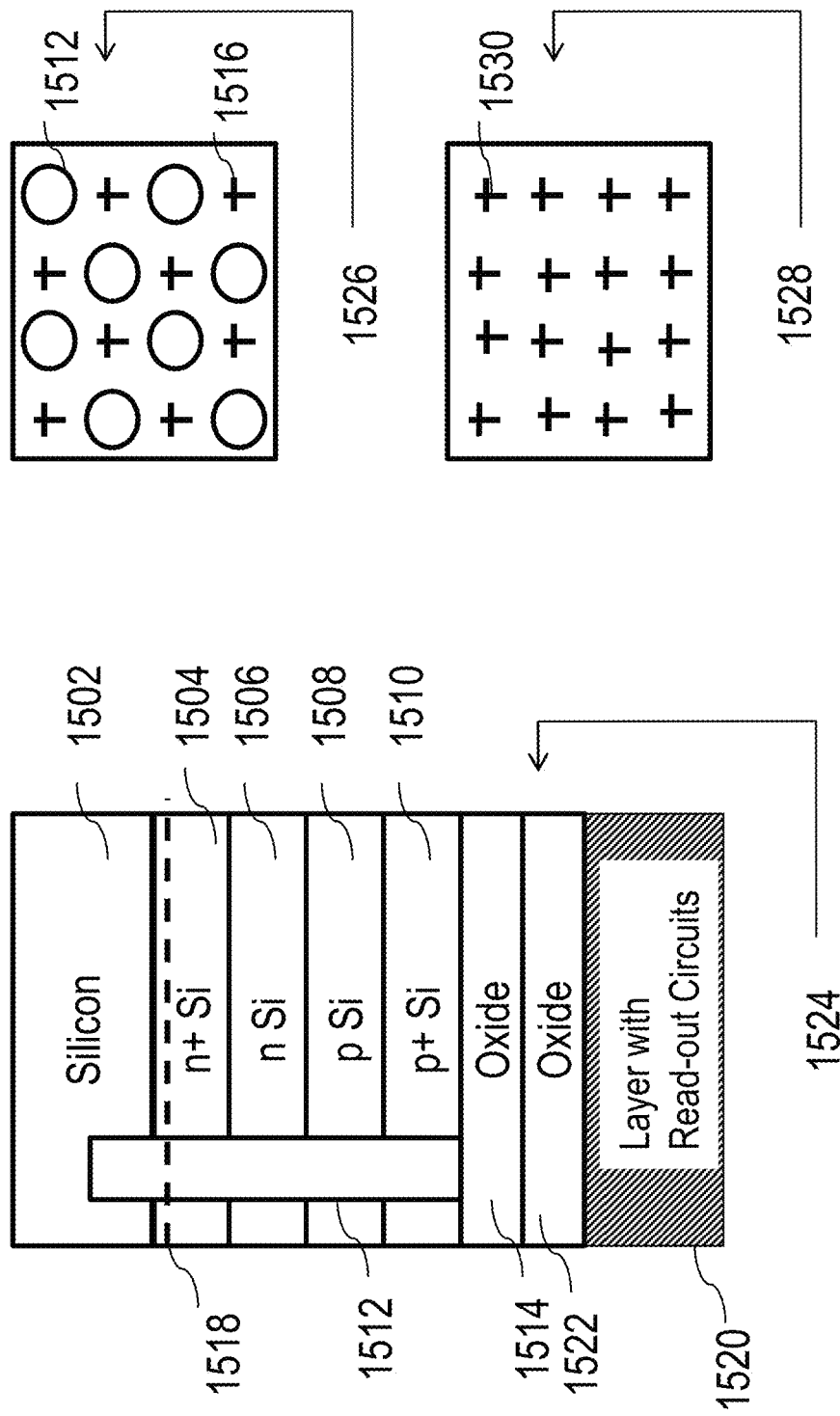

Step (E) is illustrated in FIG. 15E. The structure shown in FIG. 15C is flipped and bonded to the structure shown in FIG. 15D using oxide-to-oxide bonding of oxide layers 1514 and 1522. During this bonding procedure, alignment may be done such that oxide vias 1512 (shown in the top view 1526 of the photodetector wafer) are above alignment marks (such as 1530) on the top view 1528 of the read-out circuit wafer. A cross-sectional view of the structure is shown with 1524. Various elements in FIG. 15E such as 1502, 1504, 1506, 1508, 1510, 1512, 1514, 1516, 1518, 1520, and 1522 have been described previously.

Figure 15F:
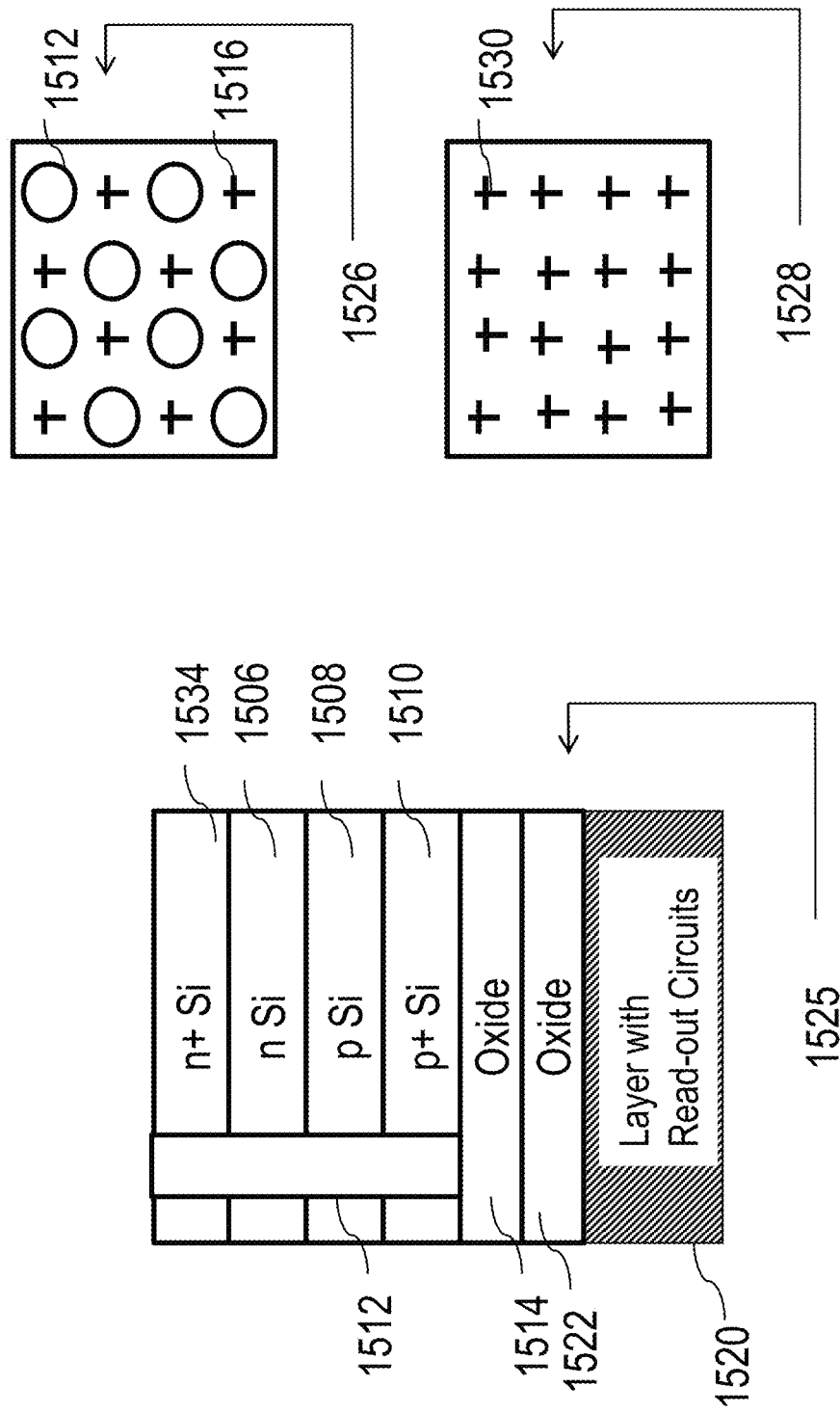

Step (F) is illustrated in FIG. 15F. The structure shown in FIG. 15E may be cleaved at its hydrogen plane 1518 preferably using a mechanical process. Alternatively, an anneal could be used for this purpose. A CMP process may be then done to planarize the surface resulting in a final n+ silicon layer indicated as 1534. 1525 depicts a cross-sectional view of the structure after the cleave and CMP process. Various elements in FIG. 15F such as 1506, 1508, 1510, 1512, 1514, 1516, 1520, 1526, 1530, 1528, 1530 and 1522 have been described previously.

Figure 15G:
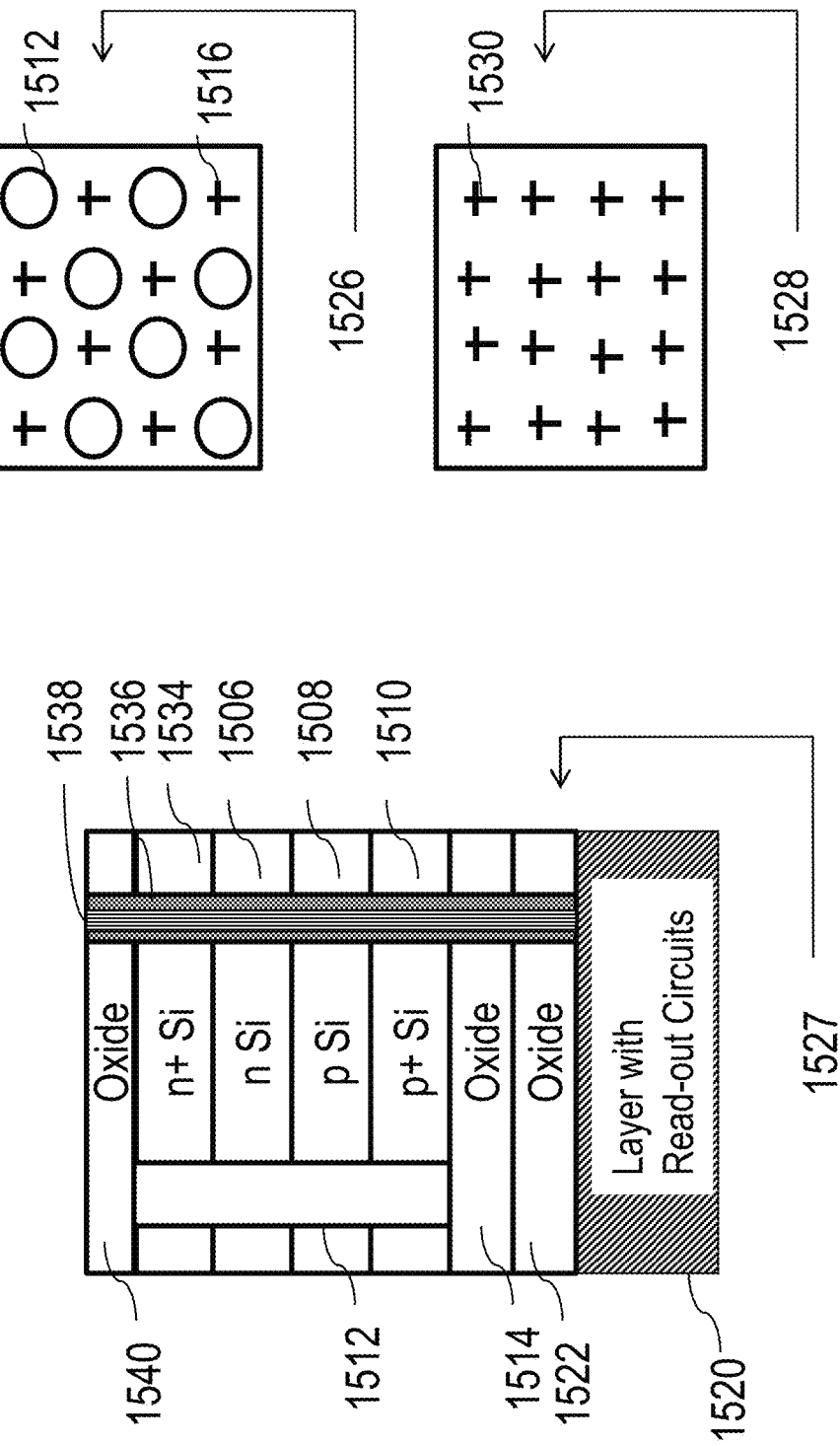
Figure 15H:
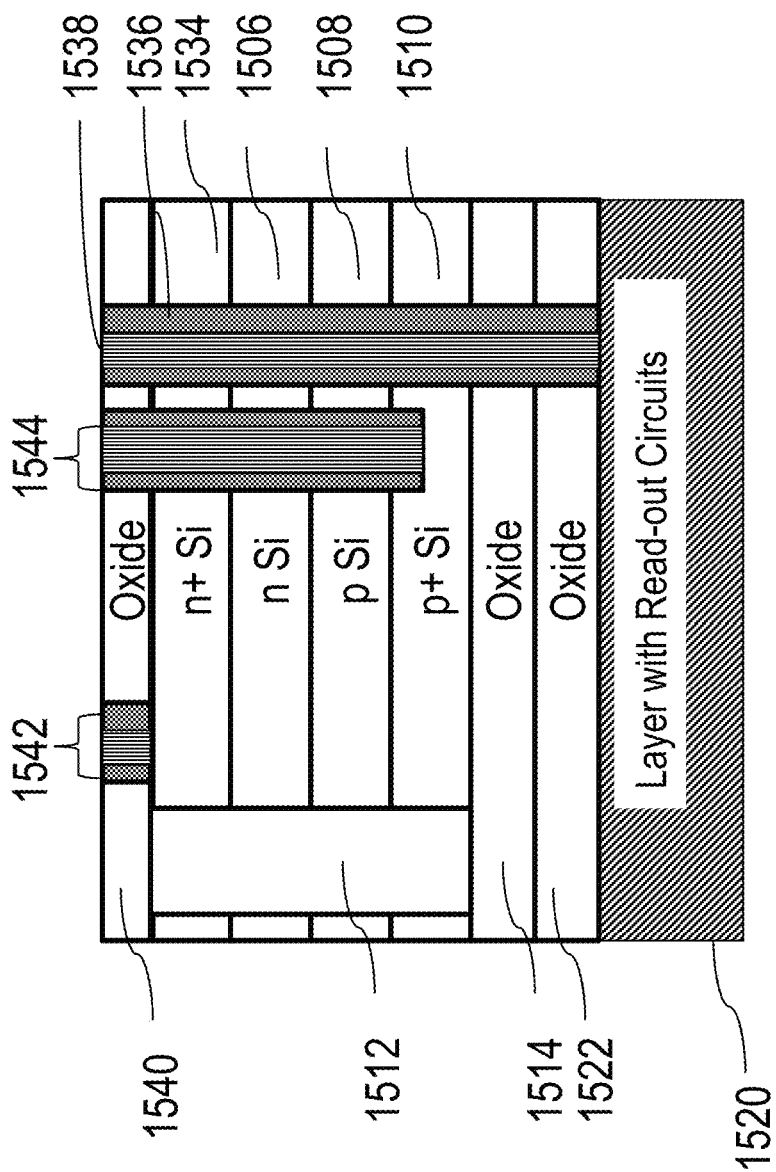
Figure 16:
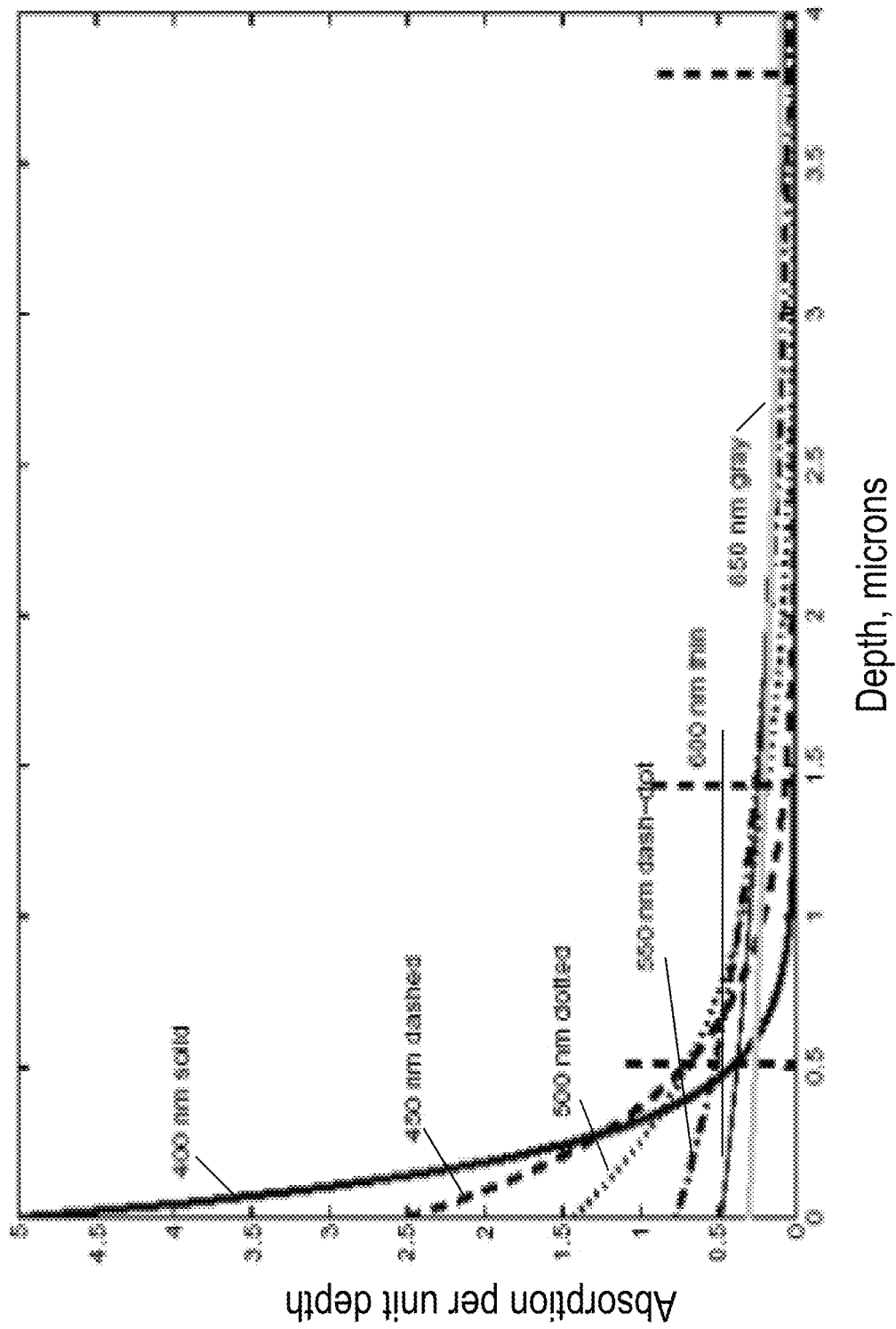
FIG. 16 illustrates the absorption process of different wavelengths of light at different depths in silicon image sensors.

Step (G) is illustrated using FIG. 15G. Various elements in FIG. 15G such as 1506, 1508, 1510, 1512, 1514, 1516, 1520, 1526, 1530, 1528, 1530, 1534 and 1522 have been described previously. An oxide layer 1540 may be deposited. Connections between the photodetector and read-out circuit wafers may be formed with metal 1538 and an insulator covering 1536. These connections may be formed well aligned to the read-out circuit layer 1520 by aligning to alignment marks 1530 on the read-out circuit layer 1520 through oxide vias 1512. 1527 depicts a cross-sectional view of the structure. Step (H) is illustrated in FIG. 15H. Connections are made to the terminals of the photodetector and are indicated as 1542 and 1544. Various elements of FIG. 15H such as 1520, 1522, 1512, 1514, 1510, 1508, 1506, 1534, 1536, 1538, 1540, 1542, and 1544 have been described previously. Contacts and interconnects for connecting terminals of the photodetector to read-out circuits may then be done, following which a packaging process is conducted.

FIGS. 15A-G show a process where oxide vias may be used to look through photodetector layers to observe alignment marks on the read-out circuit wafer below it. However, if the thickness of the silicon on the photodetector layer is <100-400 nm, the silicon wafer is thin enough that one can look through it without requiring oxide vias. A process similar to FIG. 15A-G where the silicon thickness for the photodetector is <100-400 nm represents another embodiment of this invention. In that embodiment, oxide vias may not be constructed and one could look right through the photodetector layer to observe alignment marks of the read-out circuit layer. This may help making well-aligned through-silicon connections between various layers.

As mentioned previously, FIGS. 15A-G illustrate a process where oxide vias constructed before layer transfer are used to look through photodetector layers to observe alignment marks on the read-out circuit wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme are formed. This order of sequences may enable observation of alignment marks on the bottom read-out circuit wafer by looking through the photodetector wafer.

While Silicon has been suggested as the material for the photodetector layer of FIG. 15A-G, Germanium could be used in an alternative embodiment. The advantage of Germanium is that it is sensitive to infra-red wavelengths as well. However, Germanium also suffers from high dark current.

While FIG. 15A-G described a single p-n junction as the photodetector, it will be obvious to one skilled in the art based on the present disclosure that multiple p-n junctions can be formed one on top of each other, as described in "Color Separation in an Active Pixel Cell Imaging Array Using a Triple-Well Structure," U.S. Pat. No. 5,965,875, 1999 by R. Merrill and in "Trends in CMOS Image Sensor Technology and Design," International Electron Devices Meeting Digest of Technical Papers, 2002 by A. El-Gamal. This concept relies on the fact that different wavelengths of light penetrate to different thicknesses of silicon, as described in FIG. 16. It can be observed in FIG. 16 that near the surface 400 nm wavelength light has much higher absorption per unit depth than 450 nm-650 nm wavelength light. On the other hand, at a depth of 0.5 µm, 500 nm light has a higher absorption per unit depth than 400 nm light. An advantage of this approach is that one does not require separate filters (and area) for green, red and blue light; all these different colors/wavelengths of light can be detected with different p-n junctions stacked atop each other. So, the net area required for detecting three different colors of light is reduced, leading to an improvement of resolution.

Figure 17A:
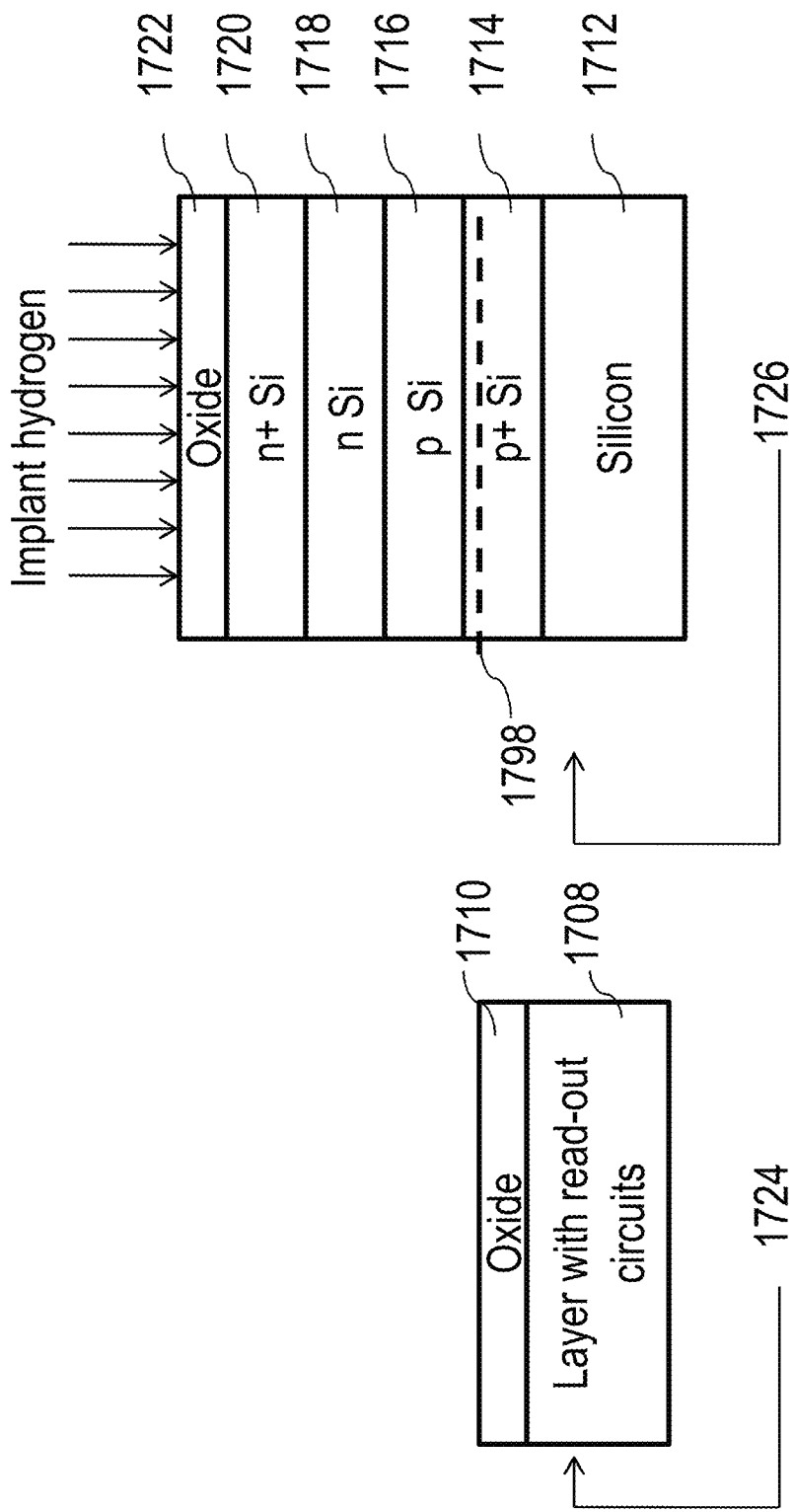
FIGS. 17A-B illustrate an embodiment of this invention, where red, green and blue photodetectors are stacked monolithically atop read-out circuits using ion-cut technology (for an image sensor)
Figure 17B:
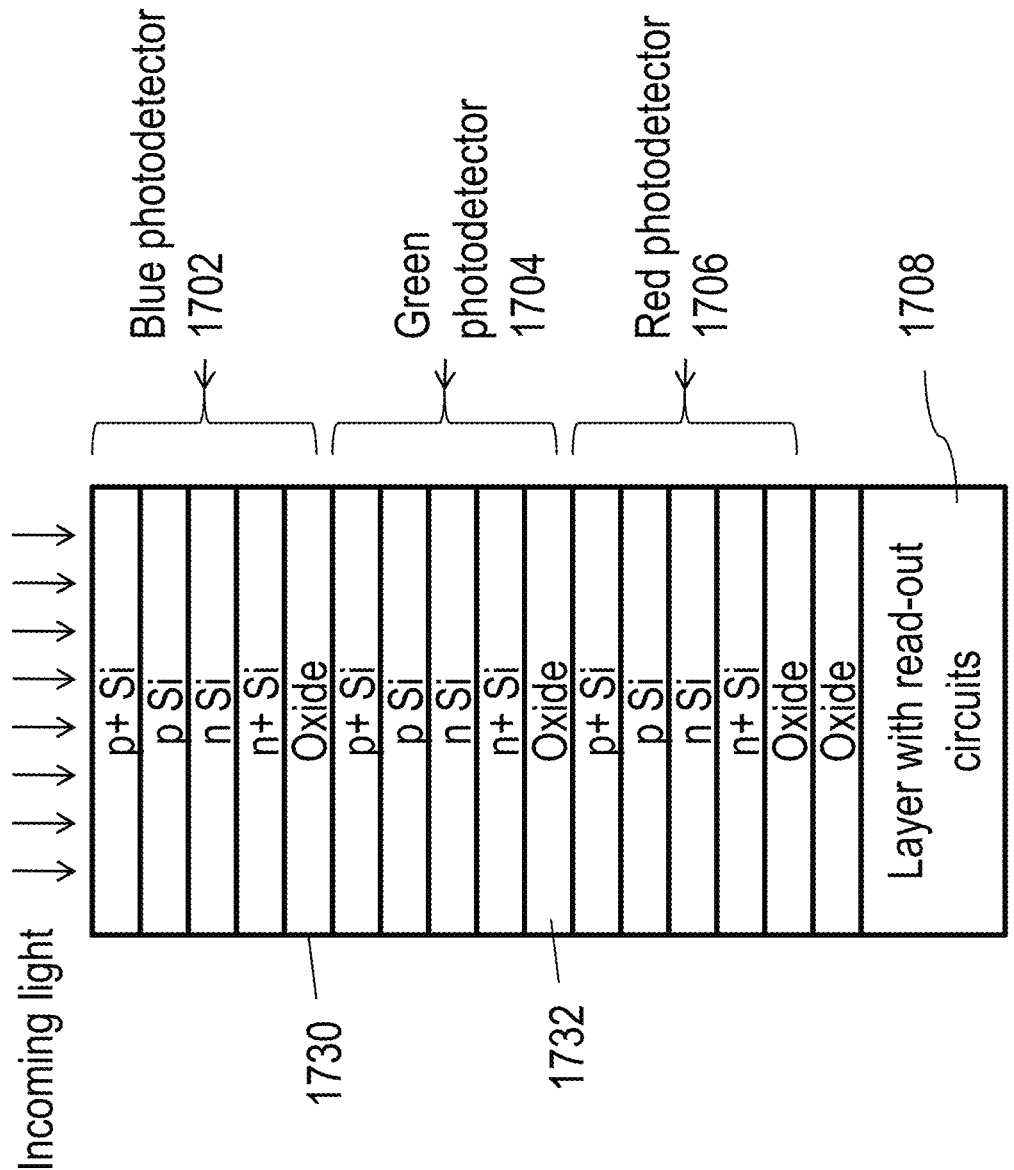

FIGS. 17A-B illustrate an embodiment of this invention, where red, green, and blue photodetectors are stacked monolithically atop read-out circuits using ion-cut technology (for an image sensor). Therefore, a smart layer transfer technique is utilized. FIG. 17A shows the first step for constructing this image sensor. 1724 shows a cross-sectional view of 1708, a silicon wafer with read-out circuits constructed on it, above which an oxide layer 1710 is deposited. 1726 shows the cross-sectional view of another wafer which may include silicon substrate 1712, a p+ Silicon layer 1714, a p Silicon layer 1716, a n Silicon layer 1718, a n+ Silicon layer 1720, and an oxide layer 1722. These layers may be formed using procedures similar to those described in FIG. 15A-G. An anneal may then be performed to activate dopants in various layers. Hydrogen may be implanted in the wafer at a certain depth depicted by 1798, shown as dashed line. FIG. 17B shows the structure of the image sensor before contact formation. Three layers of p+pnn+ silicon (each corresponding to a color band and similar to the one depicted in 1726 in FIG. 17A) are layer transferred sequentially atop the silicon wafer with read-out circuits (depicted by 1724 in FIG. 17A). Three different layer transfer steps may be used for this purpose. Procedures for layer transfer and alignment for forming the image sensor in FIG. 17B are similar to procedures used for constructing the image sensor shown in FIGS. 15A-G. Each of the three layers of p+pnn+ silicon senses a different wavelength of light. For example, blue light is detected by blue photodetector 1702, green light is detected by green photodetector 1704, and red light is detected by red photodetector 1706. Contacts, metallization, packaging and other steps are done to the structure shown in FIG. 17B to form an image sensor. The oxides 1730 and 1732 could be either transparent conducting oxides or silicon dioxide. Use of transparent conducting oxides could allow fewer contacts to be formed.

Figure 18A:
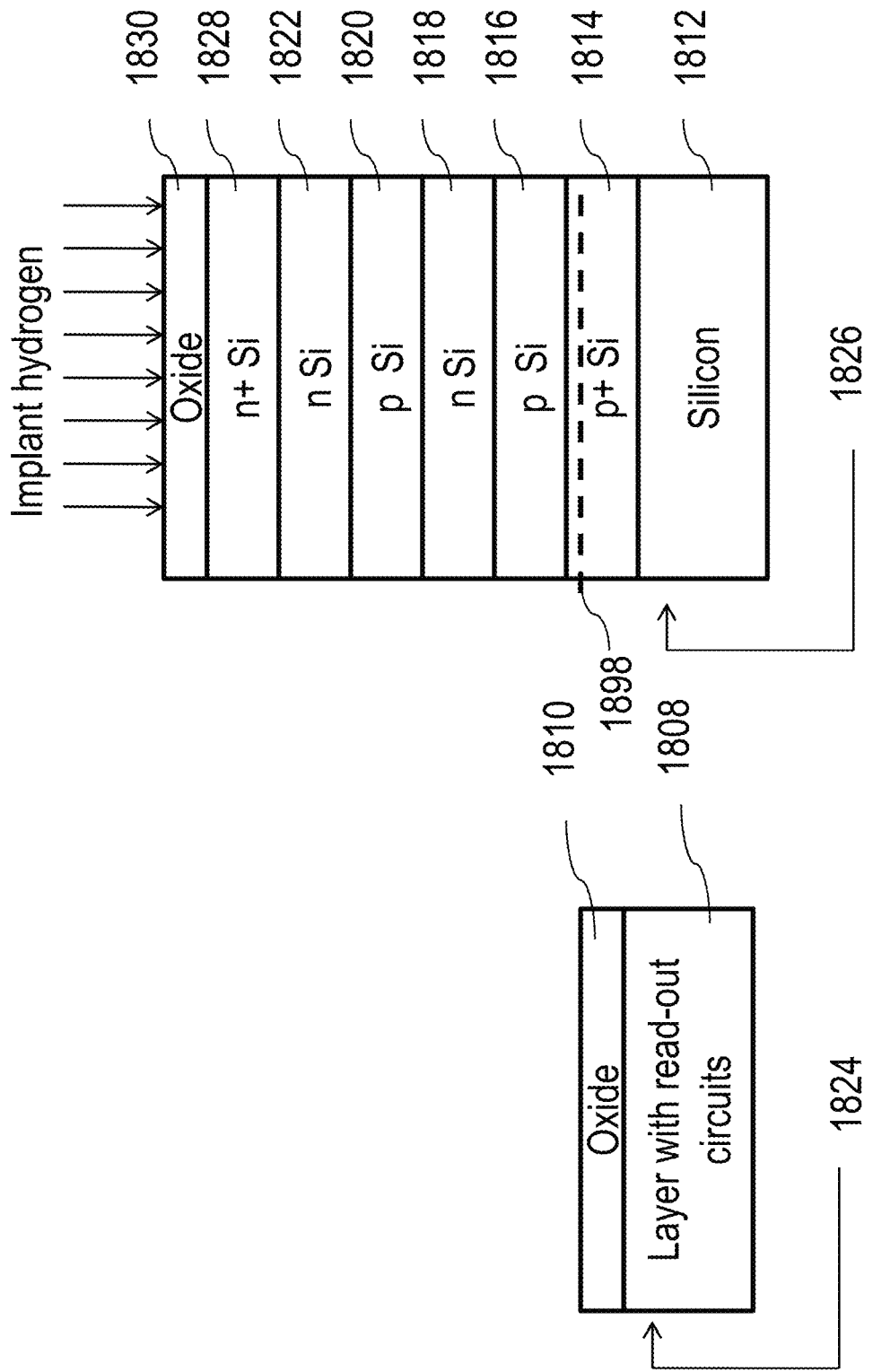
FIGS. 18A-B illustrate an embodiment of this invention, where red, green and blue photodetectors are stacked monolithically atop read-out circuits using ion-cut technology for a different configuration (for an image sensor)
Figure 18B:
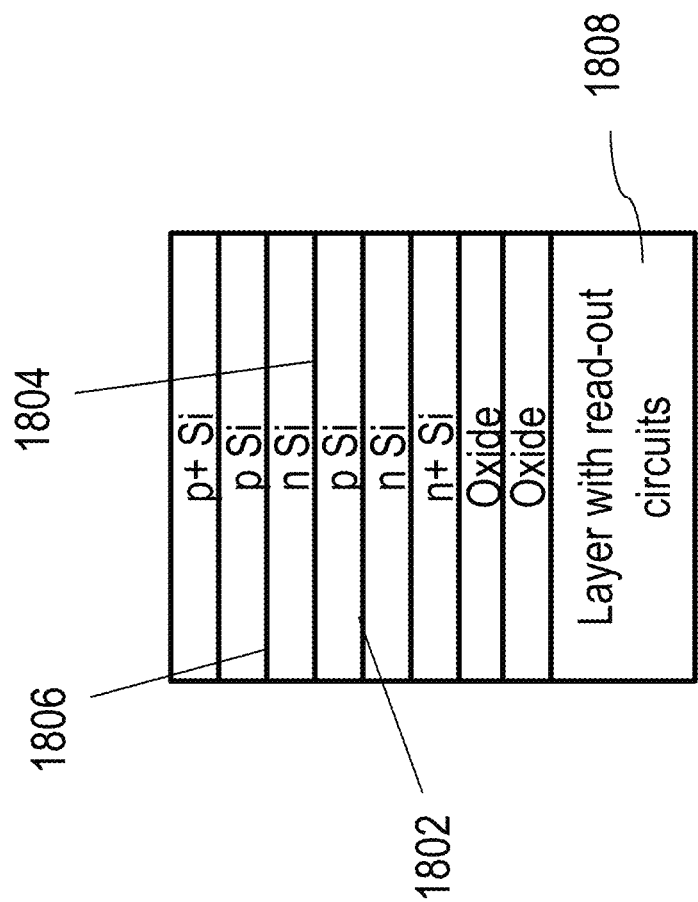

FIG. 18A-B show another embodiment of this invention, where red, green and blue photodetectors are stacked monolithically atop read-out circuits using ion-cut technology (for an image sensor) using a different configuration. Therefore, a smart layer transfer technique is utilized. FIG. 18A shows the first step for constructing this image sensor. 1824 shows a cross-section of 1808, a silicon wafer with read-out circuits constructed on it, above which an oxide layer 1810 is deposited. 1826 shows the cross-sectional view of another wafer which has silicon substrate 1812, a p+ Silicon layer 1814, a p Silicon layer 1816, a n Silicon layer 1818, a p Silicon layer 1820, a n Silicon layer 1822, a n+ Silicon layer 1828 and an oxide layer 1830. These layers may be formed using procedures similar to those described in FIG. 15A-G. An anneal may then be performed to activate dopants in various layers. Hydrogen may implanted in the wafer at a certain depth depicted by 1898, shown as dashed line. FIG. 18B shows the structure of the image sensor before contact formation. A layer of p+pnpnn+ (similar to the one depicted in 1826 in FIG. 18A) is layer transferred sequentially atop the silicon wafer with read-out circuits (depicted by 1824 in FIG. 18A). Procedures for layer transfer and alignment for forming the image sensor in FIG. 18B are similar to procedures used for constructing the image sensor shown in FIG. 15A-G. Contacts, metallization, packaging and other steps are done to the structure shown in FIG. 18B to form an image sensor. Three different pn junctions, denoted by 1802, 1804 and 1806 may be formed in the image sensor to detect different wavelengths of light.

Figure 19A:
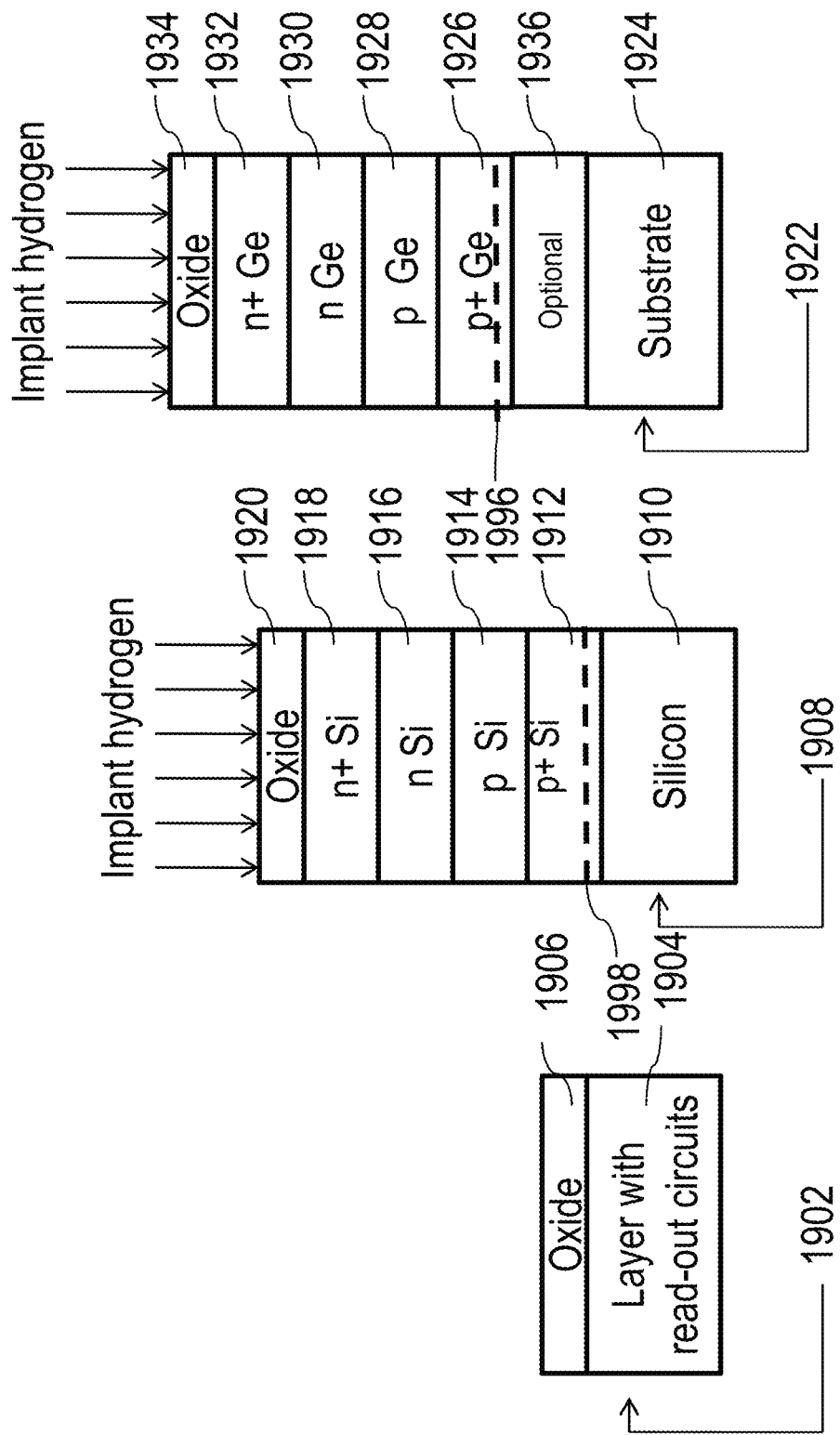
FIGS. 19A-B illustrate an embodiment of this invention, where an image sensor that can detect both visible and infrared light without any loss of resolution is constructed.
Figure 19B:
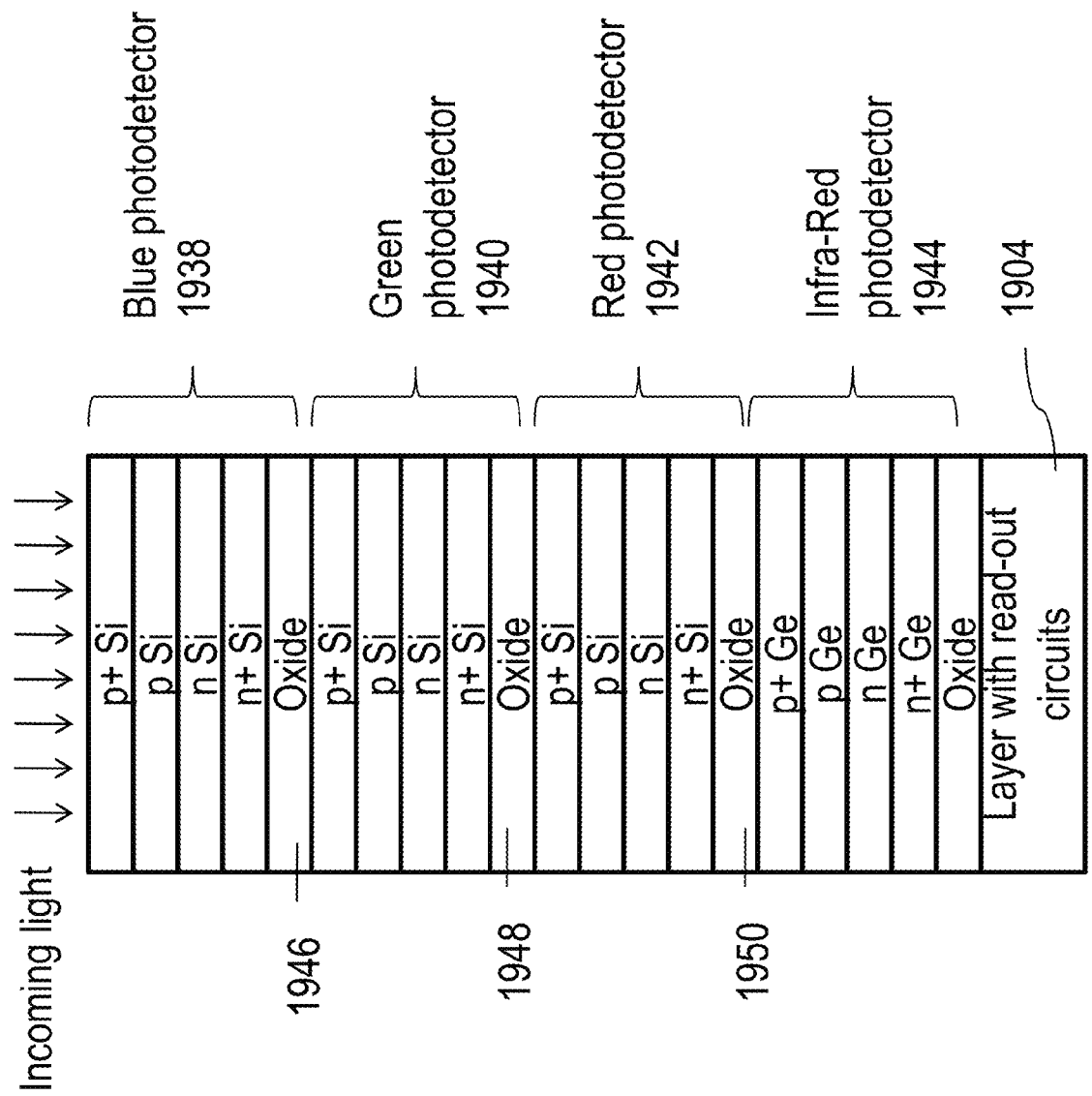

FIGS. 19A-B show another embodiment of this invention, where an image sensor that can detect both visible and infrared light is depicted. Such image sensors could be useful for taking photographs in both day and night settings (without necessarily requiring a flash). This embodiment makes use of the fact that while silicon is not sensitive to infra-red light, other materials such as Germanium and Indium Gallium Arsenide are. A smart layer transfer technique is utilized for this embodiment. FIG. 19A shows the first step for constructing this image sensor. 1902 shows a cross-sectional view of 1904, a silicon wafer with read-out circuits constructed on it, above which an oxide layer 1906 is deposited. 1908 shows the cross-sectional view of another wafer which has silicon 1910, a p+ Silicon layer 1912, a p Silicon layer 1914, a n Silicon layer 1916, a n+ Silicon layer 1918 and an oxide layer 1720. These layers may be formed using procedures similar to those described in FIGS. 15A-G. An anneal may then be performed to activate dopants in various layers. Hydrogen may be implanted in the wafer at a certain depth depicted by 1998, shown as dashed line. 1922 shows the cross-sectional view of another wafer which has a substrate 1924, an optional buffer layer 1936, a p+ Germanium layer 1926, a p Germanium layer 1928, a n Germanium layer 1930, a n+ Germanium layer 1932 and an oxide layer 1934. These layers may be formed using procedures similar to those described in FIGS. 15A-G. An anneal may then be performed to activate dopants in various layers. Hydrogen may be implanted in the wafer at a certain depth depicted by 1996, shown as dashed line. Examples of materials used for the structure 1922 may include a Germanium substrate for 1924, no buffer layer and multiple Germanium layers. Alternatively, an Indium Phosphide substrate could be used for 1924 when the layers 1926, 1924, 1922 and 1920 are constructed of InGaAs instead of Germanium. FIG. 19B shows the structure of this embodiment of the invention before contacts and metallization are constructed. The p+pnn+ Germanium layers of structure 1922 of FIG. 19A are layer transferred atop the read-out circuit layer of structure 1902. This is done using smart layer transfer procedures similar to those described in respect to FIG. 15A-G. Following this, multiple p+pnn+ layers similar to those used in structure 1908 may be layer transferred atop the read-out circuit layer and Germanium photodetector layer (using three different layer transfer steps). This, again, is done using procedures similar to those described in FIGS. 15A-G. The structure shown in FIG. 19B therefore has a layer of read-out circuits 1904, above which an infra-red photodetector 1944, a red photodetector 1942, a green photodetector 1940 and a blue photodetector 1938 are present. Procedures for layer transfer and alignment for forming the image sensor in FIG. 19B are similar to procedures used for constructing the image sensor shown in FIG. 15A-G. Each of the p+pnn+ layers senses a different wavelength of light. Contacts, metallization, packaging and other steps are done to the structure shown in FIG. 19B to form an image sensor. The oxides 1946, 1948, and 1950 could be either transparent conducting oxides or silicon dioxide. Use of transparent conducting oxides could allow fewer contacts to be formed.

Figure 20A:
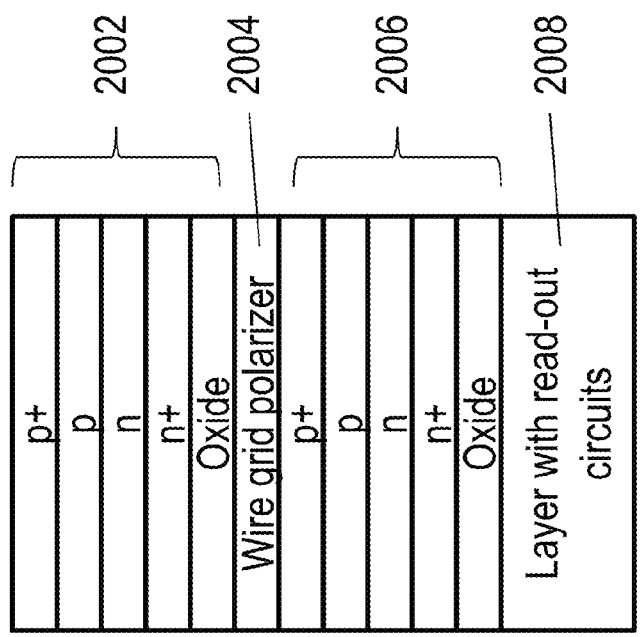
FIG. 20A illustrates an embodiment of this invention, where polarization of incoming light is detected.

FIG. 20A describes another embodiment of this invention, where polarization of incoming light can be detected. The p-n junction photodetector 2006 detects light that has passed through a wire grid polarizer 2004. Details of wire grid polarizers are described in "Fabrication of a 50 nm half-pitch wire grid polarizer using nanoimprint lithography." Nanotechnology 16 (9): 1874-1877, 2005 by Ahn, S. W.; K. D. Lee, J. S. Kim, S. H. Kim, J. D. Park, S. H. Lee, P. W. Yoon. The wire grid polarizer 2004 absorbs one plane of polarization of the incident light, and may enable detection of other planes of polarization by the p-n junction photodetector 2006. The p-n junction photodetector 2002 detects all planes of polarization for the incident light, while 2006 detects the planes of polarization that are not absorbed by the wire grid polarizer 2004. One can thereby determine polarization information from incoming light by combining results from photodetectors 2002 and 2006. The device described in FIG. 20A can be fabricated by first constructing a silicon wafer with transistor circuits 2008, following which the p-n junction photodetector 2006 can be constructed with the low-temperature layer transfer techniques described in FIG. 15A-G. Following this construction of p-n junction photodetector 2006, the wire grid polarizer 2004 may be constructed using standard integrated circuit metallization methods. The photodetector 2002 can then be constructed by another low-temperature layer transfer process as described in FIG. 15A-G. One skilled in the art, based on the present disclosure, can appreciate that low-temperature layer transfer techniques are critical to build this device, since semiconductor layers in 2002 are built atop metallization layers required for the wire grid polarizer 2004. Thickness of the photodetector layers 2002 and 2006 may be preferably less than 5 μm. An example with polarization detection where the photodetector has other pre-processed optical interaction layers (such as a wire grid polarizer) has been described herein. However, other devices for determining parameters of incoming light (such as phase) may be constructed with layer transfer techniques.

Figure 20B:
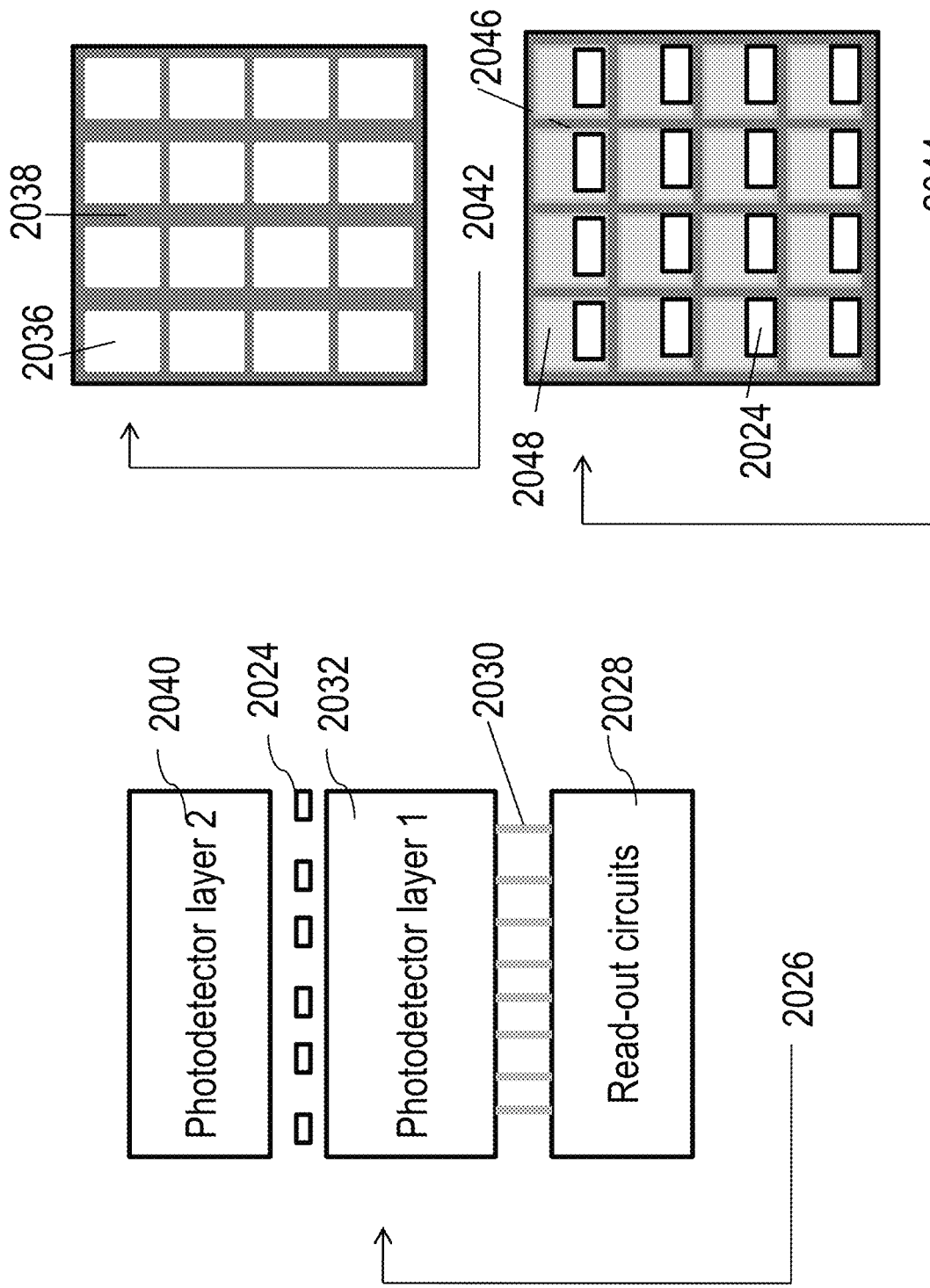
FIG. 20B illustrates another embodiment of this invention, where an image sensor with high dynamic range is constructed.

One of the common issues with taking photographs with image sensors is that in scenes with both bright and dark areas, while the exposure duration or shutter time could be set high enough to get enough photons in the dark areas to reduce noise, picture quality in bright areas degrades due to saturation of the photodetectors' characteristics. This issue is with the dynamic range of the image sensor, i.e. there is a tradeoff between picture quality in dark and bright areas. FIG. 20B shows an embodiment of this invention, where higher dynamic range can be reached. According the embodiment of FIG. 20B, two layers of photodetectors 2032 and 2040, could be stacked atop a read-out circuit layer 2028. 2026 is a schematic of the architecture. Connections 2030 run between the photodetector layers 2032 and 2040 and the read-out circuit layer 2028. 2024 are reflective metal lines that block light from reaching part of the bottom photodetector layer 2032. 2042 is a top view of the photodetector layer 2040. Photodetectors 2036 could be present, with isolation regions 2038 between them. 2044 is a top view of the photodetector layer 2032 and the metal lines 2024. Photodetectors 2048 are present, with isolation regions 2046 between them. A portion of the photodetectors 2048 can be seen to be blocked by metal lines 2024. Brighter portions of an image can be captured with photodetectors 2048, while darker portions of an image can be captured with photodetectors 2036. The metal lines 2024 positioned in the stack may substantially reduce the number of photons (from brighter portions of the image) reaching the bottom photodetectors 2048. This reduction in number of photons reaching the bottom photodetectors 2048 helps keep the dynamic range high. Read-out signals coming from both dark and bright portions of the photodetectors could be used to get the final picture from the image sensor.

Figure 21:
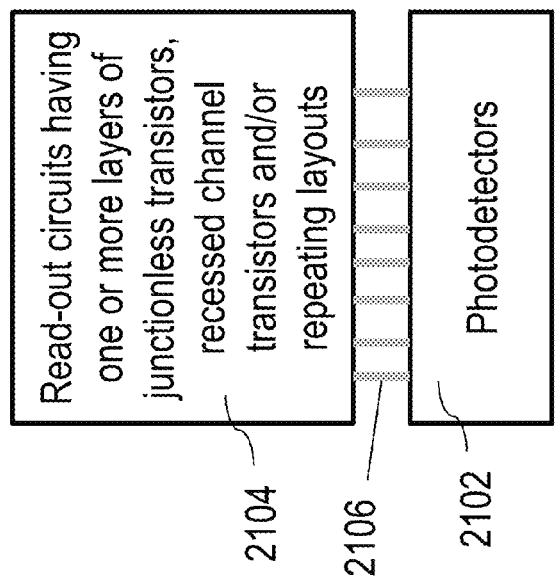
FIG. 21 illustrates an embodiment of this invention, where read-out circuits are constructed monolithically above photodetectors in an image sensor.

FIG. 21 illustrates another embodiment of this invention where a read-out circuit layer 2104 is monolithically stacked above the photodetector layer 2102 at a temperature approximately less than 400° C. Connections 2106 are formed between these two layers. Procedures for stacking high-quality monocrystalline transistor circuits and wires at temperatures approximately less than 400° C. using layer transfer are described in pending U.S. patent application Ser. No. 12/901,890 by the inventors of this patent application, the content of which is incorporated by reference. The stacked layers could use junction-less transistors, recessed channel transistors, repeating layouts or other devices/techniques described in U.S. patent application Ser. No. 12/901,890 the content of which is incorporated by reference. The embodiments of this invention described in FIG. 14-FIG. 21 may share a few common features. They can have multiple stacked (or overlying) layers, use one or more photodetector layers (terms photodetector layers and image sensor layers are often used interchangeably), thickness of at least one of the stacked layers is less than 5 microns and construction can be done with smart layer transfer techniques and stacking is done at temperatures approximately less than 450° C.

NuDisplay Technology:

In displays and microdisplays (small size displays where optical magnification is needed), transistors need to be formed on glass or plastic substrates. These substrates typically cannot withstand high process temperatures (e.g., >400° C.). Layer transfer can be advantageously used for constructing displays and microdisplays as well, since it may enable transistors to be processed on these substrates at <400° C. Various embodiments of transistors constructed on glass substrates are described in this patent application. These transistors constructed on glass substrates could form part of liquid crystal displays (LCDs) or other types of displays. It will be clear to those skilled in the art based on the present disclosure that these techniques can also be applied to plastic substrates.

FIGS. 22A-G describe a process for forming recessed channel single crystal (or monocrystalline) transistors on glass substrates at a temperature approximately less than 400° C. for display and microdisplay applications. This process could include several steps that occur in a sequence from Step (A) to Step (G). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 22A:
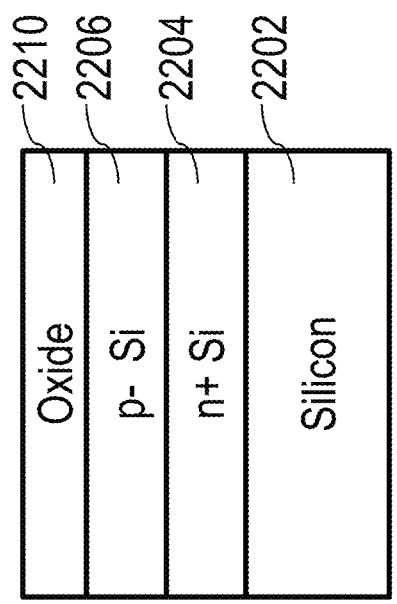
FIGS. 22A-G illustrate an embodiment of this invention, where a display is constructed using sub-400° C. processed single crystal silicon recessed channel transistors on a glass substrate.

Step (A) is illustrated in FIG. 22A. A silicon wafer 2202 is taken and a n+ region 2204 is formed by ion implantation. Following this formation, a layer of p− Silicon 2206 is epitaxially grown. An oxide layer 2210 is then deposited. Following this deposition, an anneal is performed to activate dopants in various layers. It will be clear to one skilled in the art based on the present disclosure that various other procedures can be used to get the structure shown in FIG. 22A.

Figure 22B:
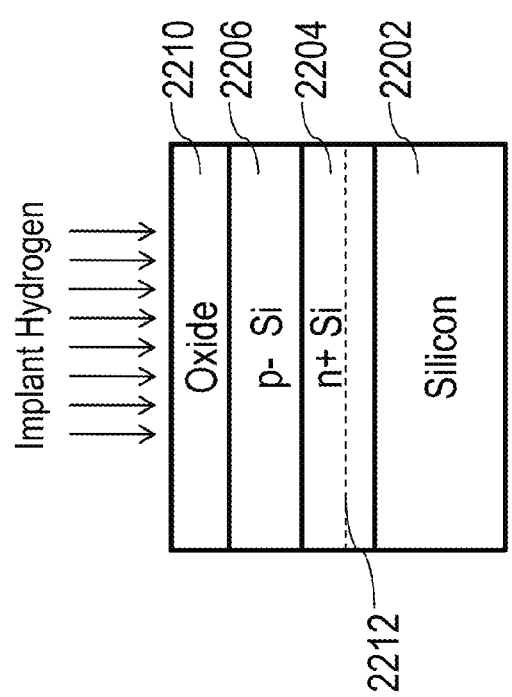

Step (B) is illustrated in FIG. 22B. Hydrogen is implanted into the structure shown in FIG. 22A at a certain depth indicated by 2212. Alternatively, Helium can be used for this purpose. Various elements in FIG. 22B, such as 2202, 2204, 2006, and 2210 have been described previously.

Figure 22C:
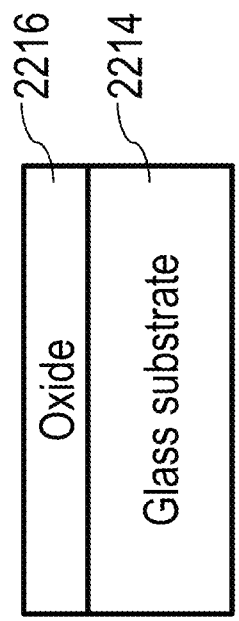

Step (C) is illustrated in FIG. 22C. A glass substrate 2214 is taken and a silicon oxide layer 2216 is deposited atop it at compatible temperatures.

Figure 22D:
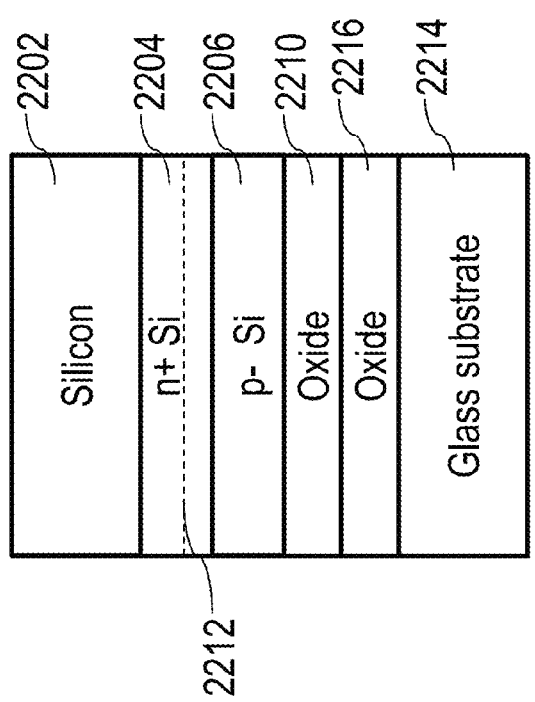

Step (D) is illustrated in FIG. 22D. Various elements in FIG. 22D, such as 2202, 2204, 2206, 2210, 2214, and 2216 have been described previously. The structure shown in FIG. 22B is flipped and bonded to the structure shown in FIG. 22C using oxide-to-oxide bonding of layers 2210 and 2216.

Figure 22E:
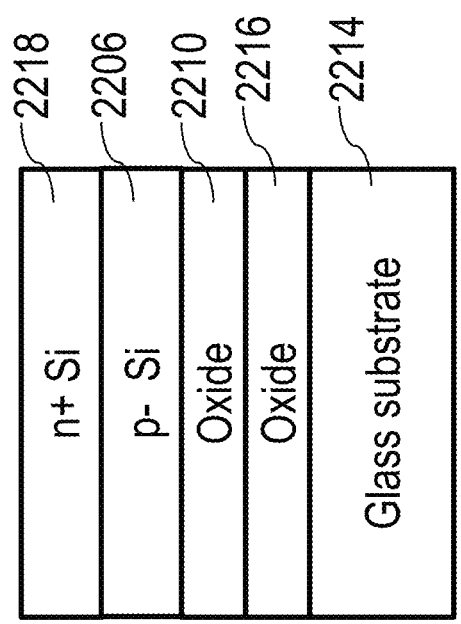

Step (E) is illustrated in FIG. 22E. The structure shown in FIG. 22D is cleaved at the hydrogen plane 2212 of FIG. 22D. A CMP is then done to planarize the surface and yield the n+ Si layer 2218. Various other elements in FIG. 22E, such as 2214, 2216, 2210 and 2206 have been described previously.

Figure 22F:
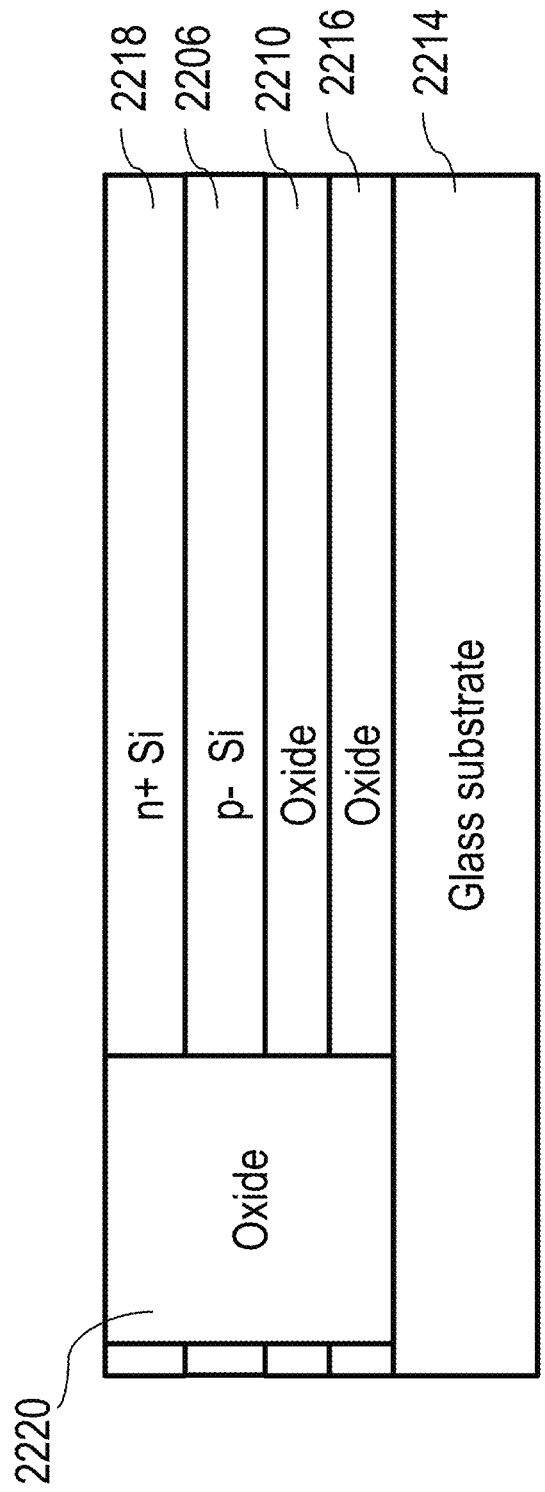

Step (F) is illustrated in FIG. 22F. Various elements in FIG. 22F such as 2214, 2216, 2210, and 2206 have been described previously. An oxide layer 2220 is formed using a shallow trench isolation (STI) process. This helps isolate transistors.

Figure 22G:
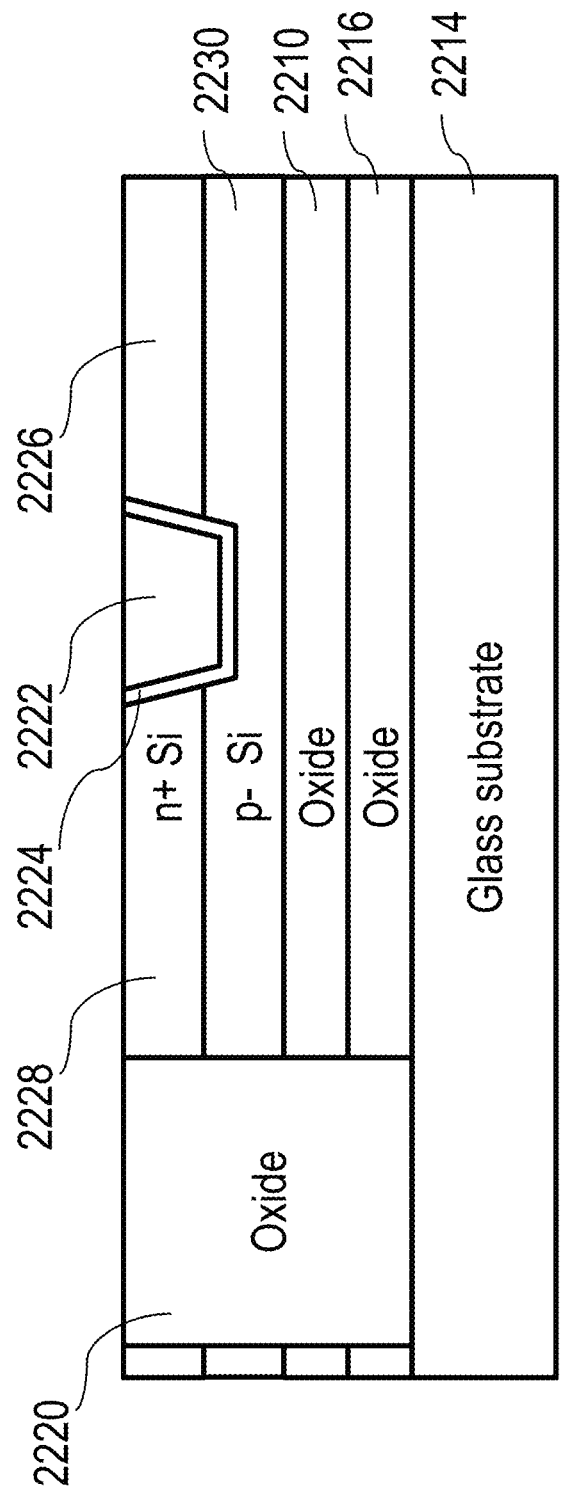

Step (G) is illustrated in FIG. 22G. Various elements in FIG. 22G such as 2210, 2216, 2220 and 2214 have been described previously. Using etch techniques, part of the n+ Silicon layer from FIG. 22F and optionally p− Silicon layer from FIG. 22F are etched. After this a thin gate dielectric is deposited, after which a gate dielectrode is deposited. The gate dielectric and gate electrode are then polished away to form the gate dielectric layer 2224 and gate electrode layer 2222. The n+ Silicon layers 2228 and 2226 form the source and drain regions of the transistors while the p− Silicon region after this step is indicated by 2230. Contacts and other parts of the display/microdisplay are then fabricated. It can be observed that during the whole process, the glass substrate substantially always experiences temperatures less than 400° C., or even lower. This is because the crystalline silicon can be transferred atop the glass substrate at a temperature less than 400° C., and dopants are pre-activated before layer transfer to glass.

FIG. 23A-H describes a process of forming both nMOS and pMOS transistors with single-crystal silicon on a glass substrate at temperatures less than 400° C., and even lower. Ion-cut technology (which is a smart layer transfer technology) is used. While the process flow described is shown for both nMOS and pMOS on a glass substrate, it could also be used for just constructing nMOS devices or for just constructing pMOS devices. This process could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 23A:
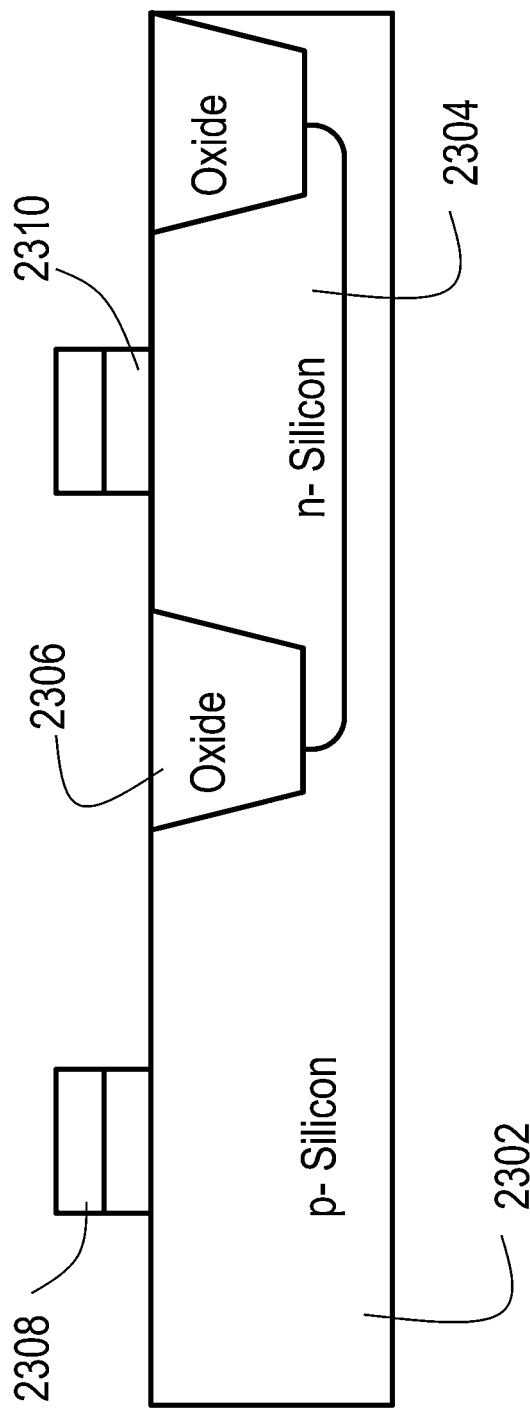
FIGS. 23A-H illustrate an embodiment of this invention, where a display is constructed using sub-400° C. processed single crystal silicon replacement gate transistors on a glass substrate.

Step (A) is illustrated in FIG. 23A. A p− Silicon wafer 2302 is taken and a n well 2304 is formed on the p− Silicon wafer 2302. Various additional implants to optimize dopant profiles can also be done. Following this formation, an isolation process is conducted to form isolation regions 2306. A dummy gate dielectric 2310 made of silicon dioxide and a dummy gate electrode 2308 made of polysilicon are constructed.

Figure 23B:
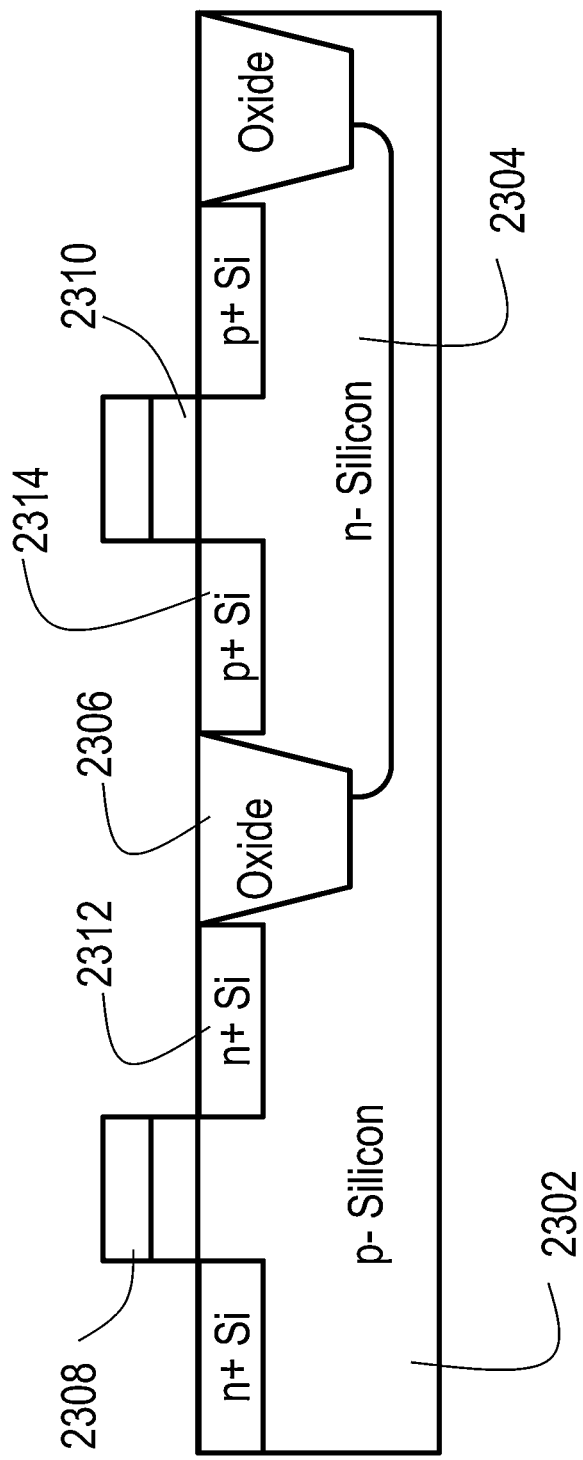

Step (B) is illustrated in FIG. 23B. Various elements of FIG. 23B, such as 2302, 2304, 2306, 2308 and 2310 have been described previously. Implants are done to form source-drain regions 2312 and 2314 for both nMOS and pMOS transistors. A rapid thermal anneal (RTA) is then done to activate dopants. Alternatively, a spike anneal or a laser anneal could be done.

Figure 23C:
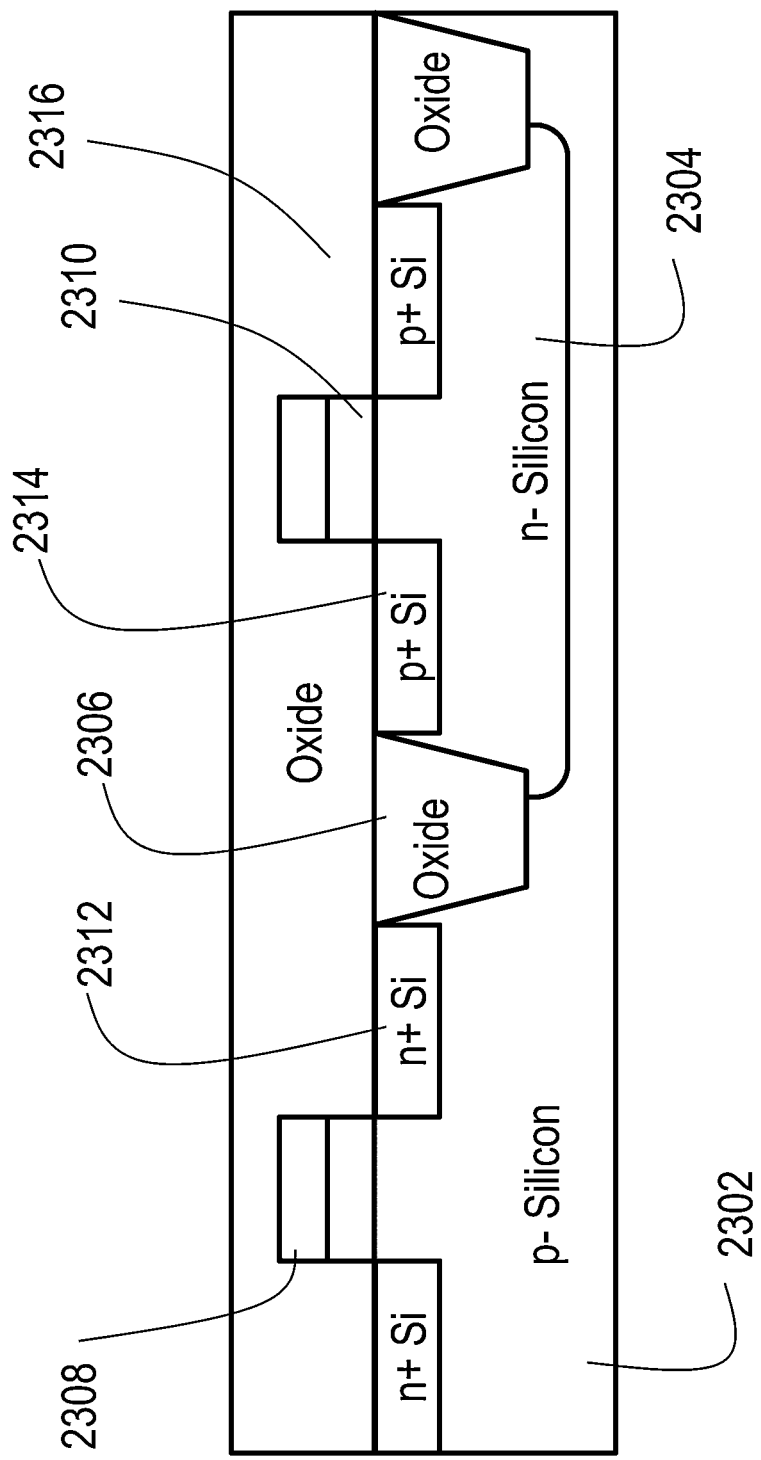

Step (C) is illustrated in FIG. 23C. Various elements of FIG. 23C such as 2302, 2304, 2306, 2308, 2310, 2312 and 2314 have been described previously. An oxide layer 2316 is deposited and planarized with CMP.

Figure 23D:
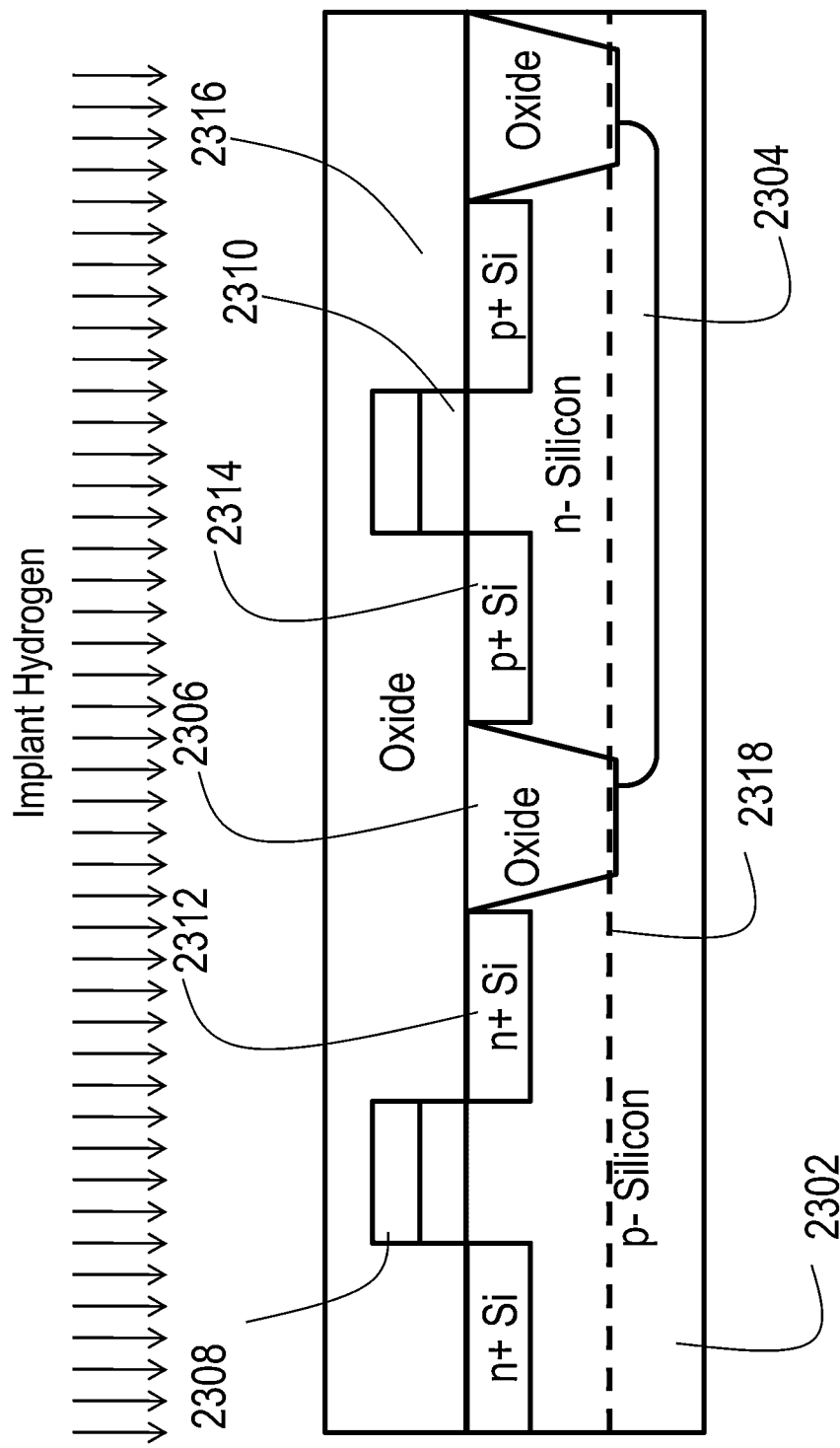

Step (D) is described in FIG. 23D. Various elements of FIG. 23D such as 2302, 2304, 2306, 2308, 2310, 2312, 2314, and 2316 have been described previously. Hydrogen is implanted into the wafer at a certain depth indicated by 2318. Alternatively, helium can be implanted.

Figure 23E:
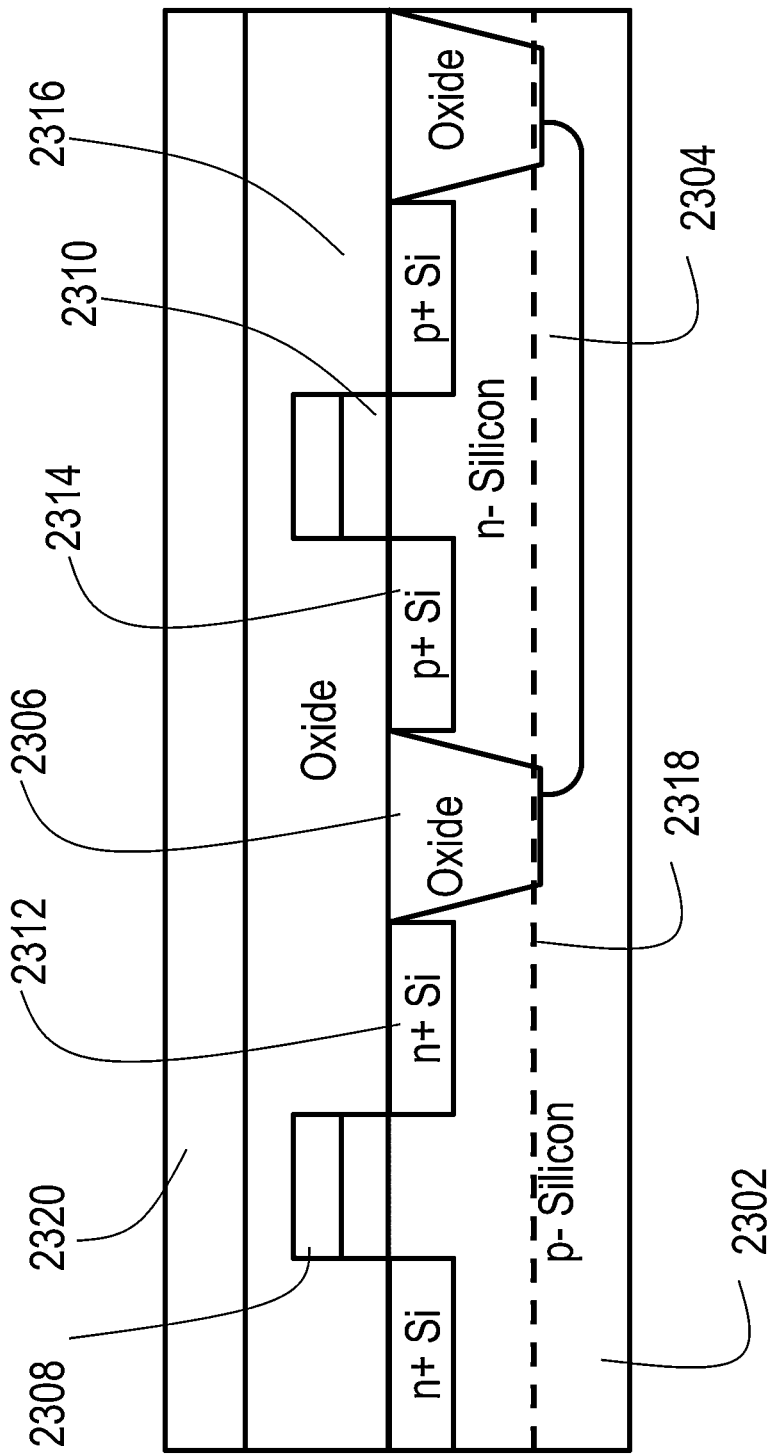

Step (E) is illustrated in FIG. 23E. Various elements of FIG. 23E such as 2302, 2304, 2306, 2308, 2310, 2312, 2314, 2316, and 2318 have been described previously. Using a temporary bonding adhesive, the oxide layer is bonded to a temporary carrier wafer 2320. An example of a temporary bonding adhesive is a polyimide that can be removed by shining a laser. An example of a temporary carrier wafer is glass.

Figure 23F:
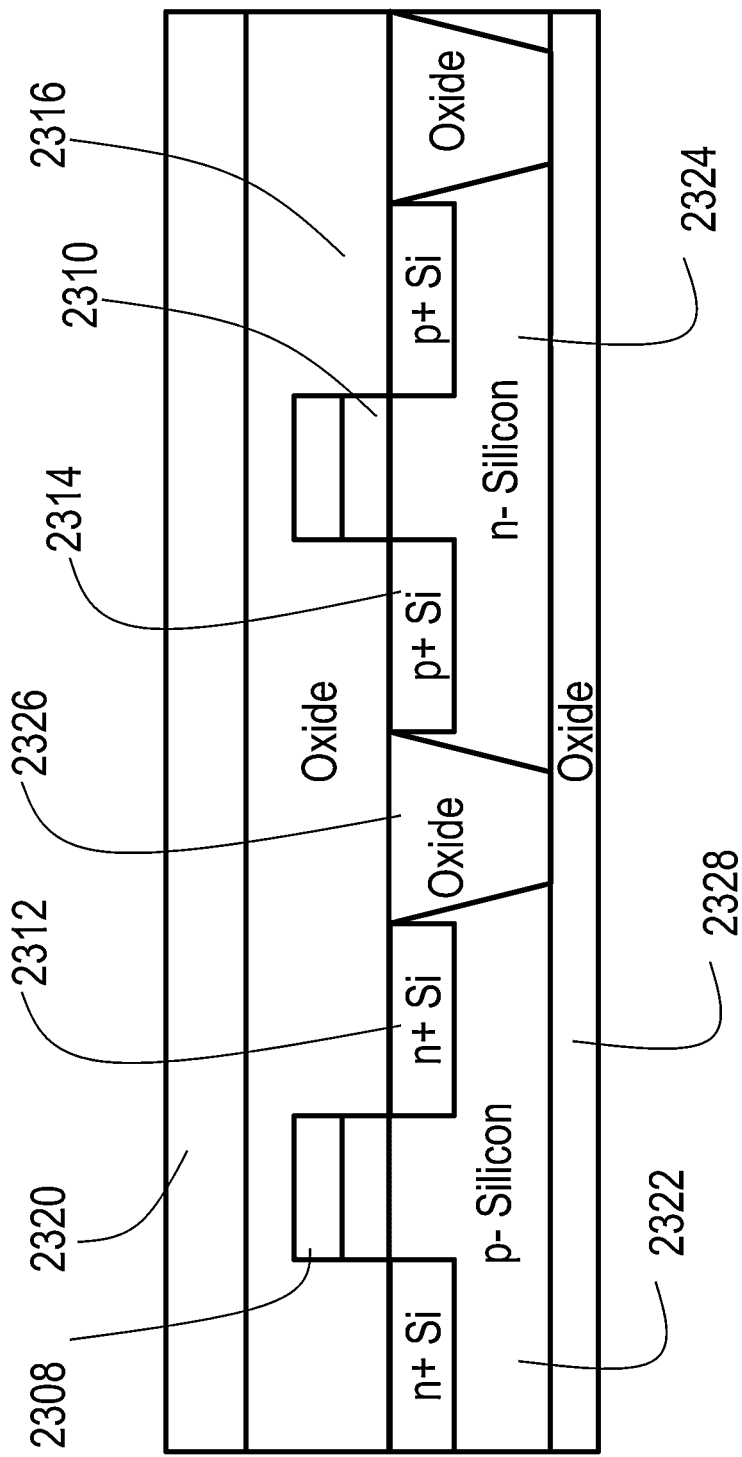

Step (F) is described in FIG. 23F. The structure shown in FIG. 23E is cleaved at the hydrogen plane using a mechanical force. Alternatively, an anneal could be used. Following this cleave, a CMP is done to planarize the surface. An oxide layer is then deposited. FIG. 23F shows the structure after all these steps are done, with the deposited oxide layer indicated as 2328. After the cleave, the p− Silicon region is indicated as 2322, the n− Silicon region is indicated as 2324, and the oxide isolation regions are indicated as 2326. Various other elements in FIG. 23F such as 2308, 2320, 2312, 2314, 2310, and 2316 have been described previously.

Figure 23G:
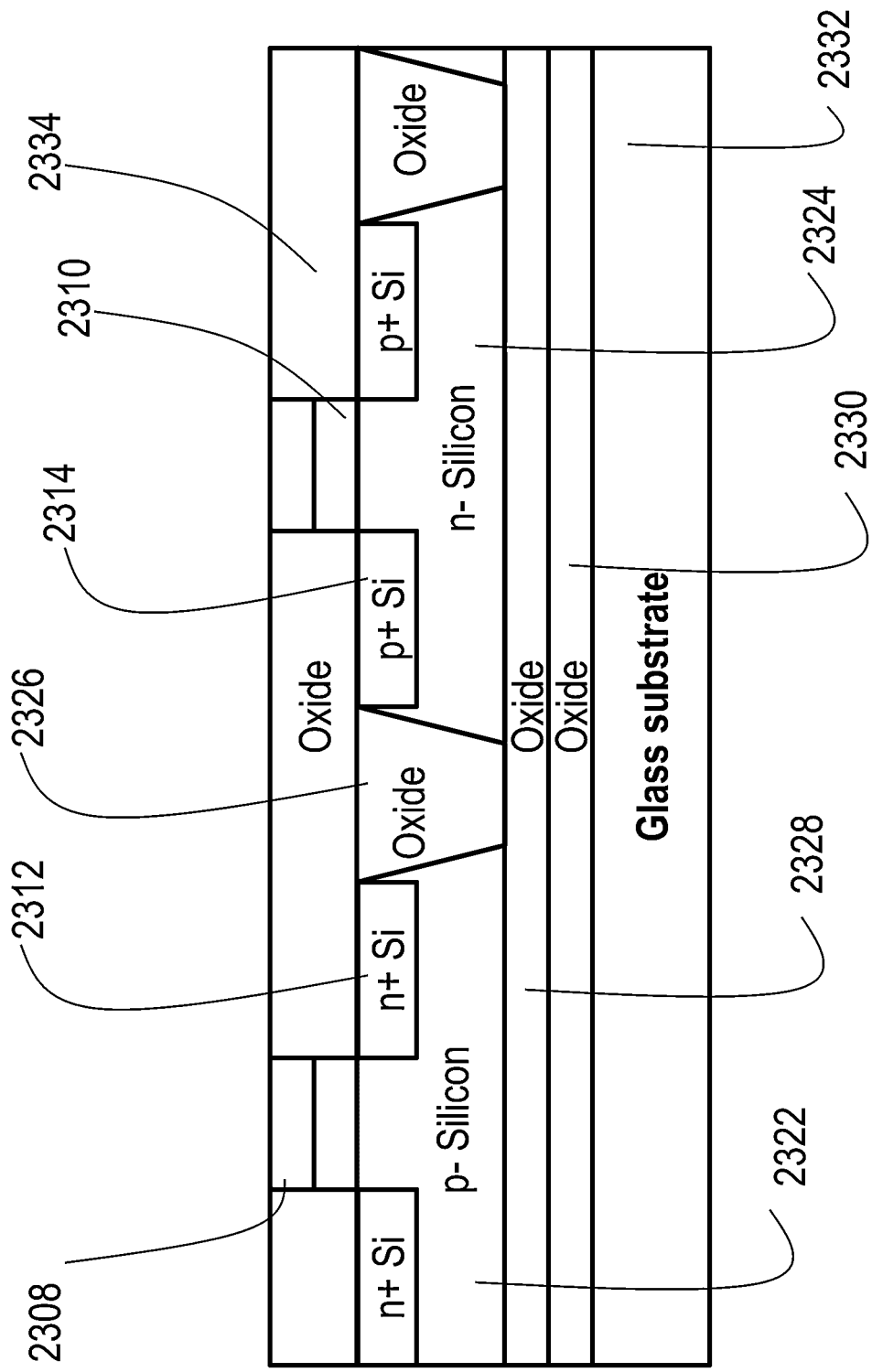

Step (G) is described in FIG. 23G. The structure shown in FIG. 23F is bonded to a glass substrate 2332 with an oxide layer 2330 using oxide-to-oxide bonding. Various elements in FIG. 23G such as 2308, 2326, 2322, 2324, 2312, 2314, and 2310 have been described previously. Oxide regions 2328 and 2330 are bonded together. The temporary carrier wafer from FIG. 23F is removed by shining a laser through it. A CMP process is then conducted to reach the surface of the gate electrode 2308. The oxide layer remaining is denoted as 2334.

Figure 23H:
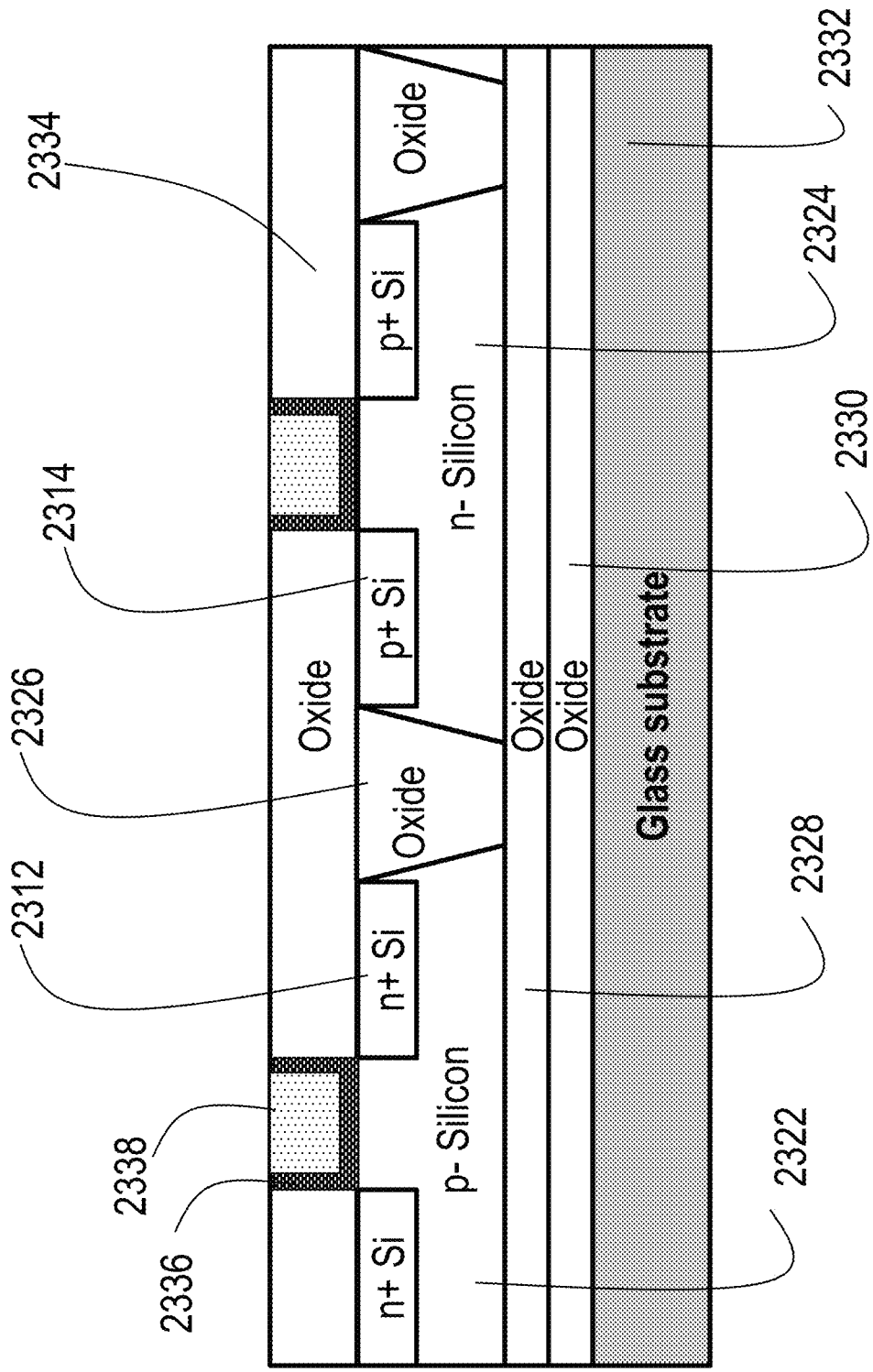

Step (H) is described in FIG. 23H. Various elements in FIG. 23H such as 2312, 2314, 2328, 2330, 2332, 2334, 2326, 2324, and 2322 have been described previously. The dummy gate dielectric and dummy gate electrode are etched away in this step and a replacement gate dielectric 2336 and a replacement gate electrode 2338 are deposited and planarized with CMP. Examples of replacement gate dielectrics could be hafnium oxide or aluminum oxide while examples of replacement gate electrodes could be TiN or TaN or some other material. Contact formation, metallization and other steps for building a display/microdisplay are then conducted. It can be observed that after attachment to the glass substrate, no process step requires a processing temperature above 400° C.

FIGS. 24A-F describe an embodiment of this invention, where single-crystal Silicon junction-less transistors are constructed above glass substrates at a temperature approximately less than 400° C. An ion-cut process (which is a smart layer transfer process) is utilized for this purpose. This process could include several steps that occur in a sequence from Step (A) to Step (F). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 24A:
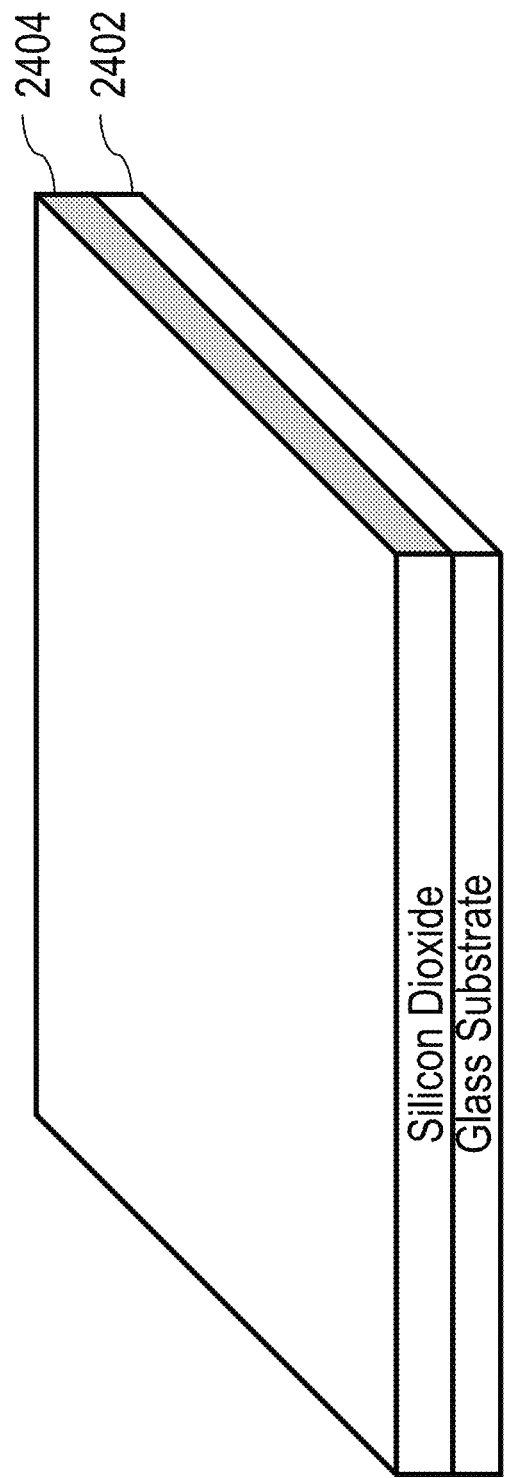

Step (A) is illustrated in FIG. 24A. A glass substrate 2402 is taken and a layer of silicon oxide 2404 is deposited on the glass substrate 2402.

Figure 24B:
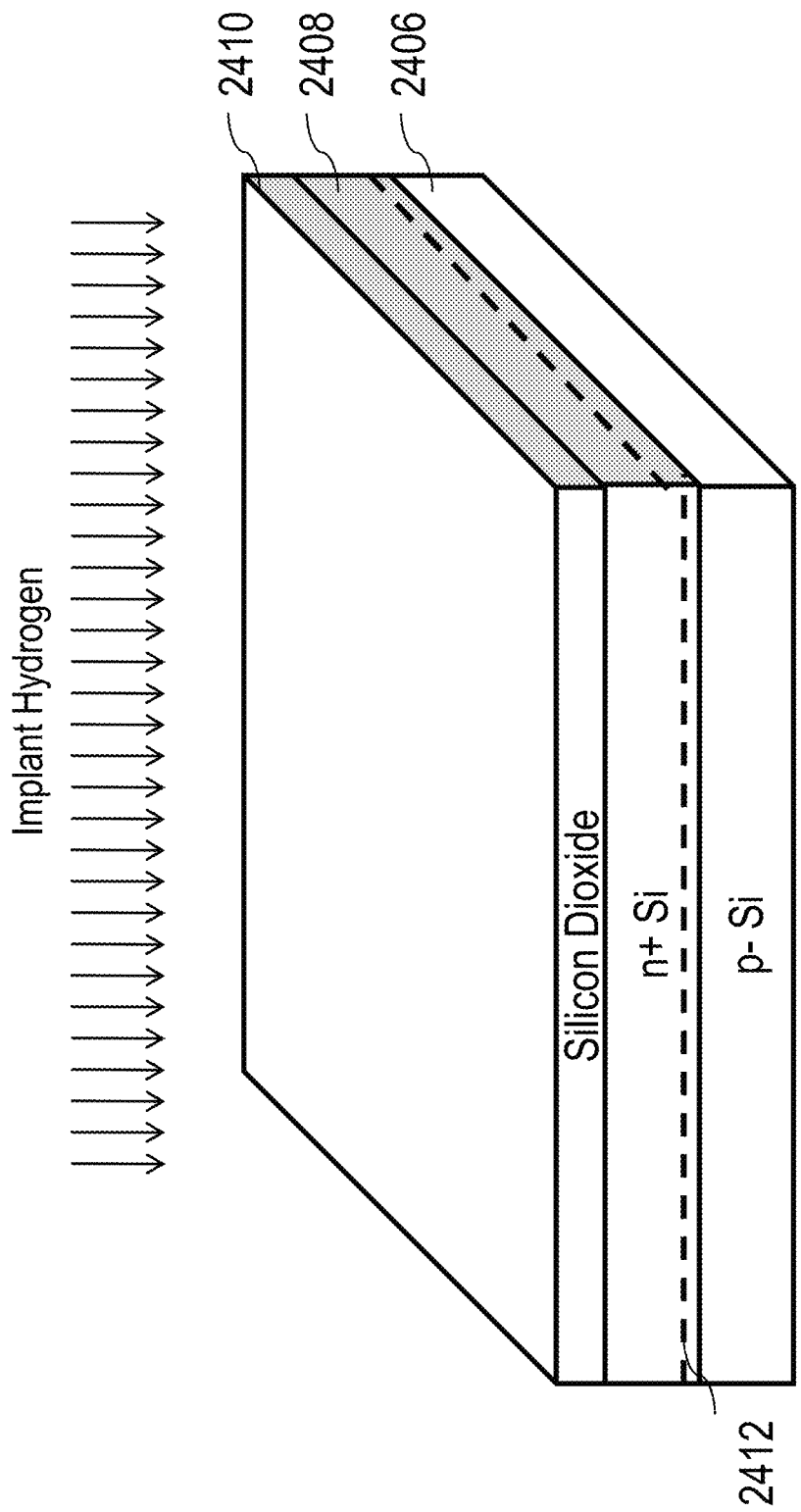

Step (B) is illustrated in FIG. 24B. A p− Silicon wafer 2406 is implanted with a n+ Silicon layer 2408 above which an oxide layer 2410 is deposited. A RTA or spike anneal or laser anneal is conducted to activate dopants. Following this, hydrogen is implanted into the wafer at a certain depth indicated by 2412. Alternatively, helium can be implanted.

Figure 24C:
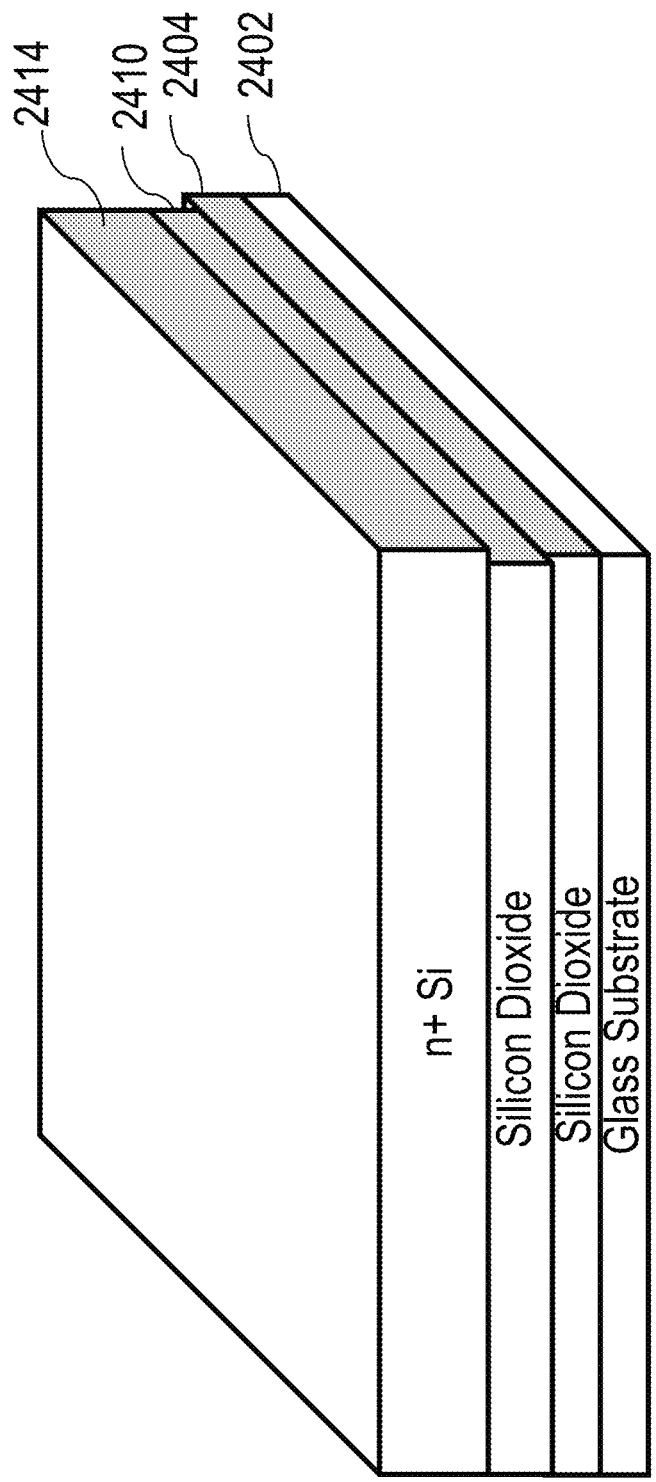

Step (C) is illustrated in FIG. 24C. The structure shown in FIG. 24B is flipped and bonded onto the structure shown in FIG. 24A using oxide-to-oxide bonding. This bonded structure is cleaved at its hydrogen plane, after which a CMP is done. FIG. 24C shows the structure after all these processes are completed. 2414 indicates the n+ Si layer, while 2402, 2404, and 2410 have been described previously.

Figure 24D:
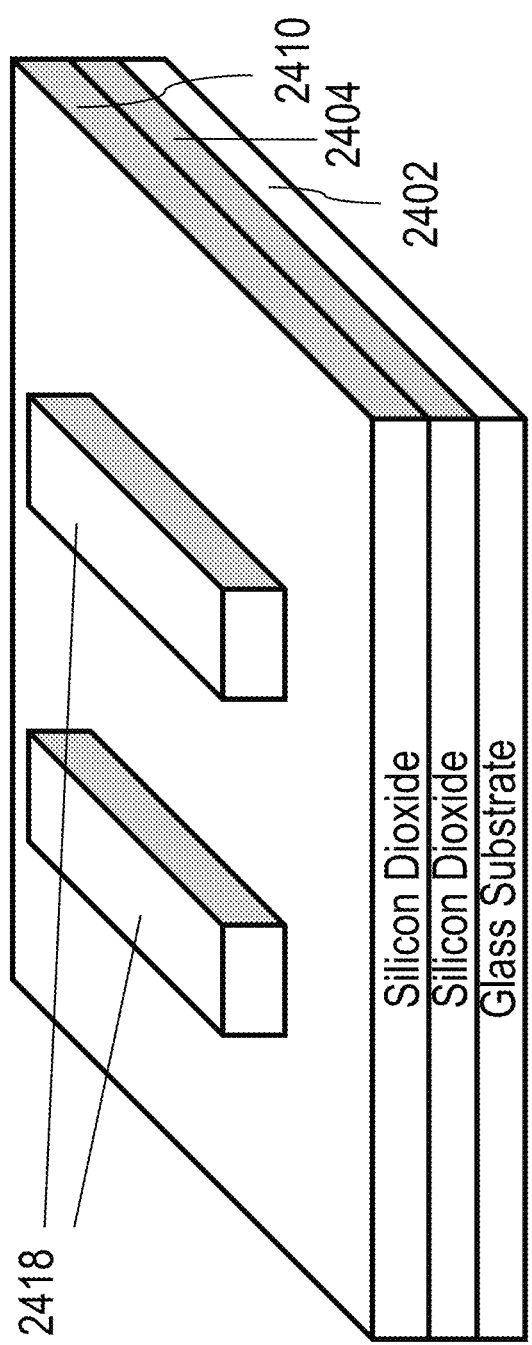

Step (D) is illustrated in FIG. 24D. A lithography and etch process is conducted to pattern the n+ Silicon layer 2414 in FIG. 24C to form n+ Silicon regions 2418 in FIG. 24D. The glass substrate is indicated as 2402 and the bonded oxide layers 2404 and 2410 are shown as well.

Figure 24E:
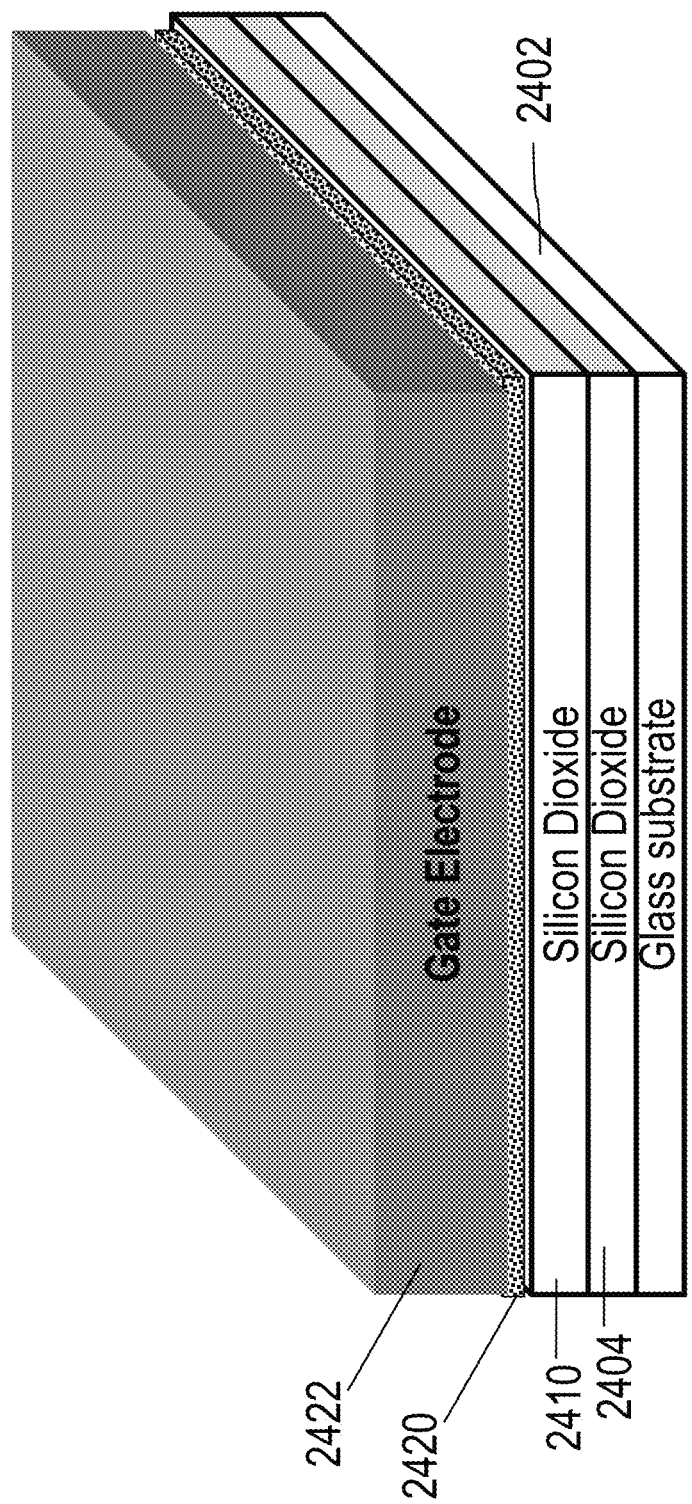

Step (E) is illustrated in FIG. 24E. A gate dielectric 2420 and gate electrode 2422 are deposited, following which a CMP is done. 2402 is as described previously. The n+ Si regions 2418 are not visible in this figure, since they are covered by the gate electrode 2422. Oxide regions 2404 and 2410 have been described previously.

Step (F) is illustrated in FIG. 24F. The gate dielectric 2420 and gate electrode 2422 from FIG. 24E are patterned and etched to form the structure shown in FIG. 24F. The gate dielectric after the etch process is indicated as 2424 while the gate electrode after the etch process is indicated as 2426. n+ Si regions are indicated as 2418 while the glass substrate is indicated as 2402. Oxide regions 2404 and 2410 have been described previously. It can be observed that a three-side gated junction-less transistor is formed at the end of the process described with respect of FIGS. 24A-F. Contacts, metallization and other steps for constructing a display/microdisplay are performed after the steps indicated by FIGS. 24A-F. It can be seen that the glass substrate is not exposed to temperatures greater than approximately 400° C. during any step of the above process for forming the junction-less transistor.

FIGS. 25A-D describe an embodiment of this invention, where amorphous Si or polysilicon junction-less transistors are constructed above glass substrates at a temperature less than 400° C. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 25A:
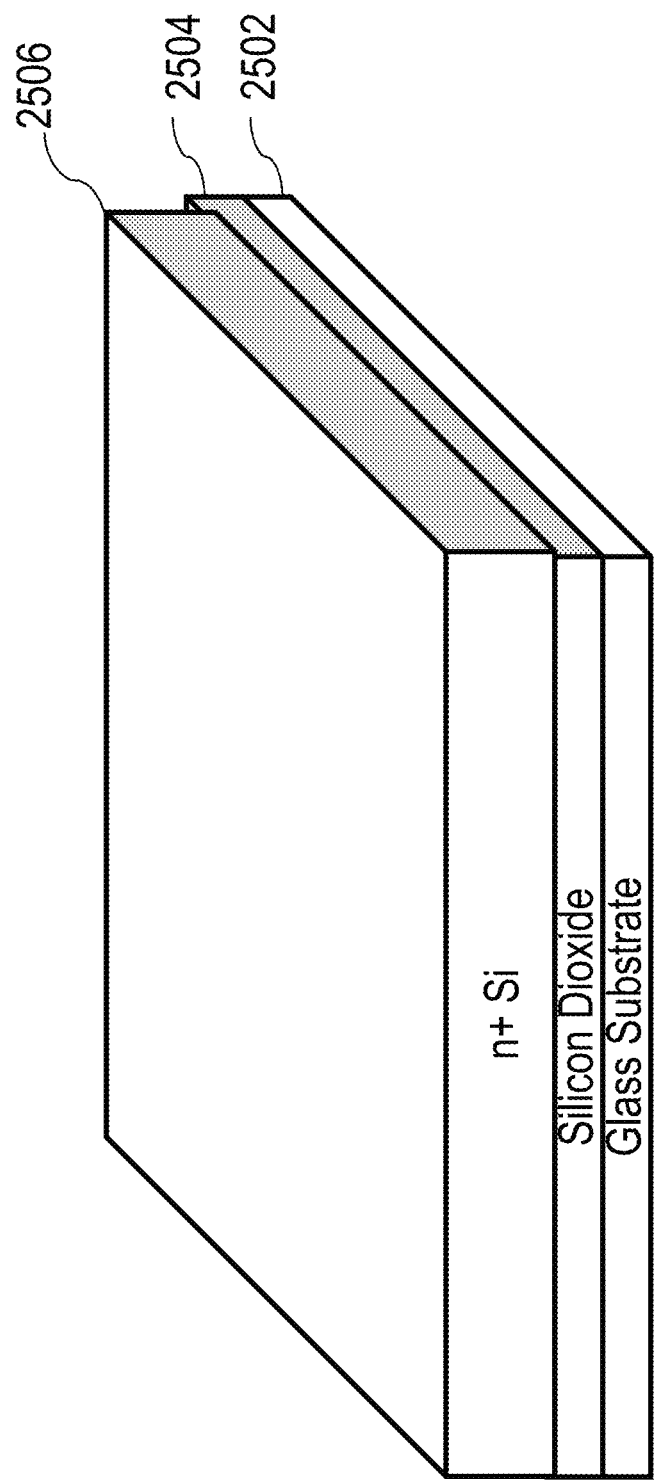
FIGS. 25A-D illustrate an embodiment of this invention, where a display is constructed using sub-400° C. processed amorphous silicon or polysilicon junctionless transistors on a glass substrate.

Step (A) is illustrated in FIG. 25A. A glass substrate 2502 is taken and a layer of silicon oxide 2504 is deposited on the glass substrate 2502. Following this deposition, a layer of n+ Si 2506 is deposited using low-pressure chemical vapor deposition (LPCVD) or plasma enhanced chemical vapor deposition (PECVD). This layer of n+ Si could optionally be hydrogenated.

Figure 25B:
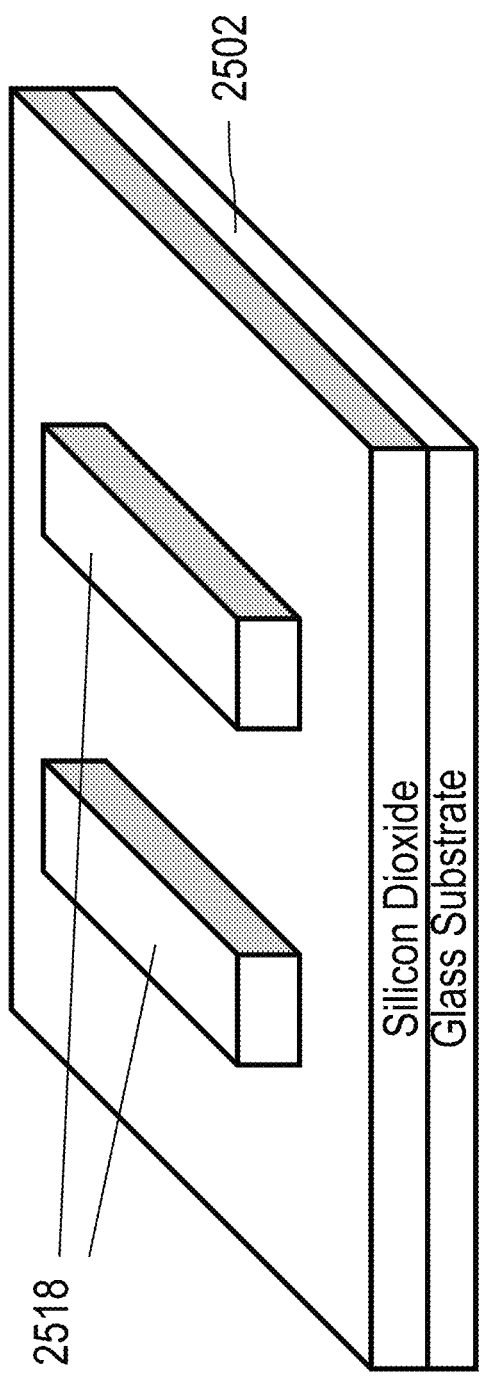

Step (B) is illustrated in FIG. 25B. A lithography and etch process is conducted to pattern the n+ Silicon layer 2506 in FIG. 25A to form n+ Silicon regions 2518 in FIG. 25B. 2502 and 2504 have been described previously.

Figure 25C:
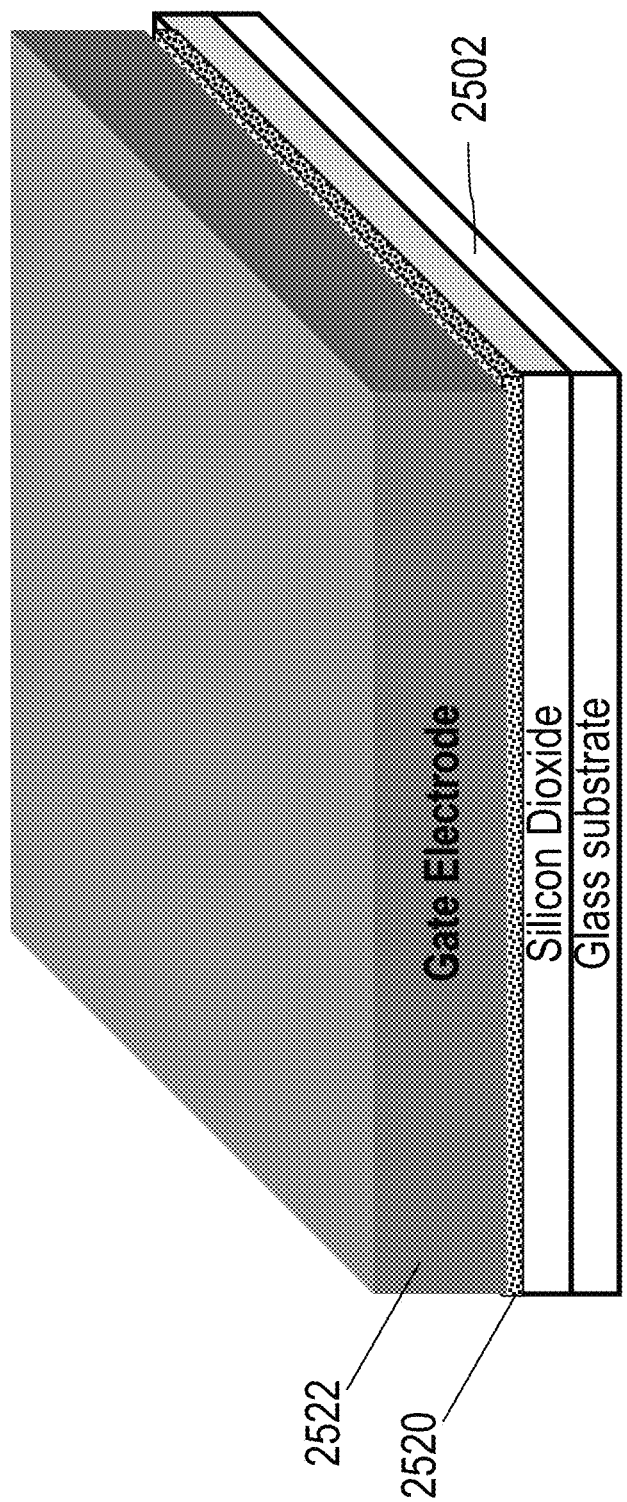

Step (C) is illustrated in FIG. 25C. A gate dielectric 2520 and gate electrode 2522 are deposited, following which a CMP is optionally done. 2502 is as described previously. The n+ Si regions 2518 are not visible in this figure, since they are covered by the gate electrode 2522.

Figure 25D:
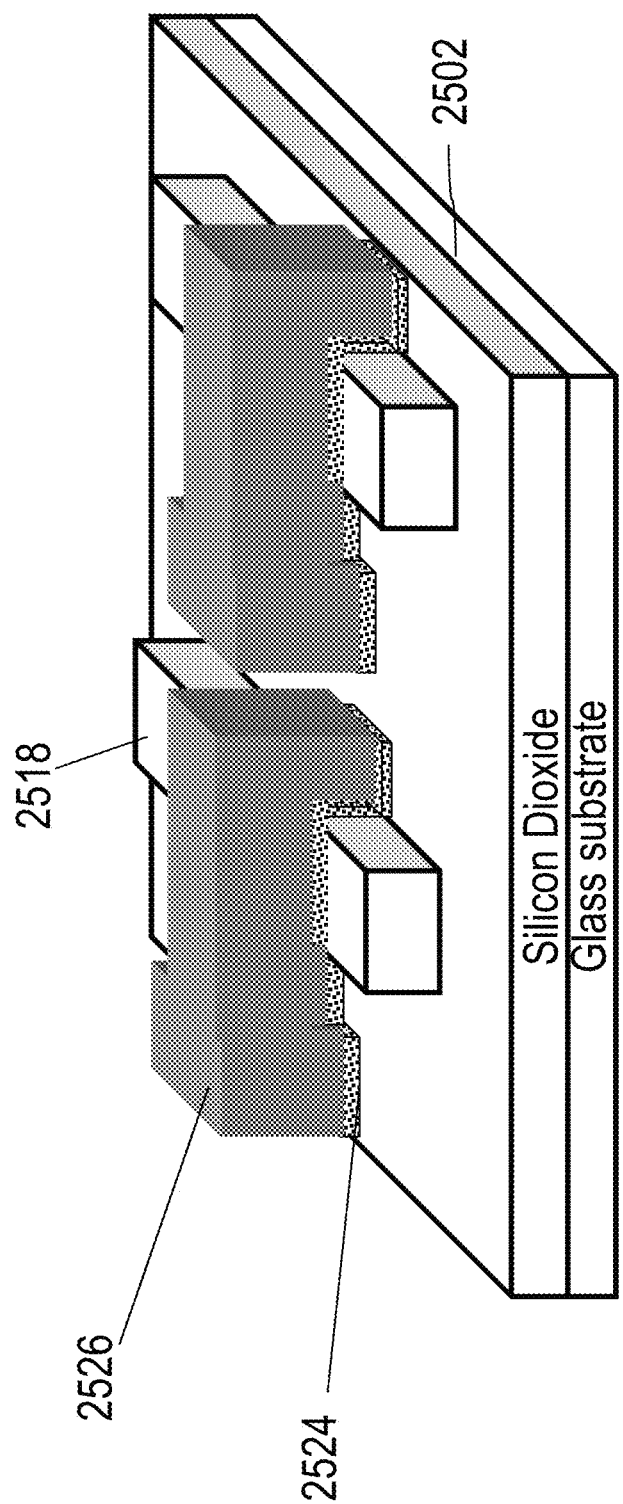

Step (D) is illustrated in FIG. 25D. The gate dielectric 2520 and gate electrode 2522 from FIG. 25C are patterned and etched to form the structure shown in FIG. 25D. The gate dielectric after the etch process is indicated as 2524 while the gate electrode after the etch process is indicated as 2526. n+ Si regions are indicated as 2518 while the glass substrate is indicated as 2502. It can be observed that a three-side gated junction-less transistor is formed at the end of the process described with respect of FIGS. 25A-D. Contacts, metallization and other steps for constructing a display/microdisplay are performed after the steps indicated by FIGS. 25A-D. It can be seen that the glass substrate is not exposed to temperatures greater than 400° C. during any step of the above process for forming the junction-less transistor.

Figure 26A:
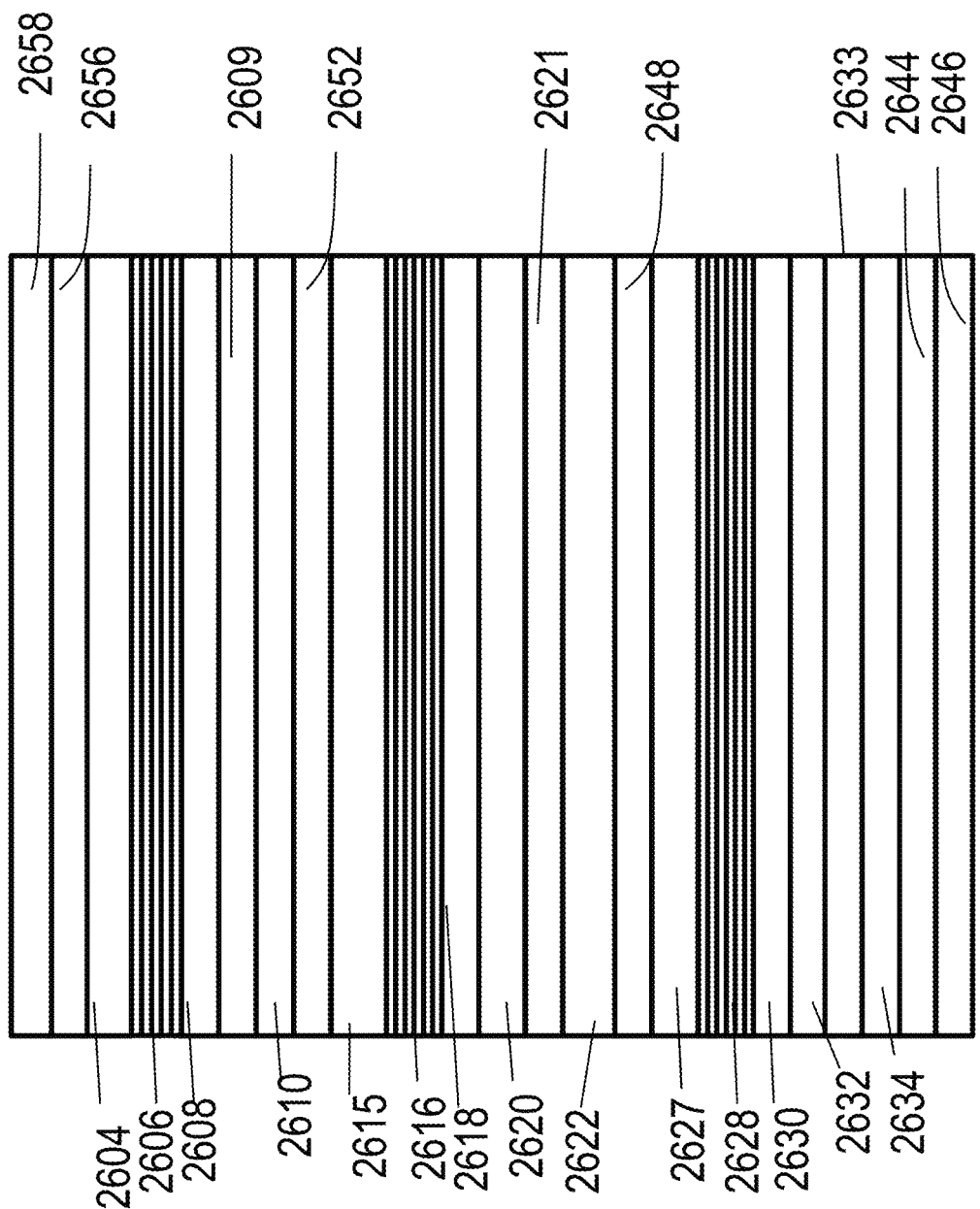
FIGS. 26A-C illustrate an embodiment of this invention, where a microdisplay is constructed using stacked RGB LEDs and control circuits are connected to each pixel with solder bumps.
Figure 26B:
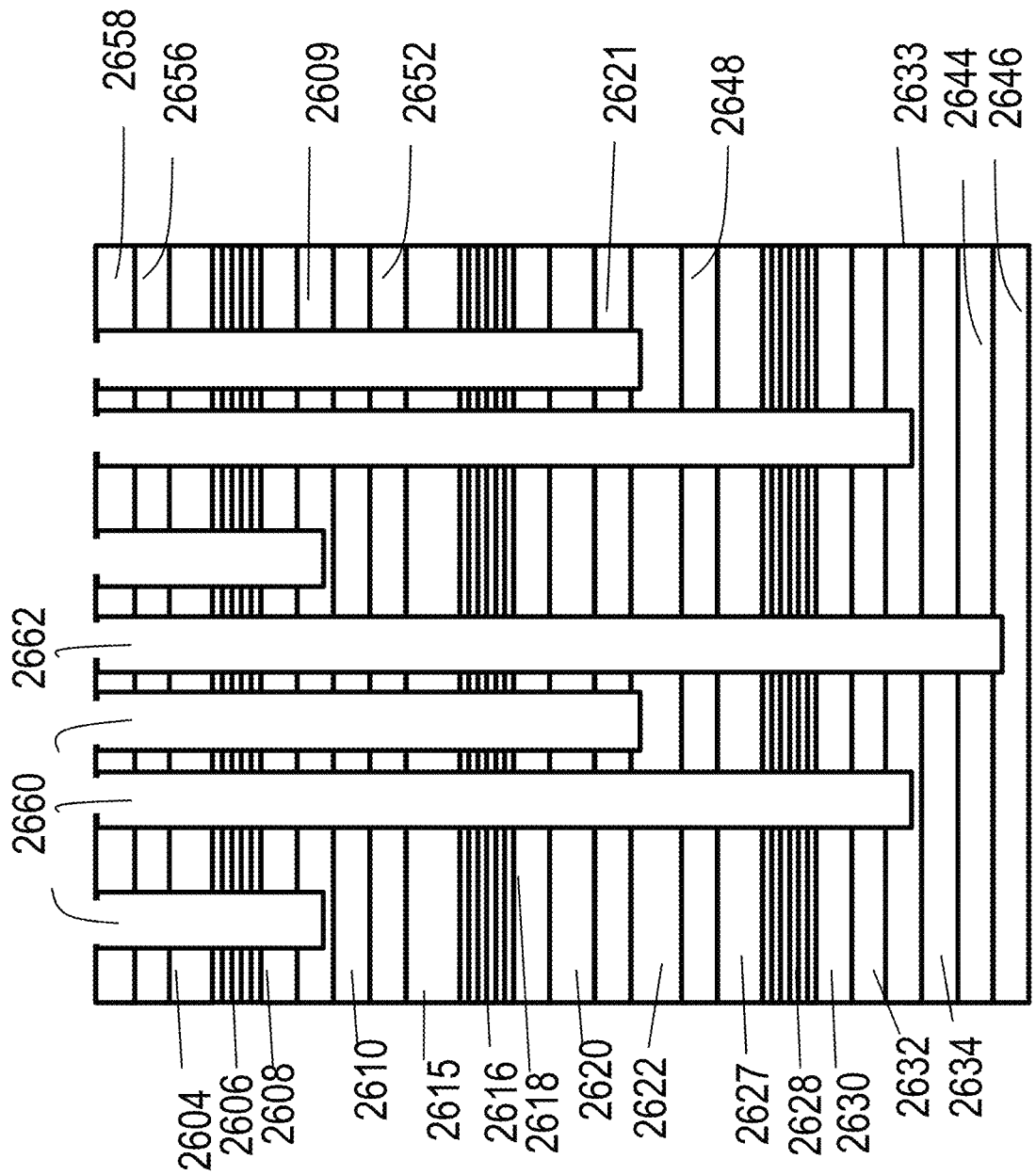
Figure 26C:
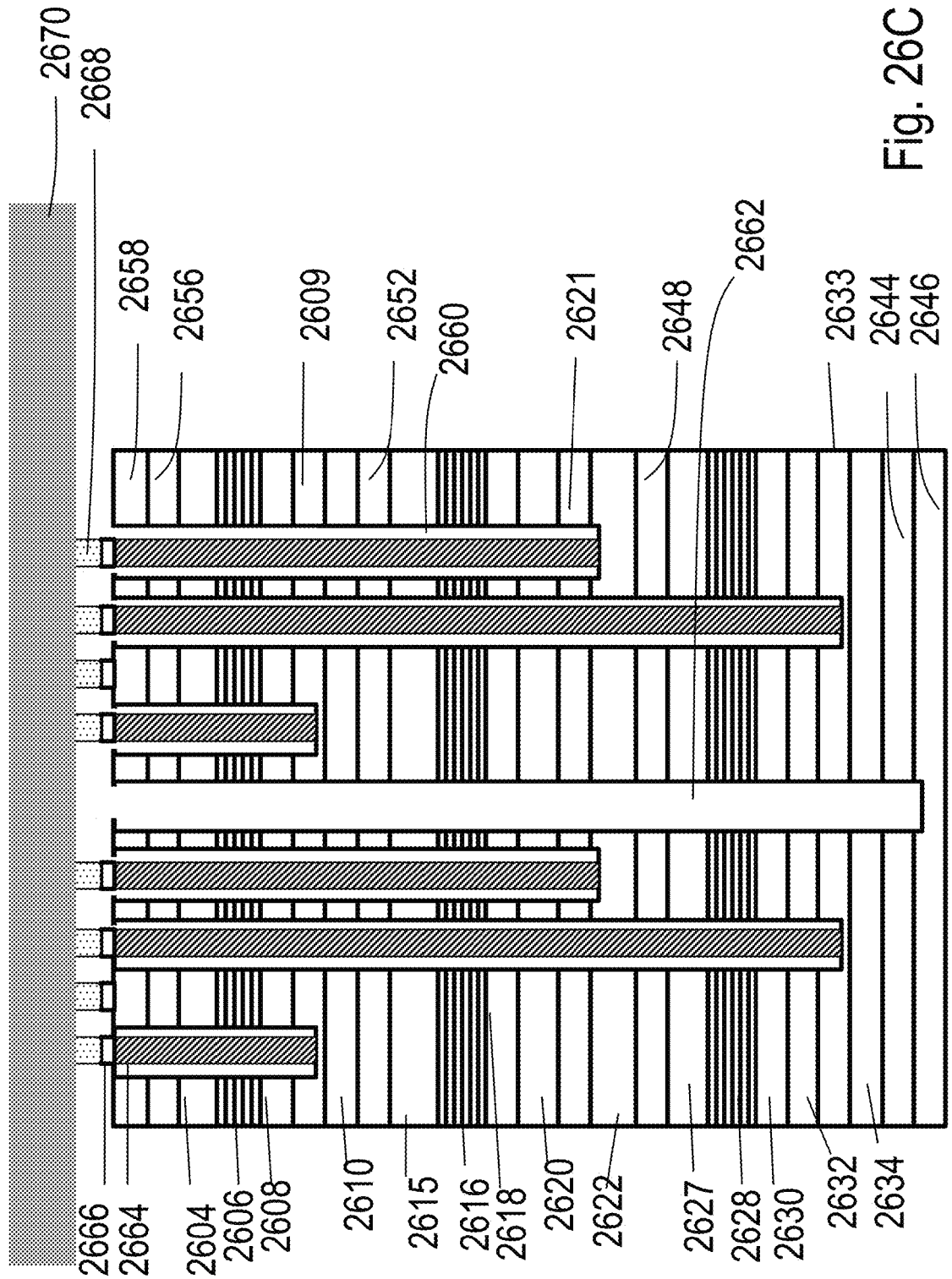

FIGS. 26A-C illustrate an embodiment of this invention, where a microdisplay is constructed using stacked RGB LEDs and control circuits are connected to each pixel with solder bumps. This process could include several steps that occur in a sequence from Step (A) to Step (C). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 26A. Using procedures similar to FIG. 4A-S, the structure shown in FIG. 26A is constructed. Various elements of FIG. 26A are as follows:

2646—a glass substrate,
2644—an oxide layer, could be a conductive oxide such as ITO,
2634—an oxide layer, could be a conductive oxide such as ITO
2633—a an optional reflector, could be a Distributed Bragg Reflector or some other type of reflector,
2632—a P-type confinement layer that is used for a Blue LED (One example of a material for this region is GaN),
2630—a buffer layer that is typically used for a Blue LED (One example of a material for this region is AlGaN),
2628—a multiple quantum well used for a Blue LED (One example of materials for this region are InGaN/GaN),
2627—a N-type confinement layer that is used for a Blue LED (One example of a material for this region is GaN).
2648—an oxide layer, may be preferably a conductive metal oxide such as ITO,
2622—an oxide layer, may be preferably a conductive metal oxide such as ITO,
2621—an optional reflector (for example, a Distributed Bragg Reflector),
2620—a P-type confinement layer that is used for a Green LED (One example of a material for this region is GaN),
2618—a buffer layer that is typically used for a Green LED (One example of a material for this region is AlGaN),
2616—a multiple quantum well used for a Green LED (One example of materials for this region are InGaN/GaN),
2615—a N-type confinement layer that is used for a Green LED (One example of a material for this region is GaN),
2652—an oxide layer, may be preferably a conductive metal oxide such as ITO,
2610—an oxide layer, may be preferably a conductive metal oxide such as ITO,
2609—an optional reflector (for example, a Distributed Bragg Reflector),
2608—a P-type confinement layer used for a Red LED (One example of a material for this region is AlInGaP),
2606—a multiple quantum well used for a Red LED (One example of materials for this region are AlInGaP/GaInP),
2604—a P-type confinement layer used for a Red LED (One example of a material for this region is AlInGaP),
2656—an oxide layer, may be preferably a transparent conductive metal oxide such as ITO, and
2658—a reflector (for example, aluminum or silver).

Step (B) is illustrated in FIG. 26B. Via holes 2662 are etched to the substrate layer 2646 to isolate different pixels in the microdisplay/display. Also, via holes 2660 are etched to make contacts to various layers of the stack. These via holes may be preferably not filled. An alternative is to fill the via holes with a compatible oxide and planarize the surface with CMP. Various elements in FIG. 26B such as 2646, 2644, 2634, 2633, 2632, 2630, 2628, 2627, 2648, 2622, 2621, 2620, 2618, 2616, 2615, 2652, 2610, 2609, 2608, 2606, 2604, 2656 and 2658 have been described previously.

Step (C) is illustrated in FIG. 26C. Using procedures similar to those described in respect to FIGS. 4A-S, the via holes 2660 have contacts 2664 (for example, with Aluminum) made to them. Also, using procedures similar to those described in FIGS. 4A-S, nickel layers 2666, solder layers 2668, and a silicon sub-mount 2670 with circuits integrated on them are constructed. The silicon sub-mount 2670 has transistors to control each pixel in the microdisplay/display. Various elements in FIG. 26C such as 2646, 2644, 2634, 2633, 2632, 2630, 2628, 2627, 2648, 2622, 2621, 2620, 2618, 2616, 2615, 2652, 2610, 2609, 2608, 2606, 2604, 2656, 2660, 2662, and 2658 have been described previously.

It can be seen that the structure shown in FIG. 26C can have each pixel emit a certain color of light by tuning the voltage given to the red, green and blue layers within each pixel. This microdisplay may be constructed using the ion-cut technology, a smart layer transfer technique.

FIGS. 27A-D illustrate an embodiment of this invention, where a microdisplay is constructed using stacked RGB LEDs and control circuits are integrated with the RGB LED stack. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 27A:
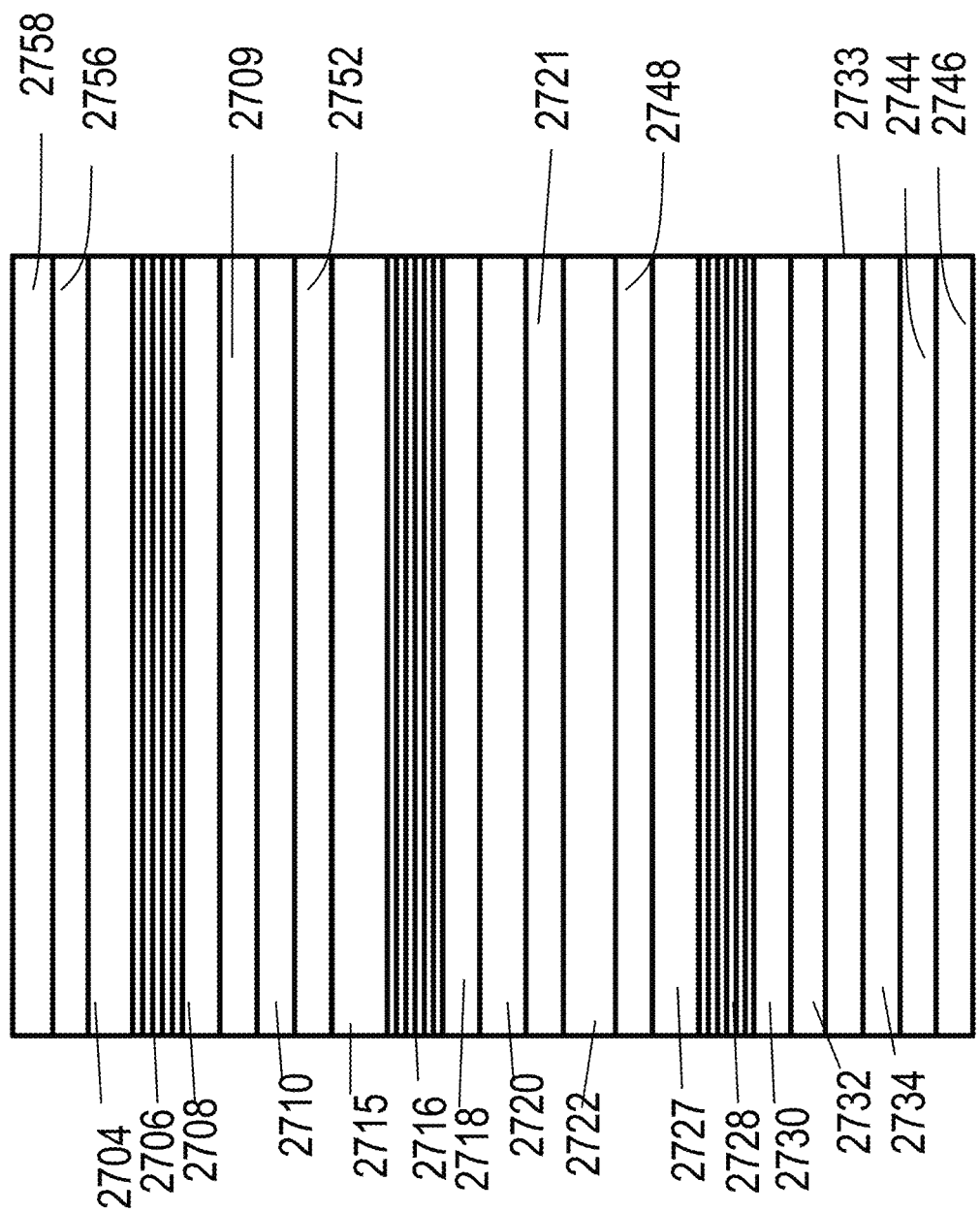
FIGS. 27A-D illustrate an embodiment of this invention, where a microdisplay is constructed using stacked RGB LEDs and control circuits are monolithically stacked above the LED.

Step (A) is illustrated in FIG. 27A. Using procedures similar to those illustrated in FIGS. 4A-S, the structure shown in FIG. 27A is constructed. Various elements of FIG. 27A are as follows:

2746—a glass substrate,
2744—an oxide layer, could be a conductive oxide such as ITO,
2734—an oxide layer, could be a conductive oxide such as ITO,
2733—a an optional reflector (e.g., a Distributed Bragg Reflector or some other type of reflector),
2732—a P-type confinement layer that is used for a Blue LED (One example of a material for this region is GaN),
2730—a buffer layer that is typically used for a Blue LED (One example of a material for this region is AlGaN),
2728—a multiple quantum well used for a Blue LED (One example of materials for this region are InGaN/GaN),
2727—a N-type confinement layer that is used for a Blue LED (One example of a material for this region is GaN),
2748—an oxide layer, may be preferably a conductive metal oxide such as ITO,
2722—an oxide layer, may be preferably a conductive metal oxide such as ITO,
2721—an optional reflector (e.g., a Distributed Bragg Reflector),
2720—a P-type confinement layer that is used for a Green LED (One example of a material for this region is GaN),
2718—a buffer layer that is typically used for a Green LED (One example of a material for this region is AlGaN), 2716—a multiple quantum well used for a Green LED (One example of materials for this region are InGaN/GaN),
2715—a N-type confinement layer that is used for a Green LED (One example of a material for this region is GaN),
2752—an oxide layer, may be preferably a conductive metal oxide such as ITO,
2710—an oxide layer, may be preferably a conductive metal oxide such as ITO,
2709—an optional reflector (e.g., a Distributed Bragg Reflector),
2708—a P-type confinement layer used for a Red LED (One example of a material for this region is AlInGaP),
2706—a multiple quantum well used for a Red LED (One example of materials for this region are AlInGaP/GaInP),
2704—a P-type confinement layer used for a Red LED (One example of a material for this region is AlInGaP),
2756—an oxide layer, may be preferably a transparent conductive metal oxide such as ITO,
2758—a reflector (e.g., aluminum or silver).

Figure 27B:
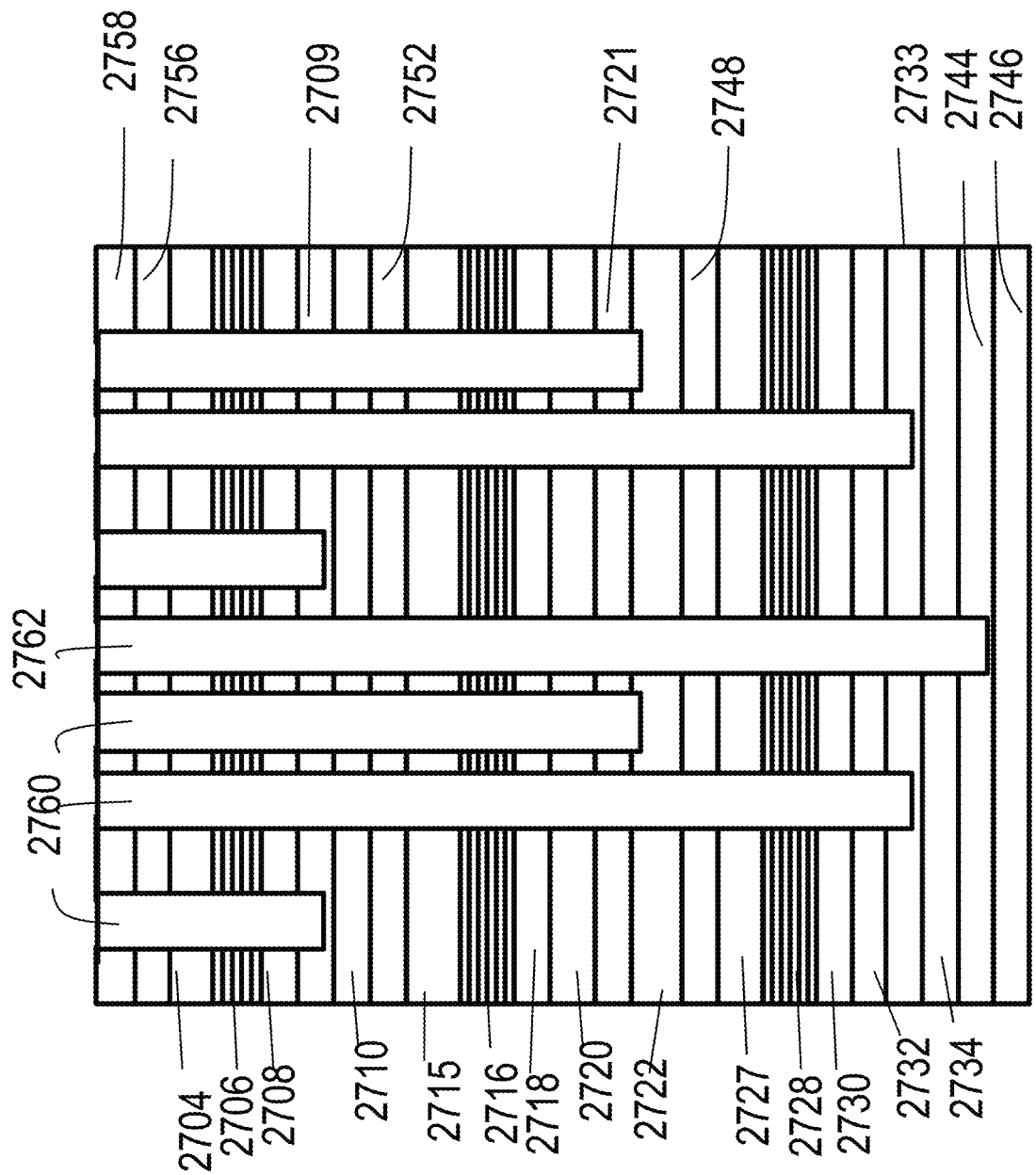

Step (B) is illustrated in FIG. 27B. Via holes 2762 are etched to the substrate layer 2746 to isolate different pixels in the microdisplay/display. Also, via holes 2760 are etched to make contacts to various layers of the stack. These via holes may be preferably filled with a compatible oxide and the surface can be planarized with CMP. Various elements of FIG. 27B such as 2746, 2744, 2734, 2733, 2732, 2730, 2728, 2727, 2748, 2722, 2721, 2720, 2718, 2716, 2715, 2752, 2710, 2709, 2708, 2706, 2704, 2756 and 2758 have been described previously.

Figure 27C:
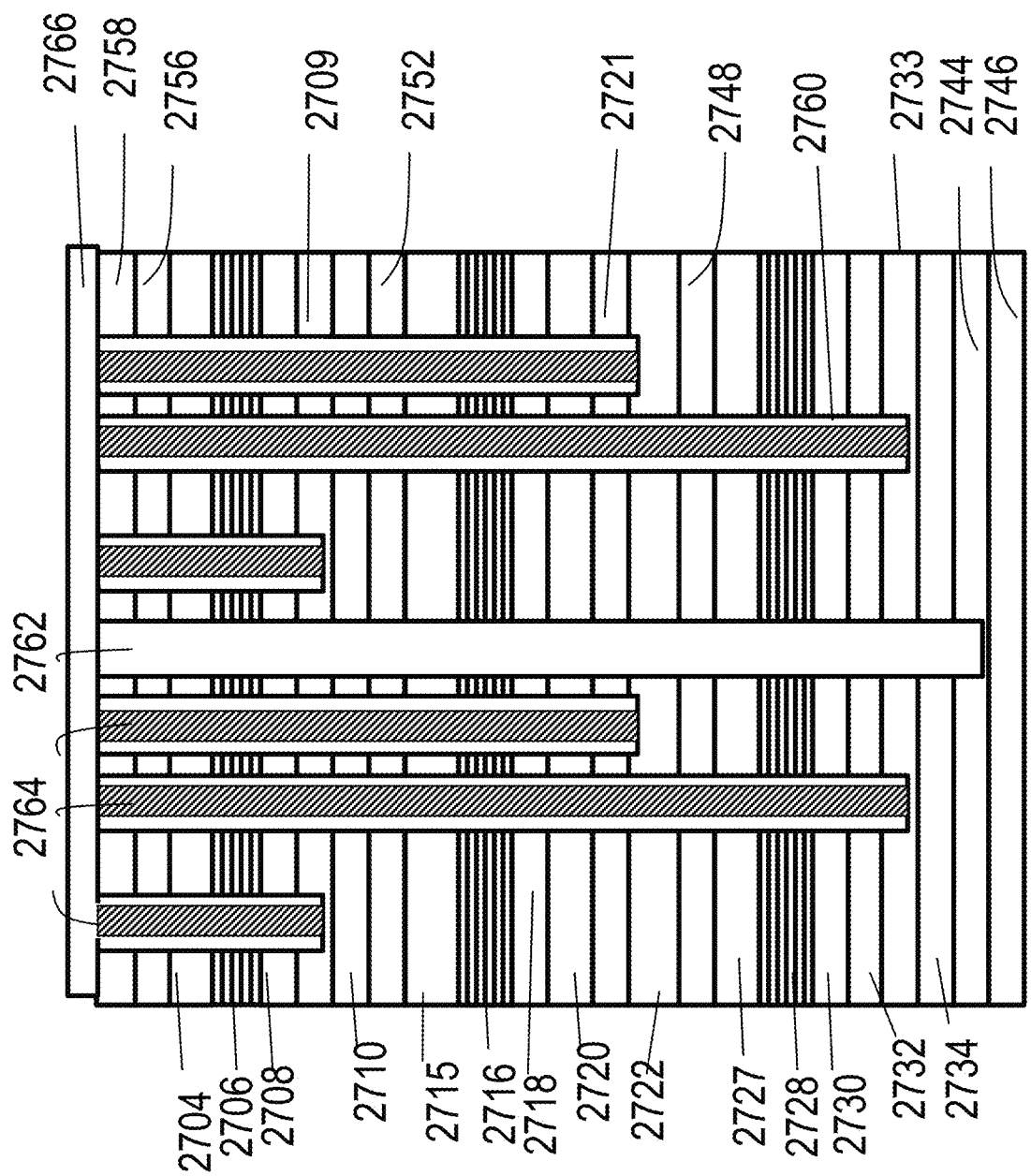

Step (C) is illustrated in FIG. 27C. Metal 2764 (for example) is constructed within the via holes 2760 using procedures similar to those described in respect to FIGS. 4A-S. Following this construction, an oxide layer 2766 is deposited. Various elements of FIG. 27C such as 2746, 2744, 2734, 2733, 2732, 2730, 2728, 2727, 2748, 2722, 2721, 2720, 2718, 2716, 2715, 2752, 2710, 2709, 2708, 2706, 2704, 2756, 2760, 2762 and 2758 have been described previously.

Figure 27D:
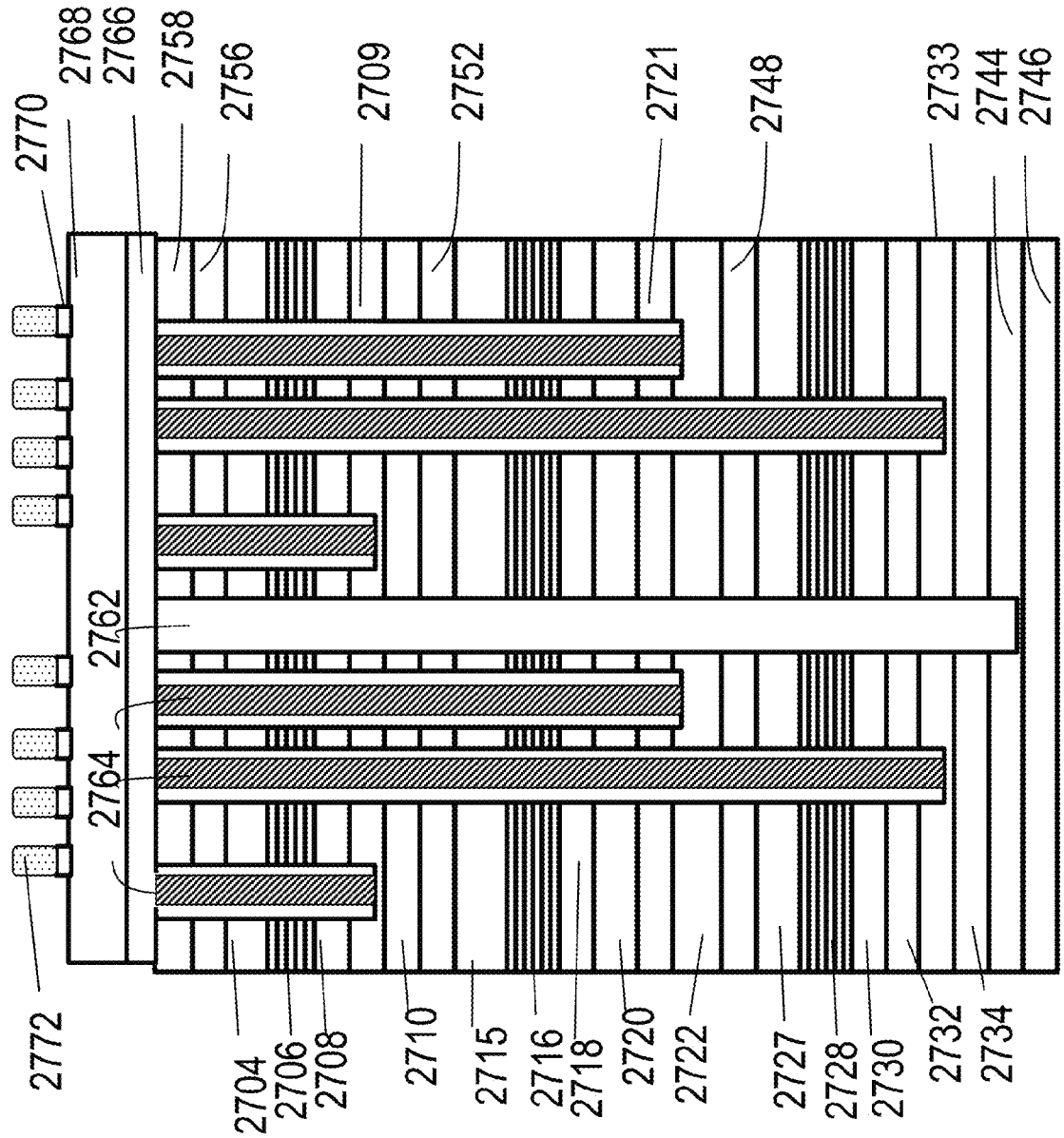

Step (D) is illustrated in FIG. 27D. Using procedures described in co-pending U.S. patent application Ser. No. 12/901,890, the content of which is incorporated herein by reference, a single crystal silicon transistor layer 2768 can be monolithically integrated using ion-cut technology atop the structure shown in FIG. 27C. This transistor layer 2768 is connected to various contacts of the stacked LED layers (not shown in the figure for simplicity). Following this connection, nickel layer 2770 is constructed and solder layer 2772 is constructed. The packaging process then is conducted where the structure shown in FIG. 27D is connected to a silicon sub-mount.

It can be seen that the structure shown in FIG. 27D can have each pixel emit a certain color of light by tuning the voltage given to the red, green and blue layers within each pixel. This microdisplay is constructed using the ion-cut technology, a smart layer transfer technique. This process where transistors are integrated monolithically atop the stacked RGB display can be applied to the LED concepts disclosed in association with FIGS. 4-10.

The embodiments of this invention described in FIGS. 26-27 may enable novel implementations of "smart-lighting concepts" (also known as visible light communications) that are described in "Switching LEDs on and off to enlighten wireless communications", EETimes, June 2010 by R. Colin Johnson. For these prior art smart lighting concepts, LED lights could be turned on and off faster than the eye can react, so signaling or communication of information with these LED lights is possible. An embodiment of this invention involves designing the displays/microdisplays described in FIGS. 26-27 to transmit information, by modulating wavelength of each pixel and frequency of switching each pixel on or off. One could thus transmit a high bandwidth through the visible light communication link compared to a LED, since each pixel could emit its own information stream, compared to just one information stream for a standard LED. The stacked RGB LED embodiment described in FIGS. 4A-S could also provide a improved smart-light than prior art since it allows wavelength tunability besides the ability to turn the LED on and off faster than the eye can react.

NuSolar Technology:

Multijunction solar cells are constructed of multiple p-n junctions stacked atop each other. Multi junction solar cells are often constructed today as shown in FIG. 18A. A Germanium substrate 2800 is taken and multiple layers are grown epitaxially atop it. The first epitaxial layer is a p-type doped Ge back-surface field (BSF) layer, indicated as 2802. Above it, a n-type doped Ge base layer 2804 is epitaxially grown. A InGaP hetero layer 2806 is grown above this. Following this growth, a n-type InGaAs buffer layer 2808 is grown. A tunnel junction 2810 is grown atop it. The layers 2802, 2804, 2806, and 2808 form the bottom Ge cell 2838 of the multi junction solar cell described in FIG. 18A. Above this bottom cell and the tunnel junction 2810, a middle cell constructed of InGaAs is epitaxially grown, and is indicated as 2836. The InGaAs middle cell has the following 4 layers: a p+ doped back surface field (BSF) layer 2812 of InGaP, a p doped base layer 2814 of InGaAs, a n doped emitter layer 2816 of InGaAs, and a n+ doped window layer 2818 of InGaP. Above this InGaAs middle cell 2836, a tunnel junction 2820 is grown epitaxially and above this, another cell, constructed of InGaP, and called a top cell 2834 is epitaxially grown. This top cell 2834 has the following layers: a p+ doped back-surface field (BSF) layer of AlInGaP 2822, a p doped base layer of InGaP 2824, a n doped emitter layer of InGaP 2826 and a n+ doped window layer of AlInP 2828. Above this layer of AlInP 2828, a GaAs layer 2830 is epitaxially grown, Aluminum contacts 2840 are deposited and an anti-reflection (AR) coating 2832 is formed. The purpose of back-surface field (BSF) layers in the multi junction solar cell depicted in FIG. 18A is to reduce scattering of carriers towards the tunnel junctions. The purpose of the window layers is to reduce surface recombination velocity. Both the BSF layers and window layers are heterojunctions that help achieve the above mentioned purposes. Tunnel junctions help achieve good ohmic contact between various junctions in the multi-junction cell. It can be observed that the bottom, middle and top cells in the multi-junction cell are arranged in the order of increasing band-gap and help capture different wavelengths of the sun's spectrum.

Figure 28A:
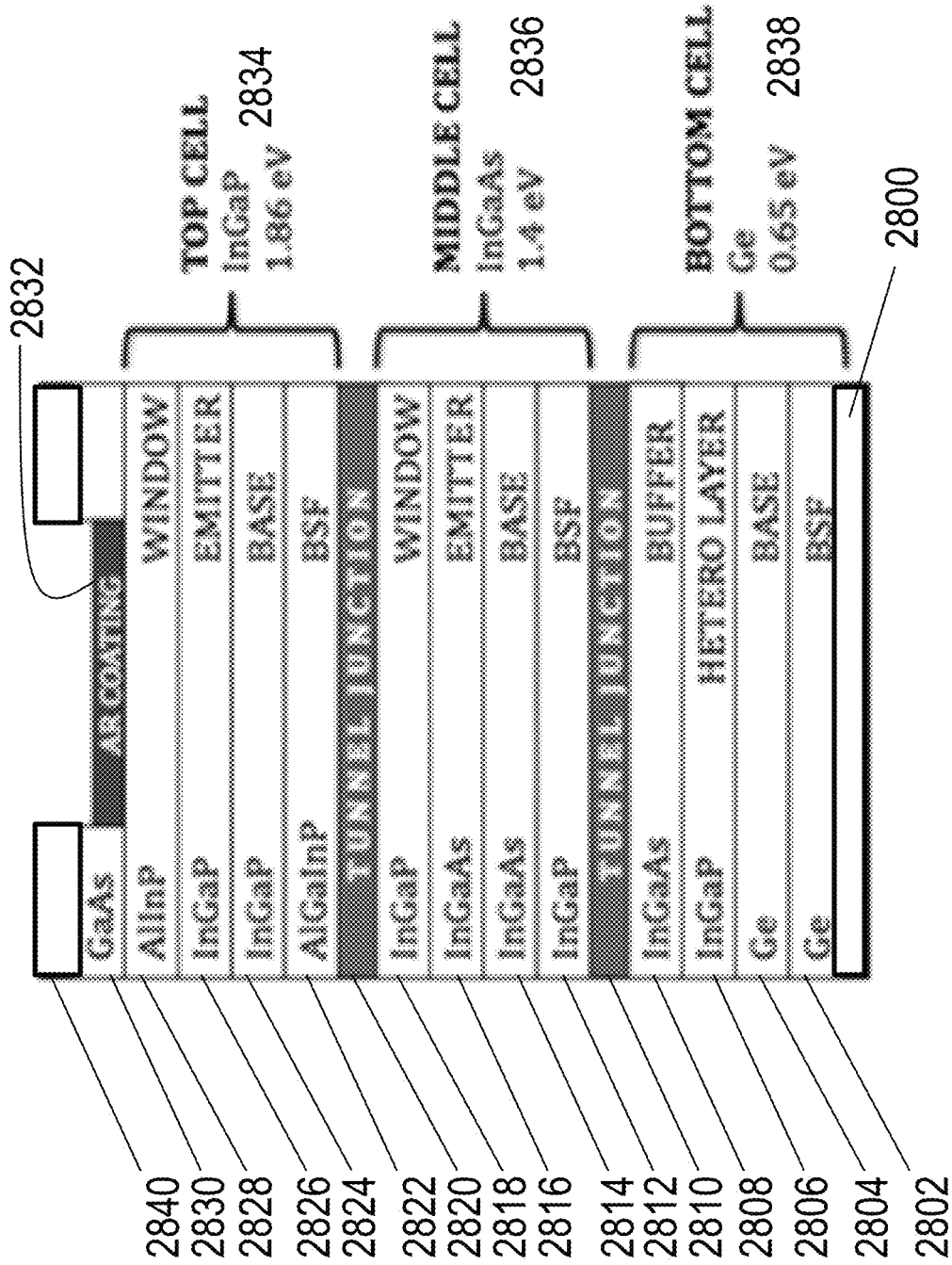
FIGS. 28A-C illustrate a description of multijunction solar cells (prior art)
Figure 28B:
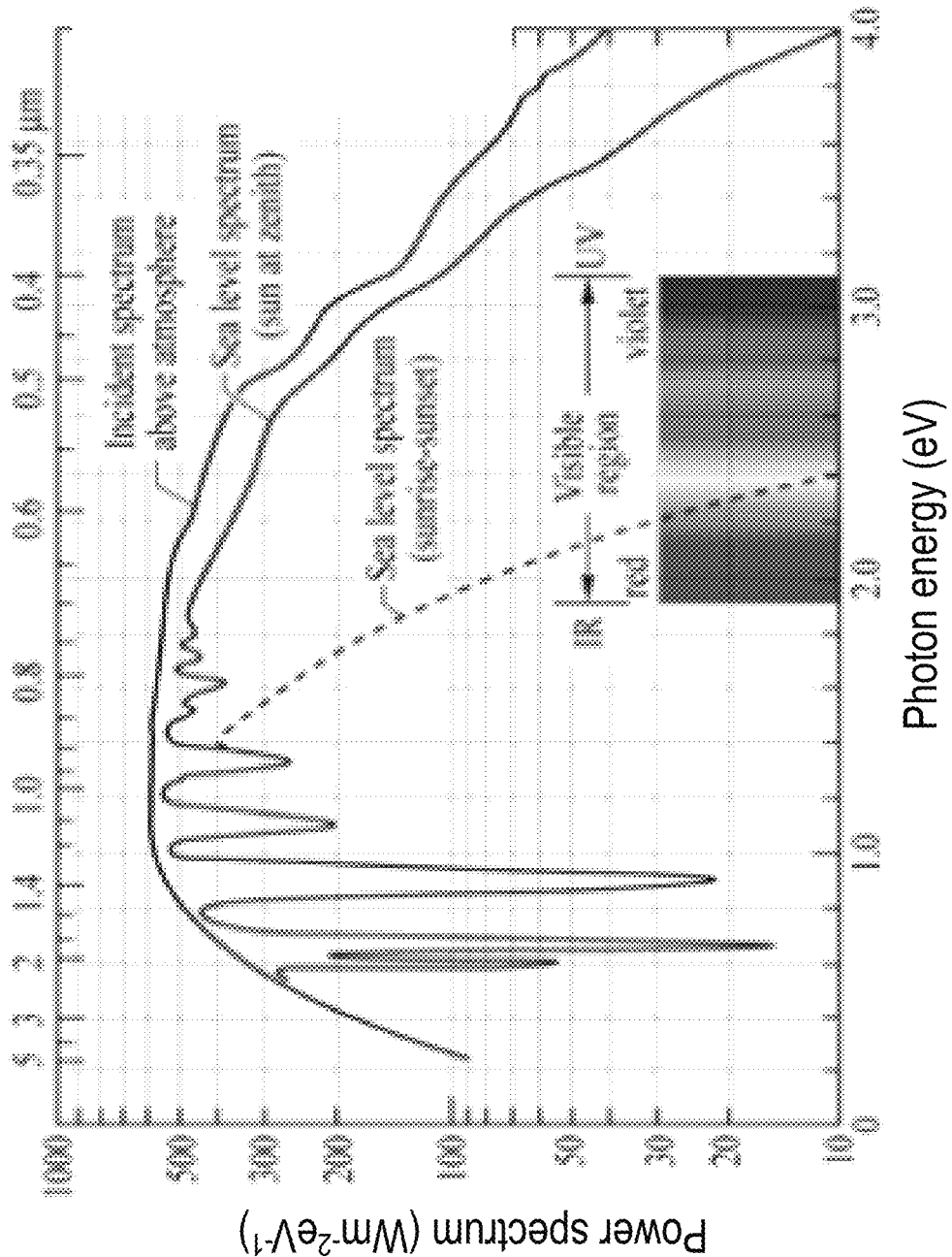

FIG. 28B shows the power spectrum of the sun vs. photon energy. It can be seen that the sun's radiation has energies in between 0.6 eV and 3.5 eV. Unfortunately though, the multi junction solar cell shown in FIG. 28A has band-gaps not covering the solar spectrum (band-gap of cells varies from 0.65 eV to 1.86 eV).

Figure 28C:
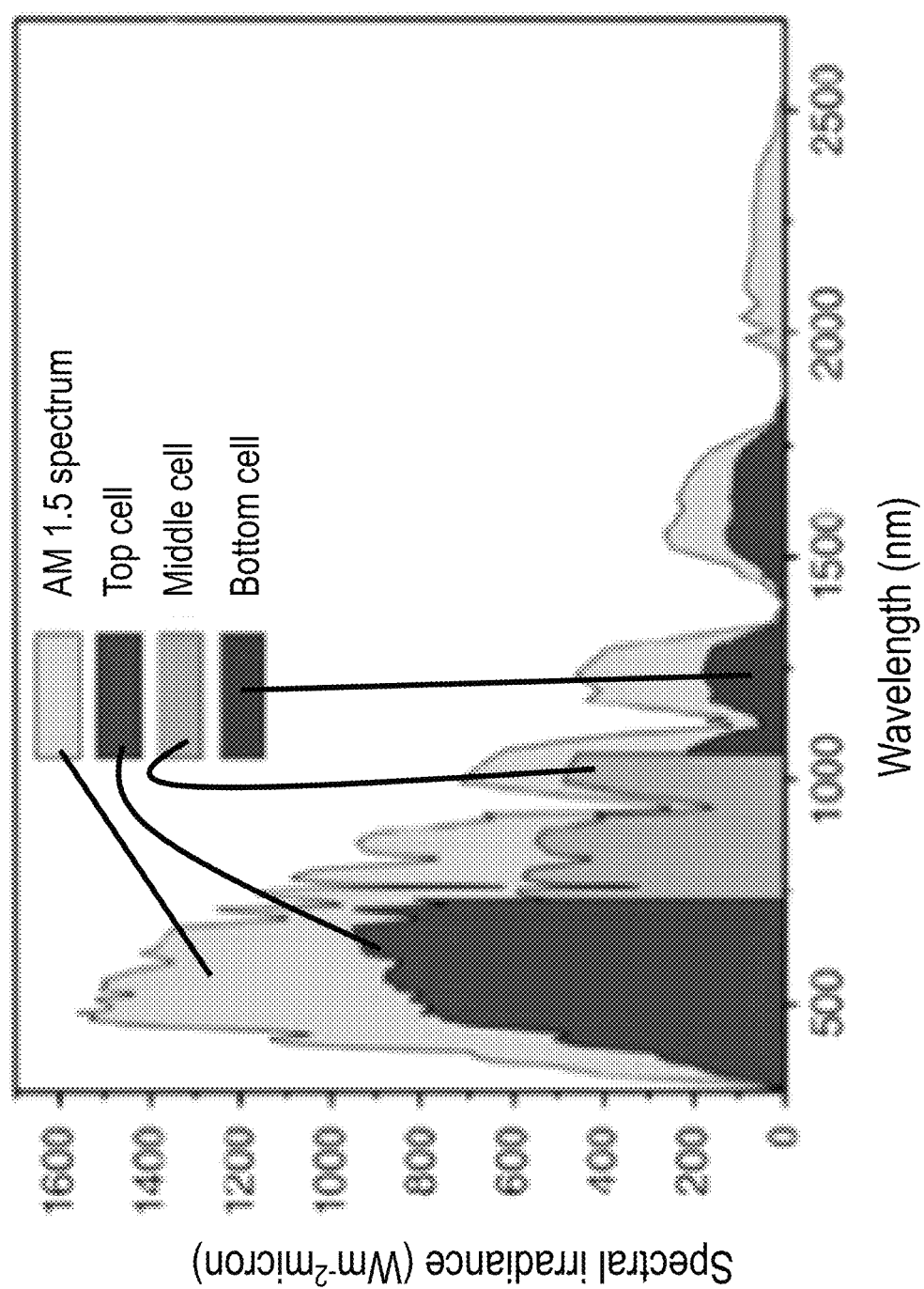

FIG. 28C shows the solar spectrum and indicates the fraction of solar power converted to electricity by the multi junction solar cell from FIG. 28A. It can be observed from FIG. 28C that a good portion of the solar spectrum is not converted to electricity. This is largely because the band-gap of various cells of the multi-junction solar cell does not cover the entire solar spectrum.

FIGS. 29A-H show a process flow for constructing multi-junction solar cells using a layer transfer flow. Although FIGS. 29A-H show a process flow for stacking two cells with two different bandgaps, it is fairly general, and can be extended to processes involving more than two cells as well. This process could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 29A:
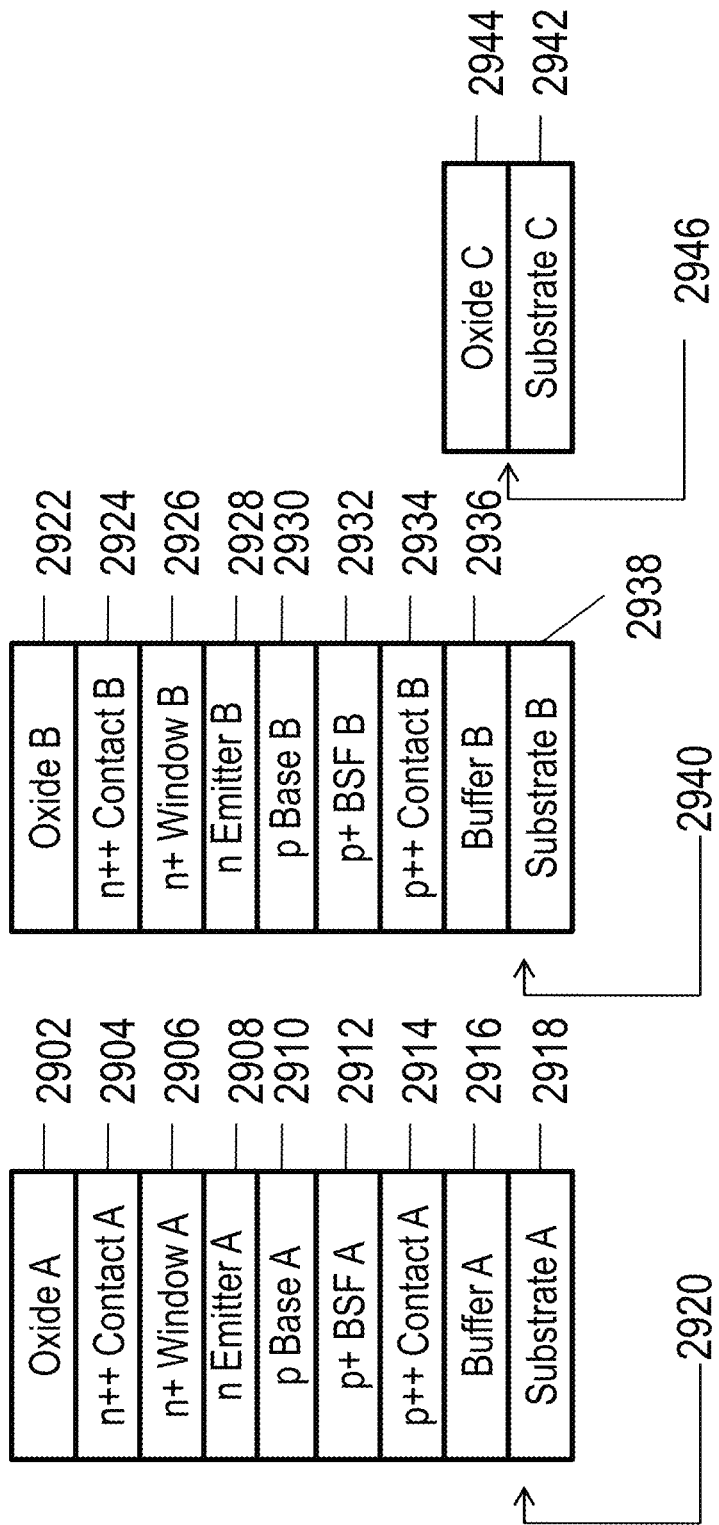

Step (A) is illustrated in FIG. 29A. Three wafers 2920, 2940 and 2946 have different materials grown or deposited above them. Materials from these three wafers 2920, 2940 and 2946 are stacked using layer transfer to construct the multi junction solar cell described in this embodiment of the invention. The wafer 2946 includes a substrate C denoted as 2942 above which an oxide layer C, denoted as 2944, is deposited. Examples of materials for 2942 include heavily doped silicon and the oxide layer C 2944 could preferably be a conductive metal oxide such as ITO. The wafer 2940 includes a substrate for material system B, also called substrate B 2938 (e.g., InP or GaAs), a buffer layer 2936, a p++ contact layer B (e.g., InGaP) 2934, a p+ back-surface field (BSF) layer B (e.g., InGaP) 2932, a p base layer B (eg. InGaAs) 2930, a n emitter layer B (e.g., InGaAs) 2928, a n+ window layer B (e.g., InGaP) 2926, a n++ contact layer B (e.g., InGaP) 2924 and an oxide layer B (e.g., ITO) 2922. The wafer 2920 includes a substrate for material system A, also called substrate A 2918 (e.g., InP or GaAs), a buffer layer 2916, a p++ contact layer A (eg. AlInGaP) 2914, a p+ back-surface field (BSF) layer A (e.g., AlInGaP) 2912, a p-base layer A (e.g., InGaP) 2910, a n-emitter layer A (e.g., InGaP) 2918, a n+ window layer A (e.g., AlInP) 2916, a n++ contact layer A (e.g., AlInP) 2914 and an oxide layer A (e.g., ITO) 2912. Various other materials and material systems can be used instead of the examples of materials listed above.

Figure 29B:
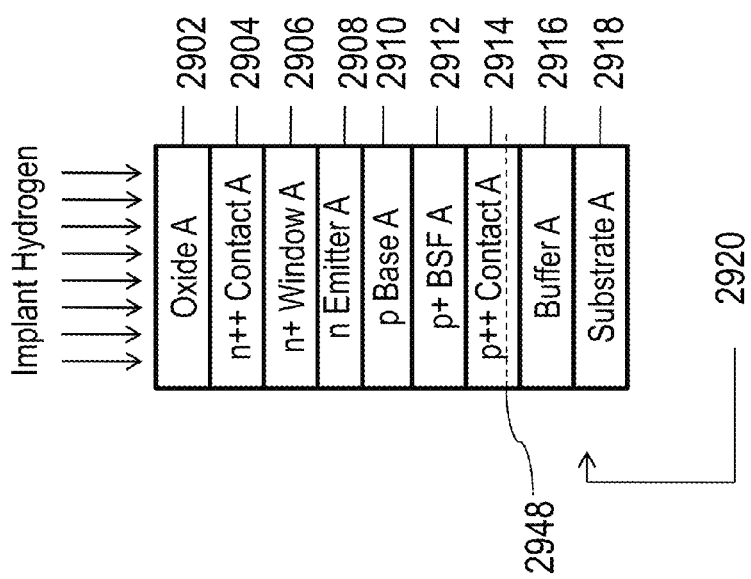

Step (B) is illustrated in FIG. 29B. Hydrogen is implanted into the structure 2920 of FIG. 29A at a certain depth indicated by 2948. Various other elements of FIG. 29B such as 2902, 2904, 2906, 2908, 2910, 2912, 2914, 2916, and 2918 have been described previously. Alternatively, Helium can be implanted instead of hydrogen. Various other atomic species can be implanted.

Figure 29C:
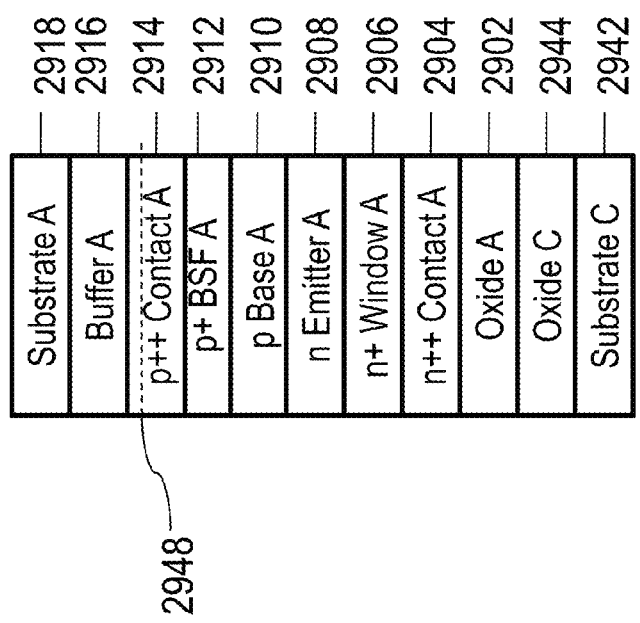

Step (C) is illustrated in FIG. 29C. The structure shown in FIG. 29B is flipped and bonded atop the structure indicated as 2946 in FIG. 29A. Various elements in FIG. 29C such as 2902, 2904, 2906, 2908, 2910, 2912, 2914, 2916, 2944, 2942, and 2918 have been described previously.

Step (D) is illustrated in FIG. 29D. The structure shown in FIG. 29C may be cleaved at its hydrogen plane 2948 preferably using a sideways mechanical force. Alternatively, an anneal could be used. A CMP is then done to planarize the surface to produce p++ contact layer A 2915. Various other elements in FIG. 29D such as 2942, 2944, 2902, 2904, 2906, 2908, 2910, and 2912 have been described previously. The substrate 2918 from FIG. 29C removed by cleaving may be reused.

Step (E) is illustrated in FIG. 29E. An oxide layer 2950 is deposited atop the structure shown in FIG. 29D. This oxide layer 2950 may be preferably a conductive metal oxide such as ITO, although an insulating oxide could also be used. Various elements in FIG. 29E such as 2942, 2944, 2902, 2904, 2906, 2908, 2910, 2915, and 2912 have been described previously.

Figure 29F:
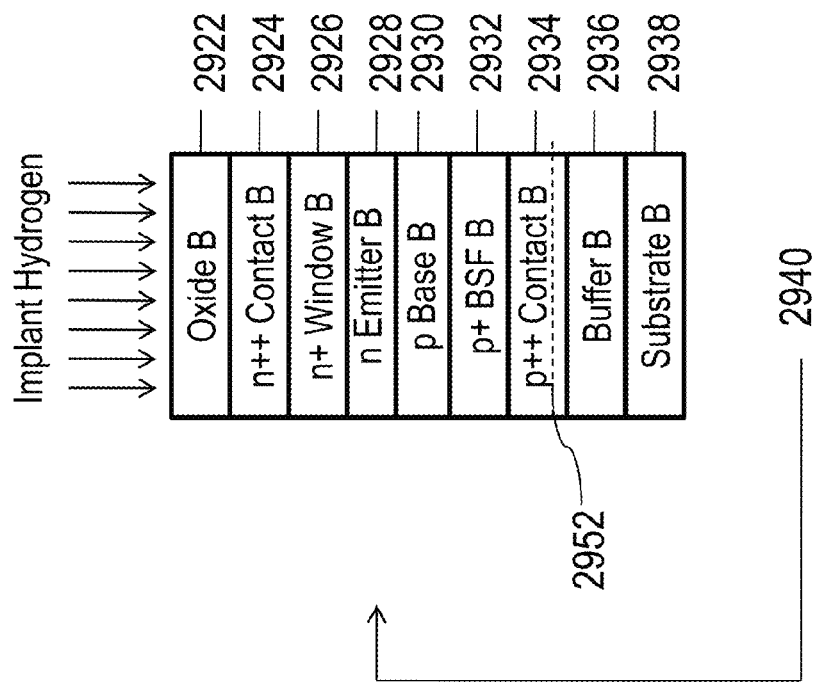

Step (F) is illustrated using FIG. 29F. The structure indicated as 2940 in FIG. 29A is implanted with hydrogen at a certain depth 2952. Alternatively, Helium or some other atomic species can be used. Various elements of FIG. 29F such as 2922, 2924, 2926, 2928, 2930, 2932, 2934, 2936, and 2938 have been indicated previously.

Figure 29G:
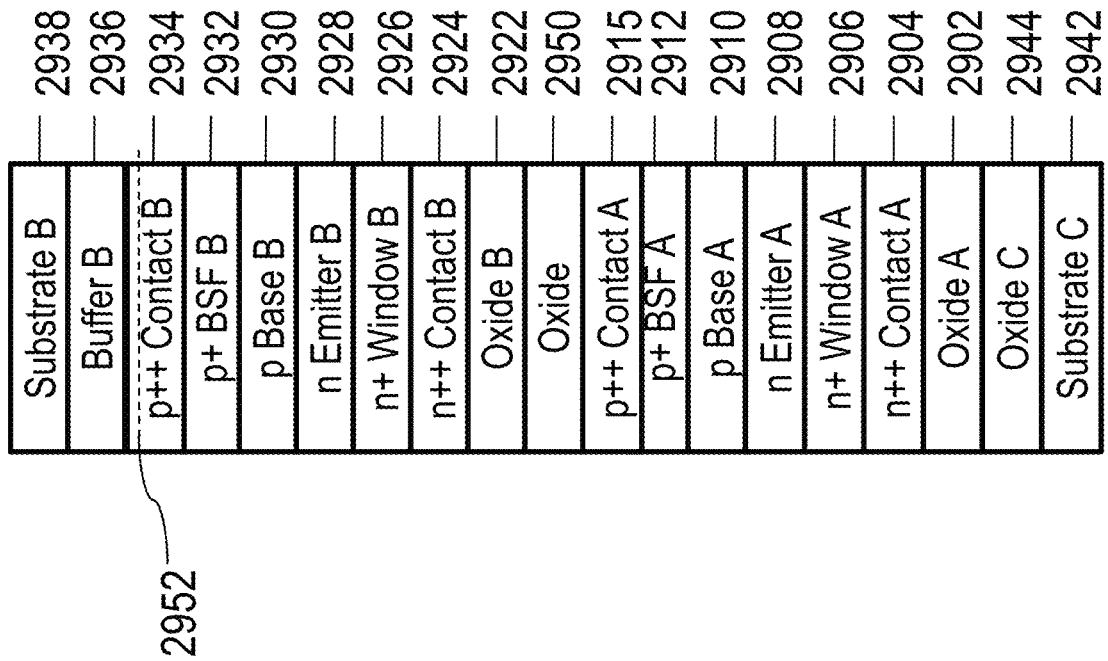

Step (G) is illustrated in FIG. 29G. The structure shown in FIG. 29F is flipped and bonded onto the structure shown in FIG. 29E using oxide-to-oxide bonding. Various elements in FIG. 29G such as 2942, 2944, 2902, 2904, 2906, 2908, 2910, 2912, 2915, 2950, 2922, 2924, 2926, 2928, 2930, 2932, 2934, 2936, 2952, and 2938 have been indicated previously.

Step (H) is illustrated in FIG. 29H. The structure shown in FIG. 29G is cleaved at its hydrogen plane 2952. A CMP is then done to planarize the surface and produces the p++ contact layer B indicated as 2935 in FIG. 29H. Above this, an oxide layer 2952 (e.g., ITO) is deposited. The substrate B indicated as 2938 in FIG. 29G can be reused after cleave. Various other elements in FIG. 29H such as 2942, 2944, 2902, 2904, 2906, 2908, 2910, 2912, 2915, 2950, 2922, 2924, 2926, 2928, 2930, and 2932 have been indicated previously.

After completing steps (A) to (H), contacts and packaging are then done. One could make contacts to the top and bottom of the stack shown in FIG. 29H using one front contact to ITO layer 2954 and one back contact to the heavily doped Si substrate 2942. Alternatively, contacts could be made to each cell of the stack shown in FIG. 29H as described in respect to FIG. 4A-S. While FIGS. 29A-H show two cells in series for the multijunction solar cell, the steps shown in the above description can be repeated for stacking more cells that could be constructed of various band gaps. The advantage of the process shown in FIG. 29A-H is that all processes for stacking are done at temperatures less than 400° C., and could even be done at less than 250° C. Therefore, thermal expansion co-efficient mismatch may be substantially mitigated. Likewise, lattice mis-match may be substantially mitigated as well. Therefore, various materials such as GaN, Ge, InGaP and others which have widely different thermal expansion co-efficients and lattice constant can be stacked atop each other. This flexibility in use of different materials may enable a full spectrum solar cell or a solar cell that covers a increased band within the solar spectrum than the prior art cell shown in FIG. 28A.

FIGS. 30A-D show a process flow for constructing another embodiment of this invention, a multi junction solar cell using a smart layer transfer technique (ion-cut). This process may include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 30A. It shows a multi junction solar cell constructed using epitaxial growth on a heavily doped Ge substrate, as described in the prior art multi-junction solar cell of FIG. 28A. The structure shown in FIG. 30A includes the following components:

3002—a Ge substrate,
3004—a p-type Ge BSF layer,
3006—a n-type Ge base layer,
3008—a InGaP hetero layer,
3010—a n-type InGaAs buffer layer,
3012—a tunnel junction,
3014—a p+ InGaP BSF layer,
3016—a p-type InGaAs base layer,
3018—a n-type InGaAs emitter layer, 3020—a n+ InGaP window layer,
3022—a tunnel junction,
3024—a p+ AlInGaP BSF layer,
3026—a p-type InGaP BSF layer,
3028—a n-type InGaP emitter layer,
3030—a n+− type AlInP window layer, and
3032—an oxide layer, may be preferably of a conductive metal oxide such as ITO. Further details of each of these layers is provided in the description of FIG. 28A.

Figure 30B:
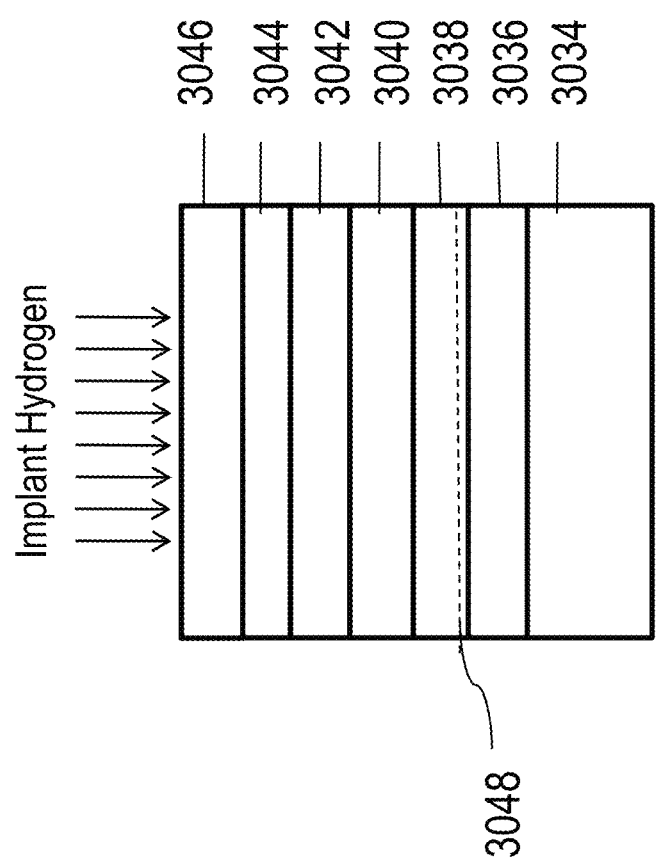

Step (B) is illustrated in FIG. 30B. Above a sapphire or SiC or bulk GaN substrate 3034, various layers such as buffer layer 3036, a n+ GaN layer 3038, a n InGaN layer 3040, a p-type InGaN layer 3042 and a p+ GaN layer 3044 are epitaxially grown. Following this growth, an oxide layer 3046 may be constructed preferably of a transparent conducting oxide such as, for example, ITO is deposited. Hydrogen is implanted into this structure at a certain depth indicated as 3048. Alternatively, Helium or some other atomic species can be implanted.

Figure 30C:
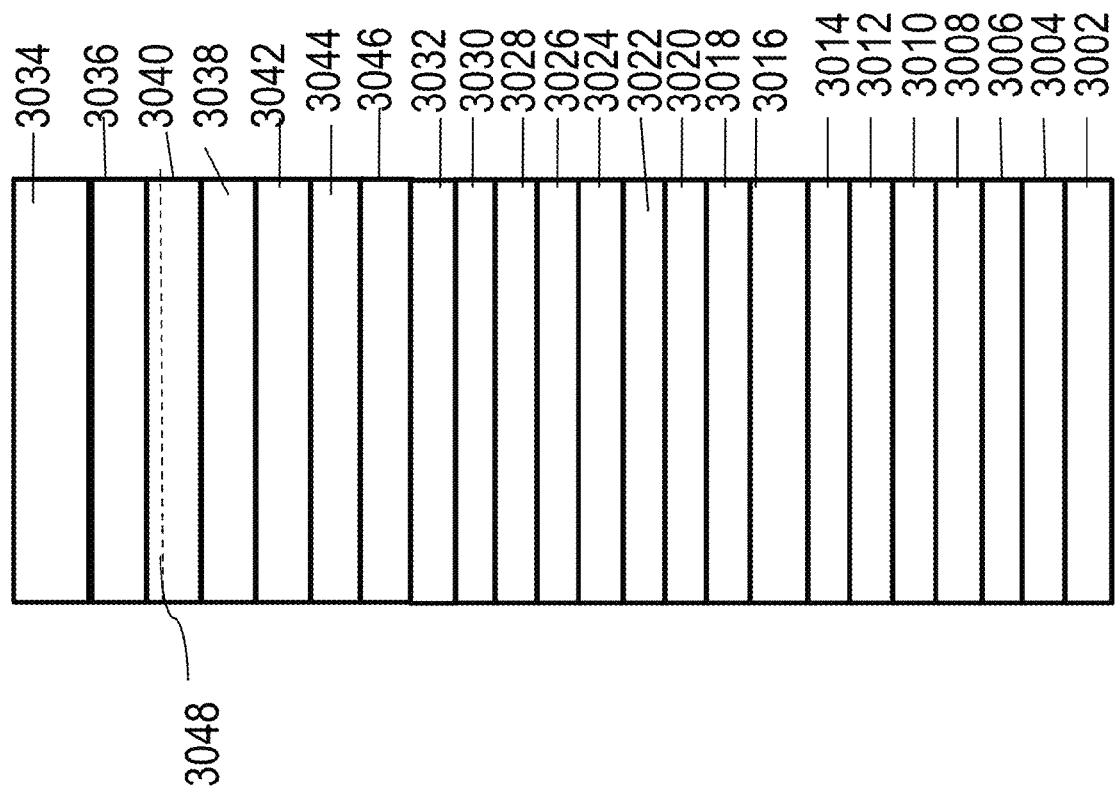

Step (C) is illustrated in FIG. 30C. The structure shown in FIG. 30B is flipped and bonded atop the structure shown in FIG. 30A using oxide-to-oxide bonding. Various elements in FIG. 30C such as 3002, 3004, 3006, 3008, 3010, 3012, 3014, 3016, 3018, 3020, 3022, 3024, 3026, 3028, 3030, 3032, 3048, 3046, 3044, 3042, 3040, 3038, 3036, and 3034 have been described previously.

Figure 30D:
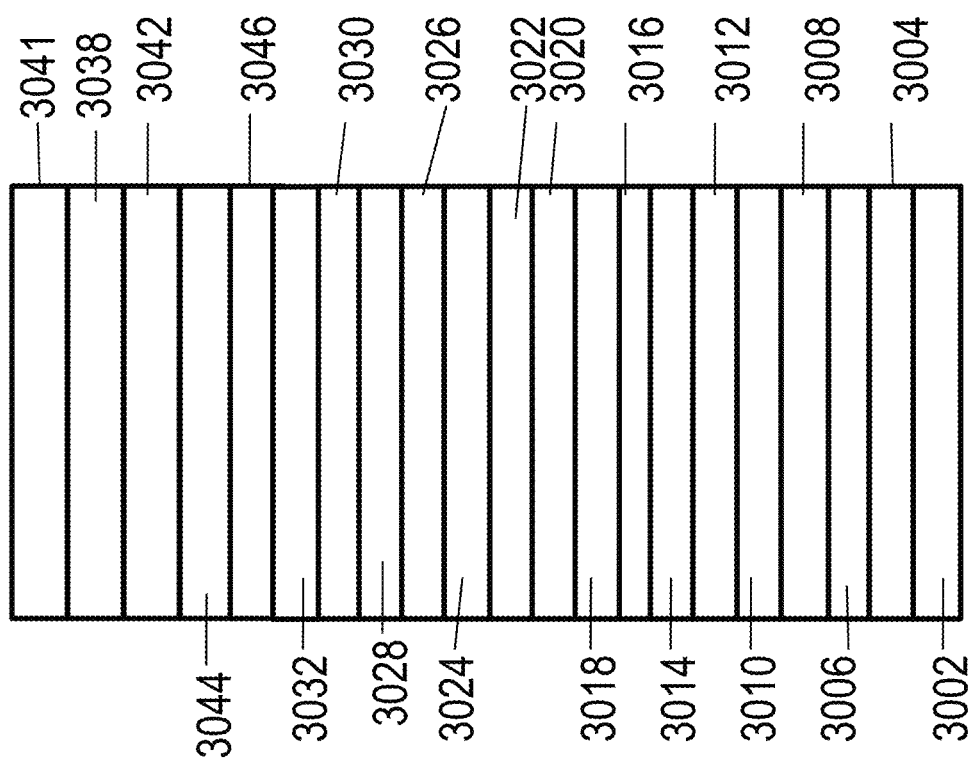

Step (D) is illustrated using FIG. 30D. The structure shown in FIG. 30C is cleaved at its hydrogen plane 3048. A CMP process is then conducted to result in the n+ GaN layer 3041. Various elements in FIG. 30D such as 3002, 3004, 3006, 3008, 3010, 3012, 3014, 3016, 3018, 3020, 3022, 3024, 3026, 3028, 3030, 3032, 3046, 3044, 3042, and 3038 have been described previously.

After completing steps (A) to (D), contacts and packaging are then done. Contacts may be made to the top and bottom of the stack shown in FIG. 30D, for example, one front contact to the n+ GaN layer 3041 and one back contact to the heavily doped Ge substrate 3002. Alternatively, contacts could be made to each cell of the stack shown in FIG. 30D as described in FIGS. 4A-S.

FIGS. 29-30 described solar cells with layer transfer processes. Although not shown in FIG. 29-30, it will be clear to those skilled in the art based on the present disclosure that front and back reflectors could be used to increase optical path length of the solar cell and harness more energy. Various other light-trapping approaches could be utilized to boost efficiency as well.

An aspect of various embodiments of this invention is the ability to cleave wafers and bond wafers at lower temperatures (e.g., less than 400° C. or even less than 250° C.). In co-pending U.S. patent application Ser. No. 12/901,890 the content of which is incorporated by reference, several techniques to reduce temperatures for cleave and bond processes are described. These techniques are herein incorporated in this document by reference.

Several material systems have been quoted as examples for various embodiments of this invention in this patent application. It will be clear to one skilled in the art based on the present disclosure that various other material systems and configurations can also be used without violating the concepts described. It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

We claim:

1. An integrated device, comprising:
a first crystalline layer covered by an oxide layer,
a second crystalline layer overlying said oxide layer, wherein said first and second crystalline layers are image sensor layers,
and said device comprises a third crystalline layer, wherein said third crystalline layer comprises single crystal transistors.

2. An integrated device according to claim 1, wherein at least one of said image sensor layers and said single crystal transistors are aligned to each other.

3. An integrated device according to claim 1, wherein said first crystalline layer is sensitive to a different spectrum than said second crystalline layer.

4. An integrated device according to claim 1, wherein said first crystalline layer has at least an order of magnitude difference in light sensitivity than said second crystalline layer.

5. An integrated device according to claim 1, wherein at least one of said image sensor layers comprises a polarizer.

6. An integrated device according to claim 1, wherein said single crystal transistors form a plurality of pixel control circuits.

7. An integrated image sensor, comprising:
a first mono-crystal layer to comprise a plurality of image sensor pixels and alignment marks, and
an oxide layer overlaying and on top of said first mono-crystal layer, and
a second mono-crystal layer to comprise a plurality of second image sensor pixels aligned to said alignment marks, and said second mono-crystal layer overlaying said oxide layer, and
a third mono-crystal layer, wherein
said third mono-crystal layer to comprise a plurality of single crystal transistors aligned to said alignment marks.

8. An integrated device according to claim 7, wherein said third mono-crystal layer is less than 2 microns thick.

9. An integrated device according to claim 7, wherein said aligned comprises less than 1 micron alignment error.

10. An integrated device according to claim 7, wherein said first mono-crystal layer is sensitive to a different spectrum than said second mono-crystal layer.

11. An integrated device according to claim 7, wherein said first mono-crystal layer has at least an order of magnitude difference in light sensitivity than said second mono-crystal layer.

12. An integrated device according to claim 7, wherein at least one of said first mono-crystal and said second mono-crystal layers is less than 2 microns thick.

13. An integrated device according to claim 7, wherein at least one of said first mono-crystal and said second mono-crystal layers comprise a polarizer.

14. An integrated device according to claim 7, wherein said single crystal transistors form a plurality of pixel control circuits.

15. An integrated device, comprising:
a first mono-crystal layer to comprise a plurality of single crystal transistors and alignment marks, and
an overlaying oxide on top of said first mono-crystal layer, and
a second mono-crystal layer overlaying said oxide, and wherein said second mono-crystal layer to comprise a plurality of image sensor pixels aligned to said alignment marks.

16. An integrated device according to claim 15, wherein said second mono-crystal layer is less than 2 microns thick.

17. An integrated device according to claim 15, wherein said image sensor pixels and said single crystal transistors are aligned to each other.

18. An integrated device according to claim 15, wherein said second mono-crystal layer comprises two crystalline layers, wherein;
said two crystalline layers comprise a first image sensor layer and a second image sensor layer, and wherein;
said first image sensor layer is sensitive to a different spectrum than said second image sensor layer.

19. An integrated device according to claim 15, wherein said second mono-crystal layer comprises two crystalline layers, wherein;
said two crystalline layers comprise a first image sensor layer and a second image sensor layer, and wherein;
said first image sensor layer has at least an order of magnitude difference in light sensitivity than said second image sensor layer.

20. An integrated device according to claim 15, wherein said second mono-crystal layer comprises two crystalline layers, wherein;
said two crystalline layers comprise a first image sensor layer and a second image sensor layer, and wherein;
at least one of said two crystalline layers is less than 2 microns thick.

21. An integrated device according to claim 15, wherein said second mono-crystal layer comprises a polarizer.

22. An integrated device according to claim 15, wherein said single crystal transistors form a plurality of pixel control circuits.

\* \* \* \* \*